United States Patent [19]
Sutoh et al.

[11] Patent Number: 5,432,589
[45] Date of Patent: Jul. 11, 1995

[54] REFERENCE PIN FOR POSITIONING A PRINTING PLATE, PUSHER FOR A PRINTING PLATE, AND ORIGINAL FILM HOLDER

[75] Inventors: Hiroki Sutoh; Shinichi Yabe; Hiroshi Kawaguchi; Keiji Osada, all of Kanagawa, Japan

[73] Assignee: Fuji Photo Film Co., Ltd., Kanagawa, Japan

[21] Appl. No.: 43,521

[22] Filed: Apr. 6, 1993

[30] Foreign Application Priority Data

Apr. 7, 1992 [JP] Japan ................... 4-085772
Apr. 9, 1992 [JP] Japan ................... 4-088560
Jul. 31, 1992 [JP] Japan ................... 4-205458

[51] Int. Cl.$^6$ ............................. G03B 27/04
[52] U.S. Cl. .................. 355/85; 355/89; 355/97
[58] Field of Search .............. 355/85, 89, 97, 99

[56] References Cited

U.S. PATENT DOCUMENTS

| | | | |
|---|---|---|---|
| 4,353,647 | 10/1982 | Harrell et al. | 355/85 |
| 4,423,955 | 1/1984 | Powers | 355/99 |
| 4,575,233 | 3/1986 | Copeland et al. | 355/85 |
| 4,575,275 | 3/1986 | Powers | 355/97 |
| 4,614,425 | 9/1986 | Copeland et al. | 355/99 |
| 4,951,089 | 8/1990 | Powers | 355/85 |
| 4,962,314 | 10/1990 | Hirota et al. | 355/99 X |
| 5,165,062 | 9/1992 | Ogura et al. | 355/85 X |
| 5,255,607 | 10/1993 | Nishiyama et al. | 355/85 X |

FOREIGN PATENT DOCUMENTS 1120559  5/1989 Japan.
4270348  9/1992 Japan.

*Primary Examiner*—Michael L. Gellner
*Assistant Examiner*—Daniel P. Malley
*Attorney, Agent, or Firm*—Sughrue, Mion, Zinn, Macpeak & Seas; Richard C. Turner

[57] ABSTRACT

An original film holder includes an elongated main body having a plurality of pins for engaging a plurality of punch holes formed in a side portion of an original film; a push-up plate for pushing up the side portion of the original film from the main body to disengage the original film from the pins, the push-up plate being located on the main body and having holes through which the pins are inserted; a pressing member located above the main body and the push-up plate to clamp the original film in cooperation with the push-up plate; a push-up plate moving unit for moving the push-up plate upwardly from the main body to disengage the original film from the pins; a pressing member moving unit for moving the pressing member downwardly to press the original film on the push-up plate; and a retreating unit for retreating the pressing member from a position above the main body.

4 Claims, 78 Drawing Sheets

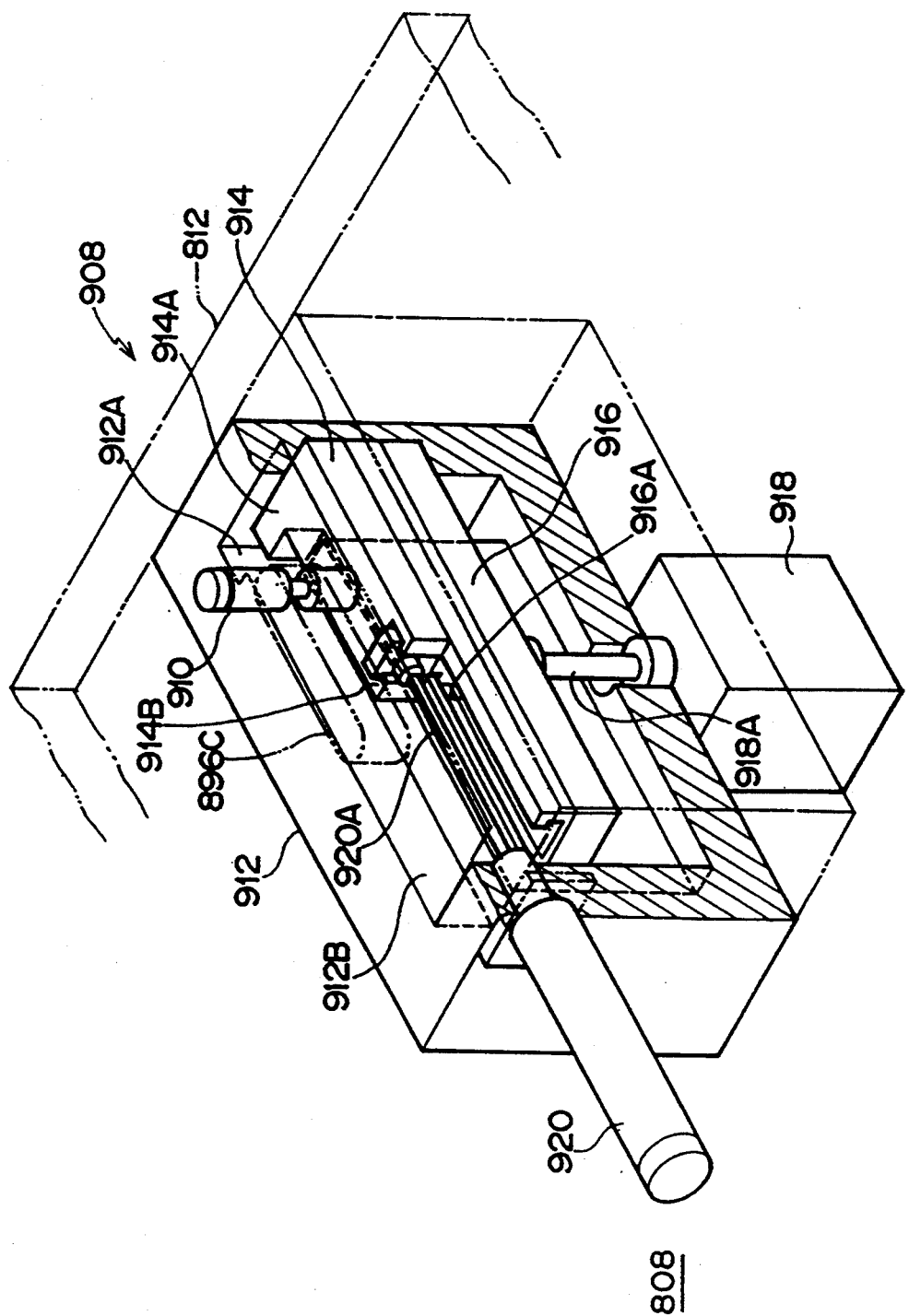

FIG. 43B(1)
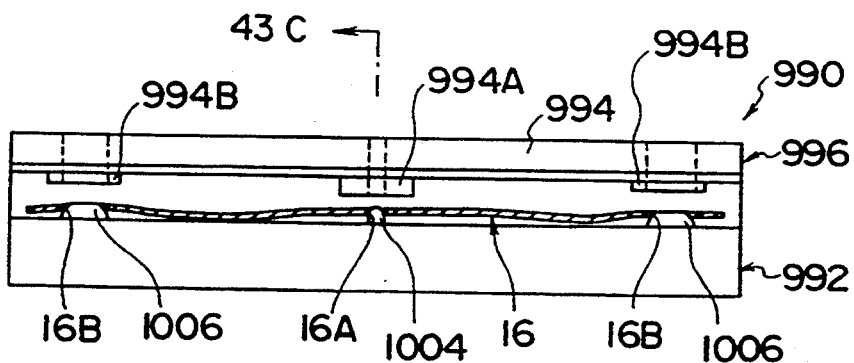
FIG. 43B(2)
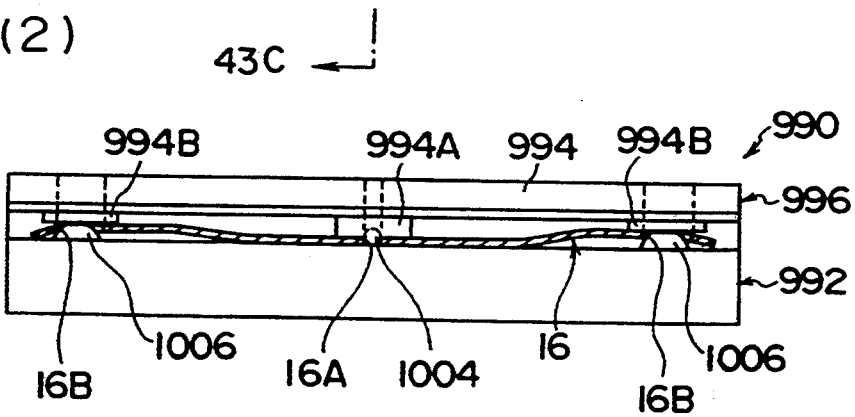
FIG. 43B(3)
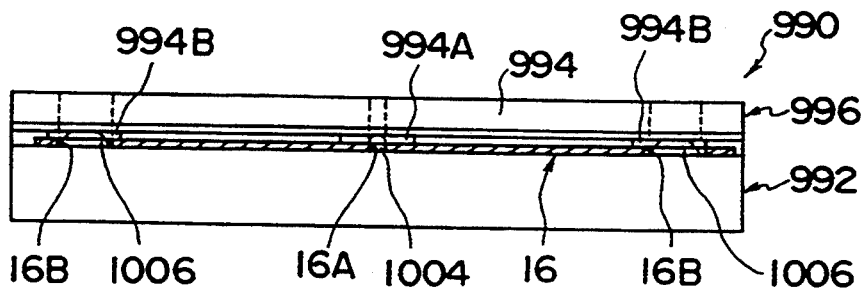

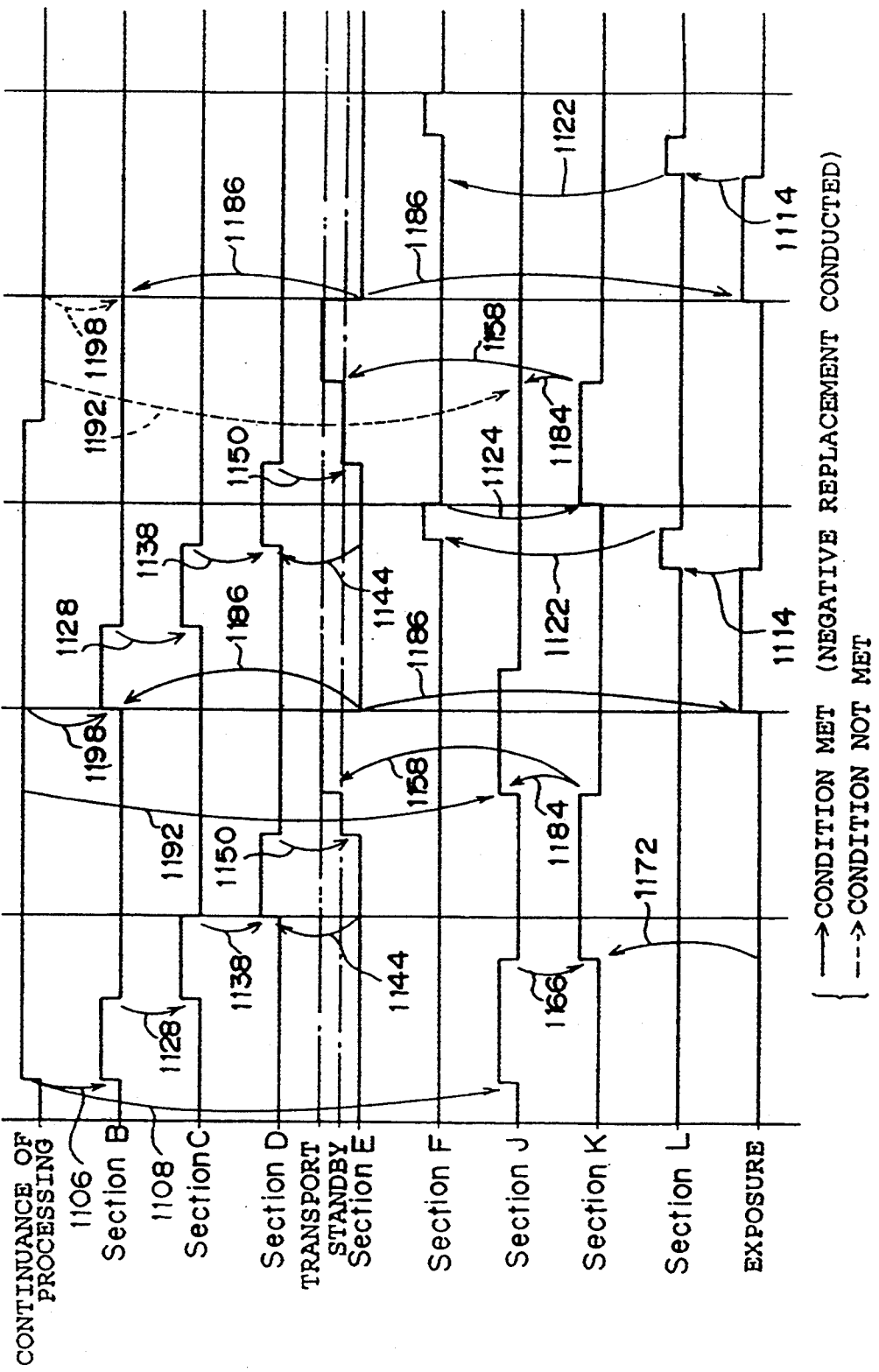

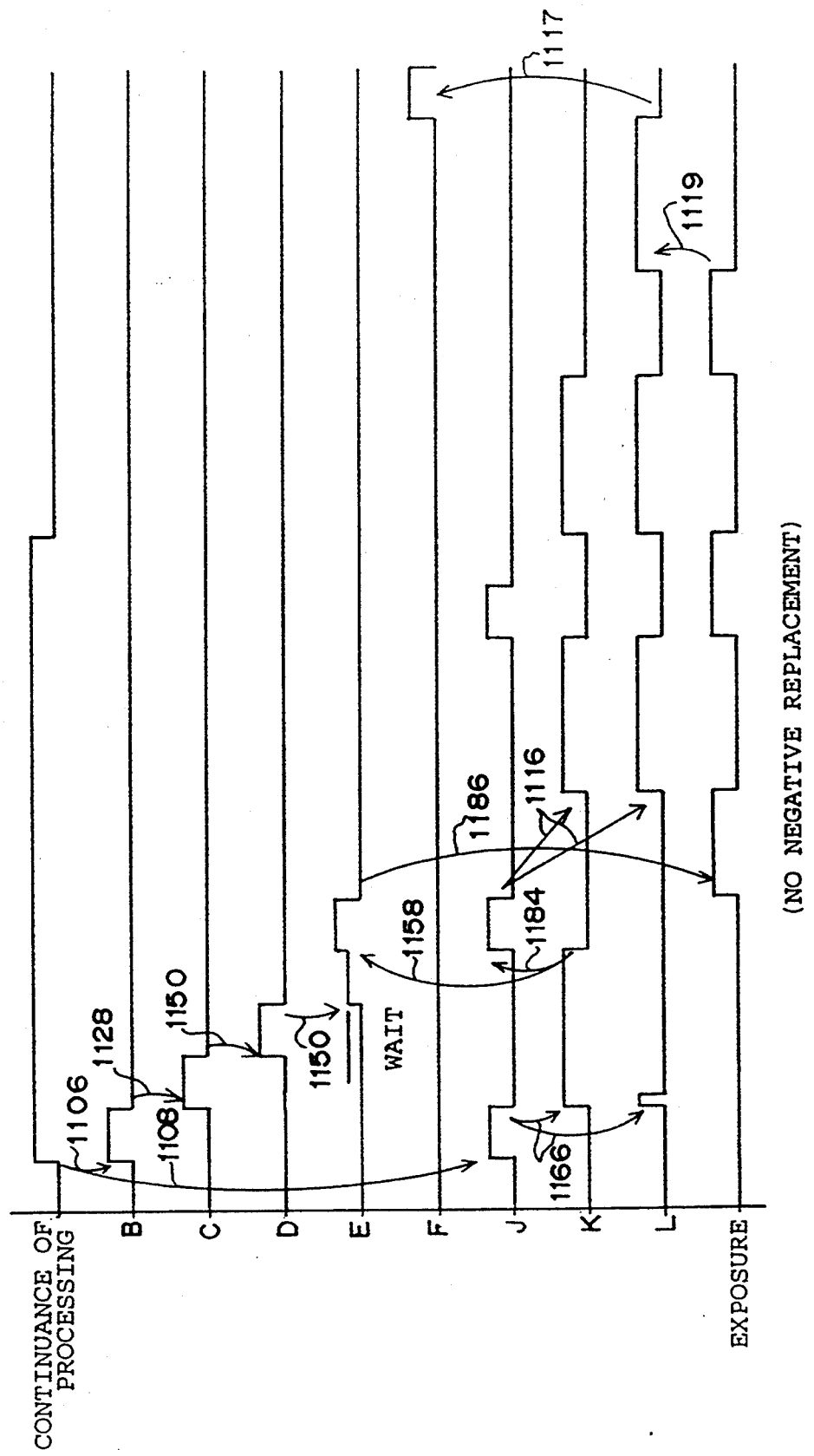

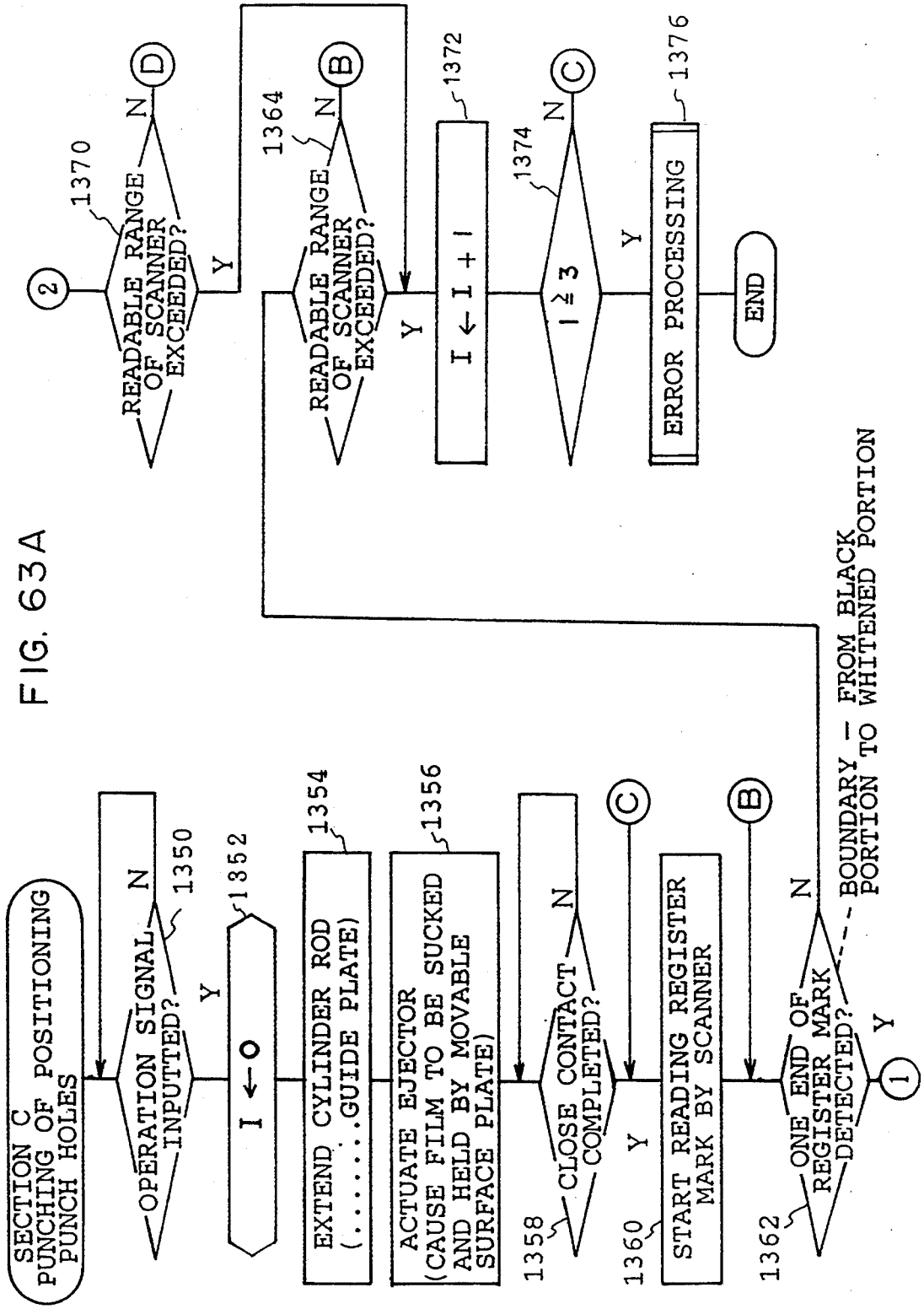

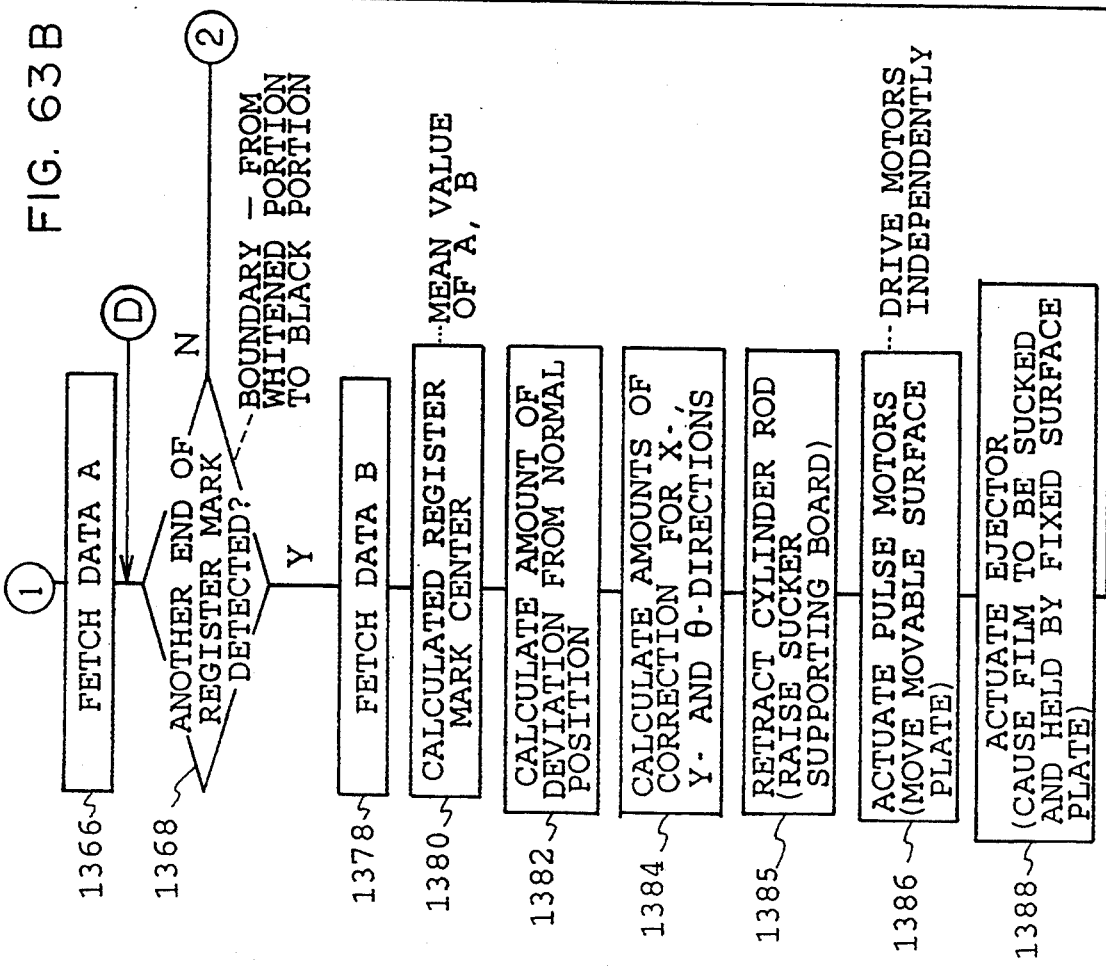

REFERENCE PIN FOR POSITIONING A PRINTING PLATE, PUSHER FOR A PRINTING PLATE, AND ORIGINAL FILM HOLDER

BACKGROUND OF THE INVENTION

1. Field of the Invention

The present invention relates to a printing plate printer for printing an image recorded on an original film onto a printing plate, and more particularly to an original film holder for holding the original film in position with respect to the printing plate, especially a lithographic printing plate. In addition, the present invention relates to a reference pin for positioning a printing plate used for a printing plate printer for positioning the printing plate by coming into contact with an end face of the printing plate, and also concerns a pusher for positioning the printing plate by pushing and moving the printing plate.

2. Description of the Related Art

A printing plate printer prints an image recorded on an original film onto a lithographic printing plate such as a presensitized plate. In the printing plate printer, after the lithographic printing plate (hereinafter referred to as a PS plate) is placed at a predetermined position on a printing surface plate opposing a light source, an original film is placed at a predetermined position on an upper surface of the PS plate, and light from the light source is radiated to the PS plate via the original film. The image on the original film is hereby printed onto the PS plate.

The PS plate is positioned with respect to the printing surface plate in a state in which the PS plate is placed on the printing surface plate. As a method for positioning the PS plate on the printing surface plate, a method is known in which the PS plate is pushed and moved by a pusher toward a positioning pin disposed at a predetermined position so as to be brought into contact with the positioning pin. In this method of positioning the PS plate, since the PS plate is moved by being slid on the printing surface plate, the positioning pin and the pusher are disposed in such a manner as to project upward and retract downward from the upper surface of the printing surface plate. In the state in which the positioning pin and the pusher are accommodated below the printing surface plate, these members are so arranged as not to interfere with the movement of the PS plate on the printing surface plate.

As the pusher disposed in such a manner as to project upward and retract downward from the upper surface of the printing surface plate, a pusher is known in which a pushing portion thereof for coming into contact with the PS plate is accommodated in an inclined manner in an elongated hole provided in the printing surface plate. A distal end portion of this pusher is made to project upward from the elongated hole as its pushing portion is raised diagonally upward. The pusher is then moved along the elongated hole in this projected state so as to push the opposing PS plate.

In addition, the positioning pin is disposed at a distal end of a rod which is moved vertically as a cylinder, for instance, is driven. In this state in which this positioning pin projects upward, as an end face of the PS plate is brought into contact with an outer peripheral surface of this pin, the PS plate is positioned.

With the above-described pusher, since the pushing portion is accommodated in the elongated hole by being inclined, a portion of the elongated hole is used as a rotating space for accommodating the pushing portion and causing the pushing portion to project therefrom. Hence, the range of movement of the pushing portion is narrow despite the length of the elongated hole. For this reason, in order to reliably push and move the PS plate, it is necessary to provide an elongated hole having a length more than is necessary on the printing surface plate.

In addition, as for the positioning pin, it is necessary for its projecting position not to move, but in the event that the rod has rotated and its axial position has been offset, the position of the positioning pin also becomes offset, thereby making it impossible to position the PS plate accurately in some cases.

Also, a printing plate printer is known which is provided with a film holder in which pins are disposed uprightly on the printing surface plate or adjacent to the printing surface plate. This film holder is adapted to hold a negative film by inserting pins through punch holes formed in advance at predetermined positions of the negative film, whereby an image portion of the negative film can be arranged at a predetermined position on the printing surface plate.

fin such a film holder, as a method of inserting the pins through the punch holes in the negative film, the negative film is first arranged such that the punch holes are positioned above the pins, and the pins are then moved vertically and inserted through the punch holes so as to hold the negative film. In this method, when the holding of the negative film is canceled, the pins are moved downwardly and drawn out of the punch holes so as to remove the negative film.

As another method of inserting the pins through the punch holes, a method is known in which the film is first sucked and held by a film sucking means, and the film sucking means is then lowered to allow the punch holes provided in the negative film to be fitted over the pins disposed uprightly on the film holder to hold the negative film. After printing, the negative film is raised by the sucking means so as to remove the negative film from the pins.

However, with the former method in which only the pins are vertically moved to be inserted through or removed from the punch holes in the negative film, there are cases where the axes of the pins themselves are offset. Consequently, it sometimes becomes impossible for the pins to be accurately inserted through the punch holes in the negative film and for an image portion of the negative film to be arranged at a predetermined position on the PS plate.

In addition, with the latter method, there are problems in that a punch hole portion of the negative film can be caught by the pin, which makes it impossible for the negative film to be removed, and that the punch hole becomes damaged at the time when the negative film is held by suckers, the punch holes in the negative film are fitted over the pins disposed uprightly on the film holder, and after the printing of the image on the negative film onto the PS plate, the negative film is lifted up by the suckers and is removed from the film holder.

Furthermore, in a case where an identical image is printed on a plurality of PS plates, since only the PS plate is moved and positioned with the original film superposed on the PS plate, there are cases where the original film is also moved and becomes twisted during that movement, thereby making it impossible to maintain a proper position.

SUMMARY OF THE INVENTION

Accordingly, it is an object of the present invention to provide an original film holder for a lithographic printing plate capable of holding an original film by allowing pins of the film holder to be accurately inserted through punch holes, and of removing the original film reliably from the pins.

Another object of the present invention is to provide a positioning device for a lithographic printing plate printer capable of properly performing the positioning of an image on an original film.

Still another object of the present invention is to provide a positioning device for a lithographic printing plate printer capable of maintaining the position of an image on an original film when the lithographic printing plate is moved with the original film superposed thereon at the time of printing an identical image on a plurality of lithographic printing plates.

In accordance with a first aspect of the present invention, there is provided an original film holder comprising: an elongated main body having a plurality of pins for engaging a plurality of punch holes formed in a side portion of an original film; a push-up plate for pushing up the side portion of the original film from the main body to disengage the original film from the pins, the push-up plate being located on the main body and having holes through which the pins are inserted; a pressing member located above the main body and the push-up plate to clamp the original film in cooperation with the push-up plate; push-up plate moving means for moving the push-up plate upwardly from the main body to disengage the original film from the pins; pressing member moving means for moving the pressing member downwardly to press the original film on the push-up plate; and retreating means for retreating the pressing member from a position above the main body.

By means of this original film holder, the original film can be separated smoothly from the pins. In accordance with a specific example of the present invention, the pressing member is provided with an eaves portion in the longitudinal direction thereof, and the original film is clamped by the lower surface of the eaves portion and the upper surface of the pushup plate. A plate-like elastic member may preferably be disposed on the lower surface of the eaves portion, wherein the thickness of the elastic member is greater at a longitudinally central portion thereof than at longitudinally opposite ends thereof. A slack of the original film is thereby eliminated when the original film is clamped by the pressing member and the pushup plate.

In accordance with another aspect of the present invention, there is provided a reference pin device for positioning a lithographic printing plate on a surface plate, comprising: a pin capable of projecting upwardly and retracting downwardly from a through hole formed in the surface plate so as to position the printing plate as an end face of the printing plate is brought into contact with a peripheral surface of the pin in a state in which the pin is projected upwardly; a pin shaft rotatably supporting the pin and disposed coaxially with the through hole; moving means for moving the pin shaft along an axis of the through hole so as to cause the pin to project upwardly and retract downwardly from the through hole; a guide shaft whose axis is disposed in parallel with an axis of the pin shaft; and a guide member having one end fixed to the pin shaft and having at another end a hole through which the guide shaft is slidably inserted. By virtue of the guide member, the rotation of the shaft is restricted, so that the axis of the pin is prevented from becoming offset, thereby making it possible to determine the position of the lithographic printing plate accurately.

In accordance with still another aspect of the present invention, there is provided a pusher for pushing a lithographic printing plate on a surface plate to position the lithographic printing plate. This pusher comprises: a pushing member for pushing the lithographic printing plate while moving along an elongated hole formed in the surface plate; a sliding member on which the pushing member is disposed uprightly; first guiding means for guiding the sliding member in a vertical direction and causing the pushing member to project upwardly from the elongated hole at an upper end position of the sliding member; first moving means for moving the sliding member along the first guiding means; second guiding means for guiding the sliding member along the elongated hole in a state in which the sliding member is guided to the upper end position by the first guiding means; and second moving means for moving the sliding member along the second guiding means. In accordance with a specific example of the present invention, the pushing member is a pin rotatably supported by the sliding member.

In accordance with a further aspect of the present invention, there is provided a pusher for pushing a lithographic printing plate on a surface plate to position the lithographic printing plate, comprising: a pushing member for pushing the printing plate while moving along an elongated hole formed in the surface plate; a sliding member on which the pushing member is disposed uprightly; first guiding means for guiding the sliding member in a vertical direction and causing the pushing member to project upwardly from the elongated hole at an upper end position of the sliding member; first moving means for moving the sliding member along the first guiding means; second guiding means for guiding the sliding member along the elongated hole in a state in which the sliding member is guided to the upper end position by the first guiding means; second moving means for moving the sliding member along the second guiding means; and an original film separating member disposed on the pushing member to separate a portion of the original film placed on the lithographic printing plate from the lithographic printing plate when the lithographic printing plate is pushed by the pushing member. In accordance with a specific example of the present invention, the original film separating member is a plate disposed on an upper portion of the pushing member in parallel with a surface of the surface plate.

In accordance with a still further aspect of the present invention, there is provided a device for positioning an image on an original film at a proper position on a lithographic printing plate for use in a lithographic printing plate printer. This device comprises: holding means for holding a side of the original film; moving means for moving the lithographic printing plate with the original film held by the holding means; and separating means for separating another end of the original film from the lithographic printing plate when the lithographic printing plate is moved by the moving means so as to prevent the moving means from interfering with the original film. The original film holder in accordance with the first aspect of the present invention may be suitably used as the holding means, while the pusher in accordance with the present invention is suitable as the moving means. Preferably, the separating means is a plate disposed on an upper portion of the pushing member in parallel with the upper surface of the surface plate.

It should be noted that the lithographic printing plate includes a presensitized plate, a waterless printing plate, and the like.

BRIEF DESCRIPTION OF THE DRAWINGS

The other objects, features and advantages of the present invention will become more apparent from the following detailed description of the invention when read in conjunction with the accompanying drawings, in which:

FIG. 37A is a schematic perspective view of a pusher;

FIGS. 38A and 38B are plan views of an essential portion of a pusher, in which FIG. 38A shows a state in which the pin roller is accommodated, and FIG. 38B shows a state in which the pusher has been operated;

FIGS. 43B(1) to 43B(3) are front elevational views, in which FIG. 43B(1) shows a state before the negative film is clamped by the pin bar, FIG. 43B(2) shows a state in which the pin bar is moving to clamp the negative film, and FIG. 43B(3) shows a state after the negative film is clamped by the pin bar;

FIG. 60 is a timing chart for replacing the negative film for each PS plate in accordance with the embodiment;

FIG. 61 is a timing chart for continuously using the negative film without replacing it in accordance with the embodiment;

FIGS. 63A and 63B are parts of a single control flowchart illustrating a processing routine for the section C;

DESCRIPTION OF THE PREFERRED EMBODIMENTS

Figure 1:
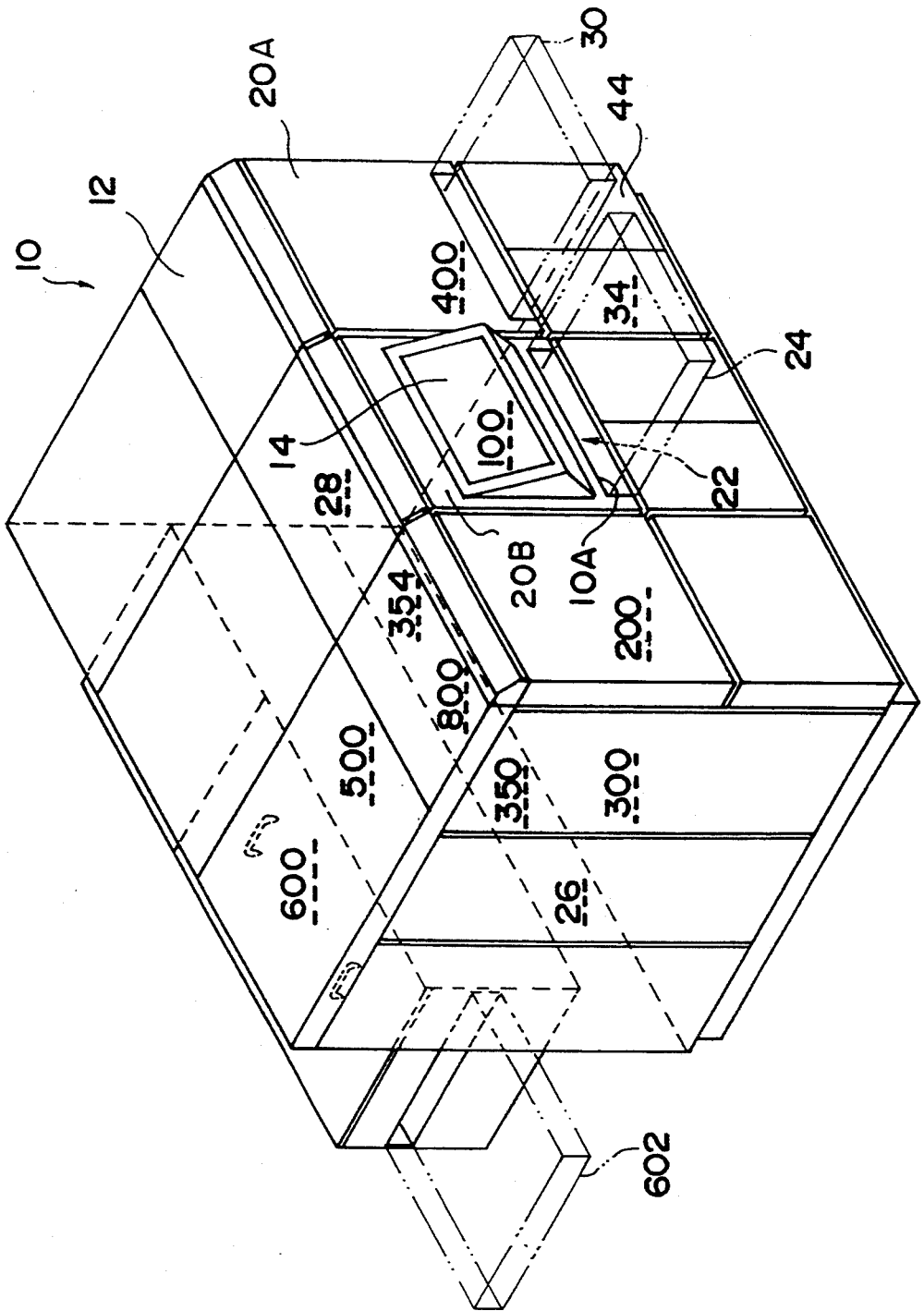
FIG. 1 is a perspective view illustrating the appearance of a lithographic printing plate printer in accordance with an embodiment of the present invention.

FIG. 1 shows the appearance of a printing plate printer 10 in accordance with an embodiment of the present invention. The printing plate printer 10 is constructed such that outer panels 12 are attached to a box-shaped frame. An operation panel 14 is mounted on the front surface of this printing plate printer 10. As the operator operates various operating portions provided on this operation panel 14, a negative film serving as an original film with an image recorded thereon and a PS plate on which the image recorded on the negative film is exposed can be respectively positioned on a printing surface plate of a printing surface-plate section 800 so as to be subjected to print processing.

This operation panel 14 is provided on a panel 20A constituting a part of an openable cover 20. The openable cover 20 is comprised of the panel 20A and a panel 20B, and is constructed in the form of a double hinged door.

Figure 2:
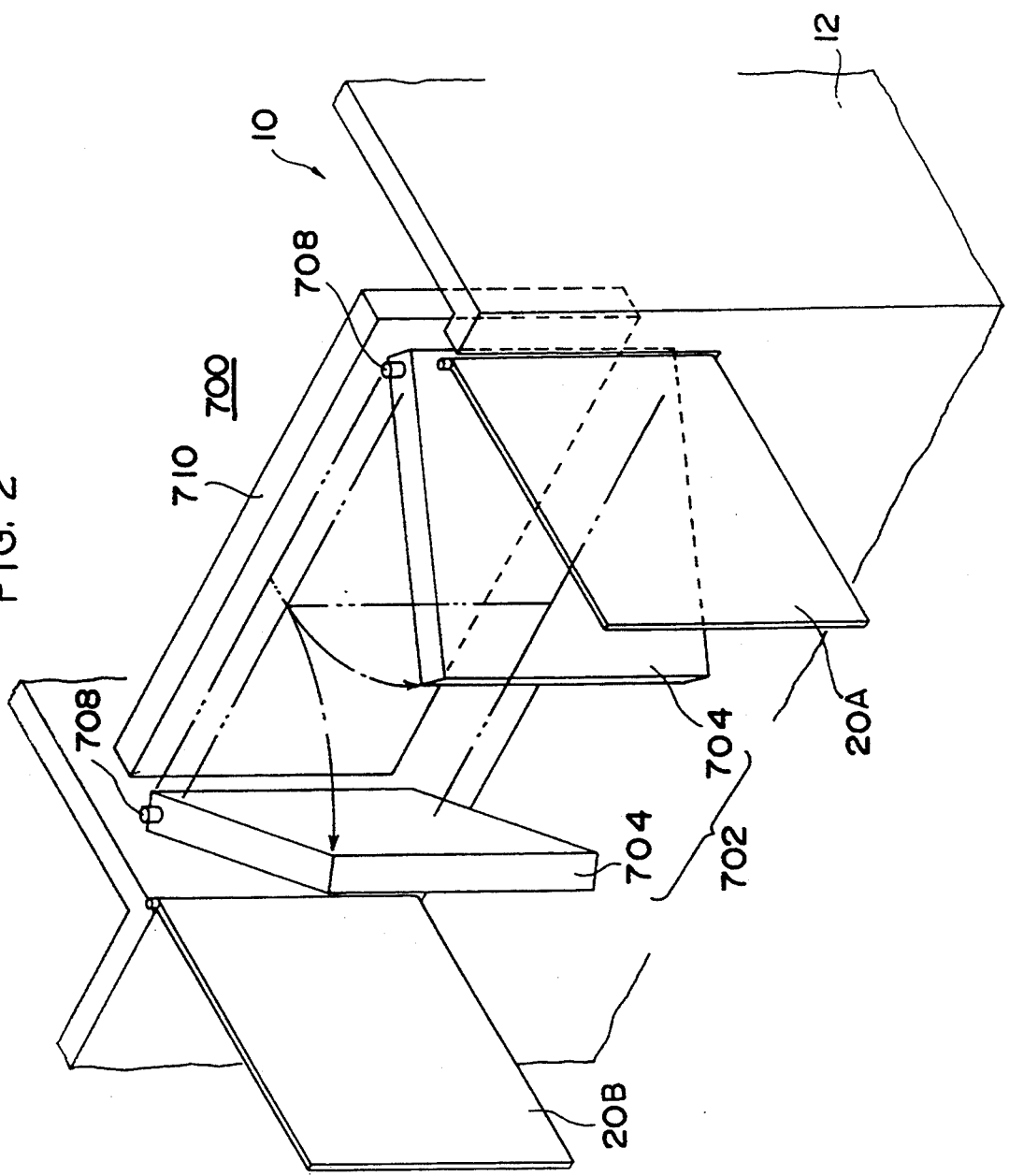
FIG. 2 is a perspective view illustrating a state in which electronic components constituting a controller are arranged and accommodated.

As shown in FIG. 2, a first control panel 702, which constitutes a part of a controller 700, can be accessed if this openable cover 20 is opened. The first control panel 702 is comprised of a pair of board frames 704 which are arranged side by side and are constructed in the form of a double hinged door. The pair of board frames 704 are pivotally supported at mutually opposite sides via guide shafts 708 so as to be opened from the center. An unillustrated control board with electronic components and the like mounted thereon is disposed on the front surface of each of these board frames 704.

A second control panel 710, which constitutes the controller 700 together with the first control panel 702, is accommodated behind the board frames 704 of the first control panel 702. In other words, since the controller 700 employs the double-structured control panel, the electronic components can be arranged in a concentrated manner, and a multiplicity of electronic components can be mounted in a relatively small opening area (the area of the openable cover 20). For this reason, the operating efficiency at the time of maintenance can be improved, and only a small working space is required.

Figure 3:
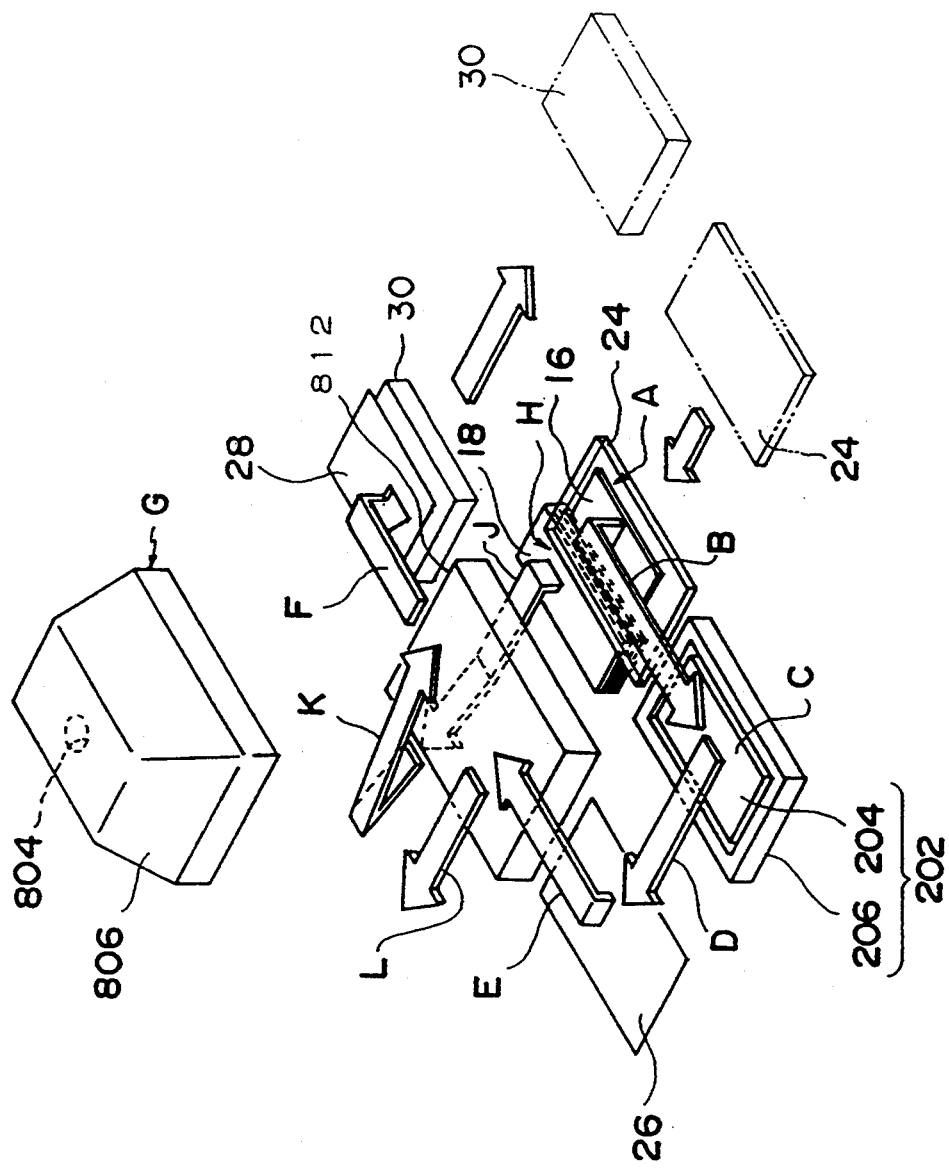
FIG. 3 is a perspective view illustrating the flow of a negative film and a PS plate in each section of the lithographic printing plate printer in accordance with the embodiment.

A description will be given of a processor installed in the printing plate printer 10. FIG. 3 conceptually shows a process in which a negative film 16 is processed.

As shown in FIG. 1, a film loading section 22 (section A) is disposed below the operation panel 14 of the printing plate printer 10. This film loading section 22 has a drawer-type tray 24, and the negative films 16 are stacked and accommodated in this tray 24. As this tray 24 is inserted into the interior of the printer, the loading of the negative films 16 is completed.

As shown in FIGS. 1 and 3, the negative films 16 loaded in the film loading section 22 are consecutively fed out by a first film transport unit 100 (section B) beginning with an uppermost film. The negative film 16 thus fed out is transported to a positioning punch-hole punching section 200 (section C) disposed on the lefthand side as viewed from the front side of the printer.

As shown in FIGS. 1 and 3, the positioning punch-hole punching section 200 has a positioning surface plate 202 on which the negative film 16 is placed. This positioning surface plate 202 is arranged such that a movable surface plate 204 which is movable in X-Y-$\theta$ directions is disposed in the center, and a fixed surface plate 206 is disposed in such a manner as to surround the movable surface plate 204. The movable surface plate 204 and the fixed surface plate 206 are respectively capable of sucking the negative film 16 by means of sucking means. The position of the negative film 16 can be corrected if this movable surface plate 204 is moved in the X-Y-$\theta$ directions in a state in which the negative film 16 is sucked by the movable surface plate 204 alone.

The positions of image-position indicating marks (register marks) are read by a reading means (scanner), and the movable surface plate 204 is moved in such a manner that the positional relationship between punch holes and the register marks becomes a proper positional relationship (a description will be given of this operation later). As a result, punch holes, through which pins of a pin bar for positioning on a printing surface plate 812 are inserted, are formed in the properly positioned negative film 16, and the negative film 16 is then transported to a standby section 26, which is disposed on a farther side as viewed from the front side of the printer, by means of a second film transport unit 300 (section D).

As shown in FIGS. 1 and 3, the standby section 26 is disposed adjacent to the printing surface plate 812, and the negative film 16 which is on standby in the standby section 26 is transported in the rightward direction as viewed from the front side of the printer by means of a third film transport unit 350 (section E) so as to be transported onto the printing surface plate 812. At this time, a PS plate 18 is positioned in place on the printing surface plate 812, and the negative film 16 is superposed on this PS plate 18 by means of lifting devices 352 (see FIG. 21) provided in the third film transport unit 350 so as to allow the pins of the positioning pin bar to be inserted through the punch holes.

A light source unit 802 (section G) capable of being raised and lowered is disposed above the printing surface plate 812. This light source unit 802 is provided with a light source hood 806 for shielding light from a light source 804. The arrangement provided is such that after the light source unit 802 is lowered, and a lower-end opening portion of this light source hood 806 is brought into contact with peripheral edges of the printing surface plate 812, the light is radiated to the negative film 16. Consequently, the image on the negative film 16 is printed onto the PS plate 18.

As shown in FIGS. 1 and 3, the negative film 16 for which printing has been completed is transported by means of a fourth film transport unit 354 (section F) in the rightward direction as viewed from the front side of the printer, i.e., to a discharge section 28 disposed on the side of the printing surface plate 812 which is remote from the side where the standby section 26 is disposed. This fourth film transport unit 354 is structured in the same way as the aforementioned third film transport unit 350, and both film transport units are driven along the same pair of rails 356 (see FIG. 22). That is, the rails 356 extend from the standby section 26 to the discharge section 28 through the printing surface plate 812, so that the third film transport unit 350 is adapted to move between the standby section 26 and the printing surface plate 812, while the fourth film transport unit 354 is adapted to move between the discharge section 28 and the printing surface plate 812. Accordingly, in the case of the so-called split run in which different images are printed on one PS plate, the negative films 16 can be held in the respective third and fourth film transport units 350 and 354, and the negative films 16 can be readily positioned alternately on the printing surface plate 812.

A discharge tray 30 is disposed in the discharge section 28, and the negative films 16 transported by the fourth film transport unit 354 are stacked on this discharge tray 30. This discharge tray 30 can be drawn out to the front side of the printer, and the accumulated negative films 16 are periodically taken out from an original-film taking-out section.

Figure 4:
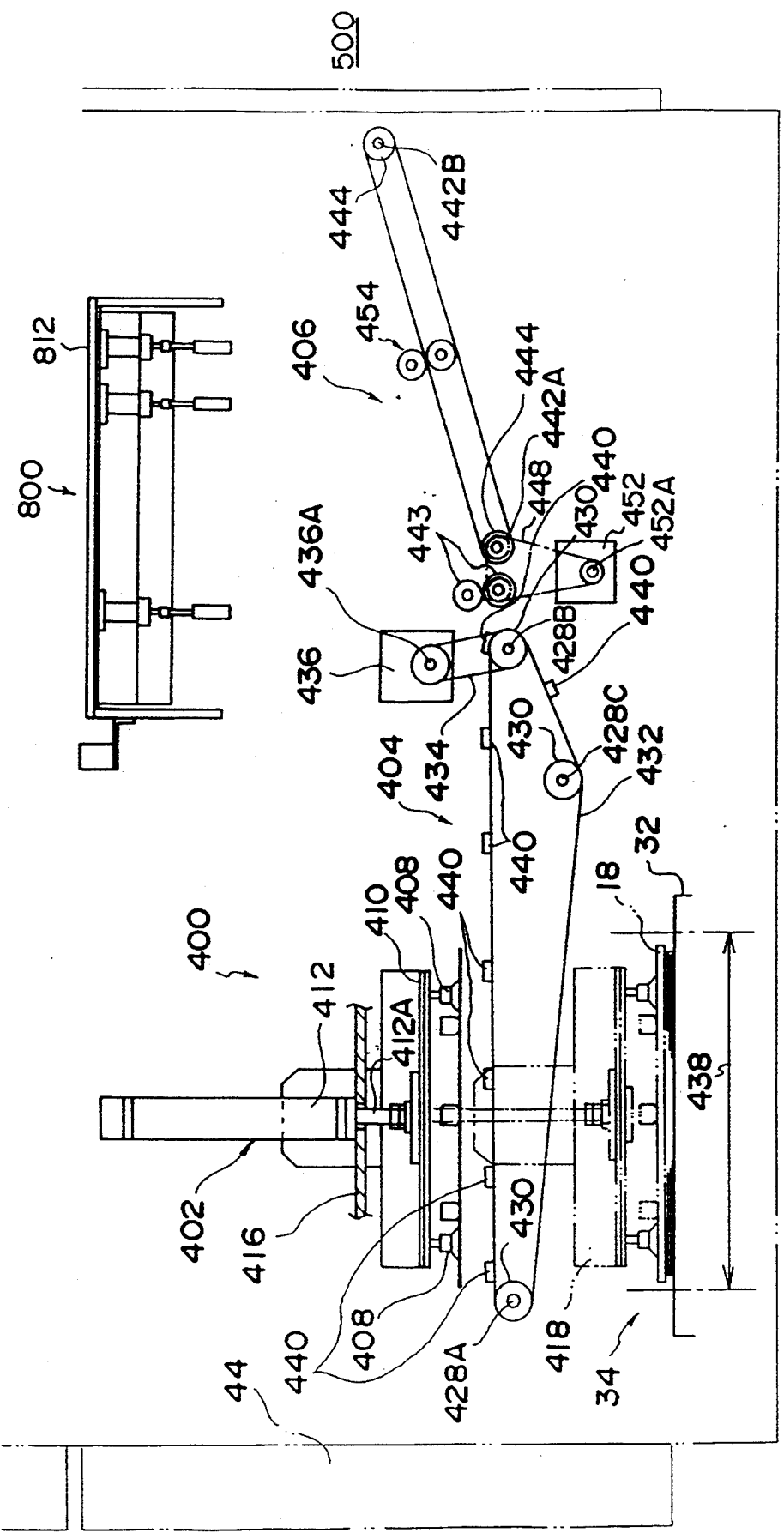
FIG. 4 is a side elevational view illustrating the arrangement of a PS-plate loading section and a PS-plate taking-out section.

Referring now to FIGS. 1, 3 and 4, a description will be given of an arrangement for processing the PS plate 18.

A plurality of PS plates (e.g., 50 to 500 plates or thereabouts) are stacked on a placing table or a skid 32, as shown in FIG. 4. In this state, the PS plates 18 are loaded in a PS-plate loading section 34 (section H) disposed in a lower portion of the printer (below the trays 24 and 30 for loading and discharging the negative films 16), as shown in FIGS. 1 and 3. The PS plates 18 are placed in such a manner that their longitudinal direction coincides with the longitudinal direction of the printer.

As shown in FIG. 4, a PS-plate taking-out section 400 (section J) is disposed above the PS-plate loading section 34. The PS-plate taking-out section 400 is comprised of a suction unit 402 for sucking and lifting up an uppermost one of the PS plates 18 on the skid 32, as well as a feeding-out transport unit 404 for feeding out the PS plate 18 toward the innermost side as viewed from the front side of the printer. Accordingly, the PS plate 18 lifted up by the suction unit 402 is transported by the feeding-out transport unit 404 so as to be fed out to a transporting-direction inverting section 500 (section K) in such a manner as to gradually rise upward via an intermediate transport unit 406 disposed adjacent to the feeding-out transport unit 404 on the innermost side of the printer.

In the transporting-direction inverting section 500, a placing unit 502, on which the PS plate 18 is placed, is swingable about a farthest end of the printer between a position for receiving the PS plate 18 from the intermediate transport unit 406 and a position for feeding the PS plate 18 onto the printing surface plate 812. Accordingly, a trailing end of the PS plate 18 transported from the intermediate transport unit 406 to the transporting-direction inverting section 500 is swung upward through a large angle. Hence, this trailing end of the PS plate 18 is set as a leading end when the PS plate 18 is fed to the printing surface plate 812 (see FIG. 29).

When the placing unit 502 is set in the position for feeding the PS plate 18 onto the printing surface plate 812, the PS plate 18 is fed onto the printing surface plate 812, is positioned in lace on the printing surface plate 812, and is set on standby. Since an upper-surface area of the printing surface plate 812 corresponds to one image portion, about half of the PS plate 18 projects out of the printing surface plate 812. When a first image is subjected to print processing in this state, the PS plate 18 is moved in the longitudinal direction thereof, and a second image is printed thereon. Normally, the first and second images become an identical image.

A pair of punch-hole punching units 808 (see FIG. 33) and 810 (see FIG. 39) for bending the PS plate are respectively disposed below longitudinally extending portions of the PS plate 18 on the printing surface plate 812, i.e., below the standby section 26 and the discharge section 28 for the negative film 16. The longitudinal ends of the PS plate 18 projecting from the printing surface plate 812 are disposed in face-to-face relation with these plate-bending punch-hole punching units 808 and 810, and the punch holes are formed in the PS plate 18 concurrently with the printing of the image.

As shown in FIGS. 1 and 3, a PS-plate discharging section 600 (section L) is disposed on the innermost side, as viewed from the front side of the printer, of the printing surface plate 812, i.e., above the transporting-direction inverting section 500.

In this PS-plate discharging section 600, it is possible to select either a transport passage for continuously feeding the PS plates 18 with images printed thereon to an unillustrated developing apparatus or a transport passage for temporarily stocking the PS plates 18 and feeding them out to an exit tray 602 for taking out the accumulated PS plates 18.

Hereafter, a detailed description will be given of the arrangement of each section and the printing surface-plate section 800.

Section A; Film Loading Section 22

Figure 5:
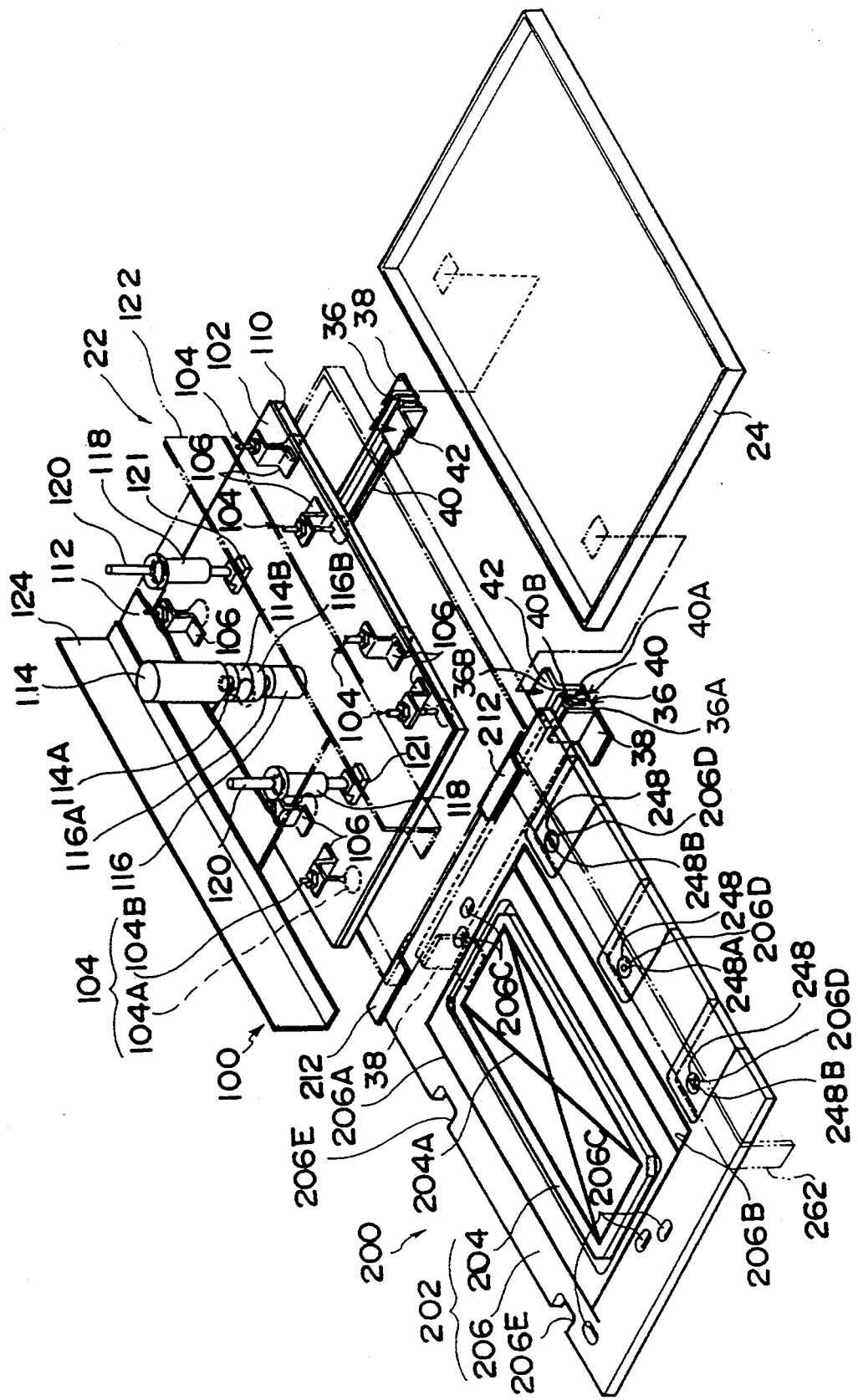
FIG. 5 is a perspective view of a first film transport unit from a negative-film loading section to a positioning punch-hole punching section.

As shown in FIG. 1, a rectangular slit 10A is formed below the operation panel 14 on the front side of the printer. A pair of first guide rails 36 are disposed on opposite sides of the interior of this rectangular slit 10A, as shown in FIG. 5. Longitudinal ends of these first guide rails 36 are respectively secured to an unillustrated frame of the printer via L-brackets 38. Each of the first guide rails 36 is comprised of a body 36A bent substantially in the form of the letter C and a slider 36B accommodated in this body 36A and movable in the longitudinal direction of the first guide rail 36.

The slider 36B of the first guide rail 36 attached to the L-bracket 38 is secured to a body 40A of a second guide rail 40 which is mounted by being superposed on the first guide rail 36. As a result, the second guide rail 40 is slidable along the first guide rail 36.

An inverse L-shaped bracket 42 is attached to a slider 40B of each of the second guide rails 40, and the upper surface of each inverse L-shaped bracket 42 is secured to the bottom surface of the tray 24. Consequently, the tray 24 can be drawn out by the sum of slidable distances of the first guide rails 36 and the second guide rails 40.

The negative films 16 of the same size are stacked and accommodated in the tray 24. Although not shown, a guide plate which can be moved in correspondence with the size of the negative films 16 to be accommodated is attached to the tray 24, so that the negative films 16 can be accommodated in the tray 24 with their central position substantially fixed irrespective of the sizes.

Section B; First Film Transport Unit 100

Figure 6:
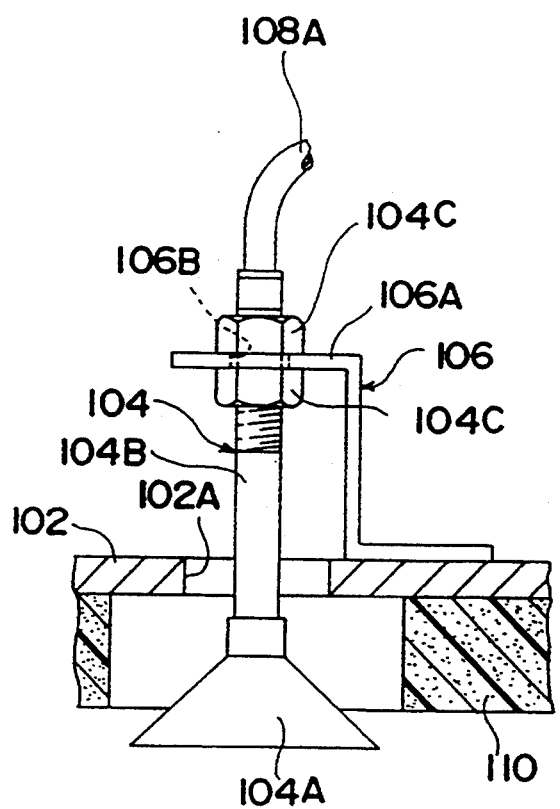
FIG. 6 is an enlarged view of a sucker attached to a sucker supporting board of the first film transport unit.

As shown in FIG. 5, a sucker supporting board 102 is located above the tray 24 which is set in a state in which the tray 24 is inserted in the film loading section 22. As shown in FIG. 6, a total of eight circular holes 102A are provided in the sucker supporting board 102, and suckers 104 are respectively disposed in the circular holes 102A. A proximal portion 104B of the sucker 104 for sucking air from its sucking portion 104A is inserted in a hole 106B provided in a top plate portion 106A of a crank-shaped bracket 106. An external thread is formed on the proximal portion 104B of the sucker 104, and a pair of nuts 104C are threadedly engaged thereon in such a manner as to clamp the top plate portion 106A. A pipe 108A from an ejector 108 (see FIG. 47) is connected to an upper end of the proximal portion 104B of this sucker 104.

A lower end of the bracket 106 is fixed to the upper surface of the sucker supporting board 102, with the result that the sucker 104 is supported in a state in which the sucking portion 104A projects slightly from the lower surface of the sucker supporting board 102.

Attached to the lower surface of the sucker supporting board 102 is a soft sheet 110 which has circular holes 110A at positions corresponding to the projecting portions of the suckers 104. This soft sheet 110 is spongy, and is adapted to clamp the negative film 16 between the same and the upper surface of the positioning surface plate 202 when the sucker supporting board 102 has moved to the positioning punch-hole punching section 200 and has been lowered.

A movable plate 112 is disposed above the sucker supporting board 102 in parallel with the sucker supporting board 102. A cylinder 114 is attached to a central portion of this movable plate 112, and a rod 114A thereof penetrates that portion in a downward direction (toward the sucker supporting board 102). A disk-like flange 114B having a larger diameter than the rod 114A is secured to a distal end of this rod 114A.

Meanwhile, a cylinder 116 is attached to the central portion of the upper surface of the sucker supporting board 102 coaxially with the aforementioned cylinder 114, and a rod 116A thereof is adapted to extend upwardly (toward the movable plate 112).

A flange 116B having the same configuration as the flange 114B is secured to a distal end of this rod 116A, and is fixed to the flange 114B in close contact therewith. Accordingly, the sucker supporting board 102 is held in a state in which it is suspended from the movable plate 112 via the cylinders 114 and 116.

As the rod 114A of the cylinder 114 on the movable plate 112 side is extended or retracted, the sucker supporting board 102 is lowered or raised a large distance, and as the rod 116A of the cylinder 116 is extended or retracted, the sucker supporting board 102 is lowered or raised a small distance. In other words, through control by the controller 700, when the uppermost negative film 16 is sucked from the tray 24, the sucker supporting board 102 is lowered and raised, whereas when the sucked negative film 16 is placed on the surface plate 202 of the positioning punch-hole punching section 200, the cylinder 116 is driven to lower the negative film 16, thereby making it possible to obtain optimum amounts of movement by maximum strokes of the cylinders 114 and 116, respectively.

Figure 7:
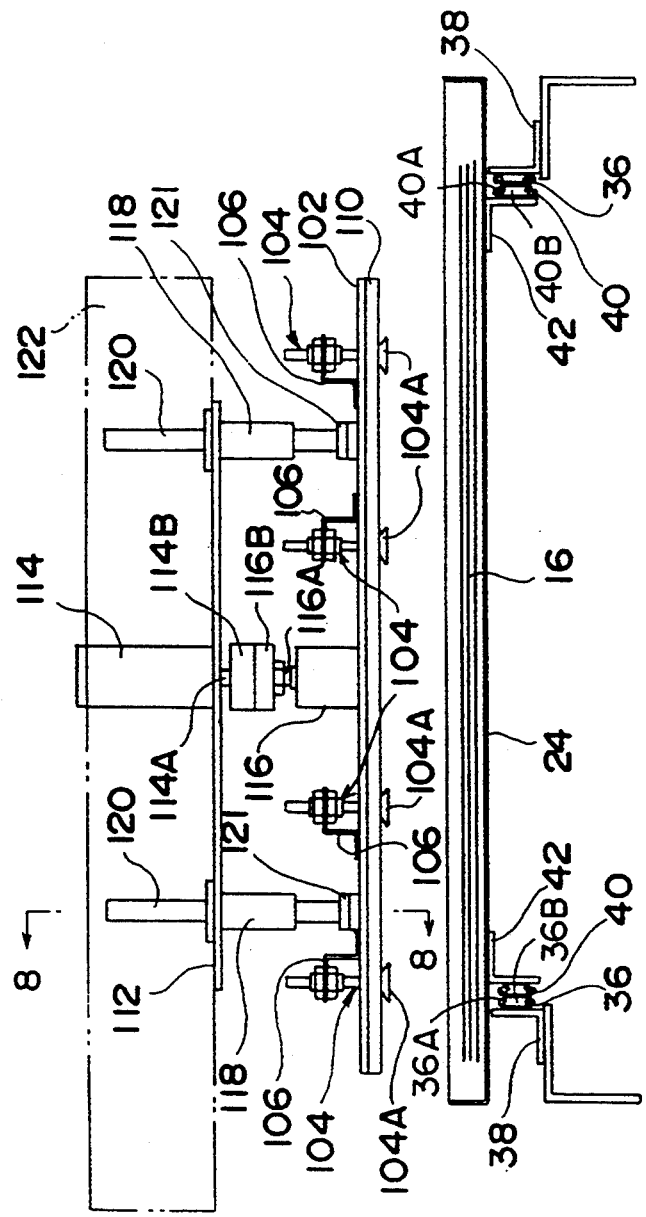
FIG. 7 is a front elevational view illustrating a state in which the sucker supporting board of the first film transport unit is brought into proximity to a tray.
Figure 8:
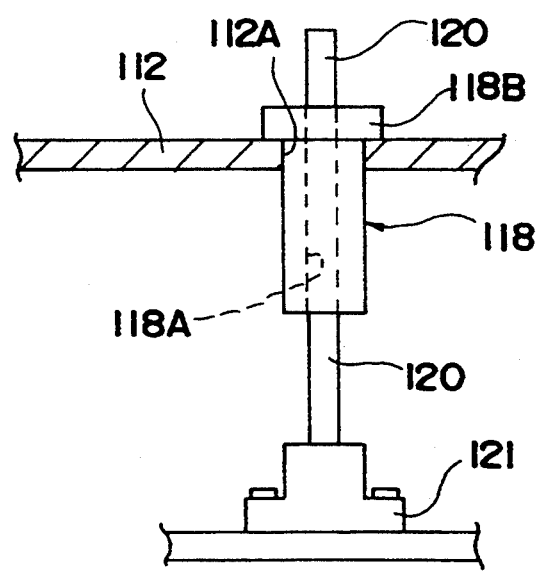
FIG. 8 is a cross-sectional view taken along line 8—8 in FIG. 7.

As shown in FIGS. 7 and 8, a pair of cylindrical members 118 are mounted on the lower surface of the movable plate 112 with the aforementioned cylinder 114 located therebetween on the left- and right-hand sides of the printer. Formed in the movable plate 112 are a pair of circular holes 112A which are each formed coaxially with a through hole 118A formed in the cylindrical member 118. The cylindrical members 118 are inserted in the respective circular holes 112A. A large-diameter collar 118B is formed on top of the cylindrical member 118 so as to prevent the cylindrical member 118 from slipping off the circular hole 112A.

A shaft 120 is supported in the through hole 118A in each of the cylindrical members 118. A lower end of each shaft 120 is secured to the upper surface of the sucker supporting board 102 via a bracket 121. The shafts 120 serve to prevent the rotation of the sucker supporting board 102 and to guide the raising and lowering of the sucker supporting board 102 by the cylinders 114 and 116.

Figure 9:
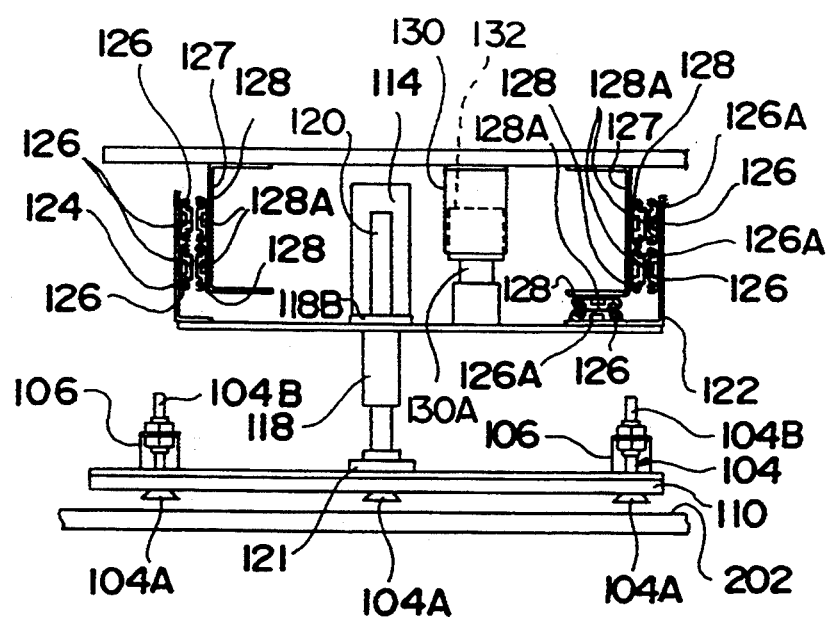
FIG. 9 is a left-hand side elevational view of FIG. 7, illustrating a state in which the sucker supporting board of the first film transport unit is positioned above a surface plate for punching punch holes for positioning.

As shown in FIG. 9, a pair of brackets 122 and 124 which are bent in the form of L are respectively attached to front and rear ends, as viewed from the front side of the printer, of the movable plate 112. Guide rails 126 are attached to a horizontal surface of the front-side bracket 122 and side walls of the brackets 122 and 124. A slider 126A of each of these guide rails 126 is secured to a slider 128A of a guide rail 128 which is attached to the frame of the printer above the surface plate 202 of the positioning punch-hole punching section 200 via a substantially U-shaped bracket 127. That is, the sliders 126A and 128A are arranged to move as a unit. In a state in which the guide rails 126 and 128 are superposed on top of each other in face-to-face relation, the movable plate 112 is located on the surface plate 202, whereas when the guide rails 126 slide toward the film loading section 22 relative to the guide rails 128 via the sliders 126A and the sliders 128A, the movable plate 112 is located above the tray 24.

This movement is effected by driving a driving block 132A of a rodless cylinder 132 attached to a bracket 130.

Section C; Positioning Punch-hole Punching Section 200

As shown in FIG. 5, the surface plate 202 which is divided into the movable surface plate 204 and the fixed surface plate 206 is disposed adjacent to the tray (on the left-hand side as viewed from the front side of the printer).

Figure 10:
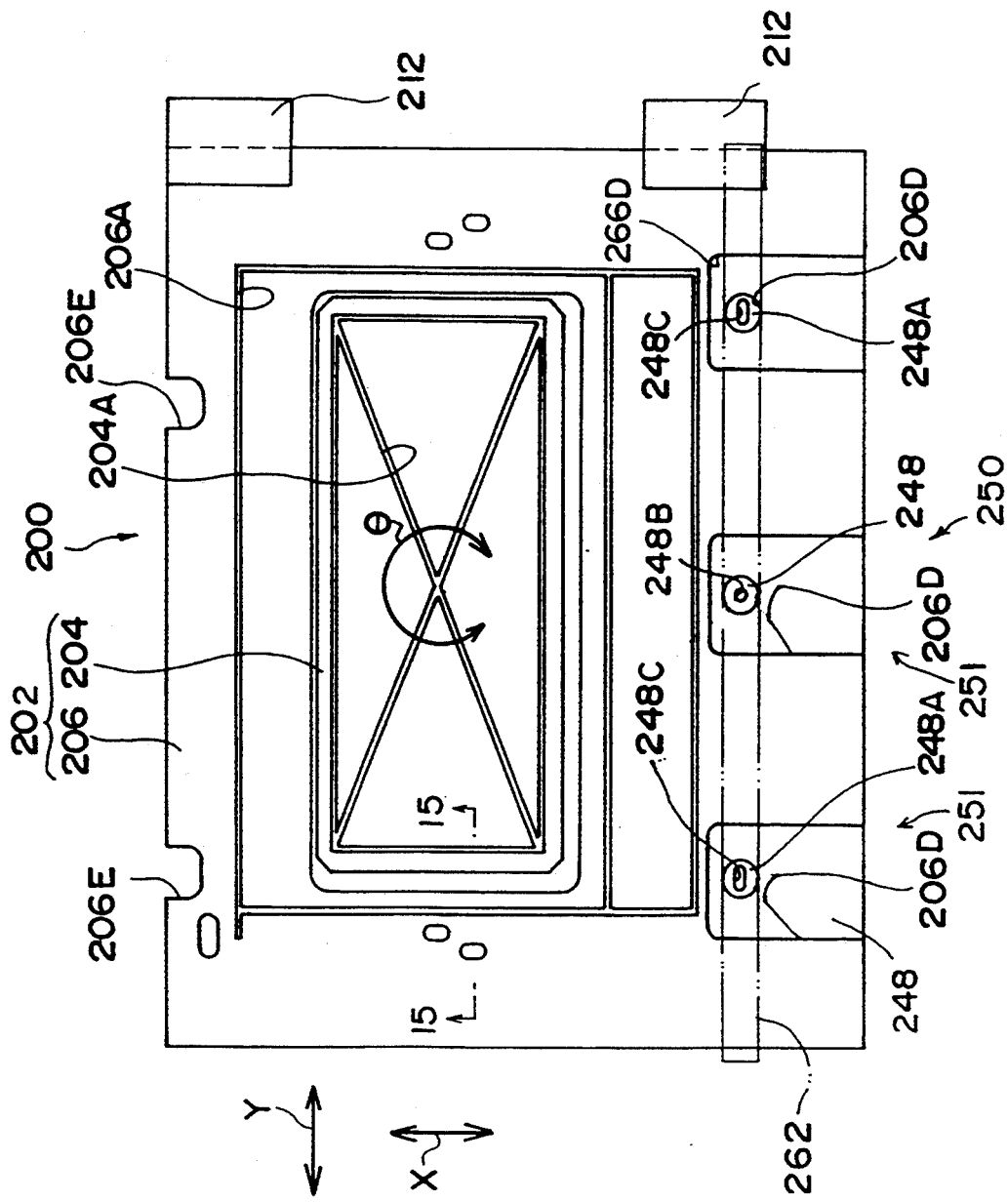
FIG. 10 is a plan view of a surface plate of the positioning punch-hole punching section.

As shown in FIG. 10, grooves 204A are formed in the movable surface plate 204 along peripheral edges and diagonal lines thereof, and a portion of the bottoms of these grooves 204A communicates with the lower surface of the movable surface plate 204. A suction pipe 208A (see FIG. 11) led from an ejector 208 (see FIG. 48) is connected to this communicating portion. As air is sucked by this suction pipe 208A when the negative film 16 is present on the movable surface plate 204, the negative film 16 can be sucked and held.

Meanwhile, a groove 206A is formed in the fixed surface plate 206 in such a manner as to surround the movable surface plate 204. A substantially U-shaped groove 206B is formed on this side, as viewed from the front side of the printer, of the groove 206A, and the grooves 206A and 206B are made to communicate with each other. A portion of the bottoms of the grooves 206A and 206B communicates with the lower surface of the fixed surface plate 206. A suction pipe (not shown) led from an ejector 210 (see FIG. 48) is connected to this communicating portion. As air is sucked by this suction pipe 210A when the negative film 16 is present on the fixed surface plate 206, the negative film 16 can be sucked and held.

As shown in FIG. 5, the height of the surface plate 202 is set to be higher than the height of the tray 24. For this reason, the negative film 16 sucked by the sucker supporting board 102 is lifted to a position higher than the surface plate 202 and is moved horizontally. However, there are cases where the leading end of the negative film 16 interferes with an edge of the surface plate 202 owing to the slackening and the like of the negative film 16. Accordingly, a pair of guide plates 212 each having a slanting surface are disposed at end of the fixed surface plate 206 on the tray 24 side in correspondence with transversely opposite ends of the negative film 16.

The negative film 16 which has been moved onto the surface plate 202 by means of the sucker supporting board 102 is lowered a slight amount as the cylinder 116 is driven, and suction is then canceled. At this time, the negative film 16 is supported by straddling the fixed surface plate 206 and the movable surface plate 204.

Here, the negative film 16 which has just been released from the sucker supporting board 102 is sucked and held only by the movable surface plate 204.

Figure 11:
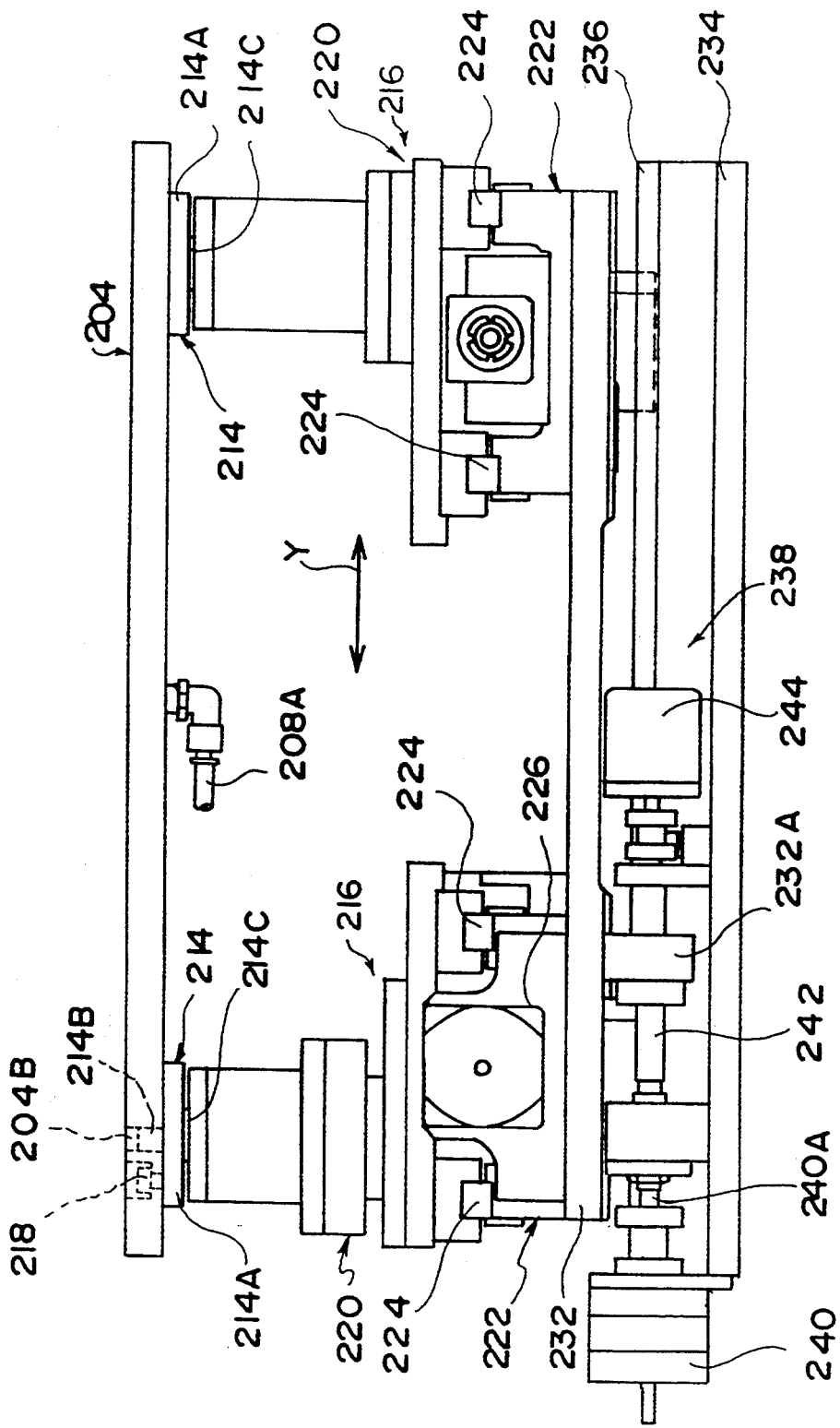
FIG. 11 is a front elevational view of a movable surface plate of the positioning punch-hole punching section as viewed from the front side of the printer.
Figure 12:
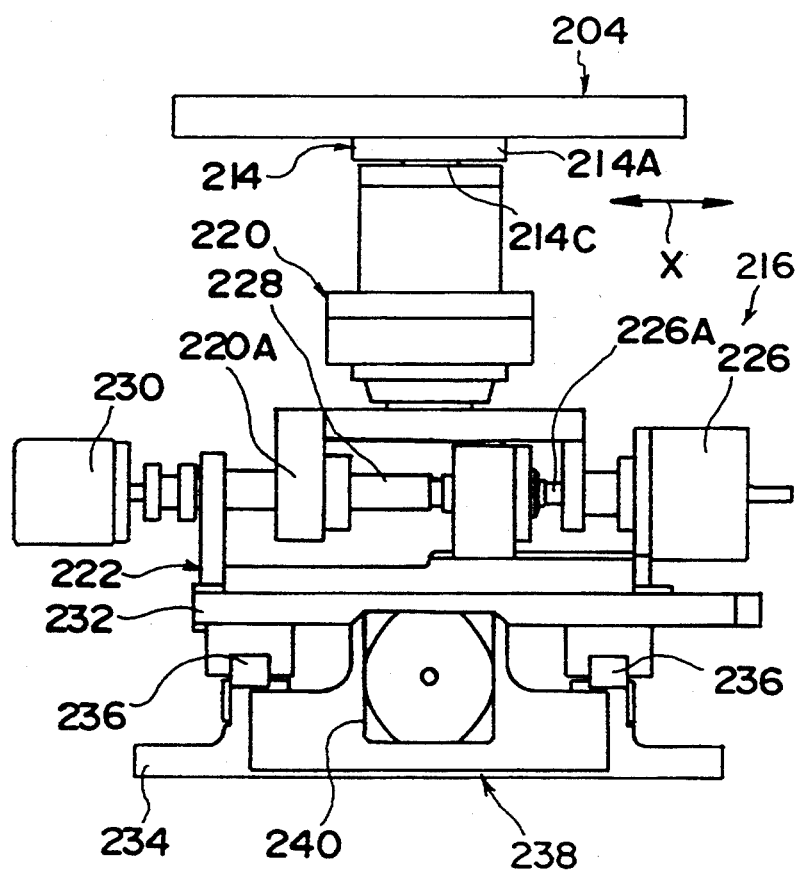
FIG. 12 is a side elevational view of the movable surface plate of the positioning punch-hole punching section.
Figure 13:
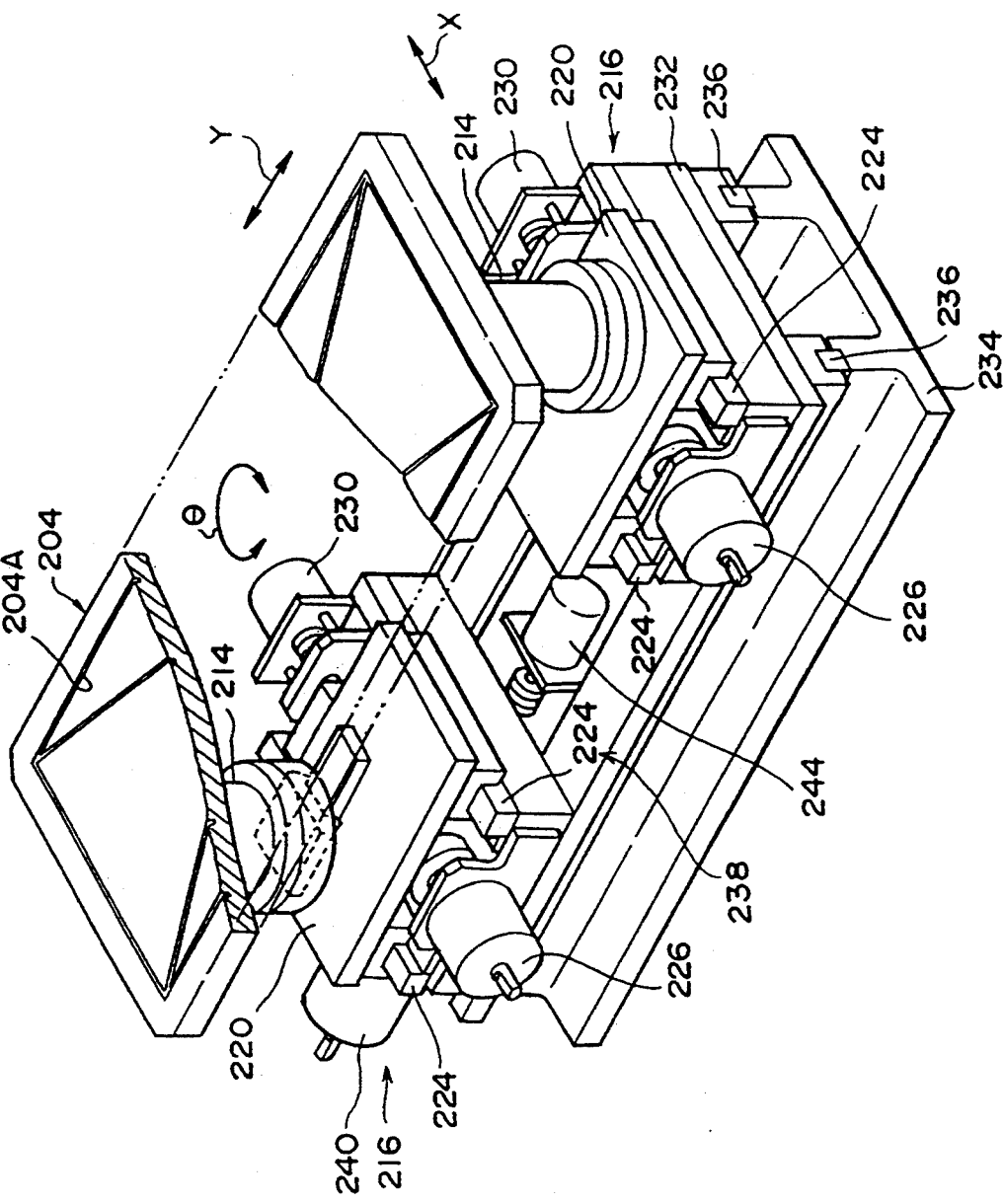
FIG. 13 is a perspective view of the movable surface plate.

As shown in FIGS. 11 and 12, the movable surface plate 204 is supported by a pair of support blocks 214 provided in a transversely central portion thereof. As shown in FIGS. 12 and 13, the support blocks 214 constitute parts of an X-direction moving mechanism unit 216 for moving the movable surface plate 204 in the transverse direction (hereafter referred to as the X-direction).

Each of the support blocks 214 is cylindrical in shape, and has a large-diameter collar 214A formed in an axially intermediate portion thereof. A small-diameter shaft portion 214B projecting closer to the movable surface plate 204 than the large-diameter collar 214A is fitted in a circular hole 204B formed in the movable surface plate 204. In addition, the large-diameter collar 214A is secured to a peripheral portion of the circular hole 204B in the movable surface plate 204 via a bolt 218. A lower shaft portion 214C lower than the large-diameter collar 214A of the support block 214 is pivotally supported by a first movable base 220.

This first movable base 220 is supported via a pair of rails 224 disposed on a sub-base 222 in the X-direction of the movable surface plate 204. As a result, the first movable base 220 is movable along the rails 224.

A pulse motor 226 is mounted on the sub-base 222. As shown in FIG. 12, a rotating shaft 226A of the pulse motor 226 is parallel with the rails 224, i.e., is set in the X-direction of the movable surface plate 204. Secured to this rotating shaft 226A is a shaft 228 on which an external thread is formed concentrically therewith. An internal thread of a moving block 220A secured to the underside of the aforementioned first movable base 220 is threadedly engaged on the external thread of this shaft 228.

For this reason, as the shaft 228 rotates by the operation of the pulse motor 226, the first movable base 220 is moved in the axial direction of the shaft 228 while being guided by the rails 224 by virtue of a ball screw mechanism.

In addition, a rotary encoder 230 is attached to a distal end of the shaft 228 so as to detect the number of revolutions of the shaft 228. Accordingly, the amount of movement of the first movable base 220 can be known through calculation on the basis of the number of revolutions of the shaft 228.

The support block 214 of one of the pair of X-direction moving mechanism units 216 is rotatable and movable perpendicularly to its axis with respect to the first movable base 220. Meanwhile, the other support block 214 is rotatable and movable with respect to the first movable base 220.

For this reason, by moving only one of the X-direction moving mechanism units 216, the movable surface plate 204 can be rotated about the other X-direction moving mechanism unit 216 (i.e., moved in the direction of $\theta$ as shown in FIG. 10). In this case, a change in the dimension of the pitch between the pair of support blocks 216 is absorbed by the movement perpendicular to the axis of the support block 214 of the other X-direction moving mechanism unit 216.

As shown in FIG. 11, the pair of X-direction moving mechanism units 216 are both supported on a second movable base 232. This second movable base 232 is supported by a pair of rails 236 (see FIG. 12) provided on a main base 234. The rails 236 are disposed in parallel with each other along the longitudinal direction of the movable surface plate 204 (this direction being hereafter referred to as the Y-direction).

As a result, the second movable base 232 is movable in the Y-direction with respect to the main base 234. This second movable base 232 and the main base 234 constitute parts of a Y-direction moving mechanism unit 238.

A pulse motor 240 is mounted on the main base 234. A rotating shaft 240A of this pulse motor 240 is set to be parallel with the rail 236, i.e., parallel with the Y-direction of the movable surface plate 204. Secured to this rotating shaft 240A is a shaft 242 on which an external thread is formed concentrically therewith. An internal thread of a moving block 232A secured to the underside of the aforementioned second movable base 232 is threadedly engaged on the external thread of this shaft 242.

For this reason, as the shaft 242 rotates by the operation of the pulse motor 240, the second movable base 232 is moved in the axial direction of the shaft 242 while being guided by the rails 236 by virtue of the ball screw mechanism.

In addition, a rotary encoder 244 is attached to a distal end of the shaft 242 so as to detect the number of revolutions of the shaft 242. Accordingly, the amount of movement of the second movable base 232 can be known through calculation on the basis of the number of revolutions of the shaft 242.

Thus the movable surface plate 204 is movable in the X-direction, Y-direction, and $\theta$-direction, thereby making it possible to adjust the position of the negative film 16. In this case, positional adjustment is effected in a state in which the negative film 16 is sucked by only the movable surface plate 204, not by the fixed surface plate 206.

The position of the negative film 16 is adjusted on the basis of register marks 16C (which will be described below) which are reference marks indicating the position of the image recorded on the negative film 16.

Figure 14:
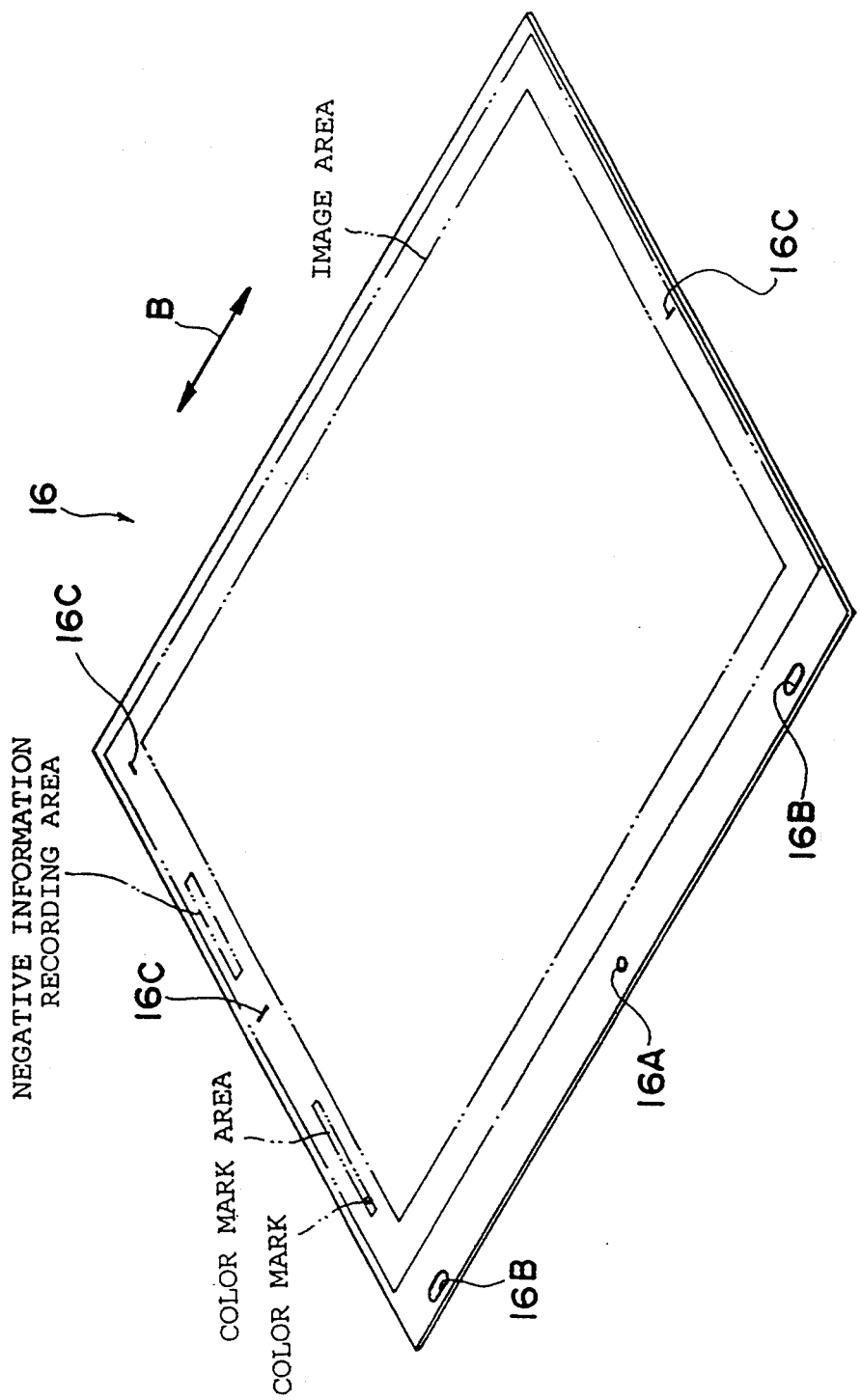
FIG. 14 is a perspective view of the negative film.

As shown in FIG. 14, an image corresponding to a one-page portion of a newspaper is recorded in an image area in a central portion of the negative film 16 serving as an original film used in this embodiment. A plurality of register marks 16C are formed at one end (hereafter referred to as the "top side") in the top-and-bottom direction (direction of arrow B) of this negative film 16 and at the other end (hereafter referred to as the "bottom side") in the top-and-bottom direction. These register marks 16C are formed in the shape of short streaks by being whitened in a black ground portion surrounding the image area. These register marks 16C are formed in correspondence with the image area, and are so arranged that the image area can be read accurately from the positions of the register marks 16C. It should be noted that, in this embodiment, a register mark 16C is formed in a transversely central portion on each of the top side and the bottom side along the top-and-bottom direction, and another register mark 16C is formed on the top side at a right-hand end, as viewed from the front, along the transverse direction.

A color mark is recorded in a color-mark area provided on the top side of the negative film 16. The color mark shows the color to which the image recorded on the negative film 16 corresponds in a case where the image recorded on the negative film 16 is a color-printing image. It should be noted that negative information and the like may be additionally recorded in a portion other than the image area.

In this embodiment, punch holes 16A and 16B are formed on the left-hand side, as viewed from the front, of the negative film 16. Pins of the pin bar are inserted through these punch holes 16A and 16B in a printing section, and the pin bar is moved to allow the image on the negative film 16 to be positioned in place on the PS plate 18 so as to effect printing.

Namely, the negative film 16 is moved by reading the positions of the register marks, and the punch holes 16A and 16B of the negative film 16 are pushed accurately such that the register marks and the punch holes assume predetermined positional relationships. Consequently, the image portion and the punch holes 16A and 16B are constantly set in fixed positional relationships, so that machine differences can be eliminated. Although the positioning pins for the PS plate 18 in the printing section also have machine differences, the image can be printed at a predetermined position of the PS plate 18 by moving the pin bar having pins which are inserted through the punch holes 16A and 16B, by the portion of machine differences determined in advance through a printing test, as will be described later. Hence, the offset of colors does not occur in color printing. The punch hole 16A is punched as a round hole at a central portion, as viewed in the top-and-bottom direction, of the negative film 16, while the punch hole 16B is punched at each opposite end, as viewed in the top-and-bottom direction, as an elongated hole whose longitudinal direction is parallel with the top-and-bottom direction. It should be noted that the positions of the register marks 16C and the positions and the configurations of the punch holes 16A and 16B are not confined to those of this embodiment.

Figure 15:
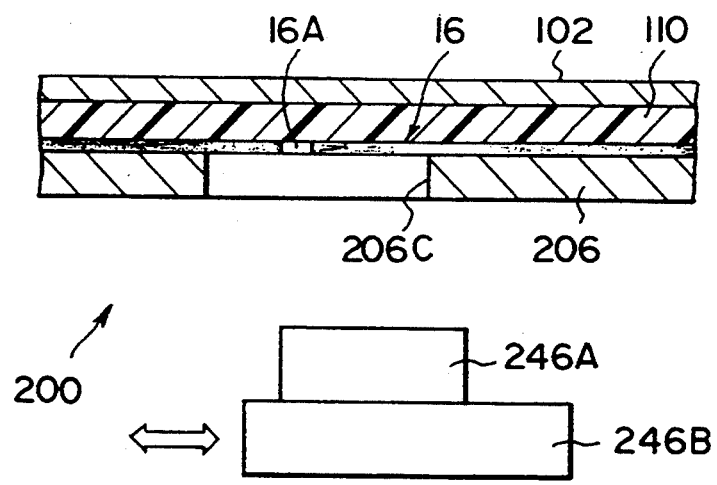
FIG. 15 is a cross-sectional view taken along line 15—15 in FIG. 10.

As shown in FIG. 15, an elongated hole 206C is formed in the fixed surface plate 206 at a position where the register mark 16C recorded on the negative film 16 is located. A reflection-type sensor 246A having a light-projecting portion and a light-receiving portion is provided below this elongated hole 206C. The reflection-type sensor 246A is secured to a movable base 246B, and constitutes a scanner 246 which is movable in the direction of the arrow. The position of the register mark 16C is determined on the basis of the distance of movement from a reference position of the scanner 246 to the position of the register mark 16C detected, and after the movable surface plate 204 is moved to locate the register mark 16C at a proper position, the punch holes 16A and 16B are punched in the negative film 16. Namely, on the basis of the position of the register mark 16C detected, the controller 700 calculates drive pulses of the pulse motors 226 and 240 of the movable surface plate 204, supplies signals to these pulse motors 226 and 240 to move the movable surface plate 204, thereby positioning the register mark 16C in place.

When the register mark 16C is read, the sucker supporting board 102 is lowered by driving the cylinder 116, and the film is clamped by the soft sheet 110 and the surface plate 202, thereby preventing an erroneous detection due to the floating of the negative film 16.

Upon completion of the positioning of the negative film 16, the negative film 16 is sucked by means of the grooves 206A and 206B in the fixed surface plate 206, the sucker supporting board 102 is lowered by driving the cylinder 116, and the overall surface of the film is clamped by the soft sheet 110 and the surface plate 202, thereby fixing the negative film 16. In this fixed state, punch holes for positioning on the printing surface plate 812 are punched. Since the register marks 16C are strictly positioned relative to the position of the image, the punch holes 16A and 16B and the position of the image are constantly fixed without machine differences.

On this side of the printer forwardly of the aforementioned U-shaped groove 206C in the fixed surface plate 206, three notches 206D are provided at predetermined intervals in the left-and-right direction as viewed from the front side of the printer.

Fitted in these notches 206D are female-blade blocks 248 each having a female blade 248A for forming a punch hole. There are two kinds in female blades, and a circular hole 248B is provided in a central female-blade block 248, while an elongated hole 248C is provided in each of the female-blade blocks 248 at opposite sides.

Figure 16:
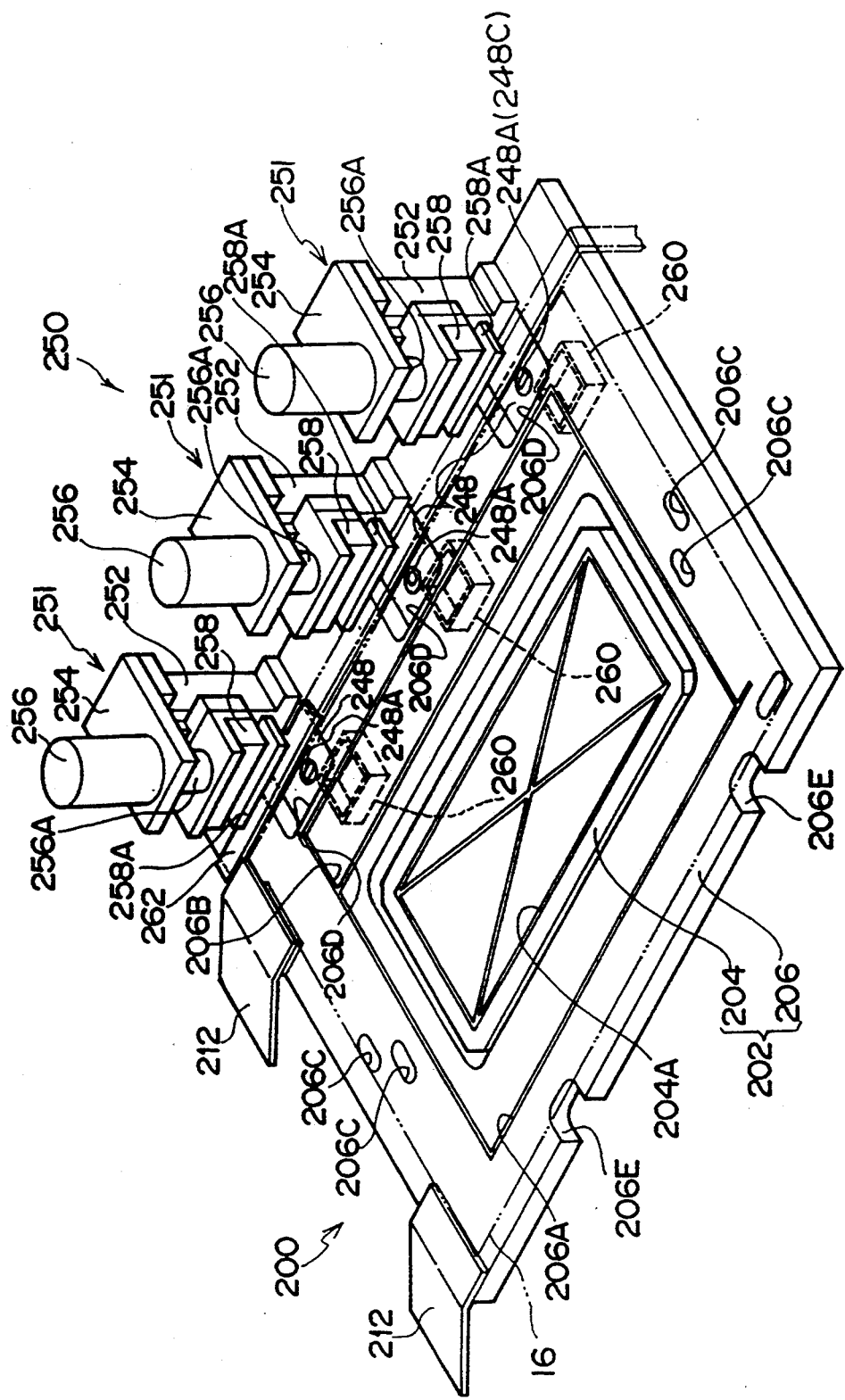
FIG. 16 is a perspective view of the movable surface plate of the positioning punch-hole punching section.

As shown in FIG. 16, these female blocks 248 constitute parts of puncher units 251 which as a whole make up a punch-hole punching mechanism section 250. In each of the puncher units 251, a top plate 254 is attached to an upper end of a column 252, and this top plate 254 extends closer to the innermost side of the printer than the column 252. A cylinder 256 is mounted on the upper surface of this extending portion. The axis of a rod 256A of this cylinder 256 is aligned with the axis of the aforementioned female blade 248A.

Male-blade blocks 258 are respectively mounted at distal ends of the rods 256A, and have blade types corresponding to the two kinds of female-blade blocks 248. For this reason, when the rods 256A are extended by the driving force of the cylinders 256, male blades (not shown) are engaged with the female blades 248A, thereby making it possible to form punch holes in the negative film 16 placed on the surface plate 202 (fixed surface plate 206). It should be noted that holding plates 258A are disposed below the respective male-blade blocks 258, thereby making it possible to hold portions of the negative film 16 surrounding the punching positions.

Punching-scraps accumulating boxes 260 are disposed below the respective female-blade blocks 248 so as to accumulate the scraps of the punched negative film 16. These accumulating boxes 260 are removable.

When the female-blade blocks 248 of the puncher units 251 are mounted on the fixed surface plate 206, there are cases where a step is formed between the upper surface of the fixed surface plate 206 and the upper surface of each female-blade block 248. A guide plate 262 is disposed in correspondence with this step.

Figure 17:
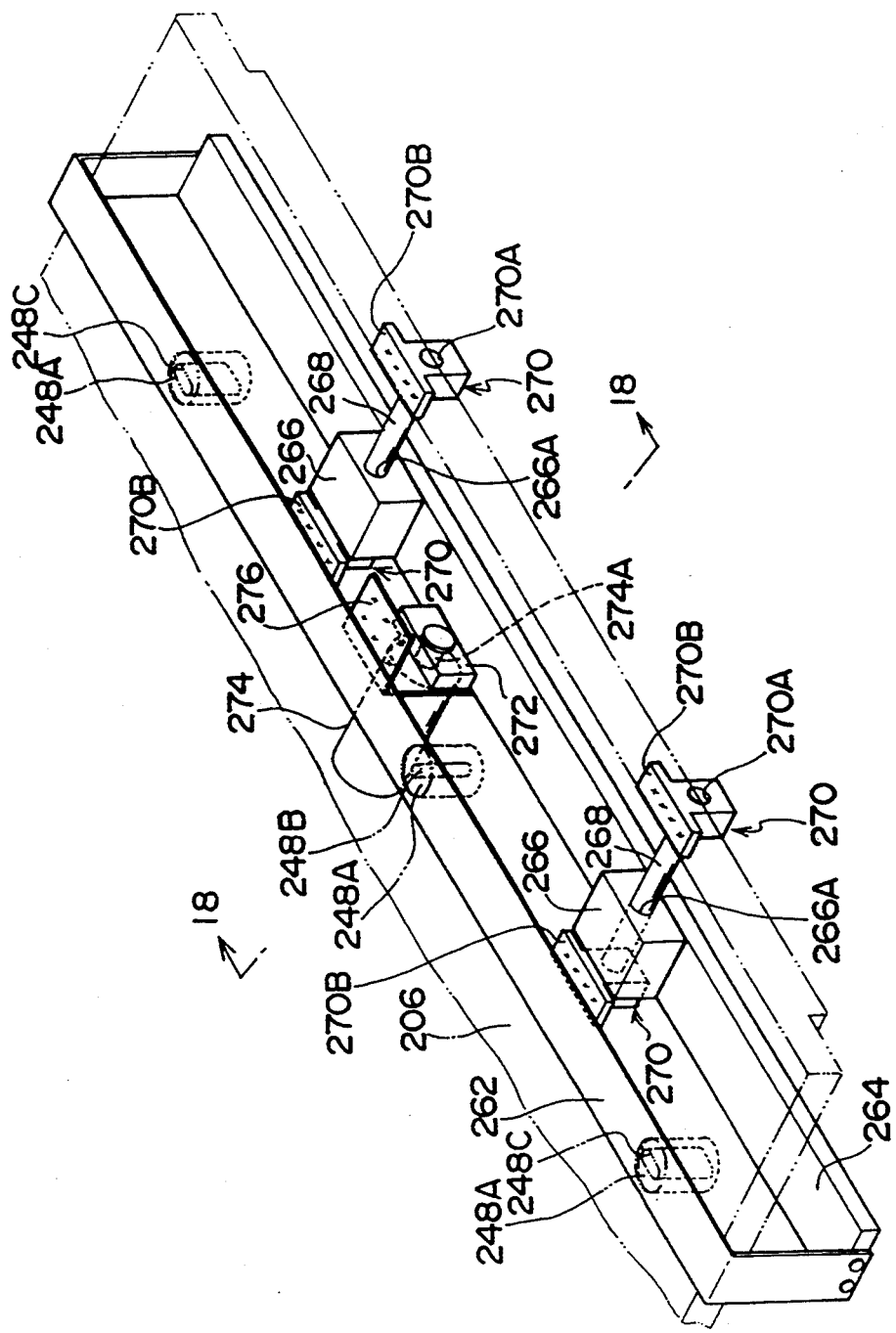
FIG. 17 is a perspective view of a cover plate for covering female blades and its vicinity.
Figure 18:
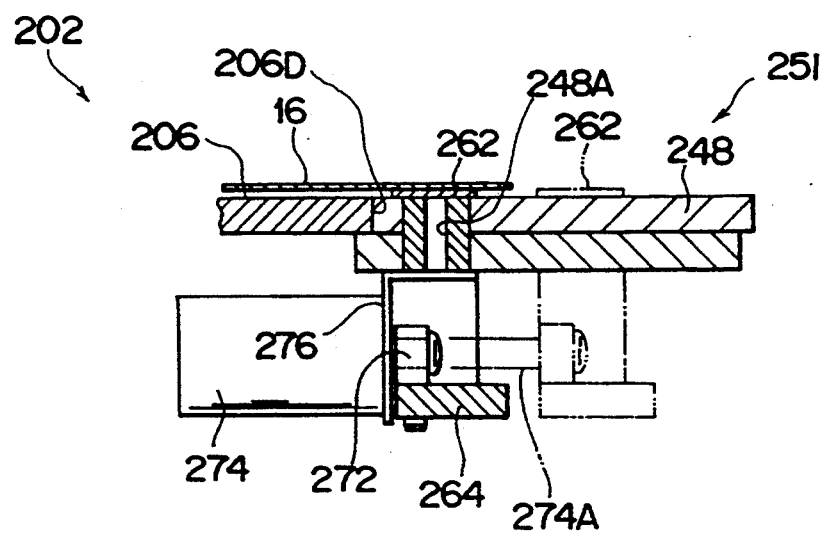
FIG. 18 is a cross-sectional view taken along line 18—18 in FIG. 17.

As shown in FIGS. 17 and 18, the guide plate 262 is arranged in the longitudinal direction of the fixed surface plate 206, and its opposite ends are bent downward substantially orthogonally. These bent ends are secured to longitudinal opposite ends of a support plate 264. A pair of guide blocks 266 are attached to a longitudinally intermediate portion of the support plate 264 at a predetermined distance therebetween. The guide blocks 266 are each provided with a through hole 266A extending from this side of the printer toward the innermost side thereof, and a shaft 268 is inserted through the through hole 266A. Axial ends of the shaft 268 are respectively fitted in circular holes 270A provided in brackets 270. A flange 270B is formed on an upper end surface of each of the brackets 270. Each bracket 270 is secured to the underside of the fixed surface plate 206 by means of this flange 270B. As a result, the guide plate 262 and the support plate 264 are movable while being guided by the shafts 268.

A moving block 272 is disposed between the guide blocks 266 on the support plate 264. This moving block 272 is secured to a distal end of a rod 274A of a cylinder 274. The cylinder 274 is mounted on a vertical wall of a bracket 276 fixed on the underside of the fixed surface plate 206, and the rod 274A is passed through the bracket 276 and is secured to the moving block 272.

As the rod 274A of the cylinder 274 is extended or retracted, the guide plate 262 is moved between a position in which the guide plate 262 covers the female blades 248A of the female-blade blocks 248 (when the rod 274A is retracted) and a position in which the guide plate 262 allows the female blades 248A to be exposed (when the rod 274A is extended). When the negative film 16 is transported from the tray 24, the female blades 248a are covered so that the negative film 16 will not be caught by the step which is otherwise present. Furthermore, when the corners of the negative film 16 are drooped down, the guide plate 262 prevents the negative film 16 from entering the holes in the female blocks 248 and becoming thereby damaged.

Section D; Second Film Transport Unit 300

Figure 19:
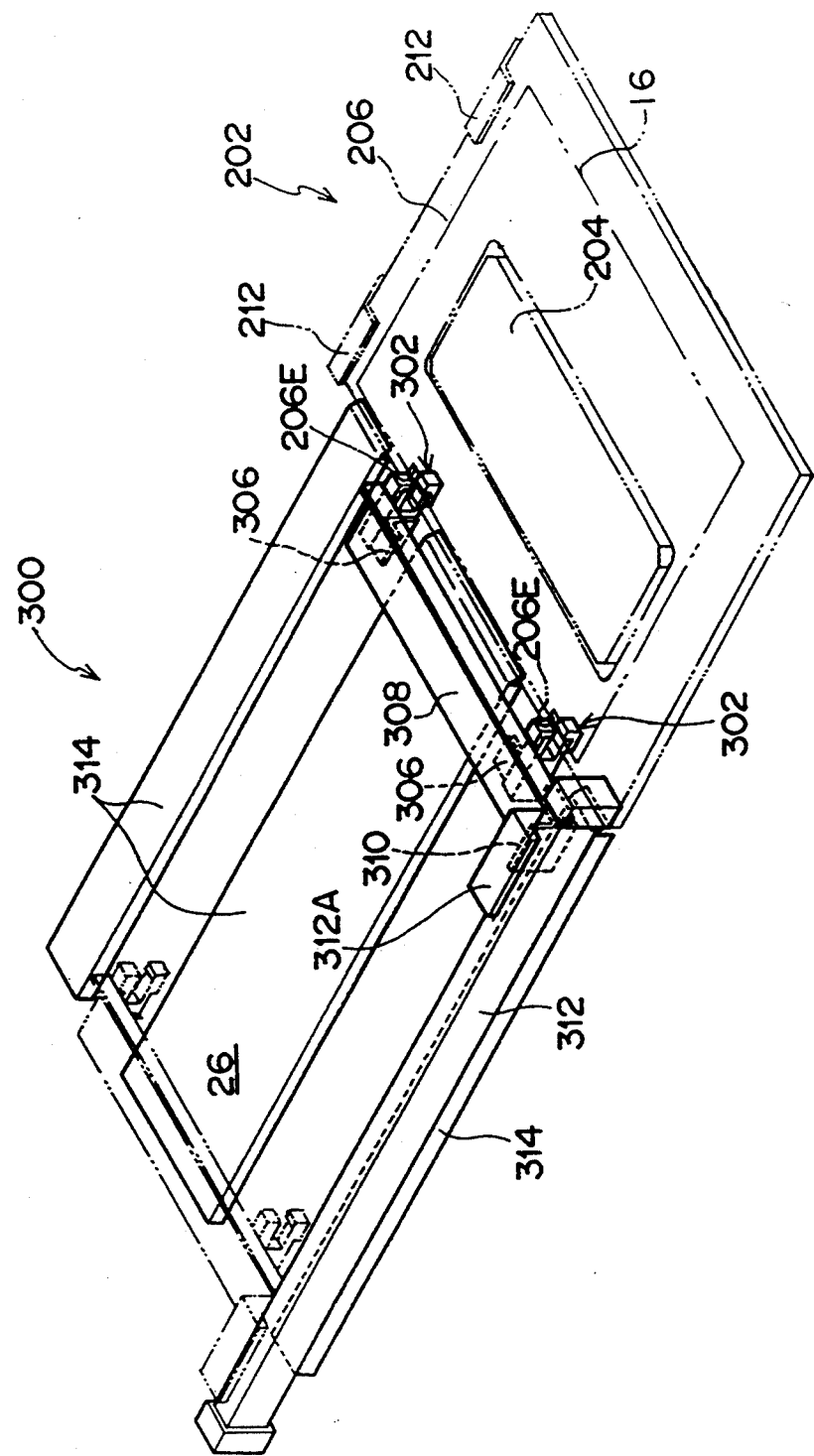
FIG. 19 is a perspective view of the structure of a second film transport unit.

As shown in FIGS. 5 and 19, a pair of notches 206E are formed on the innermost side, as viewed from the front side of the printer, of the surface plate 202 (on the fixed surface plate 206 side). A pair of clamping pawls 302 are disposed in correspondence with the notches 206E, respectively. Each of the clamping pawls 302 is arranged such that a pair of contact pieces are moved toward and away from each other by a driving force of a cylinder 304 (see FIG. 49). The respective contact pieces correspond to the obverse and reverse surfaces of the film on the fixed surface plate 202.

Figure 20:
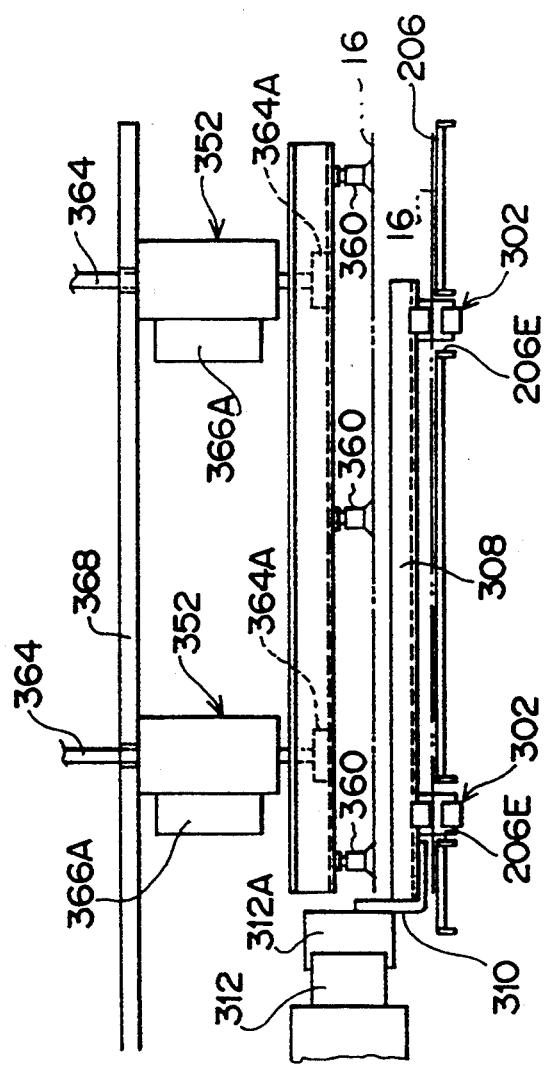
FIG. 20 is a front elevational view of a third film transport unit as viewed from the front side of the printer.

Each of the clamping pawls 302 is fixed to a movable plate 308 via an L-bracket 306. As shown in FIG. 20, the movable plate 308 is arranged along the Y-direction (in the left-and-right direction as viewed from the front side of the printer) of the surface plate 202, and one end thereof (a left-hand end as viewed from the front side of the printer) is secured to a driving block 312A of a rodless cylinder 312 via a bracket 310.

The rodless cylinder 312 is arranged from this side of the printer toward the standby section 26 on the innermost side thereof. For this reason, as the driving block 312A is driven, the movable plate 308 is moved between a position in which the movable plate 308 is close to the surface plate 302 (film clamping position) and a position in which the movable plate 308 is moved farthest from the surface plate 202 (standby position).

In the standby position, since the contact pieces of the clamping pawls 302 correspond to the obverse and reverse surfaces of the negative film 16, as the contact pieces are moved in the direction in which they are moved toward each other, the negative film 16 can be clamped thereby.

Support plates 314 are laid on the innermost side of the surface plate 202 excluding the paths of movement of the clamping pawls 302 which are moved with the movable plate 308. Consequently, the negative film 16 clamped by the clamping pawls is transported to the standby section 26 on the innermost side, as viewed from the front side of the printer, while being supported by the support plates 314.

Before the negative film 16 is placed on the surface plate 202, the movable plate 308 is in its standby position. After punch holes are punched in the negative film 16, the rodless cylinder 312 is driven, and the movable plate 308 is thereby moved to its clamping position. After the negative film 16 is clamped, the movable plate 308 is moved again to the standby position.

Sections E and F; Third and Fourth Film Transport Units 350, 354

Figure 21:
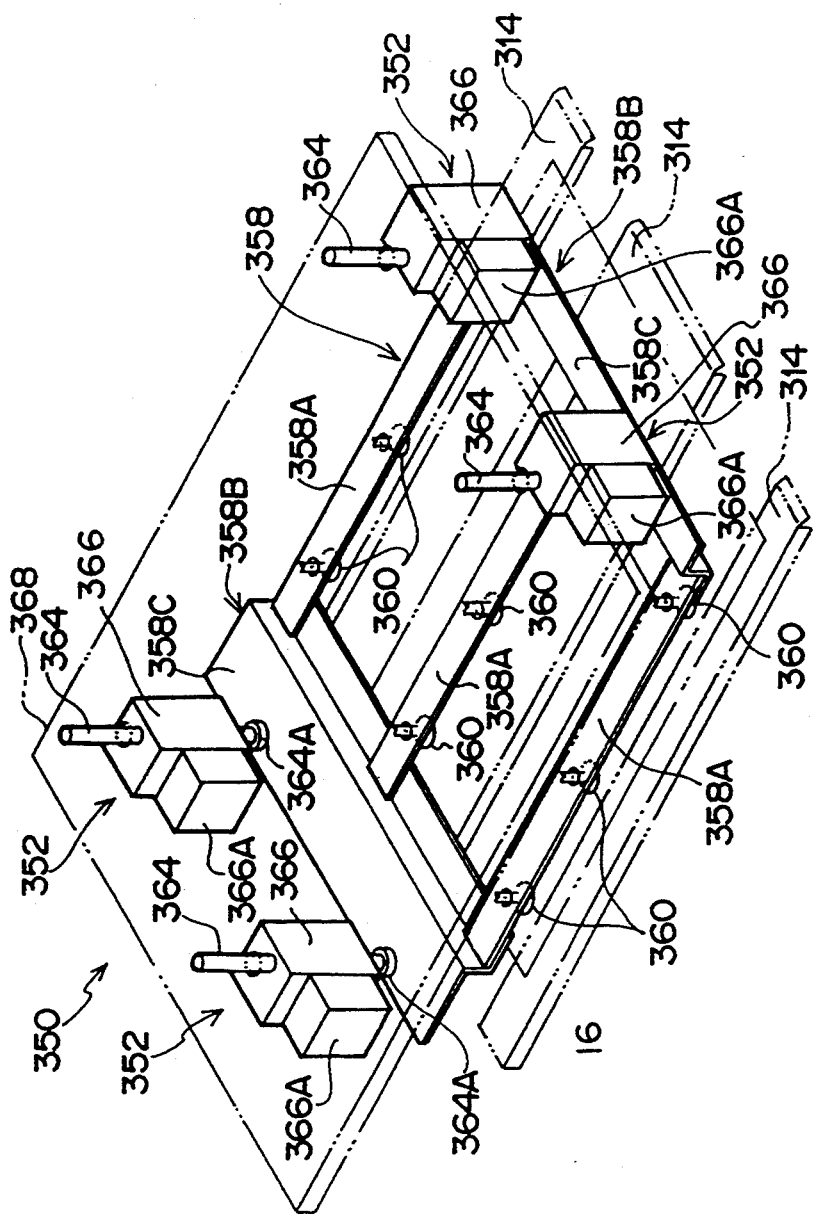
FIG. 21 is a perspective view of the structure of the third film transport unit.

As shown in FIG. 21, disposed above the support plates 314 on the standby section 26 side is a sucker supporting base 358 which has been assembled into the shape of a frame by using three mutually parallel plate-like frames 358A and a pair of connecting plates 358B respectively disposed at longitudinal opposite ends of the frames 358A.

Three suckers 360 are attached to each of the frames 358A and are connected to an ejector 362 (see FIG. 50) by means of unillustrated pipes (a total of nine suckers 360 are used).

These suckers 360 are arranged in face-to-face relation with the respective support plates 314. As the sucker supporting base 358 is lowered, the negative film 16 placed on the support plates 314 can be clamped by the support plates 314 and the suckers 360. In this state, as the negative film 16 is sucked by the suckers 360, the negative film 16 is held onto the sucker supporting base 358.

Each of the connecting plates 358B is bent in the shape of a crank, and lower ends of two shafts 364 are secured to a top plate portion 358C of the connecting plate 358B via circular flanges 364A. The shafts 364 constitute parts of the lifting devices 352, respectively.

An intermediate portion of each of the shafts is inserted eccentrically through a drive unit 366 having a pulse motor 366A as its main component. The upper surface of the drive unit 366 is secured to the underside of a movable base 368 disposed above the sucker supporting base 358.

An external thread is formed on each shaft 364, and a gear (not shown) of the drive unit 366 meshes therewith. As a result, when the pulse motor 366A is driven, each shaft 364 can be moved in the axial direction by the gear. As the shafts 364 are moved in the axial direction, the sucker supporting base 358 is moved in directions in which it is moved toward or away from the movable base 368.

Figure 46:
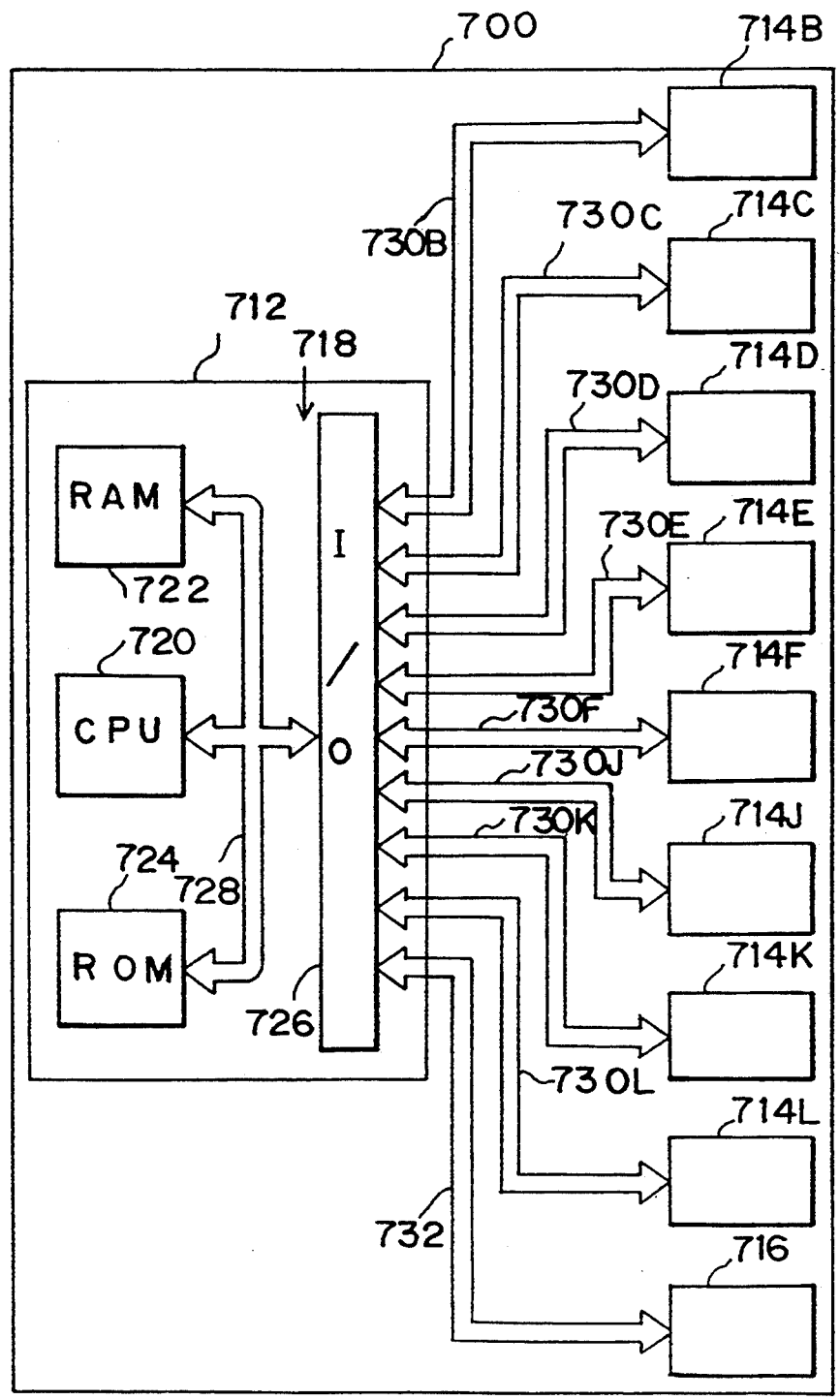
FIG. 46 is a control block diagram in accordance with the embodiment.

The pulse motors 366A are controlled by signals from the controller 700 shown in FIG. 46, and the controller 700 is adapted to synchronously drive the four pulse motors 366A. Consequently, the sucker supporting base 358 is raised or lowered by accurately maintaining the parallel state of the movable base 368, thereby making it possible to substantially maintain the state of the negative film 16 positioned on the surface plate 202. It should be noted that each of the lifting devices 352 may be provided with a detecting unit for detecting the amount of the pulse motor 366A driven and/or a braking unit for maintaining the stopped state of the lifting device 352.

Figure 22:
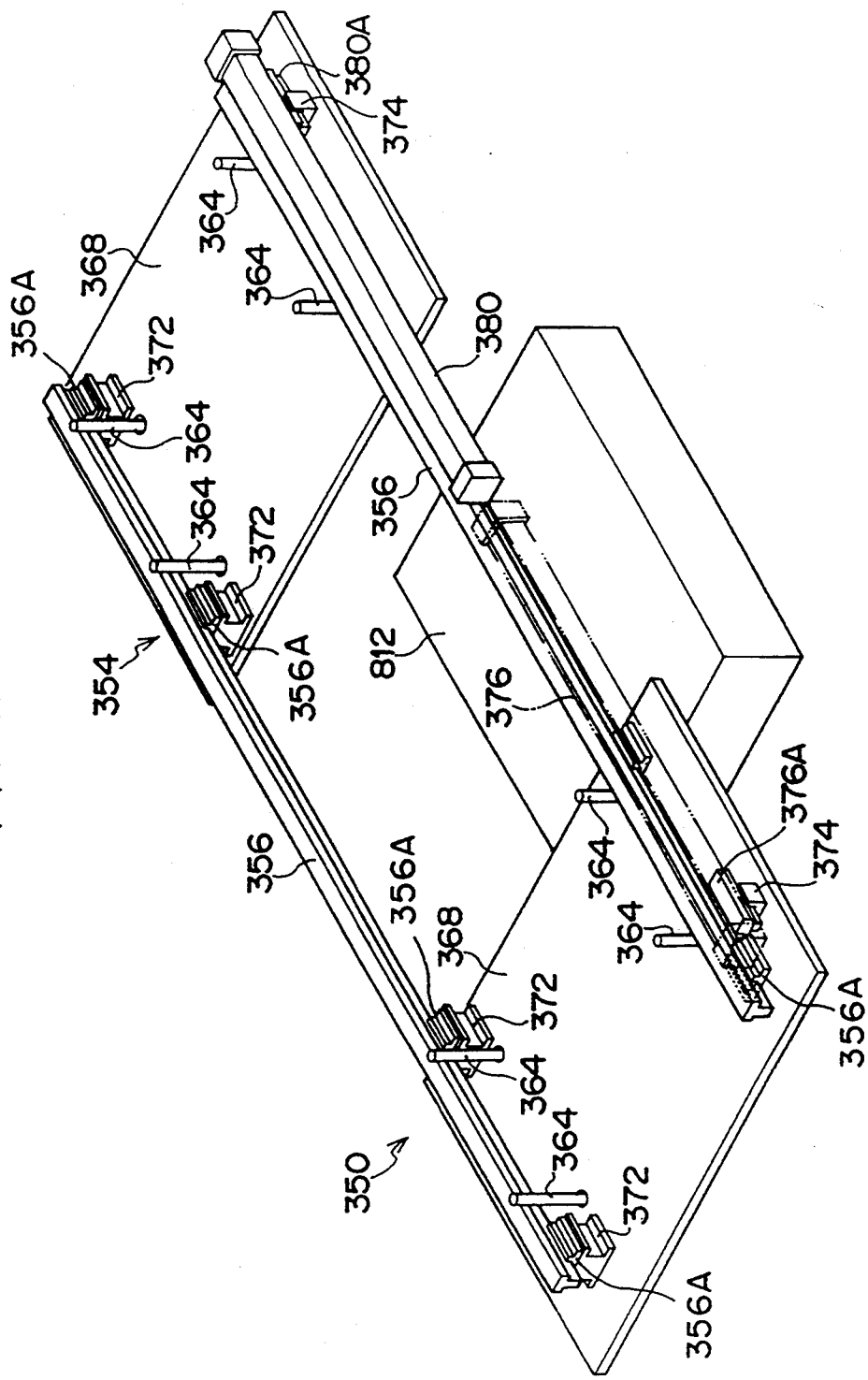
FIG. 22 is a perspective view illustrating a structure for driving the third and fourth film transport units onto a printing surface plate.

As shown in FIG. 22, the above-described third film transport unit 350 and the fourth film transport unit 354 having the same arrangement (bilateral symmetry) as the third film transport unit 350 are held by being suspended from the pair of mutually parallel rails 356 which are arranged continuously from the standby section 26 to the discharge section 28.

That is, one set of sliders 356A which are slidably fitted to one rail 356 are mounted directly on the upper surface of the movable base 368, while another set of sliders 356A which are slidably fitted to the other rail 356 are respectively mounted thereon via step blocks 372.

A coupling block 374 is mounted at an end, located on this side of the printer, of the movable base 368 in the third film transport unit 35. This coupling block 374 is secured to a driving block 376A of a rodless cylinder 376 disposed between the standby section 26 and the printing surface plate 812. The rodless cylinder 376 is fixed to the unillustrated frame of the printer.

Consequently, as the rodless cylinder 376 is driven, the third film transport unit 350 is moved between the standby section 26 and the printing surface plate 812 along the rails 356.

When this third film transport unit 350 reaches the printing surface plate 812, the pulse motors 366A (see FIG. 21) of the drive units 366 are synchronously driven, and the sucker supporting base 358 (see FIG. 21) is thereby lowered with high precision. Consequently, pins of a pin bar 990 (see FIG. 43) on the printing surface plate 812 are inserted through the punch holes formed in the positioning punch-hole punching section 200, thereby making it possible to position the negative film 16 at a predetermined position on the printing surface plate 812.

Meanwhile, the fourth film transport unit 354 similarly has a coupling block 378 mounted at an end, located on this side of the printer, of the movable base 368. This coupling block 378 is secured to a driving block 380A of a rodless cylinder 380 disposed between the printing surface plate 812 and the discharge section 28. Consequently, as the rodless cylinder 380 is driven, the fourth film transport unit 354 is moved between the printing surface plate 812 and the discharge section 28 along the rails 356.

The third film transport unit 350 serves to transport the negative film 16 from the standby section 26 to the printing surface plate 812, while the fourth film transport unit 354 serves to transport the negative film 16, for which print processing has been completed, from the printing surface plate 812 to the discharge section 28. Hence, although there are mutually interfering portions in the paths of movement of the third and fourth film transport units 350 and 354, the driving of the respective rodless cylinders 376 and 380 is controlled by the controller 700, as shown in FIG. 46. Thus the third and fourth film transport units 350 and 354 are alternately moved onto the printing surface plate 812 so that they do not interfere each other.

Section G; Light Source Unit 802

Figure 23:
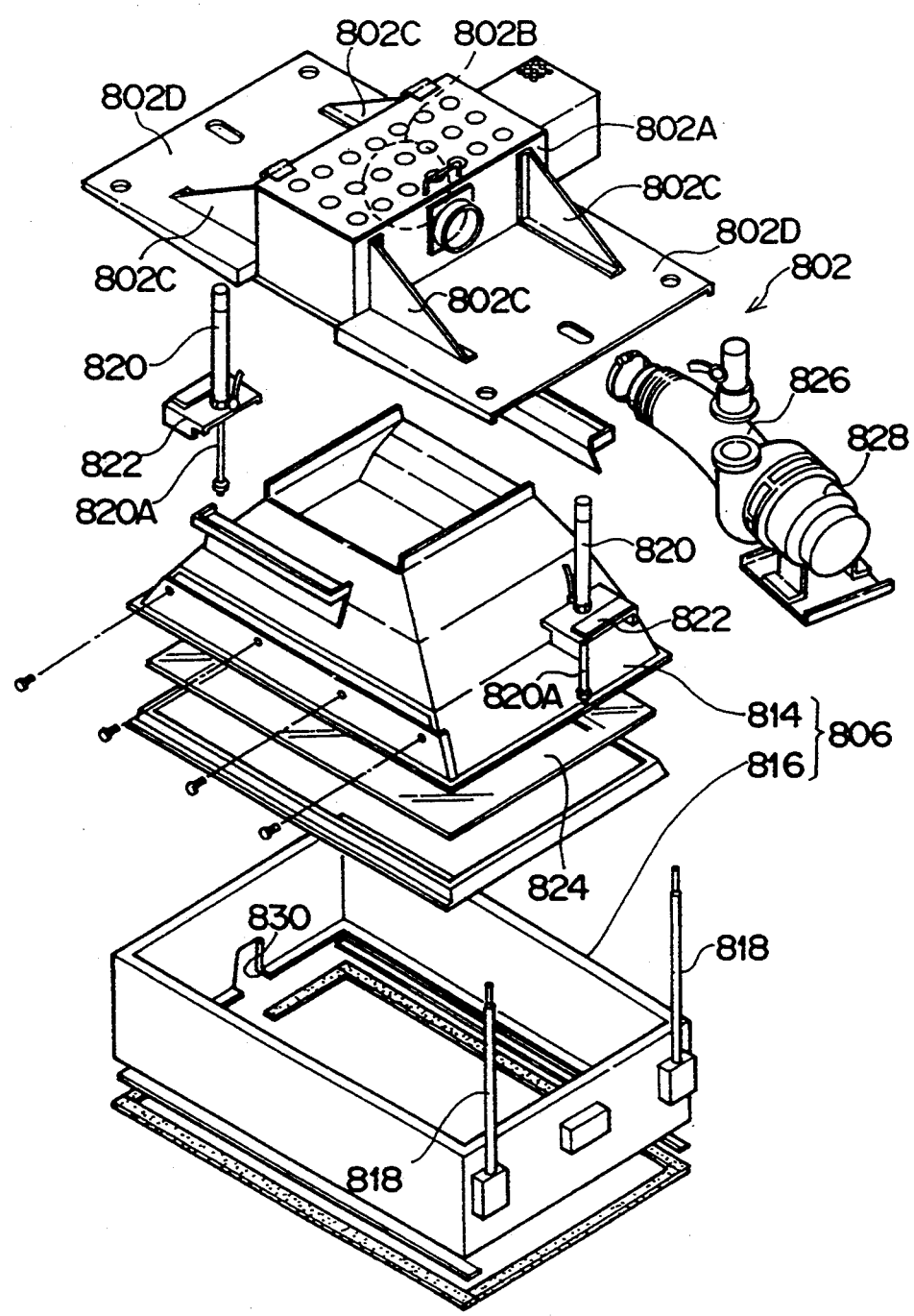
FIG. 23 is an exploded perspective view of a light source unit.

As shown in FIG. 23, the light source unit 802 is disposed above the printing surface plate 812 (see FIG. 22). An upper portion of the light source unit 802 is formed as a box-shaped light source section 802A in which a light source 802B is accommodated. An upper end of the light source hood 806 is mounted on a base plate 802D secured to a lower end of this light source section 802A via a reinforcing plate 802C.

The light source hood 806 has a double structure comprised of a reflection hood 814 and a light-shielding hood 816. The inner surface of the light source hood 806 is formed as a mirror surface and is adapted to reflect the light from the light source 804 in a diffused manner.

The light-shielding hood 816 has its four corners guided by guide shafts 818, and can be raised or lowered with respect to the reflection hood 814. Cylinders 820 are mounted on mutually opposing side walls of the light source hood 806 via brackets 822, respectively. A rod 820A of each of the cylinders 820 is secured to the light-shielding hood 816, and as the cylinders 820 are driven, the light-shielding hood 816 is raised or lowered.

A transparent glass sheet 824 is arranged in an opening at a lower end of the light source hood 806 so as to ensure that the heat generated as a result of the turning on of the light source 804 will not directly heat the negative film 16. In addition, one end of an exhaust duct 826 is attached to a side surface of the box-shaped light source section 802A, and a fan 828 is attached at the other end of this exhaust duct 826. For this reason, the warm air within the light source hood 806 can be vented to the outside. In addition, this ventilation allows dust in the light source hood 806 to be sucked and discharged to the outside.

Figure 24:
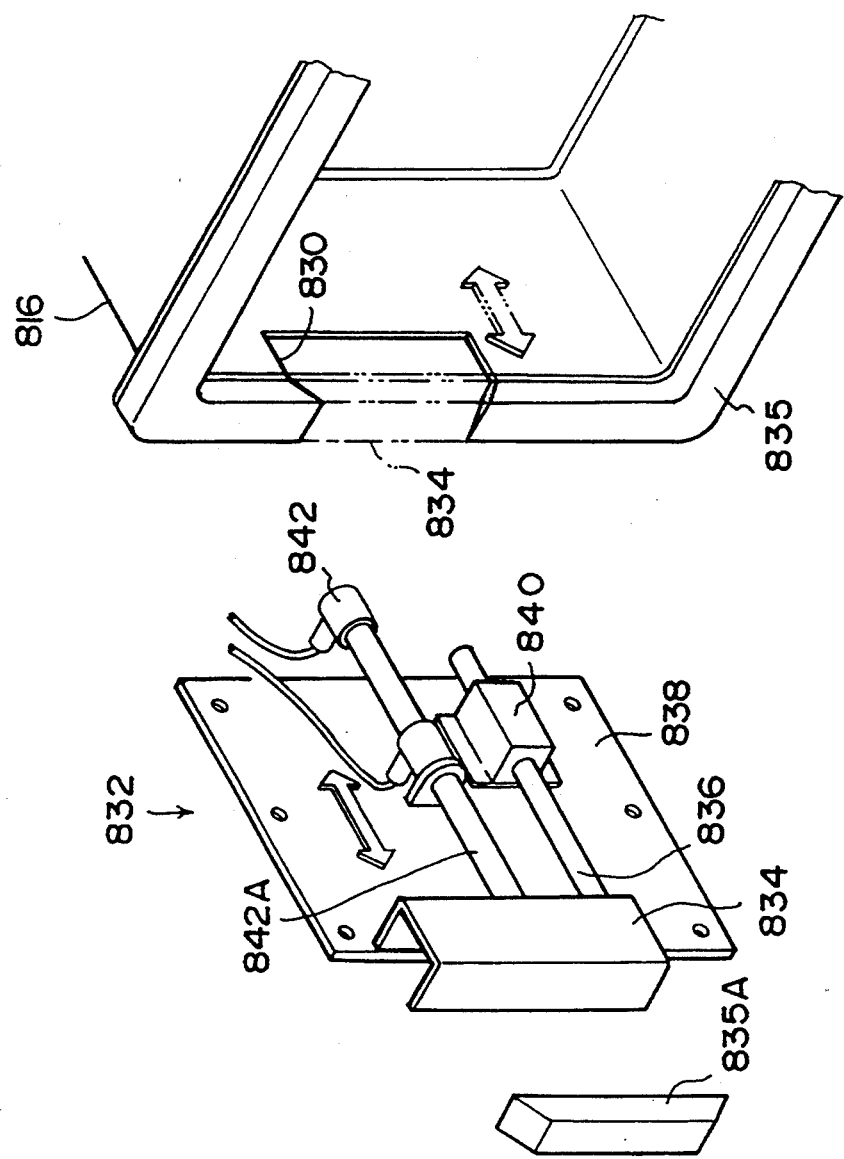
FIG. 24 is an enlarged perspective view of a light-shielding mechanism unit.

As shown in FIGS. 23 and 24, a notch 830 is formed at a lower end of a side wall of the light-shielding hood 816. This notch 830 serves to radiate light to a portion of the negative film 16 other than the image-recorded plane thereof.

A color mark for discriminating the print color of the negative film 16 is recorded in this portion of the negative film 16 other than the image-recorded plane thereof. For this reason, the color mark is printed on the PS plate 18 together with the image at the time of the recording of the image, so that the print color of the image recorded on the PS plate 18 can be discriminated.

As shown in FIG. 24, a light-shielding mechanism unit 832 is mounted in this notch 830. This light-shielding mechanism unit 832 has a closure plate 834 for closing the notch 830. The closure plate 834 has a substantially L-shaped configuration and is attached to a shaft 836. The shaft 836 is inserted through a through hole provided in a guide block 840 secured to a support plate 838. As a result, the closure plate 834 is slidable along the shaft 836. In addition, a distal end of a rod 842A of a cylinder 842 is secured to the closure plate 834, so that the closure plate 834 is movable between a position for closing the notch 830 and a position for opening it as the cylinder 842 is driven. A light-shielding seal 835A, which is made of the same material as that of a felt-like light-shielding seal 835 attached to the lower rim of the light-shielding hood 816, is attached to a distal-end surface of the closure plate 834.

Since images of the same print color are printed on the PS plate 18, it suffices if one color mark is recorded on the PS plate 18. For this reason, the controller 700 effects control in such a manner as to move the closure plate 834 to the position for opening the notch 830 when a first image plane (on the top side) is printed, and to move the closure plate 834 to the position for closing the notch 830 when a second image plane (on the bottom side) is printed.

Section H; PS-plate Loading Section 34

As shown in FIGS. 1 and 4, the PS-plate loading section 34 is located below the film loading section 22 and the discharge section 28. The lower right-hand portion of the overall front surface of the printer is provided with an openable cover 44. As this openable cover 44 is opened, the PS-plate loading section 34 is exposed.

As shown in FIG. 4, the skid 32, on which the PS plates 18 are stacked in advance, can be loaded in the PS-plate loading section 34. The PS plates 18 are thus loaded as stacked on each skid 32. It should be noted that the skid 32 can be moved along unillustrated rails or the like so as to be replaced with an ensuing skid at the front of the printer.

The PS plates 18 are set on the skid 32 and loaded in such a manner that their longitudinal direction coincides with the longitudinal direction of the printer, and the their photosensitive surfaces face upward. These PS plates 18 are taken out one by one beginning with an uppermost one by the PS-plate taking-out section 400, which will be described below, so as to be fed toward the printing surface plate 812.

Section J; PS-plate Taking-out Section 400

As shown in FIG. 4, an uppermost one of the PS plates 18 loaded in the PS-plate loading section 34 is sucked by the suction unit 402.

The suction unit 402 has a sucker supporting frame 410 to which a plurality of suckers 408 are attached. A rod 412A of a cylinder 412 is affixed to a central portion of this sucker supporting frame 410. A pipe (not shown) from an ejector 414 (see FIG. 52) is connected to each of the suckers 408, so that a suction force is imparted to the suckers 408 as the ejector 414 is actuated.

Above this sucker supporting frame 410, the cylinder 412 is secured to the upper surface of a base plate 416 disposed parallel with this sucker supporting frame 410. The rod 412A is passed through this base plate 416 and holds the sucker supporting frame 410 in a suspended state.

Guide shafts 411 are mounted on the upper surface of the sucker supporting frame 410, and these guide shafts 411 are pivotally supported by the base plate 416. Here, if the rod 412A is extended as the cylinder 412 is driven, the suckers 408 are brought into close contact with the uppermost one of the PS plates 18. In this state of close contact, if the ejector 414 is actuated, the uppermost one of the PS plates 18 can be sucked.

Figure 25:
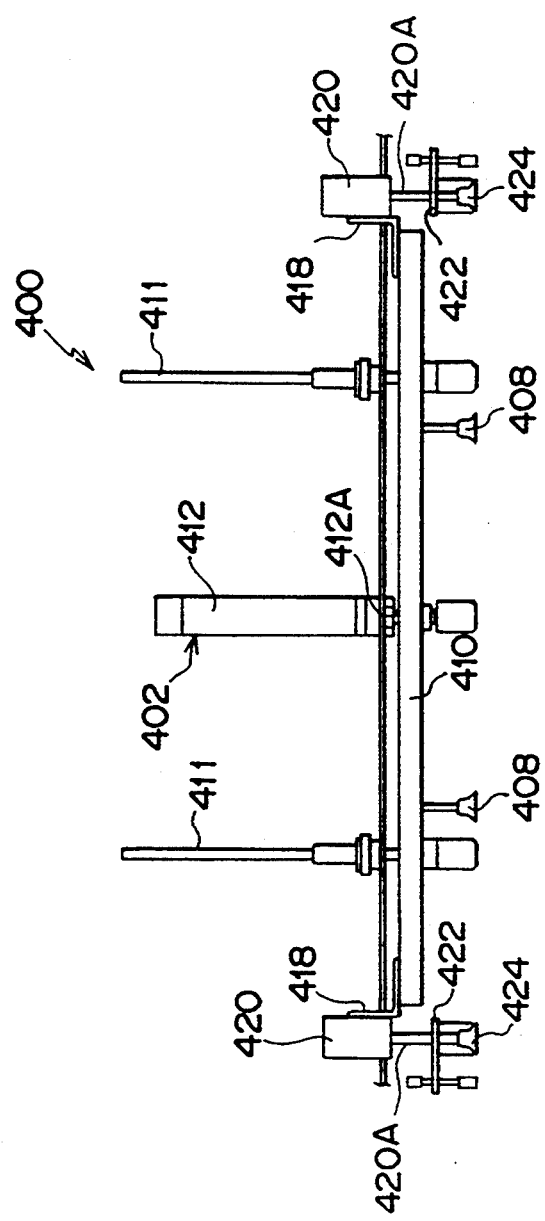
FIG. 25 is a front elevational view of a suction unit in a PS-plate taking-out section.

As shown in FIG. 25, four auxiliary cylinders 420 are respectively mounted via L-brackets 418 at four corners of the sucker supporting frame 410 that correspond to the four corners of the PS plate 18. One ends of flat plates 422 are respectively attached to distal ends of rods 420A of these auxiliary cylinders 420. Four auxiliary suckers 424 are respectively attached to the other ends of the flat plates 422, so as to be brought into close contact with the four corners of the PS plate 18 when the rods 420A of the cylinders 420 are extended. A pipe from an ejector 426 (see FIG. 52) which is separate from the aforementioned ejector 414 is connected to these auxiliary suckers 424.

If the uppermost PS plate 18 is sucked by the suckers 408 and the auxiliary suckers 424, the auxiliary suckers 424 are first raised as the auxiliary cylinders 420 are driven. As a result, the longitudinally opposite ends of the PS plate 18 are curled upward, so that the separatability of that PS plate from an ensuing PS plate placed therebelow is improved.

Next, as the cylinder 412 is driven, the uppermost PS plate 18 is removed from the skid 32. At this time, the auxiliary cylinders 420 are returned to their original positions, so that the flatness of the removed PS plate 18 is maintained.

The extension/retraction stroke of the rod 412A is made long. Hence, when the rod 412A is retracted by a maximum stroke, a large space exists between the skid 32 and the PS plate 18 sucked and held by the sucker supporting frame 410. The feeding-out transport unit 404 is arranged in this space.

As shown in FIG. 4, the feeding-out transport unit 404 has three shafts 428 (428A, 428B and 428C) each extending in the longitudinal direction of the PS plate 18 and in parallel. Pulleys 430 are respectively attached to opposite ends of these shafts 428A, 428B and 428C. The heightwise position of the shaft 428A (first shaft 428A), which is located closer to this side of the printer than the placing unit for the skid 32, and the heightwise position of the shaft 428B (second shaft 428B), which is located closer to the innermost side of the printer than the placing unit for the skid 32, are set at the same level. Meanwhile, the shaft 428C (third shaft 428C) located at an intermediate position is set at a slightly lower position than the other shafts. It should be noted that this third shaft 428C is located closer to the innermost side of the printer than the placing unit for the skid 32.

A pair of endless round belts 432 are respectively trained around the pulleys 430 disposed at both axial ends of these shafts 428A, 428B and 428C. A drive belt 434 is wound around the second shaft 428B, and this drive belt 434 is also wound around a rotating shaft 436A of a drive motor 436. As a result, the second shaft 428B is axially rotated by the driving force of the drive motor 436, thereby causing the round belts 432 to rotate in a loop in a clockwise direction as viewed in FIG. 4.

The sucker supporting frame 410 is adapted to pass vertically through an area 438 surrounded by the first shaft 428A, the second shaft 428B, and the round belts 432.

Eight rods 440, respectively extending in a direction perpendicular to the direction of travel of the round belts, are disposed on sections of the round belts 432 at predetermined intervals. The rods 440 are adapted to move in conjunction with the circulating movement of the round belts 432, and there are a period when the rods 440 are located within the aforementioned area 438 and a period when they are located outside that area 438.

The controller 700 stops the movement of the round belts 432 when the positions of the rods 440 are located outside the area 438, instructs the raising/lowering and suction of the PS plate 18 by means of the sucker supporting frame 410, and instructs the circulating movement of the round belts 432 when the PS plate 18 has reached its highest position.

Subsequently, as the suction of the PS plate 18 sucked and held by the sucker supporting frame 410 is canceled, the PS plate 18 is supported on the rods 440 and is transported to the innermost side as viewed from the front side of the printer.

The intermediate transport unit 406 is disposed downstream of the feeding-out transport unit 404.

Figure 26:
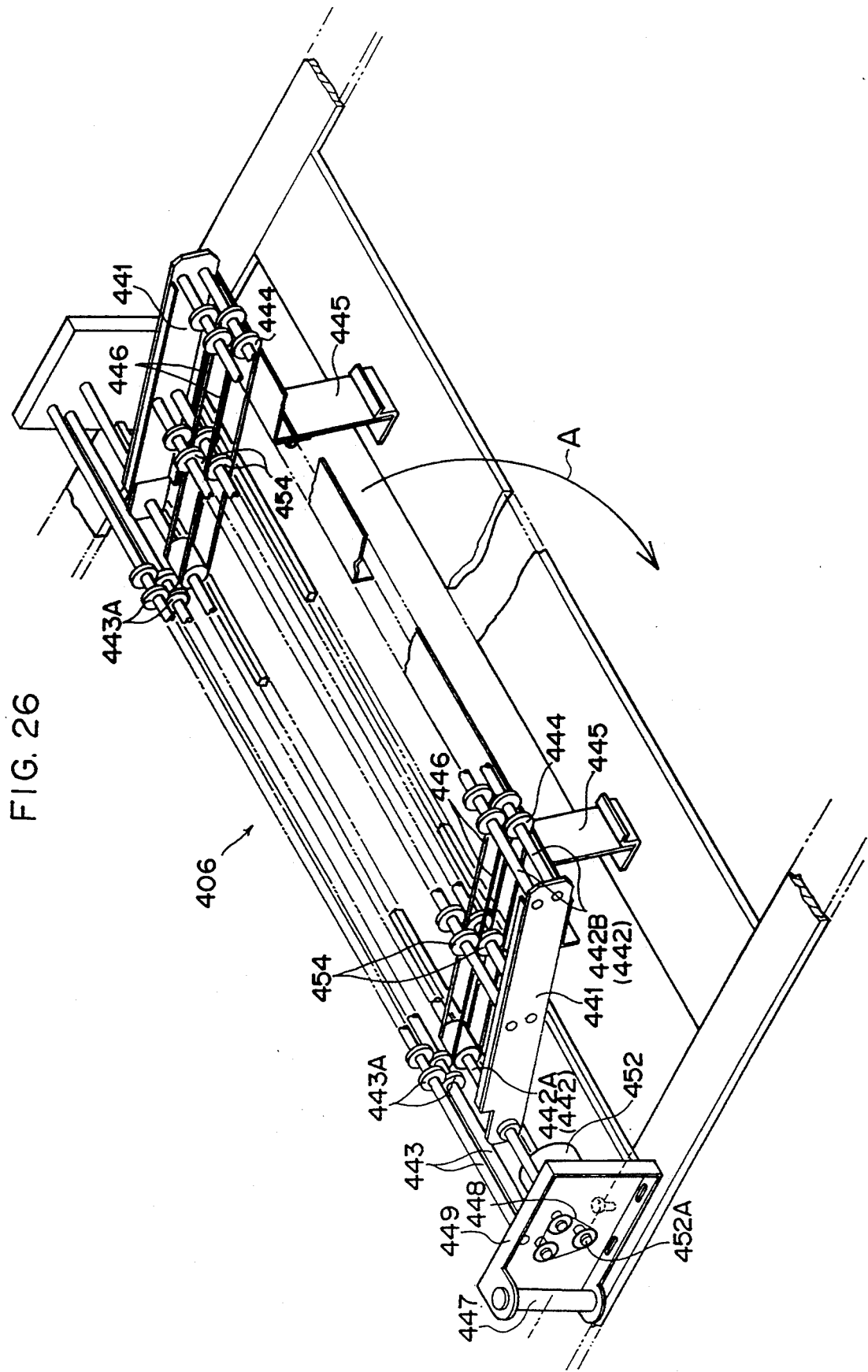
FIG. 26 is a perspective view of an intermediate transport unit.

As shown in FIG. 26, in this intermediate transport unit 406, a pair of shafts 442 (442A and 442B) extend between a pair of mutually parallel frames 441, the shaft 442A being located in the vicinity of the downstream side of the feeding-out transport unit 404, and the shaft 442B being located in the vicinity of the upstream side of the transporting-direction inverting section 500. A plurality of pulleys 444 are secured on the respective shafts 442A and 442B at predetermined intervals in the axial direction. Endless round belts 446 are respectively trained between the pulleys 444 which correspond to each other in their axial positions. Consequently, the round belts 446 are arranged in parallel with each other in the transverse direction of the PS plate 18.

In addition, a pair of shafts 443 are disposed in the vicinity of the upstream-side shaft 442A, and rollers 443A are fixed thereon in correspondence with the positions where the aforementioned round belts 446 are arranged. The arrangement provided is such that the PS plate 18 is fed into a nip between these rollers 443A from the feeding-out transport unit 404 so as to be fed to the intermediate transport unit 406.

One end of the upstream-side shaft 442A extends through the frame 441 to the outer side and is passed through a rectangular bracket 449 secured rotatably to the frame of the printer via a shaft 447. A drive belt 448 is wound around this projecting portion of the shaft 442A, and this drive belt 448 is also wound around one of the shafts 443 and around a rotating shaft 452A of a motor 452. Consequently, the round belts 446 are made to undergo circulating motion, and the pair of rollers 443A are also rotated at the same time. It should be noted that the direction of the circulating movement of the round belts 446 on the upper side thereof is the same as direction of the direction of travel of the PS plate 18 caused by the feeding-out transport unit 404.

This intermediate transport unit 406 is rotatable about the upstream-side shaft 442A. In addition, this intermediate transport unit 406 is gradually inclined upwardly toward the downstream side in the direction of travel of the PS plate 18. Namely, lower ends of the frames 441 on the downstream-side shaft 442B are supported by support brackets 445 disposed uprightly from the frame of the printer. For this reason, the PS plate 18 is transported in such a manner as to climb upward along this inclination.

A pair of nip rollers 454 are disposed at a midway position between the upstream- and downstream-side shafts 442A and 442B so as to nip the PS plate 18. By virtue of these nip rollers 454, the PS plate 18 can be fed to the transporting-direction inverting section 500 without being slipping down when it is transported while climbing up.

The support brackets 445 are detachable from the frames 441. For this reason, if these support brackets 445 are removed, the intermediate transport unit 406 is set in a horizontal state as the downstream-side shaft 442B side thereof is rotated downward about the upstream-side shaft 442A.

In this state, the intermediate transport unit 406 becomes rotatable about the shaft 447 in the direction of arrow A shown in FIG. 26. Accordingly, after this rotation a space is created below the printing surface plate 812, thereby making it possible to obtain a maintenance work space for replacement of component parts located below the printing surface plate 812 and for other maintenance operations.

Section K; Transporting-direction Inverting Section 500

Figure 27:
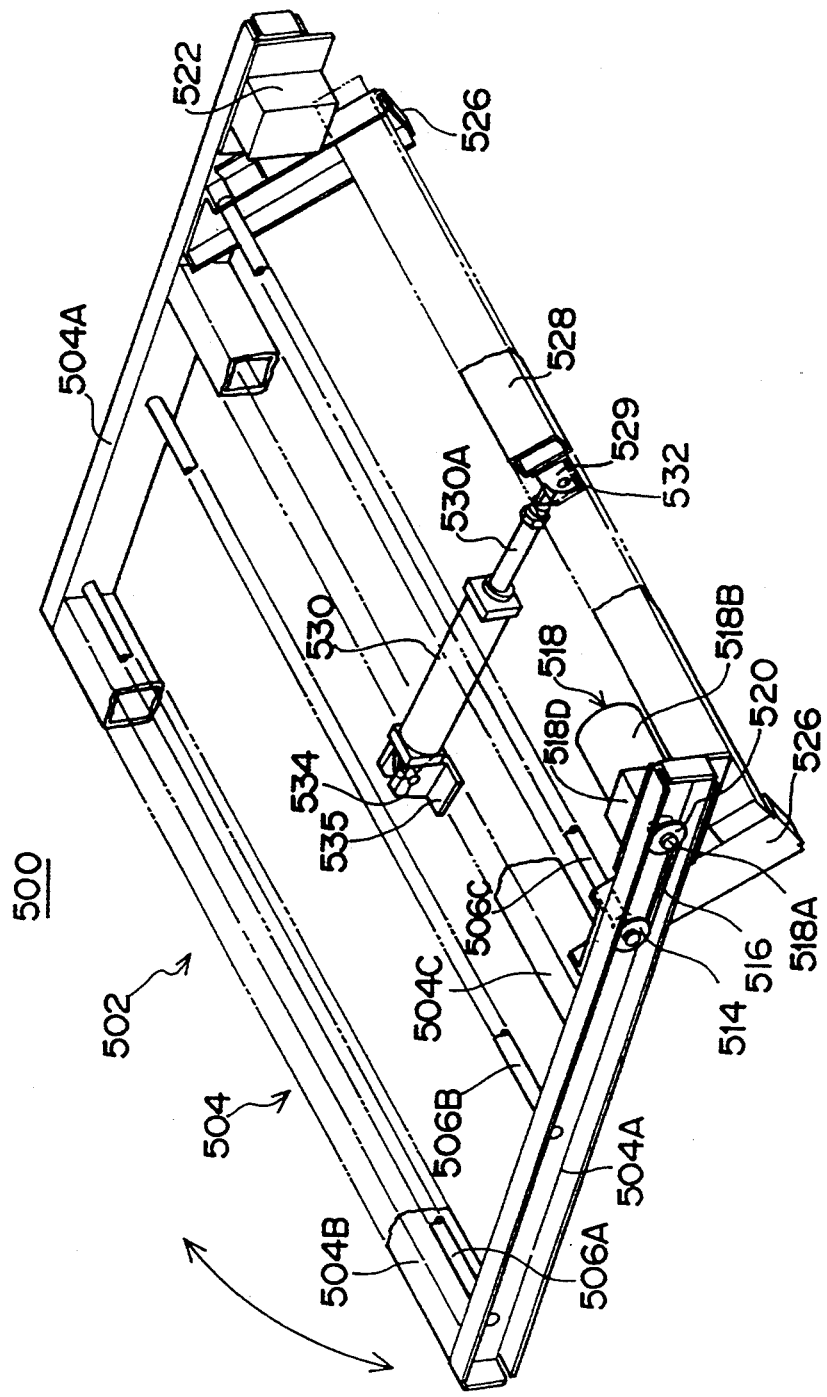
FIG. 27 is a perspective view of a placing unit of a transporting-direction inverting section.
Figure 28:
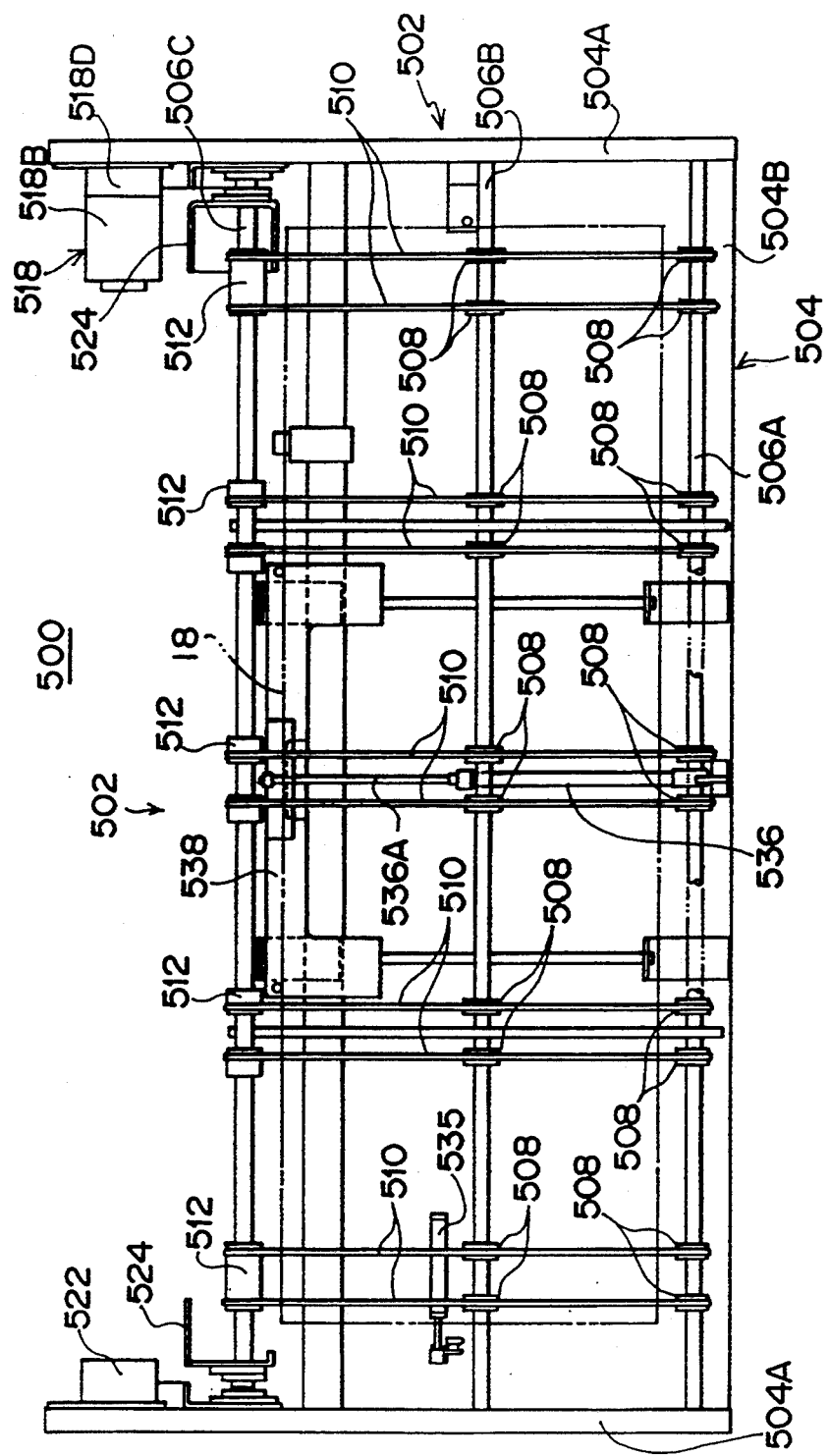
FIG. 28 is a plan view of the placing unit of the transporting-direction inverting section.

As shown in FIGS. 27 and 28, a substantially U-shaped frame body 504 is formed in the transporting-direction inverting section 500. This frame body 504 includes a pair of transverse frames 504A arranged in the transverse direction of the PS plate 18 and a longitudinal frame 504B extending between the intermediate transport unit 406-side ends of these transverse frames 504A. These members as a whole constitute parts of the placing unit 502.

Three shafts 506 extend between the transverse frames 504A in parallel with each other (these shafts 506 will be hereafter referred to—beginning with the one closest to the intermediate transport unit 406—as a first shaft 506A, a second shaft 506B, and a third shaft 506C).

In addition, a reinforcing frame 504C extends between the transverse frames 504A in the vicinity of the third shaft 506C.

As shown in FIG. 28, a plurality of pairs of (five pairs in this embodiment) pulleys 508 are secured on the first and second shafts 506A and 506B at predetermined intervals in the axial direction, and are adapted to rotate with the shafts 506A and 506B, respectively. Endless round belts 510 are respectively wound around the pulleys 508 of the first shaft 506A. These round belts 510 are also wound around pulleys 512 provided on the third shaft 506C, respectively. Intermediate rectilinear portions of the round belts 510 are guided by the pulleys 508 of the second shaft 506B.

As shown in FIG. 27, a gear 514 is secured on one end of the third shaft 506C, and a chain 516 is wound around the gear 514. This chain 516 is also wound around a gear 520 secured on an output shaft 518A of a drive unit 518. The drive unit 518 is disposed at that portion of one transverse frame 504A which projects beyond the reinforcing frame 504C.

The drive unit 518 is comprised of a motor 518B and a gear mechanism unit 518D whereby the rotating speed of the motor 518B is changed before the output shaft 518A is rotated.

As a result, when the motor 518B is driven, the first shaft 506A is rotated, which in turn causes the round belts 510 to undergo circulating motion. The gear mechanism unit 518D is capable of transmitting the rotating force of the motor 518B by changing over the rotating direction between the forward and reverse directions. Thus the direction of circulating motion of the round belts 510 can be changed over between the forward direction, i.e., the same direction as the direction of travel due to the intermediate transport unit 46, and the reverse direction.

A balancer 522 having the shape of a rectangular block is mounted at a corresponding position on the opposite transverse frame 504A to the one on which the drive unit 518 is secured. The weight of this balancer 522 is made substantially identical to the weight of the drive unit 518. For this reason, the center of gravity of the frame body 504 is not offset and is located in the vicinity of a longitudinally central portion thereof, thereby preventing the twisting of the frame body 504.

As shown in FIG. 28, portions of the third shaft 506C in the vicinity of opposite ends thereof are respectively inserted through support members 524 affixed to the frame of the printer. As a result, the third shaft 506C is rotatably supported by the support members 524. Since the transporting-direction inverting section 500 is cantilevered by the third shaft 506C, the transporting-direction inverting section 500 is rotated about the third shaft 506C and is set in an inclined state with the first shaft 506A side thereof being located downward. The angle of this inclination is made identical with the angle of inclination (approx. 15°) of the intermediate transport unit 406, so that the transport passage of the transporting-direction inverting section 500 is made rectilinearly continuous from the transport passage of the intermediate transport unit 406. In addition, in this case, the round belts 510 are controlled in such a manner as to move in the forward direction with respect to the direction of travel due to the intermediate transport unit 406.

Accordingly, the PS plate 18 transported by the intermediate transport unit 406 while climbing upward is delivered onto the round belts 510 of the transporting-direction inverting section 500.

In addition, as shown in FIG. 27, a pair of brackets 526 extending diagonally downward toward the innermost side of the printer are respectively secured loosely on both ends of the third shaft 506C and rigidly on inside surfaces of the transverse frames 504A. A support bar 528 having the shape of an elongated box extends between the pair of brackets 526.

Figure 29:
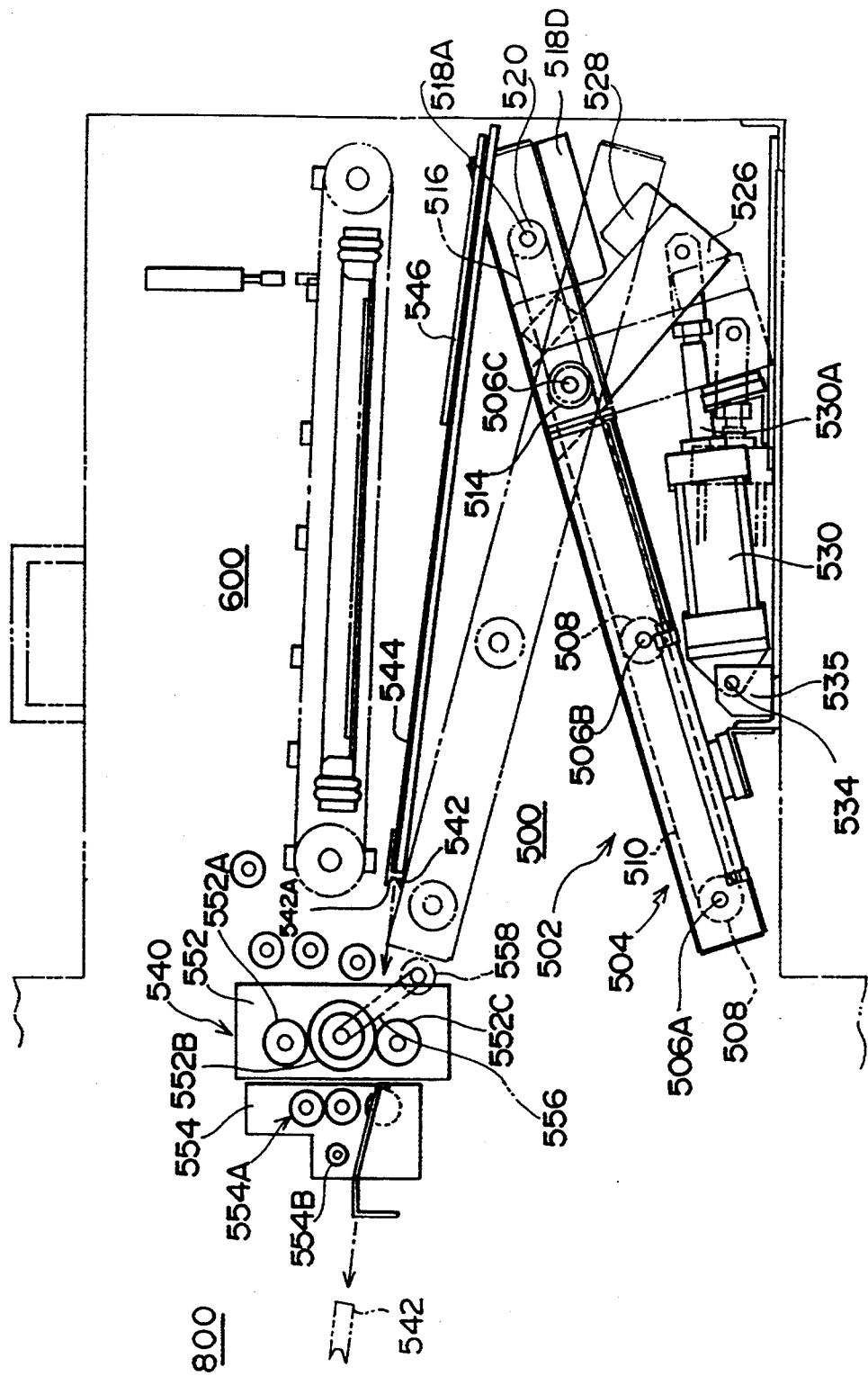
FIG. 29 is a side elevational view illustrating the arrangement of the transporting-direction inverting section and a PS-plate discharging section.

A drive rod 530A of a cylinder 530 is attached to a longitudinally intermediate portion of this support bar 528 via a bracket 529 and a shaft 532. A proximal portion of the cylinder 530 is secured via a shaft 534 to a bracket 535 disposed below the frame body 504. As shown in FIG. 29, in a state in which the drive rod 530A is extended, the transporting-direction inverting section 500 is inclined in such a manner as to be rectilinearly continuous from the transport passage of the intermediate transport unit 406, as described above.

When the rod 530A is retracted by the driving force of the cylinder 530, as shown by the phantom lines in FIG. 29, the frame body 504 is rotated such that the first shaft 506A side thereof is swung upward around the third shaft 506C through a large angle. Thus the frame body 504 is set in an inclined state (approx. 17°) in which the first shaft 50A is at a high position. In this case, since the frame body 504 is provided with the balancer 522 in correspondence with the position where the drive unit 518 is mounted, the frame body 504 is rotated without undergoing deformation such as twisting.

In this state, the controller 700 provides control such that the rotation of the output shaft 518A of the drive unit 518 is reversed so that the direction of circulating motion of the round belts 510 becomes reverse to the direction of travel in the intermediate transport unit 406.

As a result, the PS plate 18 supported on the round belts 510 is transported in such a manner as to project from the first shaft 506A. The arrangement provided is such that since the printing surface plate 812 is disposed at an extension of this direction of travel, the PS plate 18 is transported toward the printing surface plate 812.

Adjustment of the longitudinal position of the PS plate 18 placed on this placing unit 502 is effected by means of the driving force of the cylinder 530. A low-friction cylinder is used as this cylinder 530, and its pressure is regulated by a precision regulator (not shown). When the PS plate 18 is pressed, this precision regulator regulates the pressure in such a manner that the PS plate 18 will not become deformed, and regulation is possible for each of varying sizes of PS plates 18.

As shown in FIG. 28, a proximal portion of a cylinder 536 is secured to a central portion of the longitudinal frame 504B. The cylinder 536 is arranged in such a manner as to be parallel with the transverse frames 504A. A pushing plate 538 is attached to a distal end of a rod 536A of the cylinder 536. Normally, the rod 536A is set in the extended state, and there is no interference between the rod 536A and the PS plate 18 being transported from the intermediate transport unit 406.

In the state in which the frame body 504 is rotated about the third shaft 506C and the transporting direction is inverted, the controller 700 causes the cylinder 536 to be driven, thereby moving the rod 536A in a retracting direction. Through this movement, the pushing plate 538 is brought into contact with the trailing end, as viewed in the direction of travel, of the PS plate 18, and presses the PS plate 18 toward the printing surface plate 812.

The PS plate 18 pushed by the pushing plate 538 is further fed toward the printing surface plate 812 by a plate-feeding roller unit 540 (see FIG. 29) which will be described later. However, after the trailing end of the PS plate 18 passes through this plate-feeding roller unit 540, the transporting force ceases to exist.

For this reason, as shown in FIG. 29, the transporting-direction inverting section 500 is provided with pushing pawls 542 for ultimately pushing the PS plate 18 fully onto the printing surface plate 812. Each of these pushing pawls 542 has a substantially V-shaped groove 542A, is disposed in the vicinity of the first shaft 506A, and is set on standby.

Figure 30:
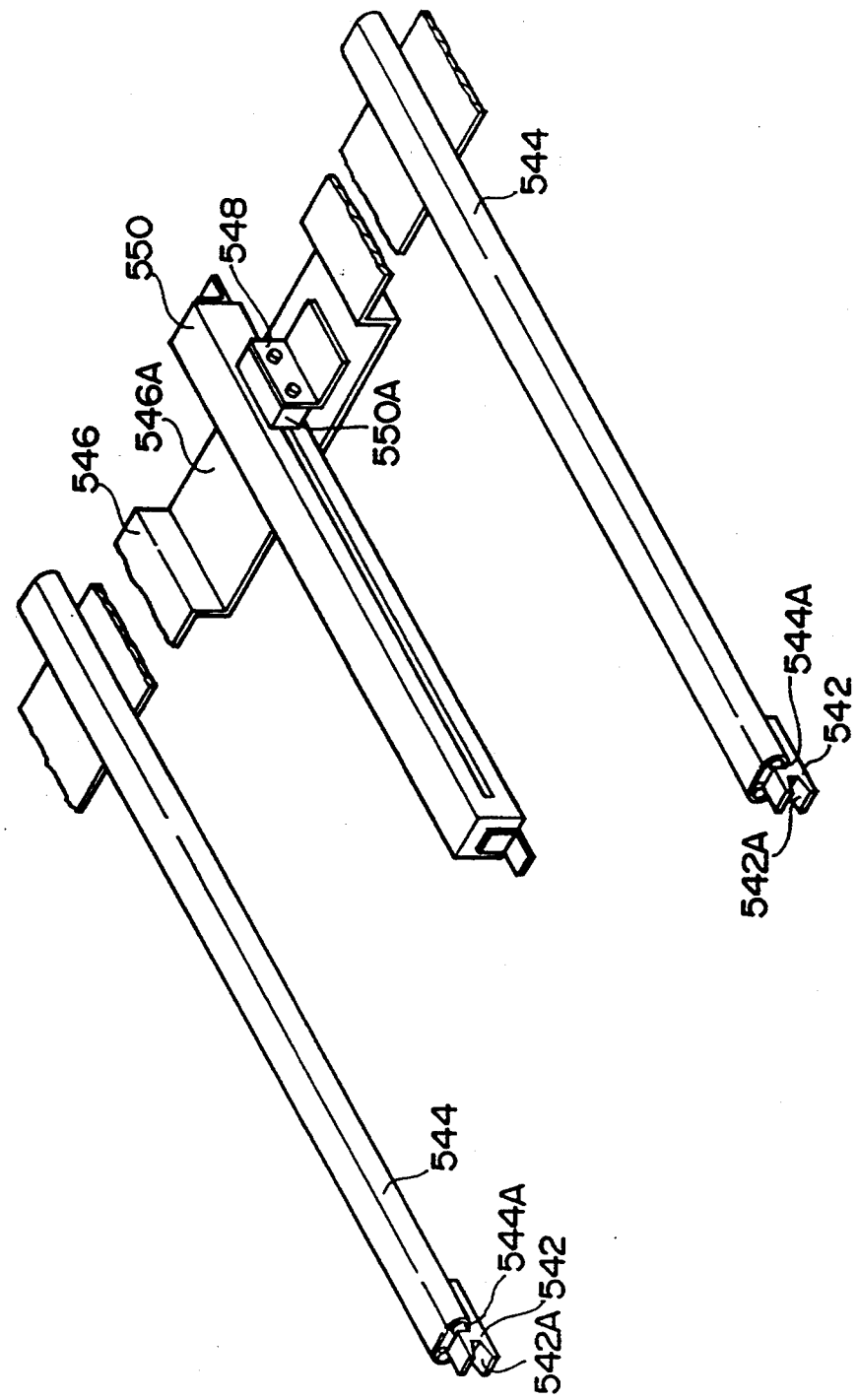
FIG. 30 is a perspective view illustrating a mechanism for driving pushing pawls for pushing the PS plate up to a predetermined position on the printing surface plate.

As shown in FIG. 30, each of the pushing pawls 542 is attached to a distal end of a slider 544A of each of a pair of guide rails 544 arranged in parallel with the transverse frames 504A. Proximal portions of the sliders 544A are coupled to a bracket 546. A longitudinally intermediate portion of this bracket 546, which is parallel with the longitudinal direction of the PS plate 18, is bent in a substantially U-shaped configuration, and a downwardly-projecting concave portion 546A is thereby formed. A drive rod 550A of a rodless cylinder 550 is attached to a bottom surface of this concave portion 546A via an L-bracket 548. The rodless cylinder 550 is disposed in parallel with the guide rails 544.

When the rodless cylinder 550 is driven, the drive rod 550A moves the bracket 546 along the guide rails 544 in a direction from the third shaft 506C to the first shaft 506A. Hence, the pushing pawls 542 attached to the distal ends of the sliders 544A of the guide rails 544 are extended toward the printing surface plate 812 (see the phantom lines in FIG. 29). For this reason, the trailing end of the PS plate 18 which has passed through the aforementioned plate-feeding roller unit 540 is received by the grooves 542A, thereby making it possible to press the PS plate 18 toward the printing surface plate 812.

Figure 31:
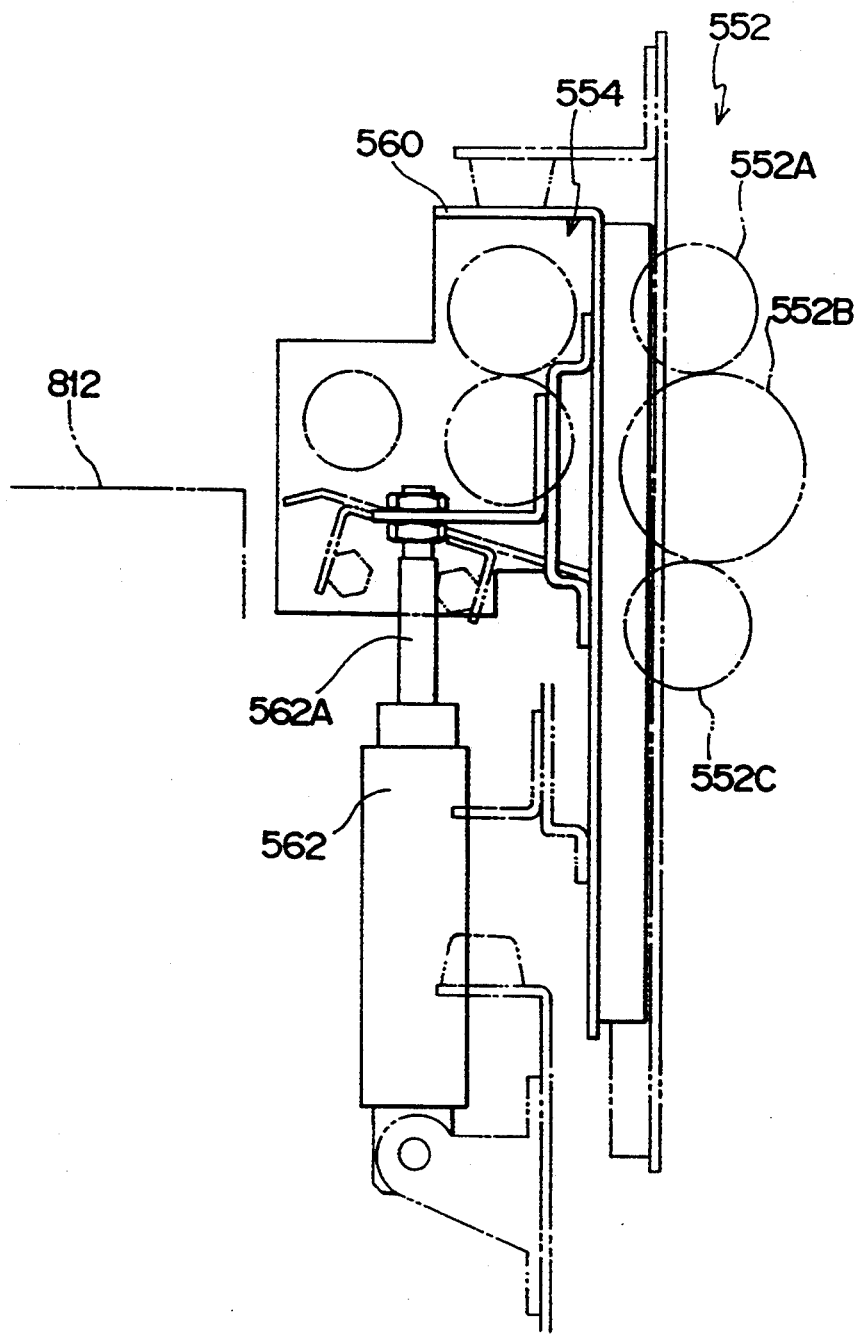
FIG. 31 is a side elevational view of a plate.

As shown in FIGS. 29 and 31, the plate-feeding roller unit 540, which is disposed in a transport passage between the transporting-direction inverting section 500 and the printing surface-plate section 800, is comprised of a fixed roller section 552 located on the transporting-direction inverting section 500 side and a movable roller section 554 located on the printing surface-plate section 800 side. It should be noted that rollers in the respective roller sections 552 and 554 are arranged at intervals in the axial direction thereof, i.e., are axially divided into a plurality of sections, so as not to interfere with the paths of movement of the aforementioned pushing pawls 542.

In the fixed roller section 552, three rollers 552A, 552B and 552C are arranged in a vertical direction. The central roller 552B has a large diameter, and the small-diameter rollers 552A and 552C respectively abut upper and lower portions of the large-diameter roller 552B.

A driving force of a motor 558 is transmitted to the large-diameter roller 552B via a chain 556 to rotate that roller clockwise as viewed in FIG. 29. A tangential line to both the large-diameter roller 552B and the lower small-diameter roller 552C, i.e., an extended line of a nip therebetween, is virtually aligned with the transport passage from the transporting-direction inverting section 500 toward the printing surface plate 812. For this reason, the PS plate 18 pushed by the pushing plate 538 is transported while being nipped between the large-diameter roller 552B and the small-diameter roller 552C.

Meanwhile, the PS plate 18 which is discharged from the printing surface plate 812 upon completion of printing is nipped between the large-diameter roller 552B and the upper small-diameter roller 552A. The direction of travel of the PS plate 18 nipped between the large-diameter roller 552B and the upper small-diameter roller 552A is made opposite to the direction of travel of the PS plate 18 nipped between the large-diameter roller 552B and the lower small-diameter roller 552C. The PS plate 18 is thus sent to the PS-plate discharging section 600 (see FIG. 29) which will be described later.

The movable roller section 554 is comprised of a pair of nip rollers 554A and a support roller 554B which is disposed closer to the printing surface plate 812 than these nip rollers 554A. These rollers are axially supported on a bracket 560 shown in FIG. 31. A distal end of a rod 562A of a cylinder 562 is attached to the bracket 560, whereby the movable roller section 554 is vertically movable.

More specifically, as the cylinder 562 is driven, the movable roller section 554 is vertically movable between, on the one hand, a position (lower position) in which the nip between the pair of nip rollers 554A is made to correspond to the nip between the large-diameter roller 552B and the lower small-diameter roller 552C, and, on the other hand, a position (upper position) in which the nip therebetween is made to correspond to the nip between the large-diameter roller 552B and the upper small-diameter roller 552A. At that time, the support roller 554B is also moved vertically as a unit.

The controller 700 effects the following control: First, the pair of nip rollers 554A are located at the lower position, and are then made to nip the PS plate 18 which is to be discharged from the printing surface plate 812. Then the pair of nip rollers 554A are moved to the upper position. Subsequently, the PS plate 18 is transported and nipped between the large-diameter roller 552B and the upper small-diameter roller 552A, and is guided to the PS-plate discharging section 600. After the movement of the pair of nip rollers 554A to the upper position, even if the PS plate 18 to be printed is nipped between the large-diameter roller 552B and the lower small-diameter roller 552C and is advanced, this PS plate 18 is guided onto the printing surface plate 812 without interfering with the PS plate 18 to be discharged.

Section L; PS-plate Discharging Section 600

Figure 32:
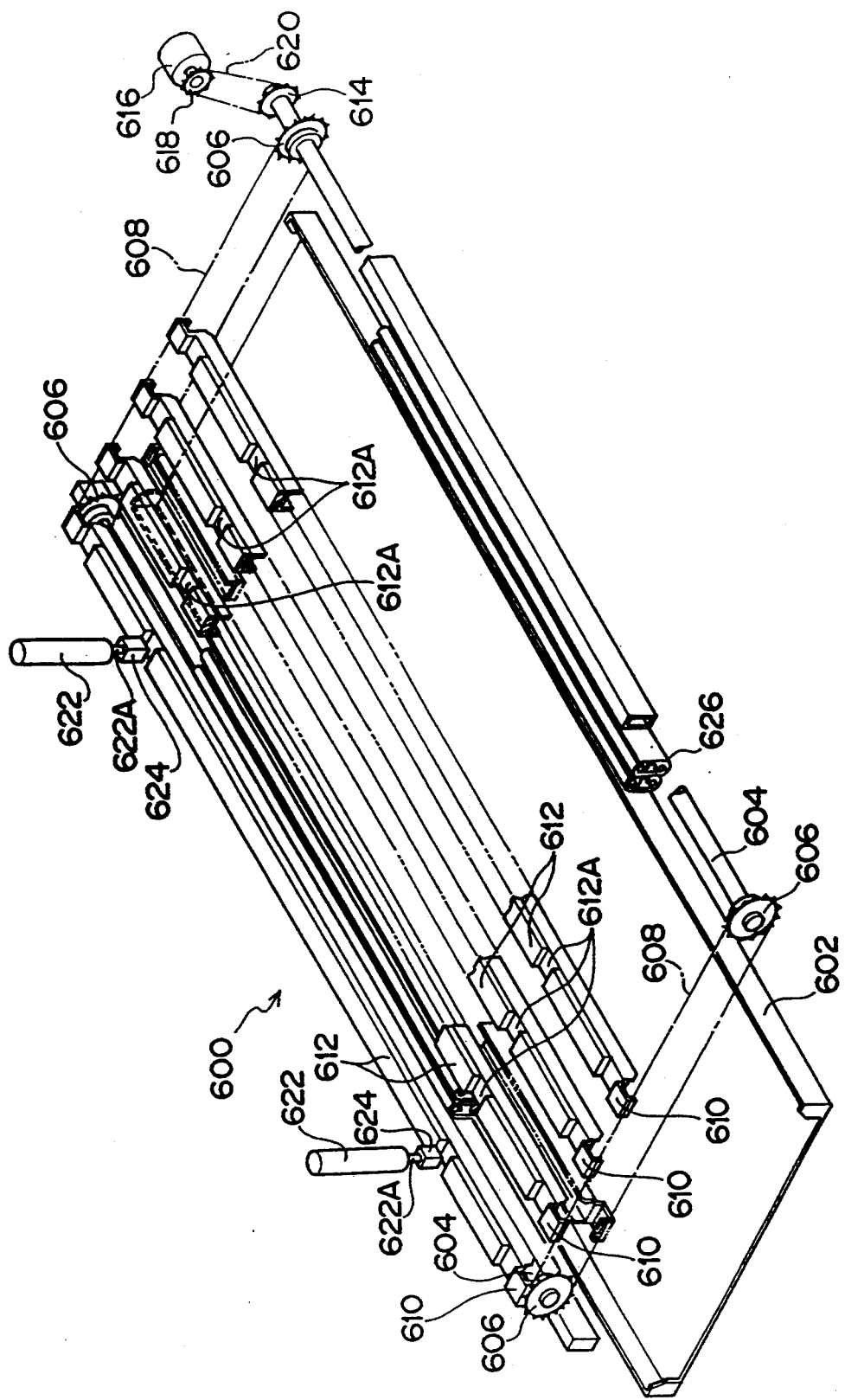
FIG. 32 is a perspective view of the PS-plate discharging section.

As shown in FIG. 32, in the PS-plate discharging section 600, a pair of mutually parallel shafts are disposed along the longitudinal direction of the PS plate 18. Both axial ends of the shafts 604 are axially supported on the frame of the printer. The distance between the pair of shafts 604 is made larger than the widthwise dimension of the PS plate 18, so that the innermost side, as viewed from the front side of the printer, of the PS-plate discharging section 600 projects by that portion.

Gears 606 are respectively secured on axial ends of the shafts 604, and a pair of chains 608 are trained between corresponding pairs of the gears 606, respectively. Small-width brackets 610 extend between sections of this pair of chains 608. Consequently, as the chains 608 are moved while forming a loop, the brackets 610 come to be located on the upper side and then the lower side of the loop. Support members 612 made of a synthetic resin are attached on longitudinally intermediate portions of the brackets 610.

The PS plate 18 transported from the printing surface plate 812 while being nipped by the large-diameter roller 552B and the upper small-diameter roller 552A is placed on these support members 612.

A gear 614 is mounted on an axial end of the shaft 604 located on this side of the printer at a position where the axial end projects exteriorly of the position where the shaft 604 is axially supported on the frame of the printer. A motor 616 is disposed above the axially supported portion of the shaft 604, and a gear 618 is attached to its rotating shaft 616A. A chain 620 is trained between these gears 614 and 618. As a result, if the motor 616 is driven, the shaft 604 is rotated, which in turn causes the other shaft 604 to be rotated by means of the chains 608. The rotation of these shafts 604 causes the brackets 610 to move, and the linear velocity thereof during this movement is controlled by the controller 700 in such a manner as to be equal to the velocity with which the PS plate 18 is transported while being nipped by the large-diameter roller 552B and the upper small-diameter roller 552A. In addition, since the brackets 610 are provided extending between sections of the chains 608, synchronization is achieved such that the leading one of the brackets 610 reaches the upper side of the loop at a point of time when the leading end of the PS plate 18 projects between the large-diameter roller 552B and the upper small-diameter roller 552A.

Consequently, the PS plate 18 can be transported without undergoing relative movement with respect to the support members 612, and can be discharged directly through a discharge port. It should be noted that an insertion port of an unillustrated developing apparatus is disposed in correspondence with the discharge port, and the PS plates 18 for which print processing has been completed are successively subjected to development processing.

Two notches 612A are provided in the longitudinally intermediate portions of the support members 612. Cylinders 622 are disposed above the shaft 604 on the innermost side of the printer in correspondence with these notches 612A, respectively. Rods 622A of these cylinders 622 are adapted to be extended downward, and stopper members 624 are attached to distal ends thereof. These stopper members 624, when lowered, are adapted to enter the notches 612A. When the PS plate 18 on the support members 612 is transported in this state, the leading end of the PS plate 18 interferes with the stopper members 624, and its movement is thereby stopped.

The PS plate 18 whose movement has been stopped undergoes relative movement with respect to the support members 612, and is caused to drop downward when the PS plate 18 corresponds to the position of the loop where the support members 612 are not provided.

The exit tray 602 is disposed between the upper and lower sides of the circulating loop of the support members 612. Side surfaces of the exit tray 602 corresponding to transverse sides of the PS plate 18 are guided by guide rails 626, so that the exit tray 602 is slidable in the longitudinal direction of the PS plate 18. i.e., leftward as viewed from the front side of the printer. As a result, after the PS plates 18 dropped from the support members 612 are accumulated in the exit tray 602, if this exit tray 602 is pulled out, the PS plates 18 can be taken out en masse.

Namely, as for the PS-plate discharging section 600, it is possible to select either the transport passage for feeding the PS plates 18 directly to the developing apparatus without operating the cylinders 622, or the transport passage for temporarily accumulating them by operating the cylinders 622.

Printing Surface-plate Section 800

The printing surface-plate section 800 is located in a central portion of the printer on the innermost side thereof as viewed from the front side of the printer. The light source unit 802 is located above this printing surface-plate section 800. In addition, disposed on the right-hand side of the printing surface-plate section 800, as viewed from the front side of the printer, are the following two plate-bending punch-hole punching units: the plate-bending punch-hole punching unit (hereafter referred to as a "first punching unit") 808 for punching on the bottom side of the PS plate 18 a punch hole serving as a reference for bending, and the plate-bending punch-hole punching unit (hereafter referred to as a "second punching unit") 810 for punching on the top side of the PS plate 18 punch holes serving as another reference for bending.

Figure 33:
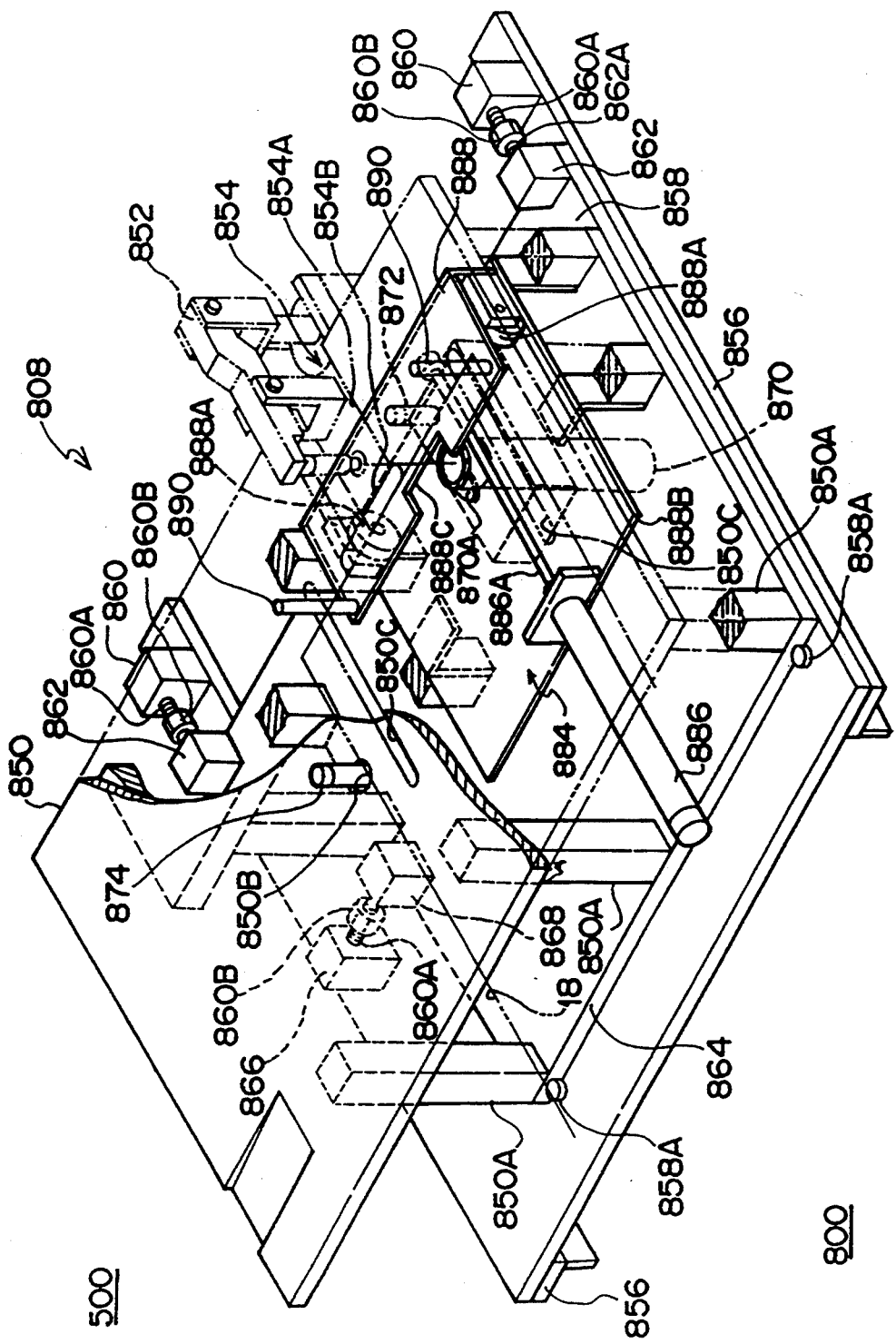
FIG. 33 is a perspective view of essential portions of a first punching unit.
Figure 34:
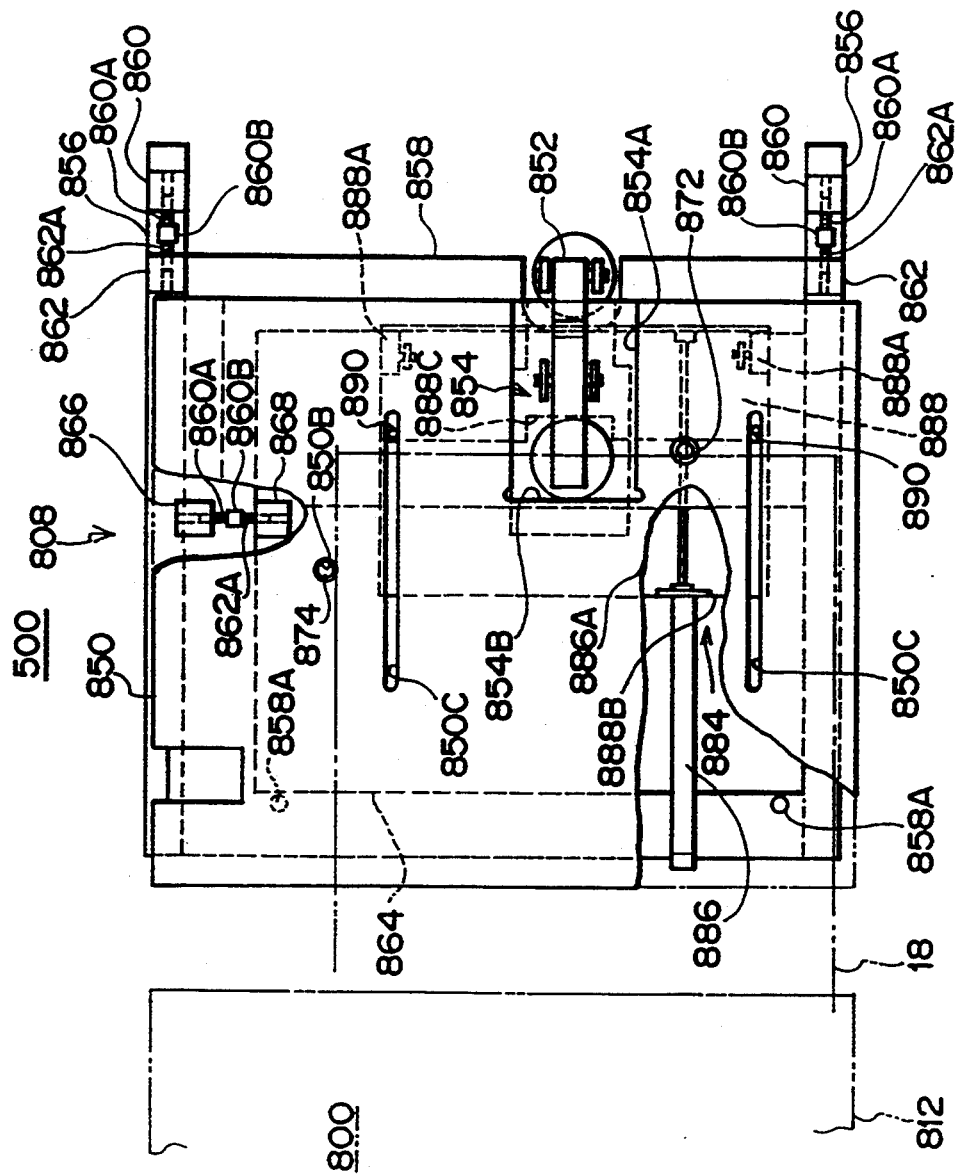
FIG. 34 is a plan view of the essential portions of the first punching unit.

As shown in FIGS. 33 and 34, the first punching unit 808 has a flat and substantially rectangular punching table 850. This punching table 850 has a rectangular recess 854 at its end corresponding to the bottom side of the PS plate 18, and a puncher 852 is mounted in this recess. Specifically, this recess 854 is formed in a U-shaped configuration, as viewed from the top, at one end of the upper surface of the punching table 850. One lateral side surface 854A and an innermost side surface 854B, which are adjacent to an opening formed in the recess, are used as references at the time of mounting the puncher 852. The puncher 852 fitted in the recess 854 is brought into contact with the lateral side surface 854A and the innermost side surface 854B so as to be positioned with respect to the punching table 850.

The punching table 850 is arranged above a main base 858 extending between a pair of brackets 856 mounted on the unillustrated frame of the presensitized plate printer 10. A block 860 is disposed uprightly on each of the pair of brackets 856, and a screw 860A is provided in each of these blocks 860. In addition, a block 862 opposing the block 860 is disposed on the main base 858. A screw 862A is threadedly engaged in each of these blocks 862. The relative position of the main base 858 with respect to the bracket 856 is determined by causing the screws 860A and 862A to be threadedly engaged in an elongated nut 860B, and the main base 858 is then secured to the brackets 856 by means of unillustrated bolts threadedly engaged in the brackets 856. That is, fine positional adjustment of the main base 858 along the direction toward and away from the printing surface-plate section 800 is carried out by changing the interval between the blocks 860 and 862.

A sub-base 864 is arranged on the upper surface of the main base 858, and a plurality of legs 850A of the punching table 850 are secured on this sub-base 864. A block 866 is mounted on the main base 858. A screw 860A whose axial direction is perpendicular to the aforementioned screw 860A and which is oriented toward the sub-base 864 is threadedly engaged in the block 866. A block 868 is mounted on the sub-base 864 in face-to-face relation with this block 866. A screw 862A is threadedly engaged in the block 868. Fine positional adjustment of the sub-base 864 in a direction perpendicular to the direction toward and away from the printing surface-plate section 800 is carried out at its mounted position on the main base 858 by causing the screws 860A and 862A to be threadedly engaged in the elongated nut 860B. In addition, projections 858A are formed on the main base 858, and one side of the sub-base 864 is brought into contact with these projections 858A to determine the position of the sub-base 864 with respect to the direction toward and away from the printing surface-plate section 800. The punching table 850 is secured on this sub-base 864 via the legs 850A.

A scraps receiver 870 is provided below the puncher 852 in such a manner as to be passed through the sub-base 864 and the main base 858. The scraps receiver 870 has a substantially cylindrical configuration having an axial end open, and is formed of a transparent resin. The scraps receiver 870 is inserted from a position below the main base 858, is then rotated approximately 90° about its axis, and is fixed by causing a rib 870A formed in the vicinity of its opening to abut the sub-base 864. This scraps receiver 870 is used for accommodating punching scraps produced when the puncher 852 punches a punch hole (rectangular in shape in this embodiment) in the PS plate 18.

The punching table 850 is provided with pin rollers 872 and 874 for positioning the PS plate 18 with respect to the puncher 852. The pin roller 872 is located in the vicinity to the puncher 852, and is fixed by being positioned with respect to the recess 854. This pin roller 872 is used to effect the positioning of the PS plate 18 in the longitudinal direction thereof as an end face of the PS plate 18 on the bottom side is brought into contact with the pin roller 872.

The pin roller 874 is disposed on the side of the punching table 850 closer to the transporting-direction inverting section 500, and is made to project upward and retract downward from a through hole 850B formed by being positioned with respect to the recess 854, as a cylinder 876 disposed below the punching table 850 is driven. When the PS plate 18 is fed onto the punching table 850 from the transporting-direction inverting section 500, the pin roller 874 is accommodated in the through hole 850B. In its projected state, a transverse end face of the PS plate 18 is opposed to the pin roller 874. The positioning of the PS plate 18 in its transverse direction with respect to the puncher 852 is effected as the transverse end face of the PS plate 18 is brought into contact with the pin roller 874.

Figure 35:
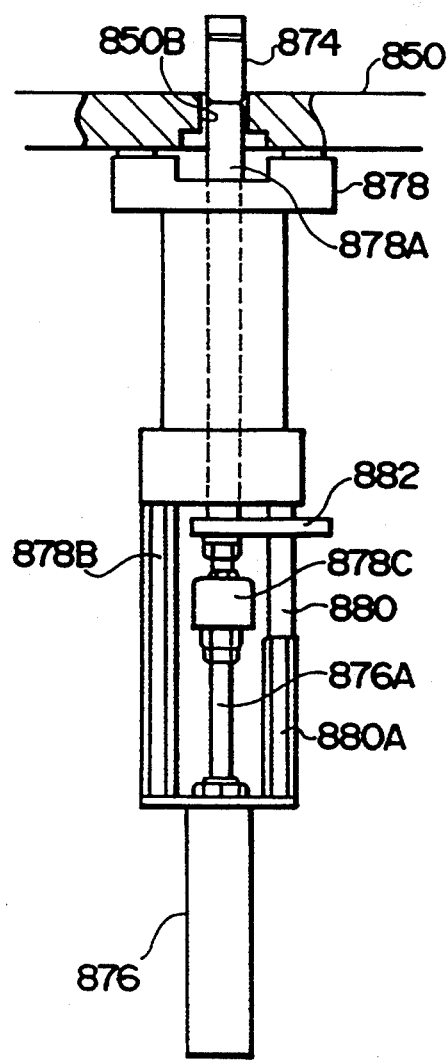
FIG. 35 is a side elevational view of an essential portion of a pin roller.

As shown in FIG. 35, the pin roller 874 is pivotally attached on an upper end of a shaft 878A slidably inserted in a slide bearing 878 secured below the punching table 850 coaxially with the through hole 850B. One end of a spacer 878B is fixed to a lower end of the slide bearing 878. The cylinder 876 is attached to the other end of this spacer 878B. A guide shaft 880 is attached to the lower end of the slide bearing 878 in parallel with the spacer 878B. The cylinder 876 is secured to a distal end of this guide shaft 880 via an elongated nut 880A. An intermediate portion of the guide shaft 880 is slidably inserted in an end portion of a guide 882. The other end of this guide 882 is secured to a lower end portion of the shaft 878A projecting downward from the slide bearing 878, and a lower end of the shaft 878A is coupled to a distal end of a rod 876A of the cylinder 876 via a float joint 878C.

As the rod 876A is vertically moved by the driving force of the cylinder 876, the shaft 878A slides in the slide bearing 878, and the guide 882 slides along the guide shaft 880. At the same time, the pin roller 874 is moved vertically and is made to project upward or downward from the through hole 850B. At this time, the rotation of the shaft 878A is prevented by the guide 882.

As shown in FIGS. 33 and 34, the punching table 850 is provided with a pusher 884 for feeding the bottom side of the PS plate 18 to the adjacent printing surface plate 812. The pusher 884 is comprised of a cylinder 886 disposed below the punching table 850 and two pins 890 arranged on a bracket 888 attached to a distal end of a rod 886A of this cylinder 886. The bracket 888 has a substantially elongated rectangular configuration arranged substantially in parallel with the punching table 850, and the rod 886A of the cylinder 886 is coupled to a longitudinally intermediate portion of the bracket 888. Longitudinally opposite ends of the bracket 888 extend in the axial direction of the rod 886A, and the pins 890 are attached to distal ends thereof.

Upper half portions of the pins 890 respectively project upward from elongated holes 850C formed in parallel in the punching table 850 from the vicinity of the puncher 852 toward the printing surface plate 812. As the cylinder 886 is driven, the pins 890 are adapted to move from respective ends of the elongated holes 850C in the vicinity of the puncher 852 toward the printing surface-plate section 800, and to press the bottom-side end face of the PS plate 18 placed on the punching table 850. It should be noted that the bracket 888 is provided with a central portion notched to form a notch 888C so that the bracket 888 will not interfere with the puncher 852 when the bracket 888 is in its standby position below the puncher 852. In addition, the bracket 888 is provided with a pair of rollers 888A which are rolled on a guide plate 888B extending between the legs 850A in parallel with the punching table 850.

Figure 36:
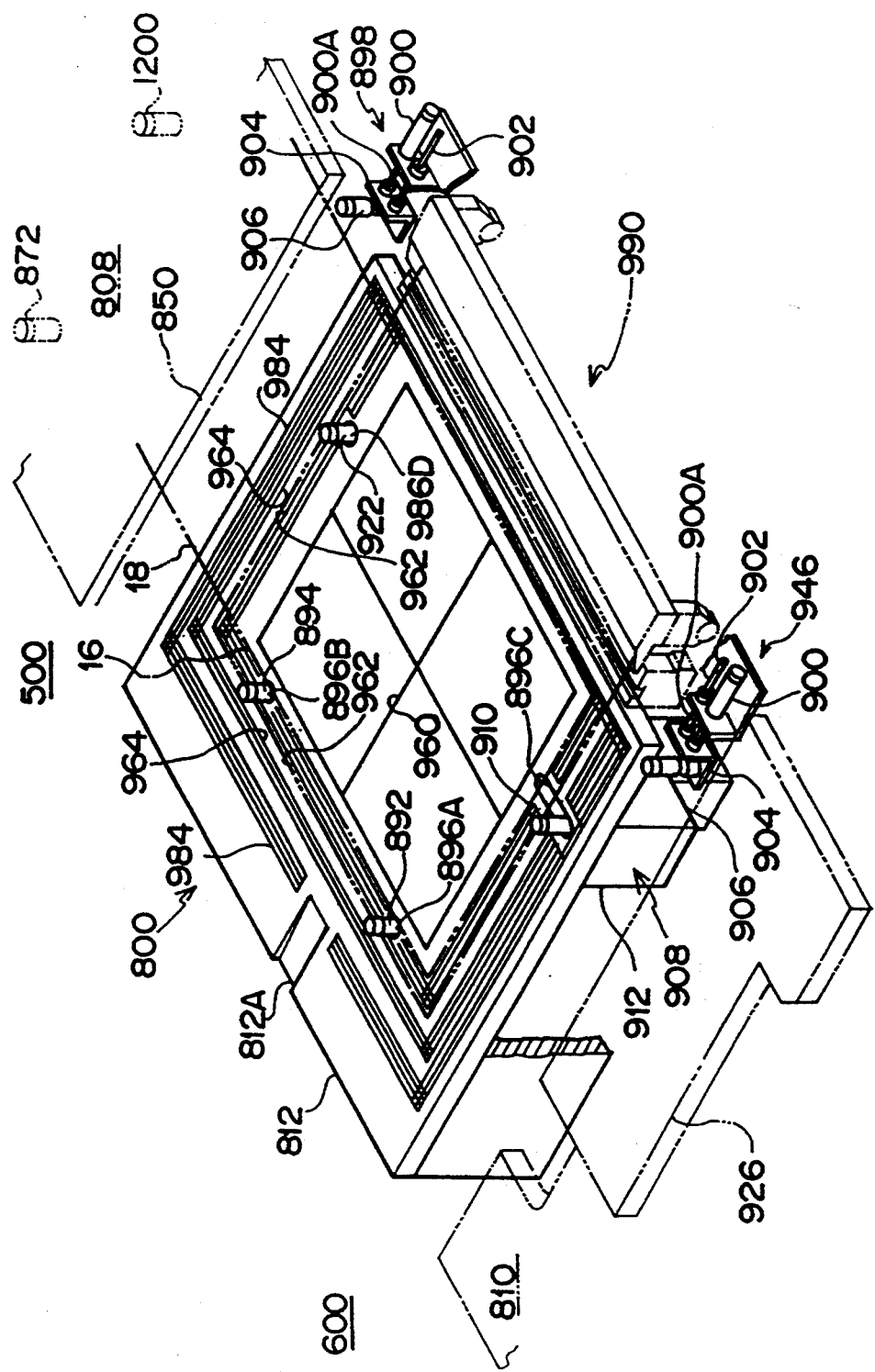
FIG. 36 is a schematic perspective view of the printing surface plate.

As shown in FIG. 36, the printing surface-plate section 800 adjacent to the first punching unit 808 is provided with the printing surface plate 812 formed in the shape of a box whose planar configuration is substantially rectangular whose lower side is open. Placed on the upper surface of the printing surface plate 812 are the punching table 850 of the first punch unit 808 as well as the PS plate 18 supplied from the transporting-direction inverting section 500. An image-area portion of the PS plate 18 on the top side is placed on the printing surface plate 812. The negative film 16 is superposed on this PS plate 18, and the image recorded on the negative film 16 is printed on the photosensitive surface of the PS plate 18 by means of the light source unit 802 (not shown in FIG. 36).

Pin rollers 892 and 894 are disposed on an end of the printing surface plate 812 closer to the transporting-direction inverting section 500. Upper half portions of the pin rollers 892 and 894 respectively project upward from through holes 896A and 896B formed in the printing surface plate 812 as the cylinders 876 (see FIG. 35) disposed interiorly of the printing surface plate 812 are driven. These pin rollers 892 and 894 are arranged in alignment with the pin roller 874, and are accommodated in the through holes 896A and 896B in the same way as the pin roller 874 when the PS plate 18 is fed from the transporting-direction inverting section 500. In addition, these pin rollers 892 and 894 are also accommodated in the through holes 896A and 896B when the PS plate 18 is discharged to the PS-plate discharging section 600. It should be noted that the printing surface plate 812 is provided with a notch 812A at an end thereof closer to the transporting-direction inverting section 500, so as not to interfere with the distal ends of the pushing pawls 542 of the transporting-direction inverting section 500.

The pin roller 892 is adapted to effect the positioning of the PS plate 18 in the transverse direction thereof in the same way as the pin roller 874 of the first punching unit 808. A pusher 898 is disposed between the printing surface plate 812 and the punching table 850 in correspondence with the pin rollers 874 and 892.

The pusher 898 operates to move the PS plate 18 in one direction, and has a cylinder 900 and a guide shaft 902 which are arranged in parallel with each other. A pin roller 906 is attached to a bracket 904 extending between a distal end of a rod 900A of the cylinder 900 and a distal end of the guide shaft 902. The pusher 898 presses a transverse end face of the PS plate 18 toward the pin rollers 874 and 892 as the cylinder 900 is driven. As a result, the positioning of the PS plate 18 in the transverse direction is effected in the state in which the PS plate 18 extends between the punching table 850 and the printing surface plate 812.

Meanwhile, a pusher 908 which moves the PS plate 18 in another direction is disposed at an end of the printing surface plate 812 which is the end away from the first punching unit 808. This pusher 908 is opposed to the pin roller 872 of the first punching unit 808. By means of this pusher 908, the PS plate 18 is brought into contact with the pin roller 872 to effect the positioning of the PS plate 18 in the top-and-bottom direction between the first punching unit 808 and the printing surface-plate section 800, and to effect the positioning of the PS plate 18 on the printing surface plate 812.

Figure 37B:
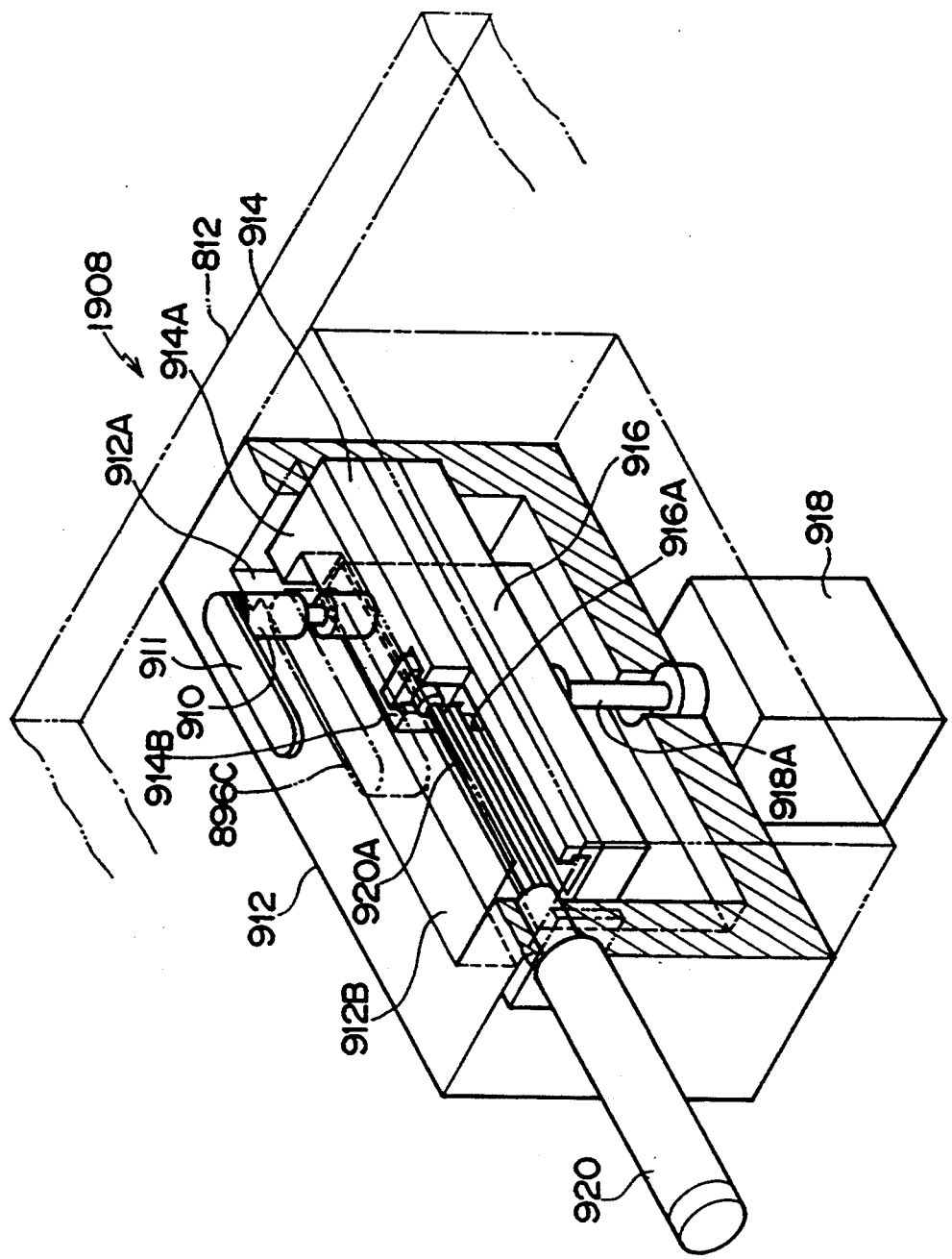
FIG. 37B is a schematic perspective view of another specific example of the pusher.
Figure 38:
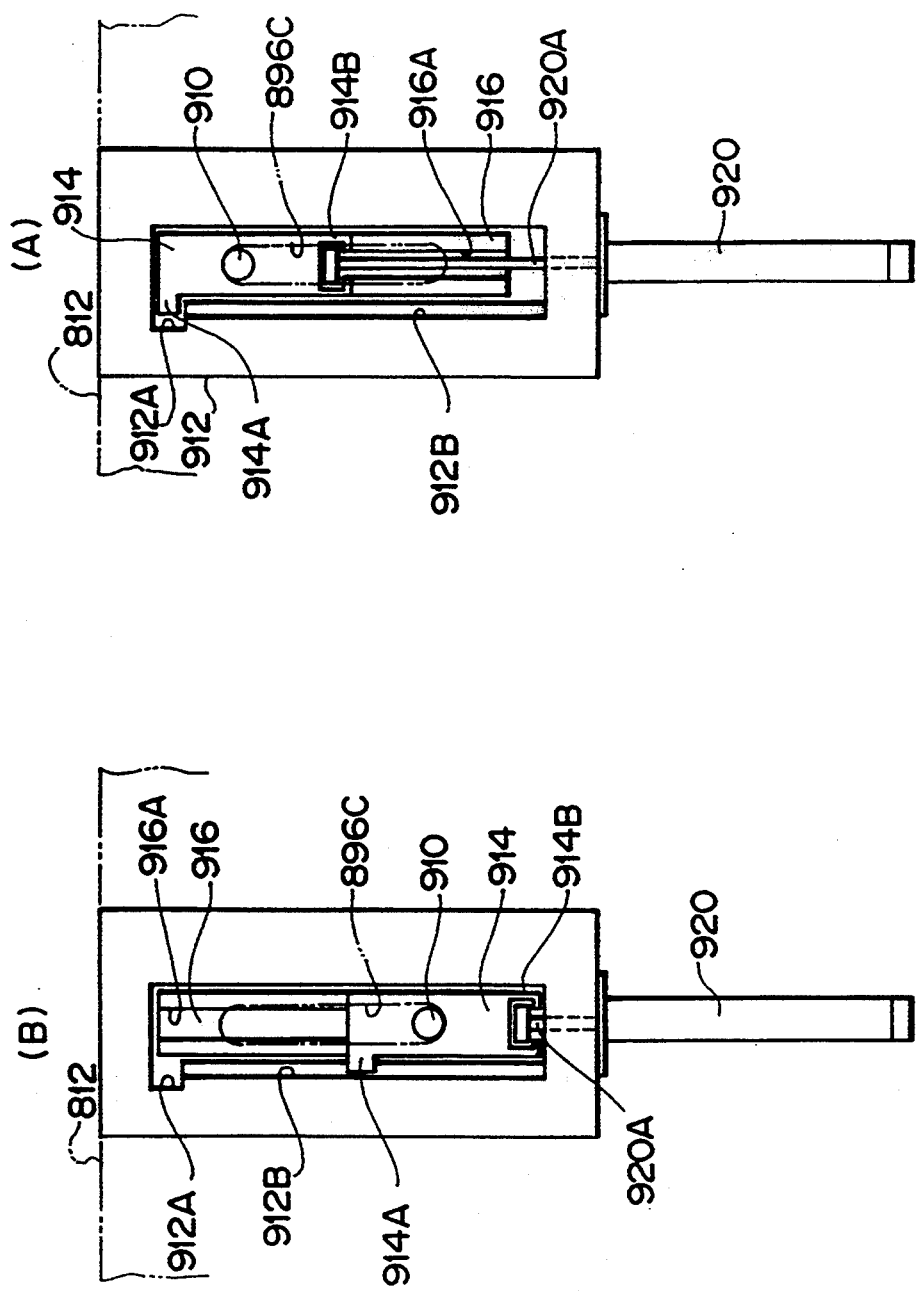

As shown in FIG. 37A and FIGS. 38A and 38B, the pusher 908 is provided with a pin roller 910, for pushing the PS plate 18, projecting from an elongated hole 896C formed in the printing surface plate 812 and extending toward the first punching unit 808. The pusher 908 has an elongated and substantially rectangular casing 912 whose upper side is open and which is mounted below the through hole 896C. Formed on an inner surface of the casing 912 is a vertical groove 912A extending vertically at one end of a wall surface for guiding a slide block 914 in a vertical direction. An upper end of this vertical groove 912A communicates with a horizontal groove 912B formed in the longitudinal direction of the casing 912 for guiding the slide block 914 along the elongated hole 896C.

A slide block 914 having the pin roller 910 disposed upright on the upper surface thereof is slidably disposed inside this casing 912. A projection 914A is formed on the slide block 914. As this projection 914A is fitted in the vertical groove 912A, the slide block 914 becomes movable along the vertical groove 912A, while as the projection 914A is fitted in the horizontal groove 912B, the slide block 914 is movable along the horizontal groove 912B. In addition, in the state in which the slide block 914 is fitted in the horizontal groove 912B, the pin roller 910 projects upward from the elongated hole 896C (see FIG. 37A).

FIG. 37B shows another specific example 1908 of the pusher 908. A horizontal plate 911, for separating the negative film 16 from PS plate 18, is attached to an upper end of the pin roller 910. The longitudinal direction of this plate 911 is set to be the same as the direction toward the printing surface plate 812, i.e., the top-and-bottom direction of the PS plate 18. The pin roller 910 is attached to a longitudinal end (an end away from the printing surface plate) of this plate 911. The elements other than the plate 911 and their operation are the same as the pusher 908 shown in FIG. 37A.

Figure 37C:
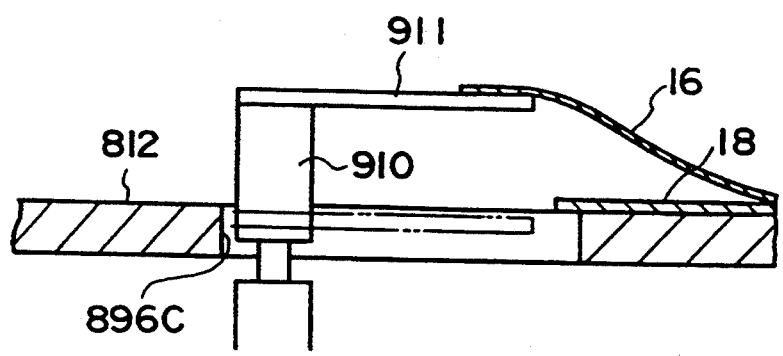
FIG. 37C is a side cross-sectional view illustrating a state in which the negative film is separated by the pusher.

As shown in FIG. 37C, when the pin roller 910 and the plate 911 are made to project upward, the negative film 16 is superposed on the PS plate 18 placed on the printing surface plate 812, and the peripheral edges of the negative film 16 protrude from the PS plate 18.

The plate 911 has such a length that the plate 911 interferes with only this protruding portion of the negative film 16 when the plate is made to project upward. The arrangement provided is such that the plate 911 operates to separate the negative film 16 from the PS plate 18 and the negative film 16 is lifted up as the pin roller 910 and the plate 911 undergo projecting motion.

Thanks to the lifting up of the negative film 16 by this plate 911, the pin roller 910 is prevented from interfering with the negative film 16 when the pin roller 910 pushes the PS plate 18 (i.e., moves in a direction perpendicular to its axial direction for positioning, which will be described later).

A guide rail 916 is laid underneath the slide block 914 within the casing 912. A groove 916A is formed on the upper surface of the guide rail 916, and the slide block 914 is slidably engaged in this groove 916A. A distal end of a rod 918A of a cylinder 918 attached to the underside of the casing 912 is coupled to a central portion of the lower surface of the guide rail 916. The cylinder 918 operates to move the slide block 914 along the vertical groove 912A. As the cylinder 918 is driven, the guide rail 916 is vertically movable within the casing 916. Consequently, in the state in which the projection 914A is located at a lower end of the vertical groove 912A, the slide block 914 is raised as the cylinder 918 is driven, thereby allowing the pin roller 910 to project upward from the elongated hole 896C.

A cylinder 920 for moving the sliding block 914 along the horizontal groove 912B, is attached to a side of the casing 912 closer to the first punching unit 808. A distal end of a rod 920A of the cylinder 920 is inserted in the casing 912, and is engaged with an engaging portion 914B of the slide block in a state in which the projection 914A is located in the horizontal groove 912B. The rod 920A of the cylinder 920 is adapted to be disengaged from the engaging portion 914B as the slide block 914 moves vertically. As the cylinder 920 is driven, the slide block 914 slides along the Guide rail 916, and the pin roller 910 moves in the elongated hole 896C toward the first punching unit 808 (in the state shown in FIG. 38B).

As a result of the movement of this pin roller 910, the top-side end of the PS plate 18 on the printing surface plate 812 is pushed toward the first punching unit 808. Consequently, the PS plate 18 is brought into contact with the pin roller 872 of the first punching unit 808, and the top-side image printing area of the PS plate 18 is positioned on the printing surface plate 812. As shown in FIG. 36, a pin roller 922 is disposed at the end of the printing surface plate 812 closer to the first punching unit 808 in such a manner as to be capable of projecting upward and retracting downward from a through hole 986D, so as to effect the positioning of the PS plate 18 in the longitudinal direction thereof in a state in which the PS plate 18 extends between the printing surface plate 812 and the second punching unit 810. This pin roller 922 is also attached to a distal end of a rod 864A of the cylinder 864. As the cylinder 864 is driven, this pin roller 922 is made to project above the upper surface of the printing surface plate 812 from the through hole 986D.

As shown in FIG. 36, a pin roller 1200 for positioning the longitudinal direction of the PS plate 18 is disposed at an end of the first punching unit 808.

Figure 39:
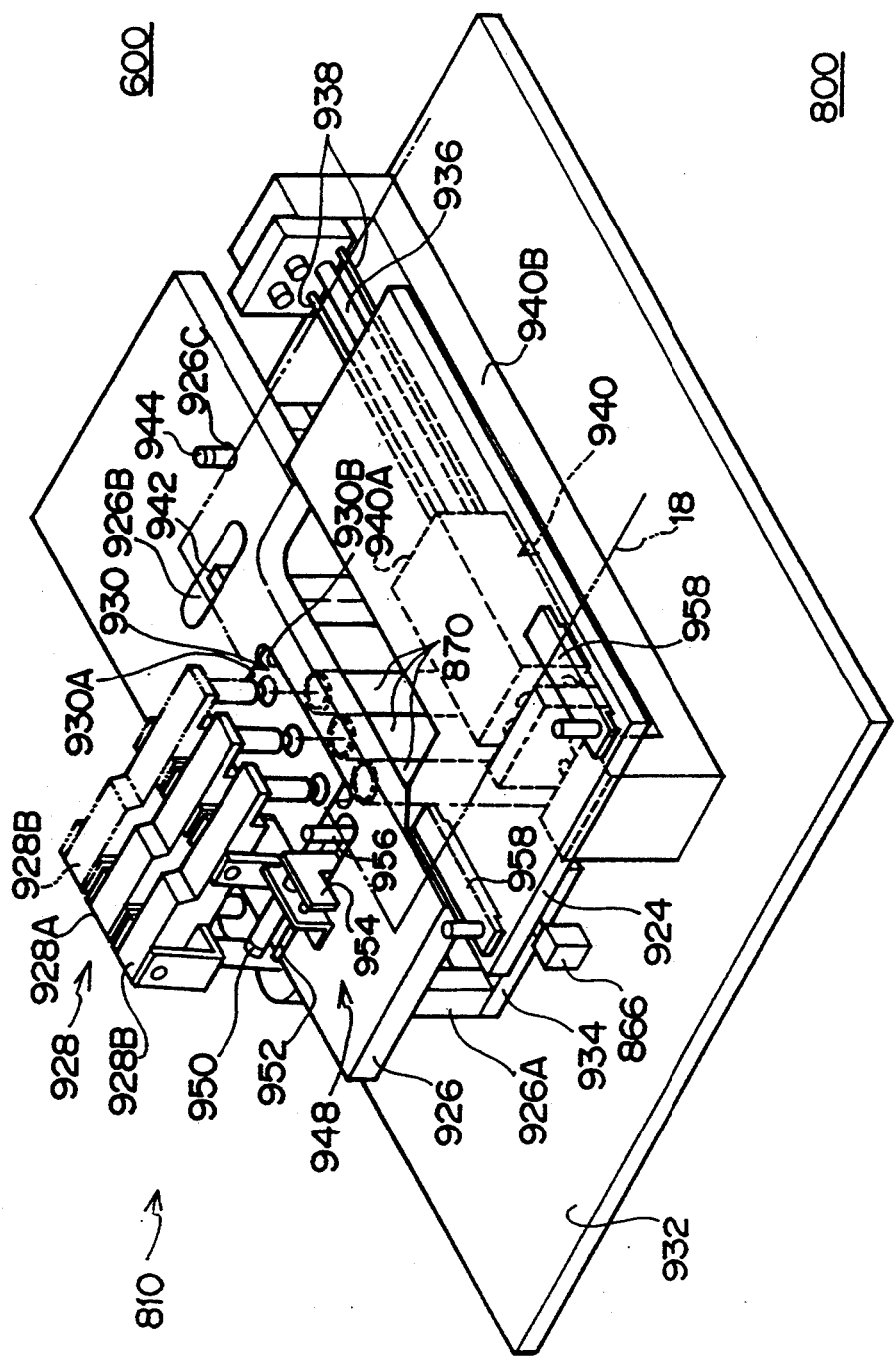
FIG. 39 is a perspective view of essential portions of a second punching unit.
Figure 40:
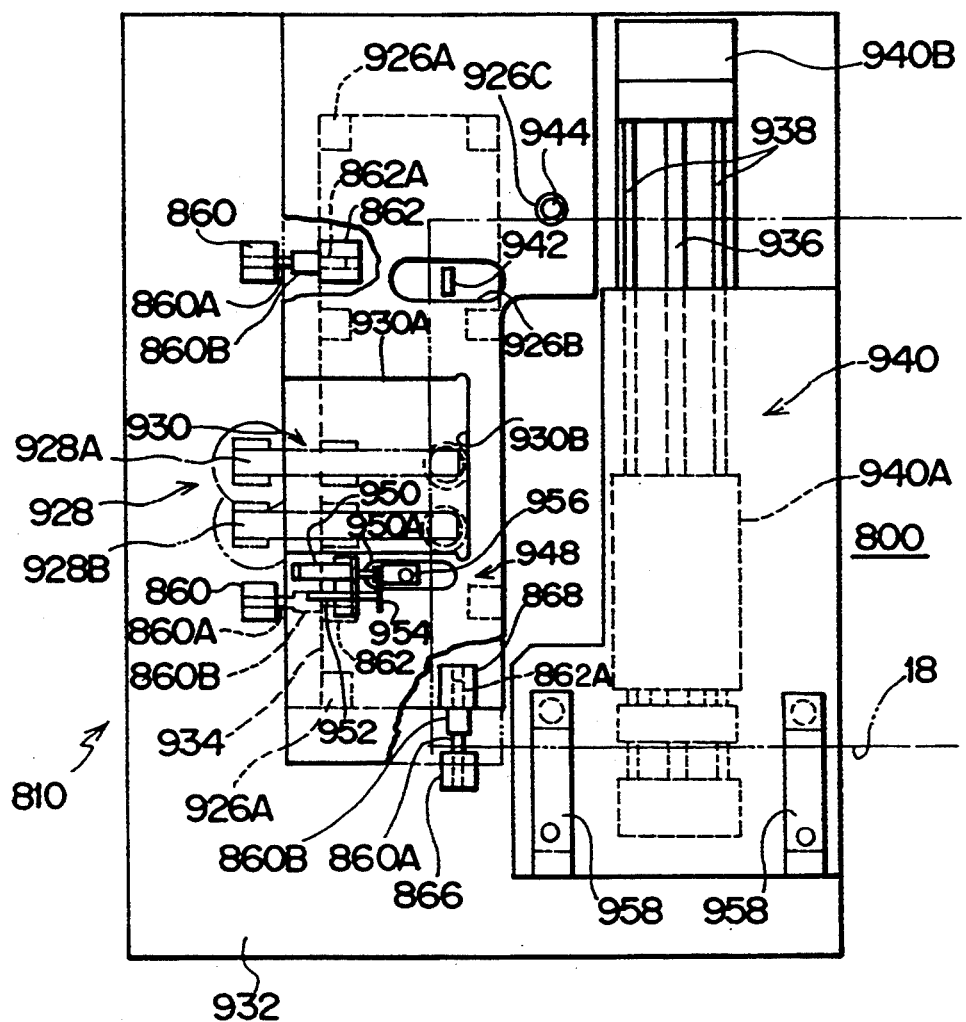
FIG. 40 is a plan view of essential portions of the second punching unit.

The second punching unit 810 is located in the vicinity of the printing surface plate 812 on the side away from the first pinching unit 808. As shown in FIGS. 39 and 40, in the second punching unit 810, a movable punching table 924 is disposed on the printing surface plate 812 side, while a fixed punching table 926 is disposed on the side away from the printing surface plate 812. A recess 930 is formed in the fixed punching table 926 for mounting a puncher 928 for forming punch holes (serving as a reference for plate bending) in the top-side end of the PS plate 18. This recess 930 is formed at an end of the fixed punching table 926. The puncher 928 is mounted by being abutting one lateral side surface 930A and an innermost side surface 930B, and the lateral side surface 930A and the innermost lateral side surface 930B serve as a reference for mounting the puncher 928 in the fixed punching table 926.

A main base 932 is attached to the unillustrated frame below the fixed punching table 926 and the movable punching table 924. The fixed punching table 926 is supported by a sub-base 934 on the main base 932 by a plurality of legs 926A.

The pair of blocks 860 are secured to an end of the main base 932 which is the end away from the printing surface-plate section 800. The pair of blocks 862 are mounted on the sub-base 934 in such a manner as to oppose the respective pair of blocks 860 along the direction toward and away from the printing surface-plate section 800. The screw 860A of the block 860 and the screw 862A of the block 862 are threadedly engaged by the nut 860B, so that the distance between the blocks 860 and 862 is adjustable.

In addition, the block 866 is mounted on the main base 932, while the block 868 opposing the block 866 along the direction perpendicular to the direction toward and away from the printing surface-plate section 800 is mounted on the sub-base 934. The screw 860A of the block 866 and the screw 862A of the block 868 are threadedly engaged by the nut 860B, so that the distance between the blocks 866 and 868 is adjustable. The mounting position of the second punching unit 810 with respect to the printing surface-plate section 800 is determined through the above-described adjustments.

The second punching unit 810 punches in the top-side end of the PS plate 18 punch holes serving as a reference for plate bending by using the puncher 928. As the puncher 928, it is possible to attach a puncher unit 928A for punching a circular hole and a puncher unit 928B for punching a rectangular hole. The punchers 928A and 928B can be mounted by being selected and combined in correspondence with a lithographic printer (not shown) which is to be used. The scraps receivers 870 are disposed below the respective puncher units 928A and 928B as well (see FIG. 39).

A drive unit 940 comprised of a rodless cylinder 936 and a pair of guide shafts 938 arranged on both sides of the rodless cylinder 936 is disposed below the lower surface of the movable punching table 924. This drive unit 940 is provided with a drive block 940A. Opposite ends of the drive unit 940 are secured to the main base 932 by means of a bracket 940B. Consequently, as the rodless cylinder 936 is driven, the movable punching table 924 is moved toward the PS-plate discharging section 600 along the transverse direction of the PS plate 18. It should be noted that the movable punching table 924, when on standby, is located at an end of the second punching unit 810 which is the end away from the PS-plate discharging section 600.

Unillustrated transport rollers are arranged between the printing surface-plate section 800 and the second punching unit 810. The arrangement provided is such that the PS plate 18 is pushed out from the first punching unit 808 by the pusher 884, and the leading end of the PS plate 18 is brought into contact with the transport rollers (not shown) so as to impart a transporting force to the PS plate 18. Thus the leading end of the PS plate 18 is passed over the movable punching table 924 and reaches the vicinity of the puncher 928 of the fixed punching table 926. That is, the other half printing surface of the PS plate 18 can be placed on the printing surface plate 812.

An elongated hole 926B is formed in the fixed punching table 926 in the vicinity of the puncher 928, and a plate detection sensor 942 disposed below this elongated hole 926B detects the leading end of the PS plate 18 fed onto the fixed punching table 926. When the plate detection sensor 942 detects the leading end of the PS plate 18, the driving of the aforementioned transport rollers is stopped.

In the fixed punching table 926, a pin roller 944 is disposed on the PS-plate discharging section 600 side in such a manner as to be capable of projecting upward or retracting downward from a through hole 926C. This pin roller 944 is used to effect the positioning of the PS plate 18 in the transverse direction thereof in the second punching unit 810. The pin roller 944 is made to project upward or retract downward from the through hole 926C as the cylinder 876 mounted on the underside of the fixed punching table 926 is driven. This through hole 926C is formed in the fixed punching table 926 by using the recess 930 as a reference, and the position of the pin roller 944 is determined with respect to the puncher 928.

The position of the fixed punching table 926 is determined in such a manner that the pin roller 944 is aligned with the pin rollers 892 and 894 of the printing surface plate 812, with the result that the pin roller 874 of the first punching unit 808 is also aligned therewith.

As shown in FIG. 36, a pusher 946 is disposed between the printing surface plate 812 and the second punching unit 810. In the same way as the pusher 898 disposed between the first punching unit 808 and the printing surface plate 812, this pusher 946 causes the PS plate 18 to be brought into contact with the pin roller 944 and the pin roller 894 of the printing surface plate 812 so as to effect the positioning of the PS plate 18 in the transverse direction thereof.

As shown in FIGS. 39 and 40, a pusher 948 corresponding to the longitudinal leading end (top side) of the PS plate 18 is disposed in the fixed punching table 926 in the vicinity of the puncher 928. The pusher 948 has a cylinder 950 and a guide shaft 952 which extend in the longitudinal direction of the PS plate 18. A pin roller 956 is attached to a distal end of a rod 950A of the cylinder 950 and a distal end of the guide shaft 952 via a bracket 954. The pusher 948 pushes the top-side end face of the PS plate 18 by means of the pin roller 956 to allow the PS plate 18 to be brought into contact with the pin roller 922 of the printing surface plate 812. As a result, the positioning of the PS plate 18 in the longitudinal direction thereof is effected in a state in which the PS plate 18 extends between the second punching unit 810 and the printing surface plate 812, and the image-forming area on the bottom side of the PS plate 18 is positioned on the printing surface plate 812.

In the printing surface-plate section 800, the first punching unit 808, and the second punching unit 810, since the pin rollers 874 (first punching unit 808), 892, 894 (printing surface-plate section 800), and 944 (second punching unit 810) are aligned with each other, the image printed on the PS plate 18 is arranged accurately along the longitudinal direction of the PS plate 18.

Two holders 958 are disposed at a position corresponding to an end of the movable punching table 924, as viewed in the transverse direction of the PS plate 18, which is an end away from the PS-plate discharging section 600. The holders 958 are actuated by air supplied by an unillustrated air supplying means so as to nip and hold a transverse end of the PS plate 18 on the upper surface of the movable punching unit 924. As the rodless cylinder 936 of the drive unit 940 is driven in a state in which the PS plate 18 is held by the holder 958, the movable punching table 924 is moved to allow the PS plate 18 to be fed to the PS-plate discharging section 600. In this state, if the state in which the PS plate 18 is held by the holder 958 is canceled, the PS plate 18 is delivered to the PS-plate discharging section 600.

Figure 41:
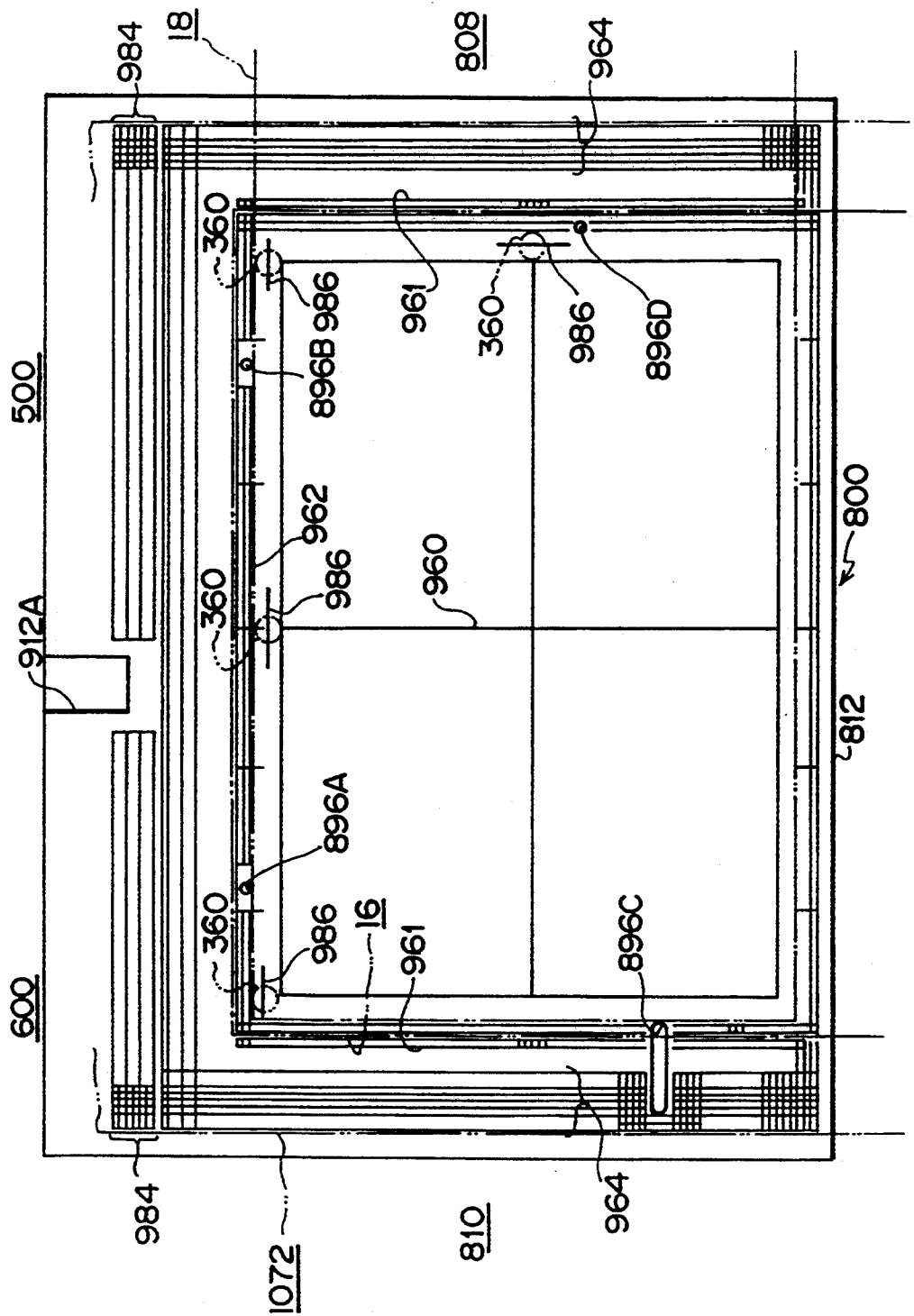
FIG. 41 is a schematic plan view of suction grooves of the printing surface plate.

As shown in FIG. 41, suction grooves 960 for sucking and holding the PS plate 18 positioned on the printing surface plate 812 are provided in a central portion of the printing surface plate 812. The suction grooves 960 are formed in a substantially rectangular shape. Negative pressure is supplied from an unillustrated ejector to these suction grooves 960 to suck the PS plate 18 and hold it onto the printing surface plate 812.

A suction groove 962 is formed outside the suction grooves 960 in such a manner as to surround the same. This suction groove 962 corresponds to peripheral edges of the negative film 16 placed on and protruding from the PS plate 18, and is adapted to suck the negative film 16 and hold it onto the printing surface plate 812 as negative pressure is supplied thereto.

Figure 42:
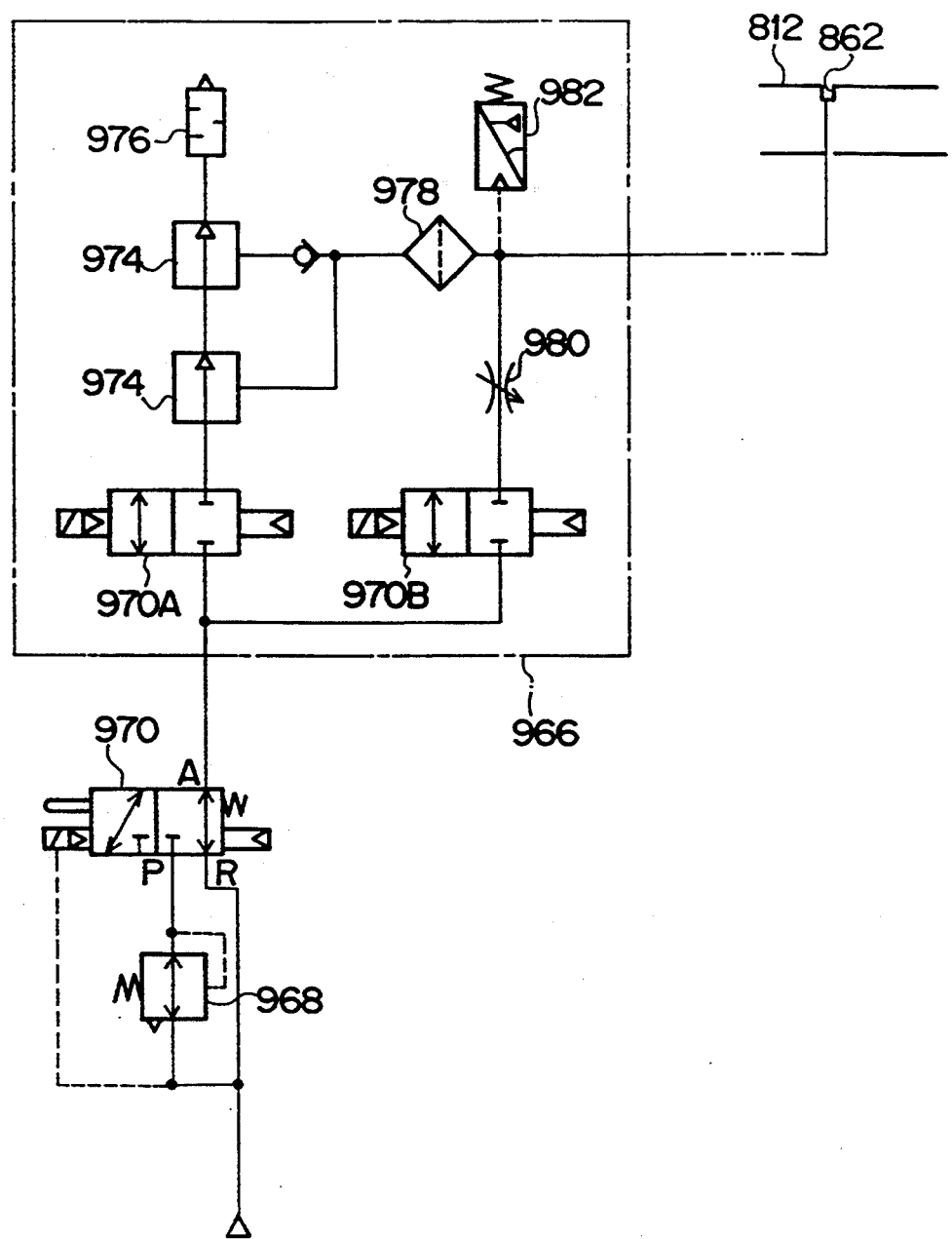
FIG. 42 is a block diagram illustrating the arrangement of an ejector unit.

FIG. 42 shows an example of an ejector unit 966 for supplying negative pressure to the suction groove 962 for sucking the negative film 16. In this ejector unit 966, air of a fixed pressure supplied by an unillustrated air supplying means and air whose pressure has been reduced via a regulator 968 are changed over by means of a solenoid valve 970.

The ejector unit 966 is provided with a solenoid valve 972A for producing negative pressure and a solenoid valve 972B for canceling a vacuum. Connected to the solenoid valve 972A for producing negative pressure are two vacuum-producing nozzles 974 and a silencer 976. A pipe for communicating with the suction groove 962 in the printing surface plate 812 is connected to the vacuum-producing nozzles 974 via a filter 978. It should be noted that the downstream-side vacuum-producing nozzle 974 is provided with a check valve A.

The solenoid valve 972A for cancelling negative pressure is connected to an intermediate portion of a pipeline communicating with the suction groove via a throttle valve 980. In addition, this pipeline is provided with a vacuum switch 982, thereby making it possible to detect the state of vacuum of the suction groove 962 and the operating state of the ejector unit 966.

For this reason, the peripheral edges of the negative film 16 are sucked and held on the outer side of the PS plate 18 by means of the negative pressure supplied from the ejector unit 966. In addition, the negative pressure supplied to the suction groove 962 has been dropped since the pressure of the air for producing the negative pressure is reduced via the regulator 968 before the air is supplied to the ejector unit 966.

As shown in FIG. 41, the printing surface plate 812 is provided with suction grooves 961 on the first punching unit 808 side and the second punching unit 810 side of the suction groove 962. These suction grooves 961 are used in cases where the negative film 16 is of a size protruding from the suction groove 962. When these suction grooves 961 are used, the pipe from the ejector unit 966 for supplying negative pressure to the suction groove 962 is connected to the suction grooves 961.

In addition, the printing surface plate 812 are provided with suction grooves 964 on the outer sides of the suction groove 982 on the first punching unit 808 side, the transporting-direction inverting section 500 side, and the second punching unit 810 side. Suction grooves 984 are formed on the outer side of the suction grooves 964 on the transporting-direction inverting section 500 side. These suction grooves 964 and 984 are used to suck and hold an overlay sheet (see FIG. 45) for bringing the negative film 16 into close contact with the PS plate 18.

Furthermore, the printing surface plate 812 is provided with grooves between the suction grooves 960 for sucking the PS plate 18 and the suction groove 962 for sucking the negative film 16 at positions corresponding to the suckers 360 provided in the third film transport unit 350 and the fourth film transport unit 354. These grooves 986 are elongated more than the outside dimension of the suction surface of each sucker 360, and are provided at positions where they do not interfere with the adjacent suction grooves 960 and 962. In the printing surface-plate section 800, the discharge of the PS plate 18 in a state in which the negative film 16 is arranged on the printing surface plate 812. In the state in which the PS plate 18 is discharged from the printing surface plate 812, when the negative film 16 is sucked by the suckers 360, the negative film 16 is pressed by the suckers 360 and is brought into close contact with the printing surface plate 812. At this time, the state of close contact between the negative film 16 and the printing surface plate 812 is prevented from occurring by virtue of the air entering from the grooves 986.

As shown in FIG. 36, the pin bar 990, which holds a side of negative film 16, is disposed adjacent to the printing surface plate 812 on the front side of the printer. This pin bar 990 is adapted to hold the negative film 16 arranged on the upper surface of the PS plate 18 placed on the printing surface plate 812.

Figure 43A:
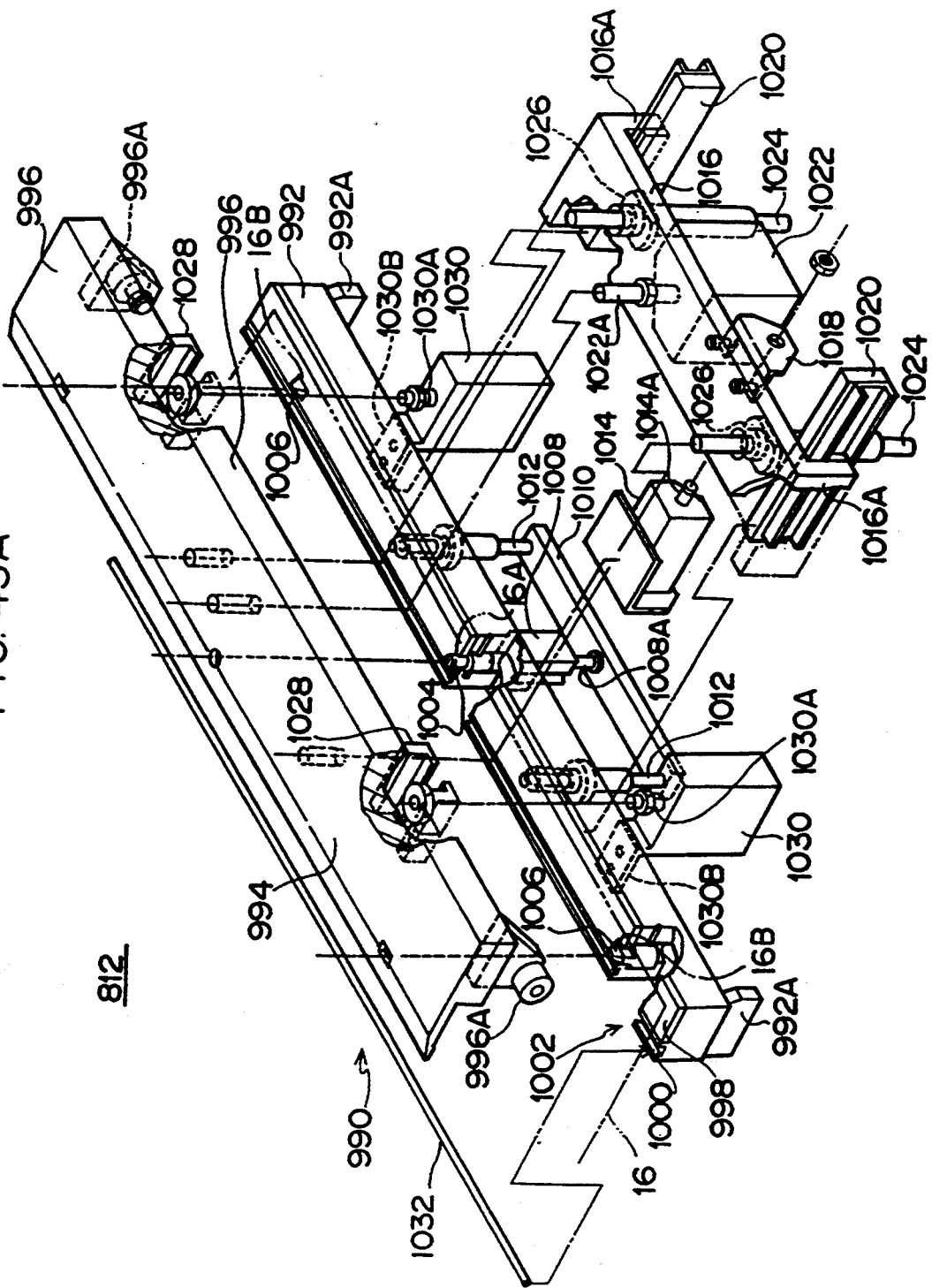
FIG. 43A is a perspective view of a pin bar.

As shown in FIG. 43A, the pin bar 990 for holding the side of the negative film 16, is comprised of an elongated and main-body block 992, which is rectangular in shape, and an elongated pressing portion 996 in which an eaves portion 994 is formed in such a manner as to cover the upper surface of the main-body block 992. The pin bar 990 is arranged such that the longitudinal direction of the main-body block 992 is parallel with the longitudinal direction of the printer.

On the upper surface of the main-body block 992, an elongated rectangular push-up plate 998 is disposed along the elongated longitudinal direction at an end of the main-body block 992 which is the end away from the printing surface plate 812 in such as a manner as to be vertically movable. A groove section 1002 having a groove 1000 which is upwardly open is formed on that side of the push-up plate 998 which is closer to the printing surface plate 812.

A pin 1004 is disposed uprightly at a longitudinally central portion of this main-body block 992. A pair of pins 1006 are disposed uprightly on both sides of the pin 1004 along the longitudinal direction of the main-body block 992. The pin 1004 and the pins 1006 project upwardly by being passed through the push-up plate 998. The dimension between the axis of the pin 1004 and the axis of each pin 1006 is identical with the dimension between the punch holes 16A and 16B formed in the negative film 16 by the positioning punch-hole punching section 200. The pin 1004 and the pins 1006 are respectively inserted into the punch hole 16a and the punch holes 16B of the negative film 16 placed on the printing surface plate 812.

The cylinder 1008 for moving push-up plate 998 is now described. A cylinder 1008 is disposed at a central portion of the underside of the main-body block 992, and an intermediate portion of a support bar 1010 is coupled to a distal end of a downwardly extending rod 1008A of this cylinder 1008. One end of a guide shaft 1012 is coupled to each opposite end of this support bar 1010. Distal end portions of these guide shafts 1012 are oriented upwardly in parallel with the rod 1008A of the cylinder 1008, are passed through the main-body block 992, and are coupled to the push-up plate 998. For this reason, when the rod 1008A is extended by the driving force of the cylinder 1008, the push-up plate 998 is fitted to the main-body block 992. When the rod 1008A is retracted, the push-up plate 998 then moves upwardly relative to the main-body block 992, thereby allowing the pin 1004 and the pins 1006 to be released from the push-up plate 998.

The operation of the push-up plate 998 for pushing up a side portion of the negative film 16 to disengage the negative film 16 from the pins is now described. When the push-up plate 998 is moved upwardly with the pin 1004 and the pins 1006 inserted in the punch holes 16A and 16B, the end of the negative film 16 is raised, and the pin 1004 and the pins 1006 are released from the punch holes 16A and 16B, so that the negative film 16 is disengaged from the pin bar 990.

A cylinder 1014, for retreating the pressing portion 996 from a positive above the elongated main body 992, is disposed on the underside of the main-body block 992 adjacent to the cylinder 1008. A rod 1014A of this cylinder 1014 is adapted to extend in a direction away from the printing surface plate 812. Coupled to a distal end of the rod 1014A is a bracket 1018 disposed at a central portion of the underside of an elongated, substantially plate-like movable bracket 1016 disposed below the pressing portion 996. Attached to the underside of the main-body block 992 is a pair of guide rails 1020 disposed on both sides of the cylinder 1014 in such a manner as to project away from the printing surface plate 812. A pair of sliders 1016A projecting downward from both ends of the movable bracket 1016 are slidably engaged on these guide rails 1020, respectively. Consequently, when the rod 1014A of the cylinder 1014 is extended, the movable bracket 1016 is moved along the guide rails 1020 relative to the main-body block 992 in the direction away from the printing surface plate 812.

A cylinder 1022 is disposed at a central portion of the underside of the movable bracket 1016, and a rod 1022A of this cylinder 1022 is passed through the movable bracket 1016, and a distal end of the rod 1022A is coupled to the pressing portion 996. In addition, a pair of vertically extending guide shafts 1024 are provided at both ends of the movable bracket 1016. An intermediate portion of each of these guide shafts 1024 is slidably inserted in a slide bearing 1026 disposed in the movable bracket 1016. An upper end of each of these guide shafts 1024 is coupled to the pressing portion 996. Consequently, when the rod 1022A of the cylinder 1022 is extended, the pressing portion 996 is moved upward relative to the movable bracket 1016.

A pair of short, rail-like projections 1028 are respectively formed on the underside of the pressing portion 996 at opposite ends thereof. A distal end of a rod 1030A of a cylinder 1030 is adapted to be engaged in each of these projections 1028. The cylinder 1030 is disposed on a bracket 1030B mounted on the underside of the main-body block 992. The projection 1028 and the distal end of the rod 1030A can be engaged with each other in a state in which the eaves portion 994 is located above the main-body block 992. If the cylinder 1030 is driven with each projection 1028 and each rod 1030A engaged with each other, and the pressing portion 996 together with the movable block 1016 is moved in the direction away from the printing surface plate 812, the distal end of the rods 1030A are disengaged from the projections 1028, respectively.

The pressing portion 996 is moved by cylinder 1030 to press on negative film 16 as follows. If the rods 1030A are lowered with the distal ends of the rods 1030A and the projections 1028 engaged with each other, the pressing portion 996 is lowered and is brought into contact with the upper surface of the push-up plate 998 and the groove portion 1002 so as to cover these members. A pair of tapered guides 992A are respectively disposed on the underside of the main-body block 992 at opposite ends thereof, while a pair of rollers 996A opposing the guides 992A are disposed at opposite ends of the pressing portion 996. The arrangement provided is such that when the rollers 996A are brought into contact with the respective guides 992A by the driving forces of the cylinder 1030, and the pressing portion 996 is thereby lowered, the pressing portion 996 is pulled slightly in a direction away from the printing surface plate 812. As a result, the negative film 16 can be nipped reliably between the eaves portion 994 and the main-body block 992.

In addition, an inflatable pipe 1032 formed of a resilient material such as rubber and having one end closed is fitted in the groove 1000. An unillustrated air supplying means is coupled to this inflatable pipe 1032. The inflatable pipe 1032 is accommodated in the groove 1000 in a shrunk state, and when air is supplied thereto, the inflatable pipe 1032 is inflated, so that a portion of its outer peripheral portion projects to the outside from the groove 1000. Consequently, an end of the negative film 16 is pressed against the underside of the eaves portion 994, thereby allowing the negative film 16 to be held by the pin bar 990.

Figure 44:
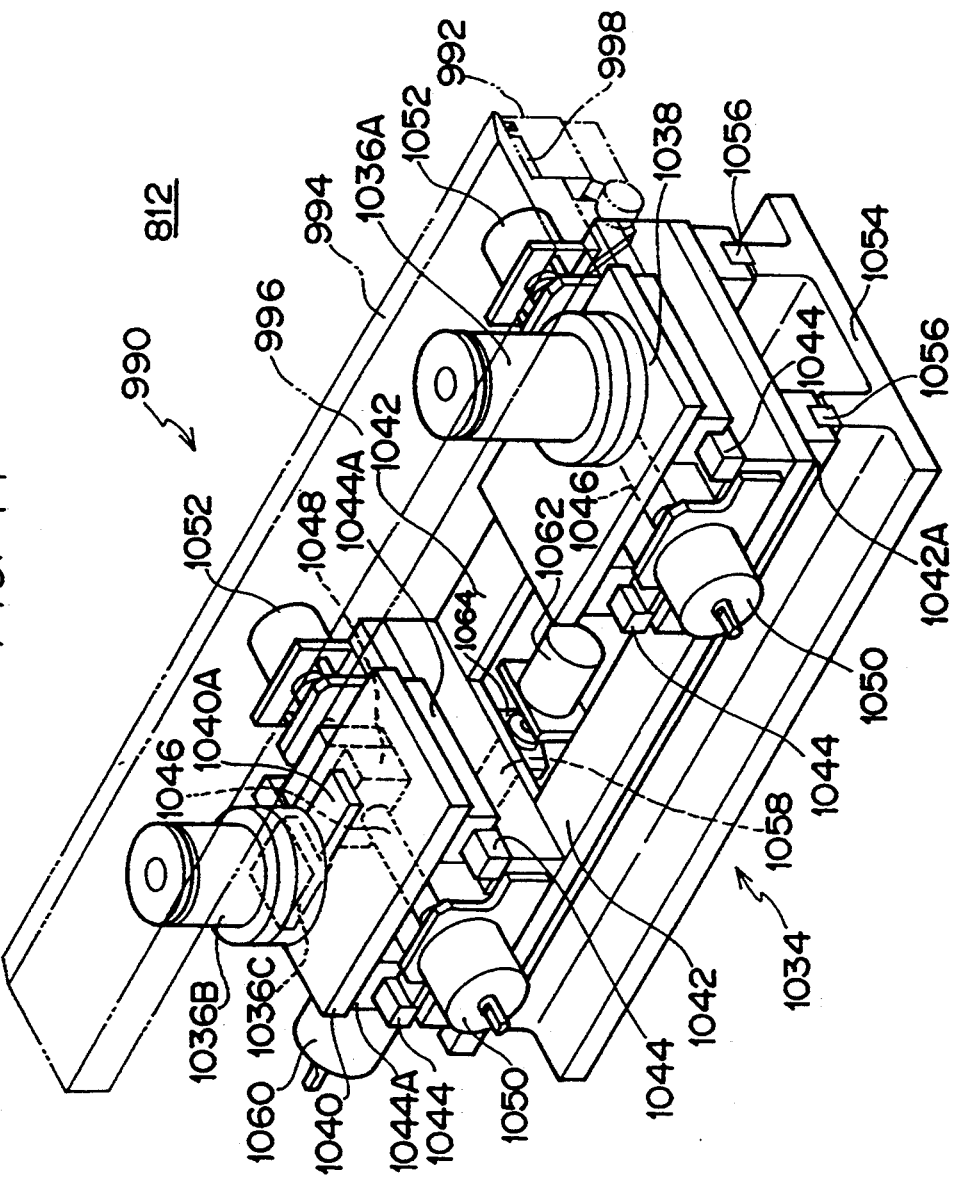
FIG. 44 is a perspective view of essential portions of a moving mechanism unit for moving the pin bar.

A moving mechanism unit 1034 for moving the position of the pin bar 990 relative to the printing surface plate 812 is disposed below the pin bar 990. As shown in FIG. 44, blocks 1036A and 1036B are disposed on the underside of the main-body block 992 of the pin bar 990 and at positions substantially below the respective pins 1006. The block 1036A is rotatably supported by a first movable base 1038. In addition, a slider 1036C is disposed on the underside of the block 1036B, so that the blocks 1036B and the slider 1036C are rotatable relative to each other. This slider 1036C is slidably engaged in a guide rail 1040A disposed on the upper surface of a second movable base 1040 on the printing surface plate 812 side thereof. As a result, the block 1036B is supported on the second movable base 1040.

A sub-base 1042 is disposed below the first and second movable bases 1038 and 1040. The sub-base 1042 is formed of a substantially elongated rectangular flat plate, and is arranged such that its longitudinal direction is parallel with an end of the adjacent printing surface plate 812. A pair of guide rails 1044 and a ball screw 1046 arranged in parallel with the guide rails 1044 are disposed between the first movable base 1038 and the sub-base 1042 and between the second movable base 1040 and the sub-base 1042, respectively. These members are arranged along a direction perpendicular to the longitudinal direction of the sub-base 1042.

A pair of sliders 1044A slidably engaged on the guide rails 1044 are disposed on the underside of each of the first and second movable bases 1038 and 1040. Also disposed thereon is a driving block 1048 threadedly engaged on an intermediate portion of the ball screw 1046. The position of threaded engagement of the driving block 1048 undergoes relative movement along the axial direction of the ball screw 1046 by the rotation of the ball screw 1046. A pulse motor 1050 for rotating the ball screw 1046 is provided at one end of the ball screw 1046. A rotary encoder 1052 for detecting an amount of rotation of the ball screw 1046 is disposed at the other end of the ball screw 1046. The position of threaded engagement of the driving block 1048 is moved by the rotation of the ball screw 1046, and an amount of this movement can be detected by the rotary encoder 1052.

Consequently, the first and second movable bases 1038 and 1040 are respectively adapted to move individually toward or away from the printing surface plate 812 as their respective pulse motors 1050 are driven. In a case where their amounts of movement differ, the pin bar 990 rotates about one of the pins 1006.

A substantially flat main base 1054 attached to the unillustrated frame of the printer body is disposed below the sub-base 1042. A pair of guide rails 1056 corresponding to transverse ends of the underside of the sub-base 1042 and extending along the longitudinal direction of the sub-base 1042 are disposed on the main base 1054. A pair of sliders 1042A slidably engaged on the respective guide rails 1056 are attached on the longitudinal ends of the sub-base 1042. Hence, the sub-base 1042 is supported on the main base 1050 in such a manner as to be capable of undergoing relative movement therewith.

A ball screw 1058 is disposed between the guide rails 1056 in parallel with the guide rails 1056. Axial ends of the ball screw 1058 are rotatably supported by the main base 1054.

A pulse motor 1060 for rotatively driving the ball screw 1058 is coupled to one end of the ball screw 1058, while a rotary encoder 1062 for detecting an amount of rotation of the ball screw 1058 is coupled to the other end thereof. In addition, a driving block 1064 attached to the underside of the sub-base 1042 is threadedly engaged on an intermediate portion of the ball screw 1058. The driving block 1064 is adapted to undergo relative movement along the axial direction of the ball screw 1058 by means of the rotation of the ball screw 1058. This relative movement of the driving block 1064 causes the sub-frame 1042 to be moved along the guide rails 1056 relative to the main base 1054. This movement of the sub-frame 1042 relative to the main base 1054 moves the pin bar 992 along the end of the adjacent printing surface plate 812.

As a result, as the pulse motors 1050 and 1060 of the moving mechanism unit 1034 are driven, the pin bar 990 is movable in the X-Y-$\theta$ directions with respect to the printing surface plate 812. This movement of the pin bar 990 makes it possible to change the position of the image portion of the negative film 16, held by the pin bar 990, with respect to the printing surface plate 812, thus allowing PS plate 18 and negative film 16 to be moved independently of one another. The driving of these pulse motors 1050 and 1060 is carried out accurately in correspondence with inputs from the controller 700.

A description will now be given of a modification of the above-described pin bar.

As shown in FIG. 43B, elastic members 994A and 994B formed of a sponge or the like are attached to a longitudinally central portion and opposite end portions of the underside of the eaves portion 994, i.e., portions of contact with the negative film 16. For this reason, when the eaves portion 994 is lowered (when clamping the negative film 16), the elastic members 994A and 994B are first brought into contact with the negative film 16.

Figure 43C:
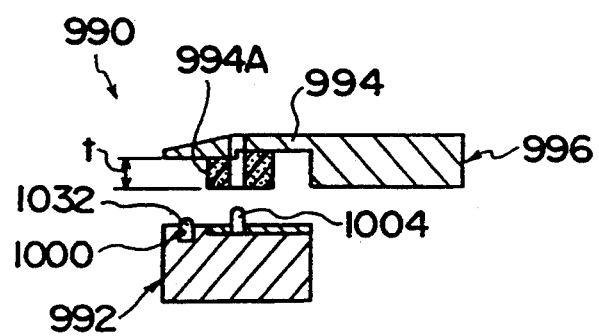
FIG. 43C is a cross-sectional view taken along line 43C—43C in FIG. 43B(1)

As shown in FIG. 43C, the elastic member 994A attached to the central portion of the eaves portion 994 has a thickness t of approx. 5 mm, and is made slightly thicker than the thickness (approx. 3 mm) of the elastic members 994B provided at the opposite end portions.

For this reason, among the elastic members 994A and 994B, the central elastic member 994A is first brought into contact with the negative film 16, and the elastic members 994B are then brought into contact with the negative film 16.

If this process is illustrated in steps, as shown in FIG. 43B(1), the insertion of the pin 1004 is effected smoothly as the central elastic member 994A is brought into contact a portion surrounding the central punch hole 16A, and a slack occurring in the negative film 16 moves toward the opposite ends of the eaves portion 994. Subsequently, as shown in FIG. 43B(2), this slack is pushed out from the opposite ends of the negative film 16 by the elastic members 994B. In the state in which the slack is removed, the negative film 16 is clamped by the eaves portion 994 and the main-body block 992, and the pins 1006 are inserted (see FIG. 43B(3)).

Although, in this embodiment, the elastic members 994A and 994B are provided at three portions of the eaves portion 991 at a longitudinally central portion and opposite end portions thereof, and the thickness (approx. 5 mm) of the central elastic member 994A is made greater than the thickness (approx. 3 mm) of the elastic members 994B at the opposite end portions, a belt-like elastic member may be attached continuously from one end to the other end of the eaves portion 992. In this case, it suffices if the thickness is made to change gradually.

Figure 45:
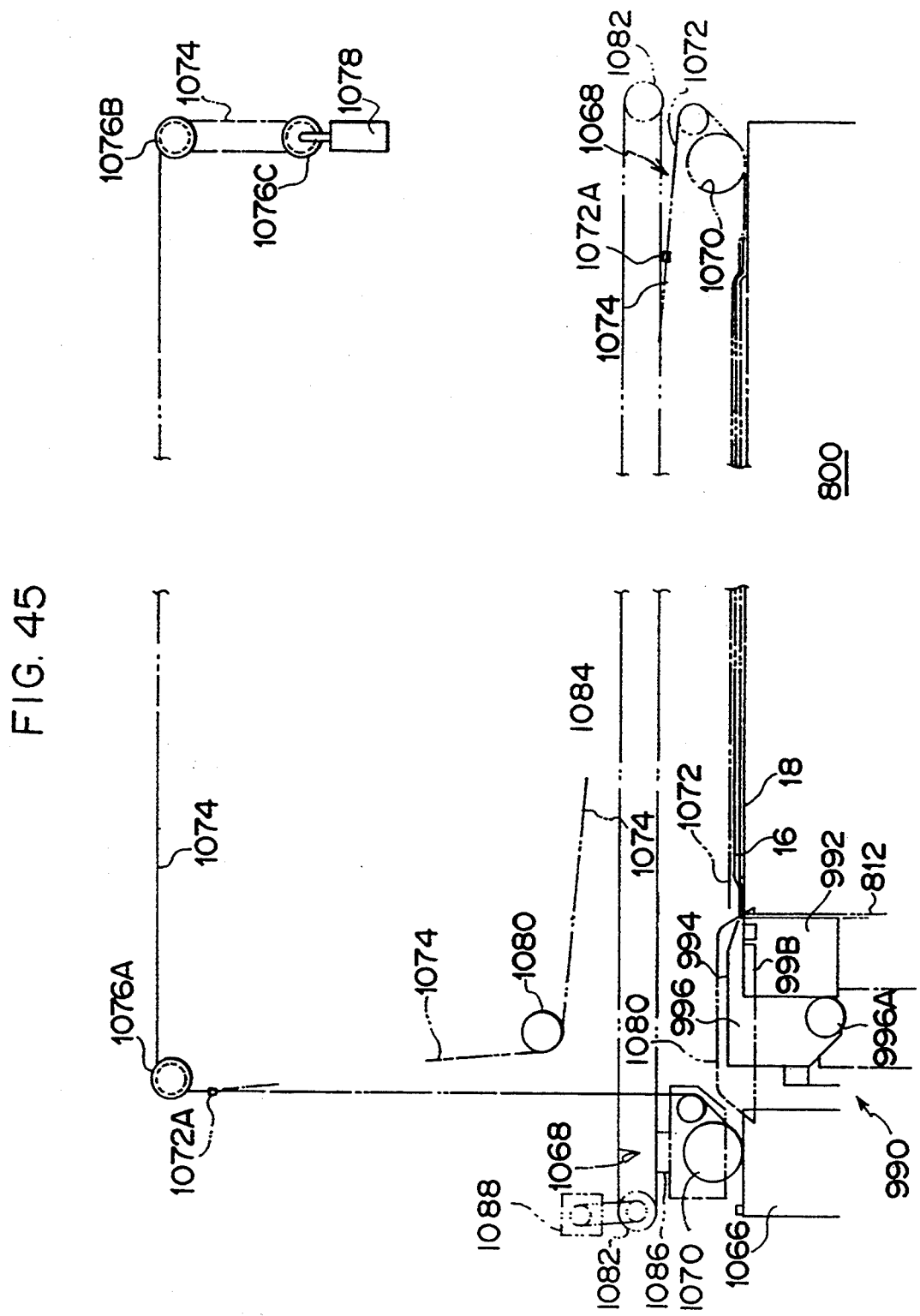
FIG. 45 is a schematic side elevational view illustrating the operation of a squeeze unit.

As shown in FIG. 45, in the printing surface-plate section 800, a small surface plate 1066 is placed on a side of the pin bar 990 which is the side away from the printing surface plate 812. A squeeze unit 1068 is arranged on this small surface plate 1066. The squeeze unit 1068 has a squeeze roller 1070 whose longitudinal direction is arranged along the longitudinal direction of the pin bar 990. A longitudinally intermediate portion of a transparent overlay sheet 1072 for covering the PS plate 18 and the negative film 16 during exposure is wound around this squeeze roller 1070. One longitudinal end of the overlay sheet 1072 is secured to an end of the small surface plate 1066 which is the end away from the pin bar 990, while the other end is led out upwardly from the squeeze unit 1060, a coupling bar 1072A being attached to a tip thereof. One end of a wire 1074 is connected to opposite ends of this coupling bar 1072A parallel with the longitudinal direction of the pin bar 990.

The other end of the wire 1074 is wound around a pulley 1076A in an upper position and is led substantially horizontally toward the PS-plate discharging section 600. In addition, a pulley 1076B is disposed above an end of the printing surface plate 812 which is the end closer to the PS-plate discharging section 600. A pulley 1078C with a weight 1078 attached thereto is provided below the pulley 1076B. A tip portion of the wire 1074 is wound a number of turns (e.g., three turns) between the pulley 1076B and a pulley 1076C, and is then connected to the pulley 1076C, and the pulley 1076C is suspended downward.

An axially intermediate portion of the squeeze roller 1070 which comes into contact with the overlay sheet 1072 is formed of a resilient material such as rubber, and axial ends are made metallic rollers. These metallic portions are respectively opposed to cams 1080 (only one is shown in FIG. 45) disposed at longitudinal ends of the pin bar 990. The cam 1080 is formed such that its upper surface straddles the pin bar 990 transversely, and when the squeeze unit 1068 passes above the pin bar 990, the metallic portions of the squeeze roller 1070 are guided by the cams 1080, and the squeeze unit 1068 moves in such a manner as to ride over the pin bar 990 without interference between the pin bar 990 and the squeeze unit 1068.

A pair of spools 1082 are arranged above the small surface plate 1066 and above an end of the printing surface plate 812 which is an end away from the small surface plate 1066. A belt 1084 stretched above the printing surface plate 812 is trained between these spools 1082. A block 1086 attached to the squeeze unit 1068 is coupled to an intermediate portion of the belt 1084. In addition, a motor 1088 for driving the belt 1084 is provided on the spool 1082 above the small surface plate 1066.

As this motor 1088 is driven, the spools 1082 are rotated to drive the belt 1084. The squeeze unit 1068 is moved from the small surface plate 1066 and over the printing surface plate 812 as this belt 1084 is driven. As a result, the squeeze roller 1070 is moved from over the pin bar 990 to over the printing surface plate 812, and is further moved to the end of the printing surface plate 812 which is the end closer to the PS-plate discharging section 600 while pressing the negative film 16 on the printing surface plate 812. This movement causes the negative film 16 to be covered by the overlay sheet 1072. A fixed tension is imparted to this overlay sheet 1072 by the weight 1078 attached to the tip of the wire 1074. In addition, the squeeze roller 1070 is urged by an unillustrated spring in such a manner as to be pressed against the printing surface plate 812. By virtue of this squeeze roller 1070, air between the negative film 16 and the PS plate 18 on the printing surface plate 812 is removed, and the negative film and the surface plate are covered by the overlay sheet 1072 and are brought into close contact with each other.

It should be noted that in the state in which the squeeze unit 1068 has moved to the PS-plate discharging section 600 side, the aforementioned coupling bar 1072A is located in the vicinity of the squeeze unit 1068, so that the overlay sheet 1072 will not interfere with the light source unit 802. In addition, a turn roller 1080 is disposed above the pin bar 990, and the wire 1074 is wound around this turn roller 1080.

When the negative film 16 is squeezed to be brought into close contact with the surface of the PS plate 18, the negative pressure supplied to the suction grooves 964 which are sucking and holding the negative film 16 is temporarily reduced, and the negative film 16 is sucked again with a predetermined sucking force after completion of squeezing.

In the printing surface-plate section 800, in the state in which the PS plate 18, the negative film 16, and the overlay sheet 1072 are superposed one on top of another in three layers on the printing surface plate 812, the light-source hood 806 is lowered, and light radiated from the light source 804 is transmitted through the negative film 16 so as to print the image recorded on the film 16 onto the photosensitive surface of the PS plate 18.

The operation of printing images recorded on the negative film 16 onto the PS plate 18 is carried out twice, i.e., for the top-side image-printing area of the PS plate 18 and the bottom-side image-printing area thereof. The PS plate 18 for which printing has been completed is delivered to the PS-plate discharging section 600 as the movable punching table 924 of the second punching unit 810 is moved.

Controller 700

As shown in FIG. 46, the controller 700 is comprised of a main control unit 712 for controlling the operation of various sections by processing signals sent thereto from various sections and by performing arithmetic operations; sequence control units 714 (the character at the end of each number in the drawing represents each section) in which relay circuits are incorporated for performing a series of processing by driving the cylinders, rodless cylinders, motors, ejectors, and the like for each section; and an exposure-processing sequence circuit unit 716 in which relay circuits for performing exposure processing are incorporated.

The main control unit 712 includes a microcomputer 718, and the microcomputer 718 is comprised of a CPU 720, a RAM 722, a ROM 724, input/output ports 726, and buses 728 such as data buses and control buses for connecting them.

A signal line from the operation panel 14 is connected to the input/output ports 726. Also connected to the input/output ports 726 are signal lines 730 and 732 for transmission and reception of signals to and from the sequence circuit units 714 and the exposure-processing sequence circuit unit 716. Operation signals are supplied from the input/output ports 726 to the sequence circuit units 714 and the exposure-processing sequence circuit unit 716, and processing end signals are supplied thereto from the sequence circuit units 714 and the exposure-processing sequence circuit unit 716. The processing state in each section can be ascertained by the main control unit 712.

On the basis of the processing end signal supplied, the CPU 720 selects an ensuing section to be operated, and controls in such a manner as to supply the operation signal to the sequence circuit unit 714 corresponding to the selected section or to the exposure-processing sequence circuit unit 716.

Figure 47:
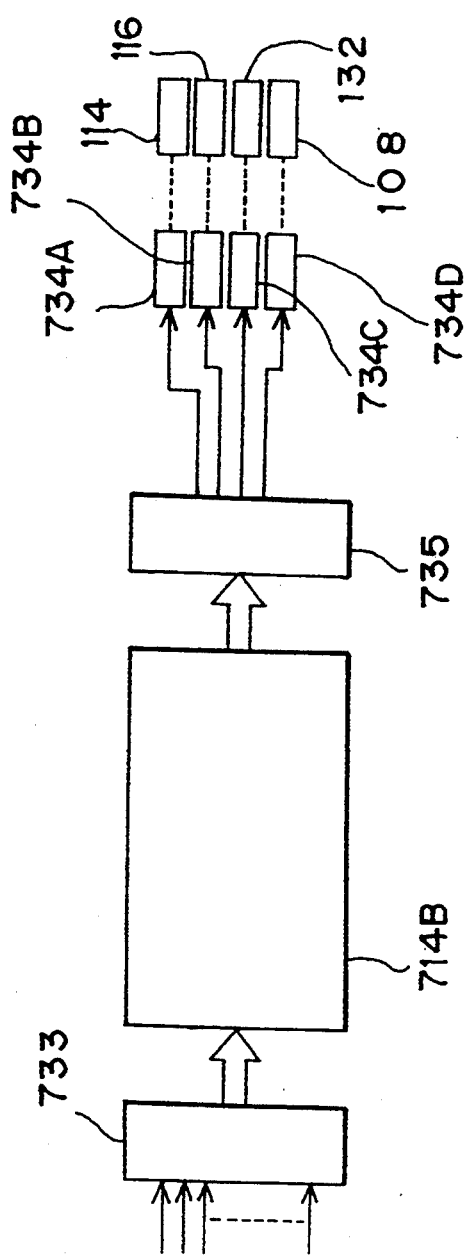
FIG. 47 is a block diagram illustrating a state of connection of signal lines to a sequence circuit unit of a section B.

As shown in FIG. 47, solenoid valves 734A, 734B and 734C for the cylinders 114 and 116 and the rodless cylinder 132, and a solenoid valve 734D for actuating the ejector 108 are connected to a sequence circuit unit 714B for the section B via an output board 735. Also connected to the sequence circuit unit 714B is an input board 733 to which signals from sensors for detecting limits of various operations in the section B are inputted.

Figure 48:
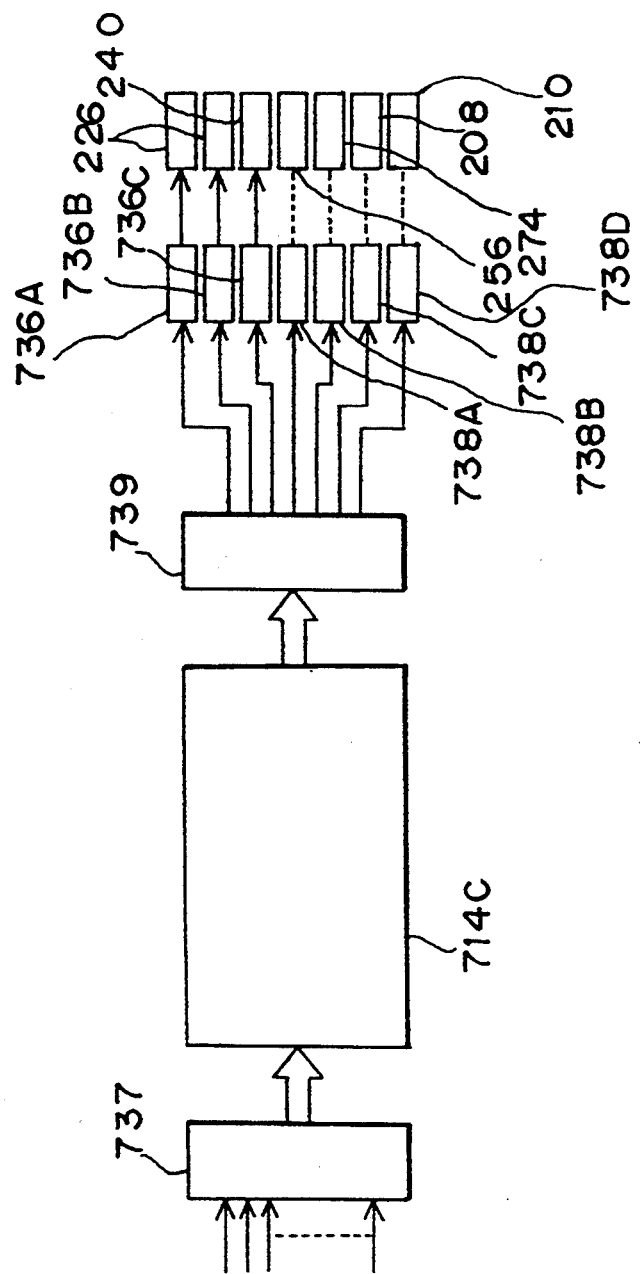
FIG. 48 is a block diagram illustrating a state of connection of signal lines to a sequence circuit unit of a section C.

As shown in FIG. 48, drivers 736A, 736B and 736C for driving the pulse motors 226, 226 and 240, solenoid valves 738A and 738B for the cylinders 256 and 274, and solenoid valves 738C and 738D for actuating the ejectors 208 and 210 are connected to a sequence circuit unit 714C for the section C via an output board 739. Also connected to the sequence circuit unit 714C is an input board 737 to which signals from sensors for detecting limits of various operations in the section C are inputted.

Figure 49:
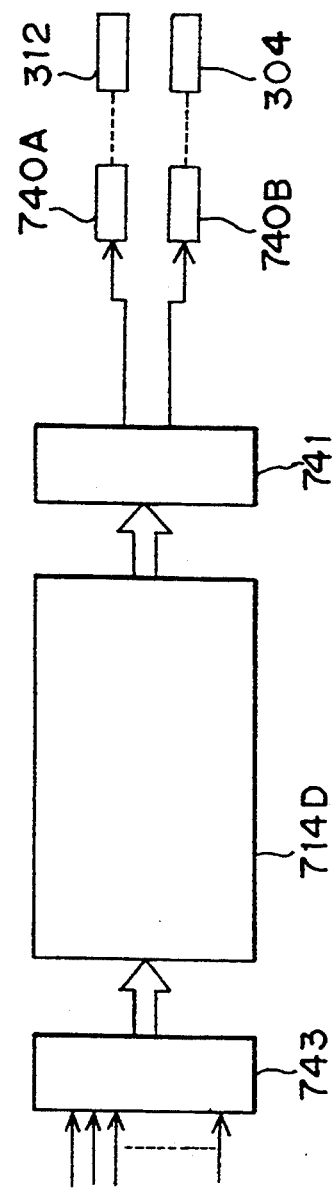
FIG. 49 is a block diagram illustrating a state of connection of signal lines to a sequence circuit unit of a section D.

As shown in FIG. 49, solenoid valves 740A and 740B for the rodless cylinder 312 and the cylinder 304 are connected to a sequence circuit unit 714D for the section D via an output board 741. Also connected to the sequence circuit unit 714D is an input board 743 to which signals from sensors for detecting limits of various operations in the section D are inputted.

Figure 50:
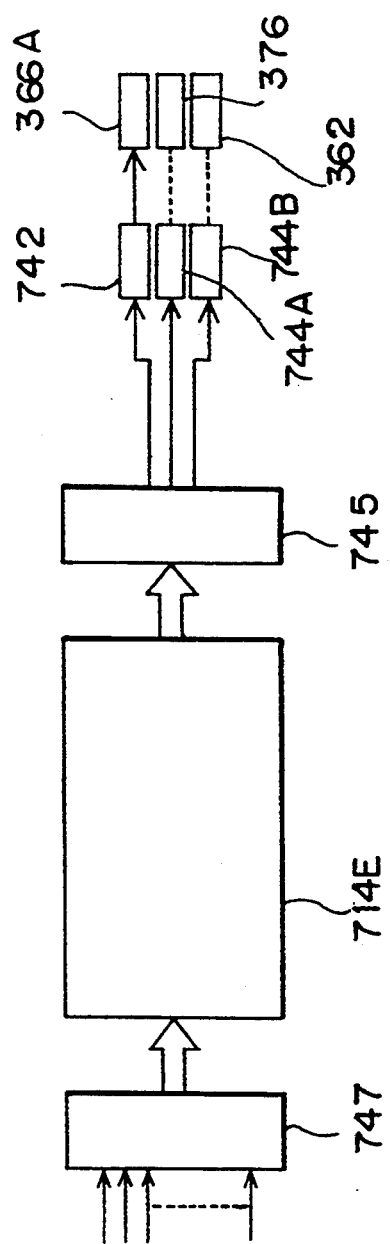
FIG. 50 is a block diagram illustrating a state of connection of signal lines to a sequence circuit unit of a section E.

As shown in FIG. 50, a driver 742 for driving the pulse motor 366A, a solenoid valve 744A for the rodless cylinder 376, and a solenoid 744B for driving the ejector 362 are connected to a sequence circuit unit 714E for the section E via an output board 745. Also connected to the sequence circuit unit 714E is an input board 747 to which signals from sensors for detecting limits of various operations in the section E are inputted.

Figure 51:
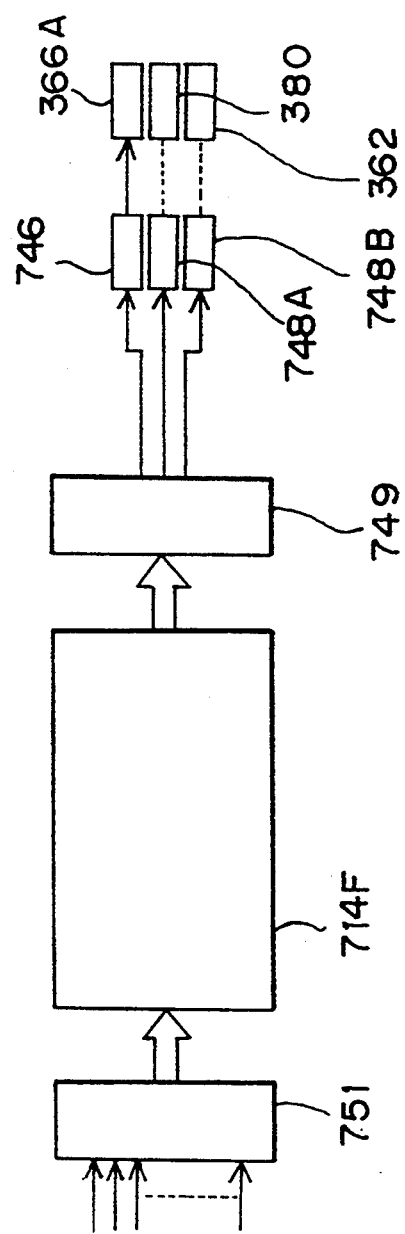
FIG. 51 is a block diagram illustrating a state of connection of signal lines to a sequence circuit unit of a section F.

As shown in FIG. 51, a driver 746 for driving the pulse motor 366A, a solenoid valve 748A for the rodless cylinder 380, and a solenoid valve 748B for driving the ejector 362 are connected to a sequence circuit unit 714F for the section F via an output board 749. Also connected to the sequence circuit unit 714F is an input board 751 to which signals from sensors for detecting limits of various operations in the section F are inputted.

Figure 52:
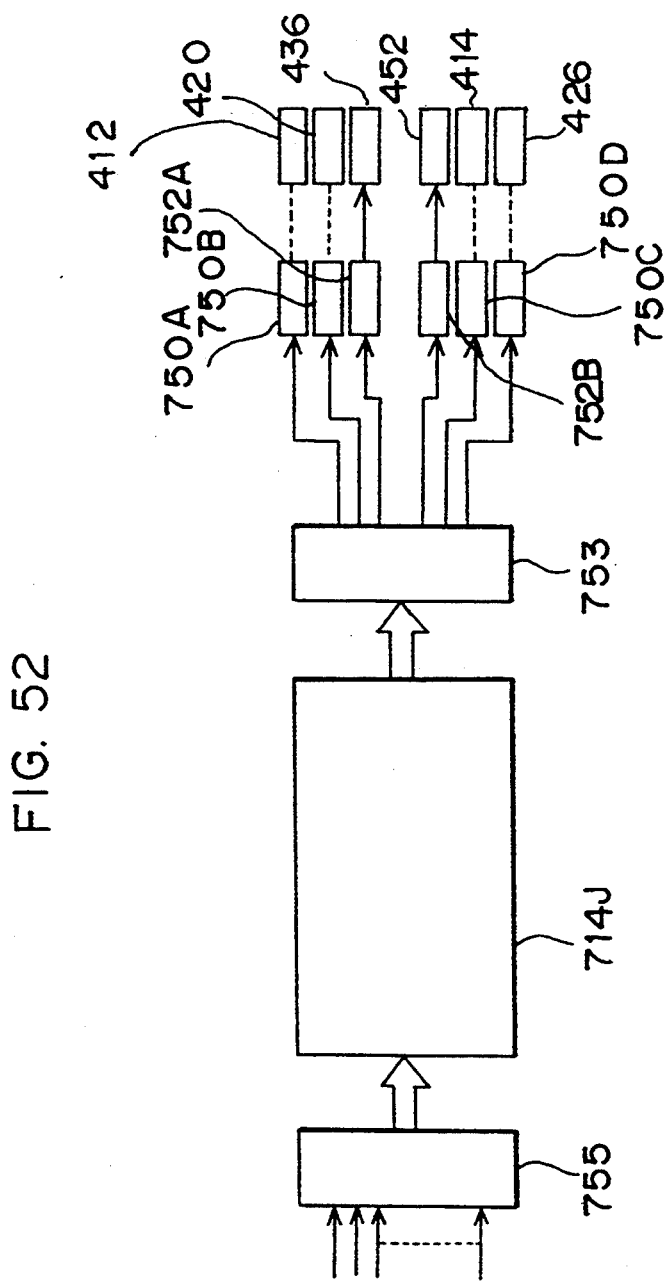
FIG. 52 is a block diagram illustrating a state of connection of signal lines to a sequence circuit unit of a section J.

As shown in FIG. 52, solenoid valves 750A and 750B for the cylinder 412 and the auxiliary cylinder 420, drivers 752A and 752B for driving the motors 436 and 452, and solenoid valves 750C and 750D for driving the ejectors 414 and 426 are connected to a sequence circuit unit 714J for the section J via an output board 753. Also connected to the sequence circuit unit 714J is an input board 755 to which signals from sensors for detecting limits of various operations in the section J are inputted.

Figure 53:
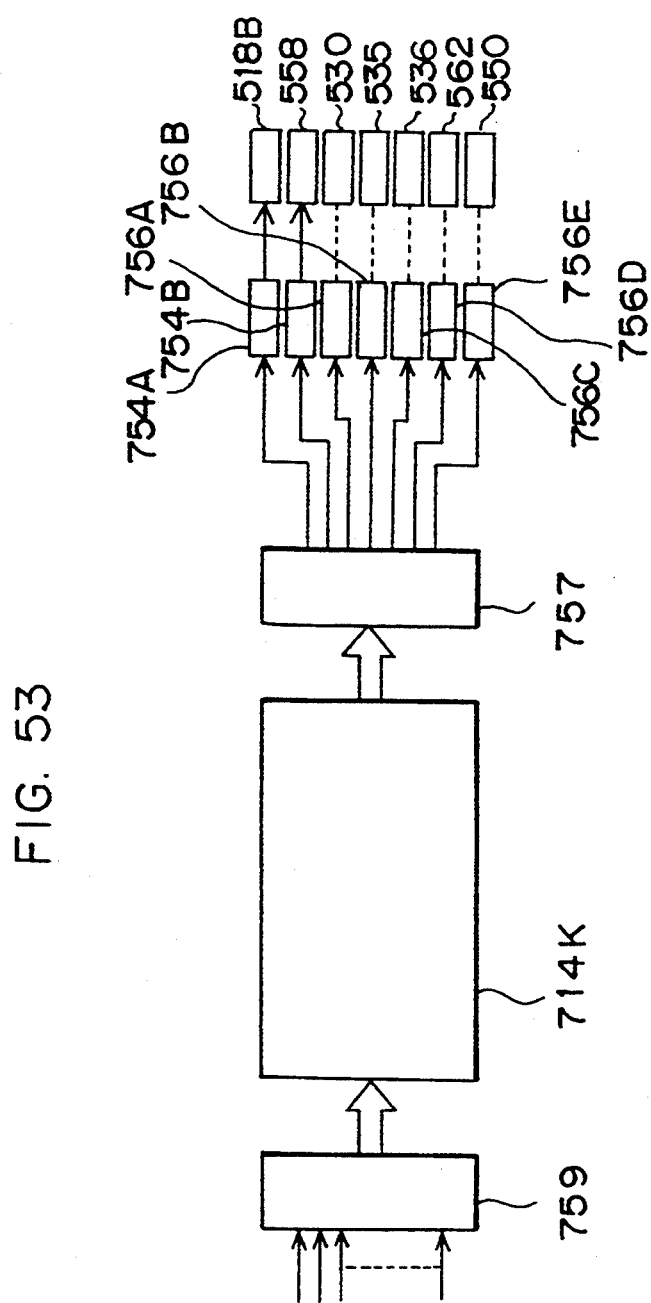
FIG. 53 is a block diagram illustrating a state of connection of signal lines to a sequence circuit unit of a section K.

As shown in FIG. 53, drivers 754A and 754B for driving the motors 518B and 558, solenoid valves 756A, 756B, 756C, 756D and 756E for the cylinders 530, 535, 536, 562, and the rodless cylinder 550 are connected to a sequence circuit unit 714K for the section K via an output board 757. Also connected to the sequence circuit unit 714K is an input board 759 to which signals from sensors for detecting limits of various operations in the section K are inputted.

Figure 54:
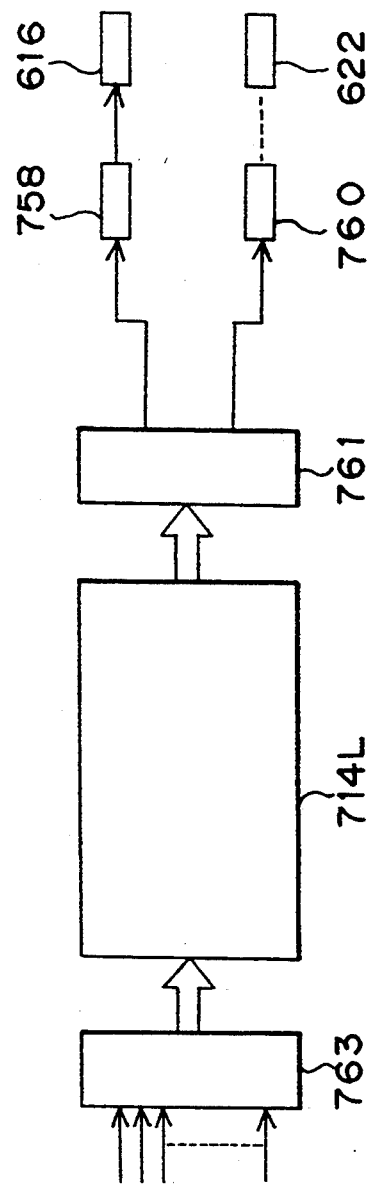
FIG. 54 is a block diagram illustrating a state of connection of signal lines to a sequence circuit unit of a section L.

As shown in FIG. 54, a driver 758 for driving the motor 616 and a solenoid valve 760 for the cylinder 622 are connected to a sequence circuit unit 714L for the section L via an output board 761. Also connected to the sequence circuit unit 714L is an input board 763 to which signals from sensors for detecting limits of various operations in the section L are inputted.

Figure 55:
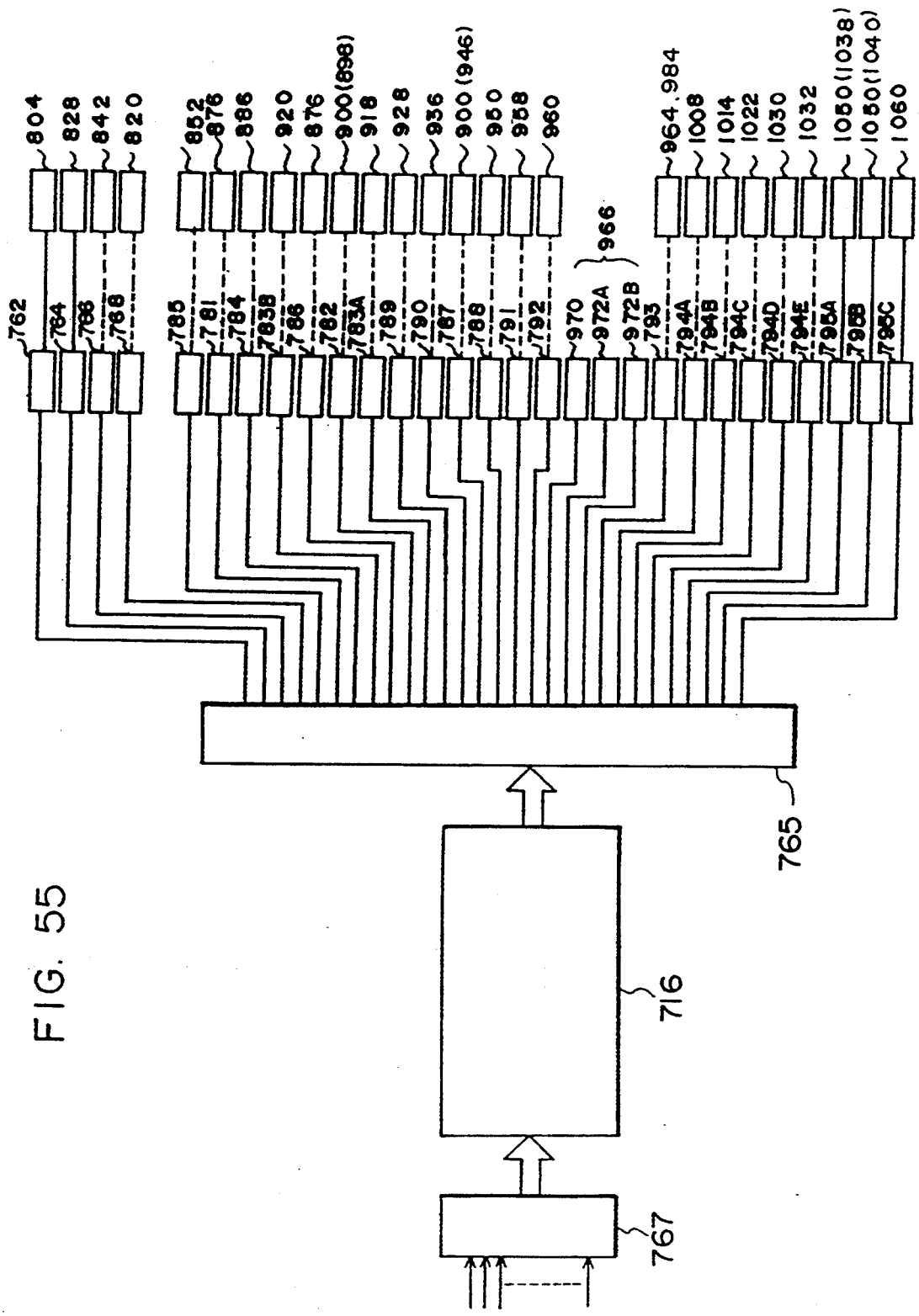
FIG. 55 is a block diagram illustrating a state of connection of signal lines to a sequence circuit unit for exposure.

As shown in FIG. 55, a driver 772 for turning on the light source 804, a driver 764 for driving the fan 828, a solenoid valve 766 for the cylinder 842 for actuating the closure plate (for covering a color mark) 834, and a solenoid valve 768 for the cylinder 820 for raising or lowering the light source hood 806 are connected to the exposure-processing sequence circuit unit 716 via an output board 765. Also connected to the exposure-processing sequence circuit unit 716 is an input board 767 to which signals from sensors for detecting limits of various operations in the printing surface-plate section 800 are inputted.

In addition, in the exposure-processing sequence circuit unit 716, control is carried out in the positioning of the PS plate 18 on the first punching unit 808, the printing surface-plate section 800, and the second punching unit 810, as well as the positioning and holding of the negative film 16 on the printing surface-plate section 800.

Connected to the output board 765 are a solenoid valve 781 for the air cylinder 876 for positioning the PS plate 18 between the printing surface-plate section 800 and the first punching unit 808, a solenoid valve 782 for the air cylinder 900, and solenoid valves 783A and 783B for the air cylinders 918 and 920. Also, a solenoid valve 784 for the air cylinder 886 for feeding the PS plate 18 from the first punching unit 808 to the second punching unit 810, and a solenoid valve 785 for actuating the puncher 852 of the first punching unit 808 are connected thereto.

Furthermore, the following are also connected to the output board 765: a solenoid valve 786 for the air cylinder 876 for positioning between the printing surface-plate section 800 and the second punching unit 810; a solenoid valve 787 for the air cylinder 900; a solenoid valve 788 for the air cylinder 950; a solenoid valve 789 for actuating the puncher 928; a solenoid valve 790 for the rodless cylinder 936 for feeding out the PS plate 18 from the second punching unit 810; and a solenoid valve 791 for the holder 958.

In the printing surface-plate section 800, the following are connected to the output board 765: a solenoid valve 792 for the suction grooves 960 and 962 for sucking the PS plate 18; solenoid valves 970, 972A and 972B for the suction grooves 964 for sucking the negative film 16; a solenoid valve 793 for the suction grooves 984 for sucking the overlay sheet 1072; and solenoid valves 794A, 794B, 794C, 794D and 794E for the air cylinders 1008, 1014, 1022, 1030 and 1032 for the pin bar 990. Also, drivers 795A, 795B and 795C for driving the pulse motors 1050 and 1060 for moving the pin bar 990 are connected thereto.

Figure 56:
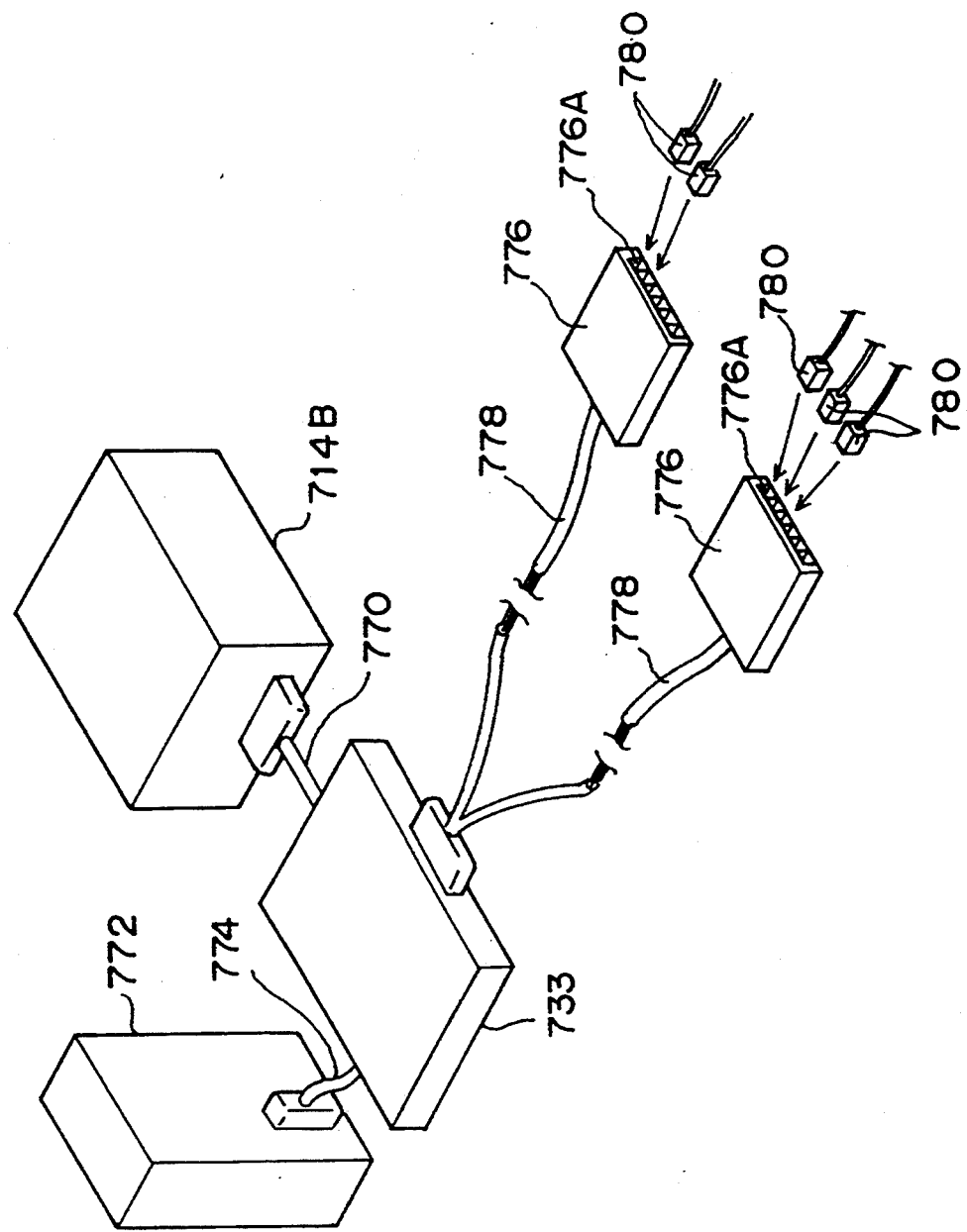
FIG. 56 is a schematic perspective view illustrating a state of wiring of sensors disposed in various sections.

In the actual wiring of the sensors in each section (a description will be given hereafter by citing the section B as an example), as shown in FIG. 56, the input board 733 and the sequence circuit unit 714 are connected to each other via a cable 770 in which a plurality of signal lines are bundled together. In addition, a power unit 772 is connected to this input board 733 via a cable 774.

For this reason, a power line necessary to output signals of sensors and signal lines for supplying signals to the sequence circuit unit 714B are wired in a centralized manner.

A plurality of (in this embodiment, two) relay boards 776 are connected to the input board 733 via cables 778, respectively.

An input terminal section 776A is provided in each relay board 776 which serves as a connecting section for a connector 780 in which signal lines from various sensors are connected to its terminal. Since the sensors are connected to the input terminal section 776A via the connectors, a power lie and signal lines can be connected in combined form.

Accordingly, it is unnecessary to provide separate wirings between the sensors and the sequence circuit unit 714B and between the sensors and the power unit 772, thereby making it possible to reduce the number of wirings.

In addition, a capacitor (not shown) for prevention of malfunctions due to noise occurring in the sensors is provided in the input board 733, and is used jointly for a plurality of sensors. It should be noted that as the cables 770 and 778 it is possible to use cabtire cables in which a plurality of signal lines are accommodated in advance and coated with an insulating material, harnesses in which a plurality of signal lines are bundled together by a separate member, or other similar cables.

The operation of this embodiment will be described hereafter.

First, a description will be given of the overall flow of processing in the main control unit 712 with reference to the flowcharts shown in FIGS. 57 to 59B and timing charts shown in FIGS. 60 and 61. It should be noted that FIG. 60 shows a timing chart at a time when the negative films 16 together with the PS plates 18 are replaced one at a time, respectively, whereas FIG. 61 shows a timing chart at a time when an identical image is printed onto a plurality of PS plates 18 without replacing the negative film 16. In addition, numbers for arrows shown in FIGS. 60 and 61 correspond to step numbers of each flowchart.

Figure 57:
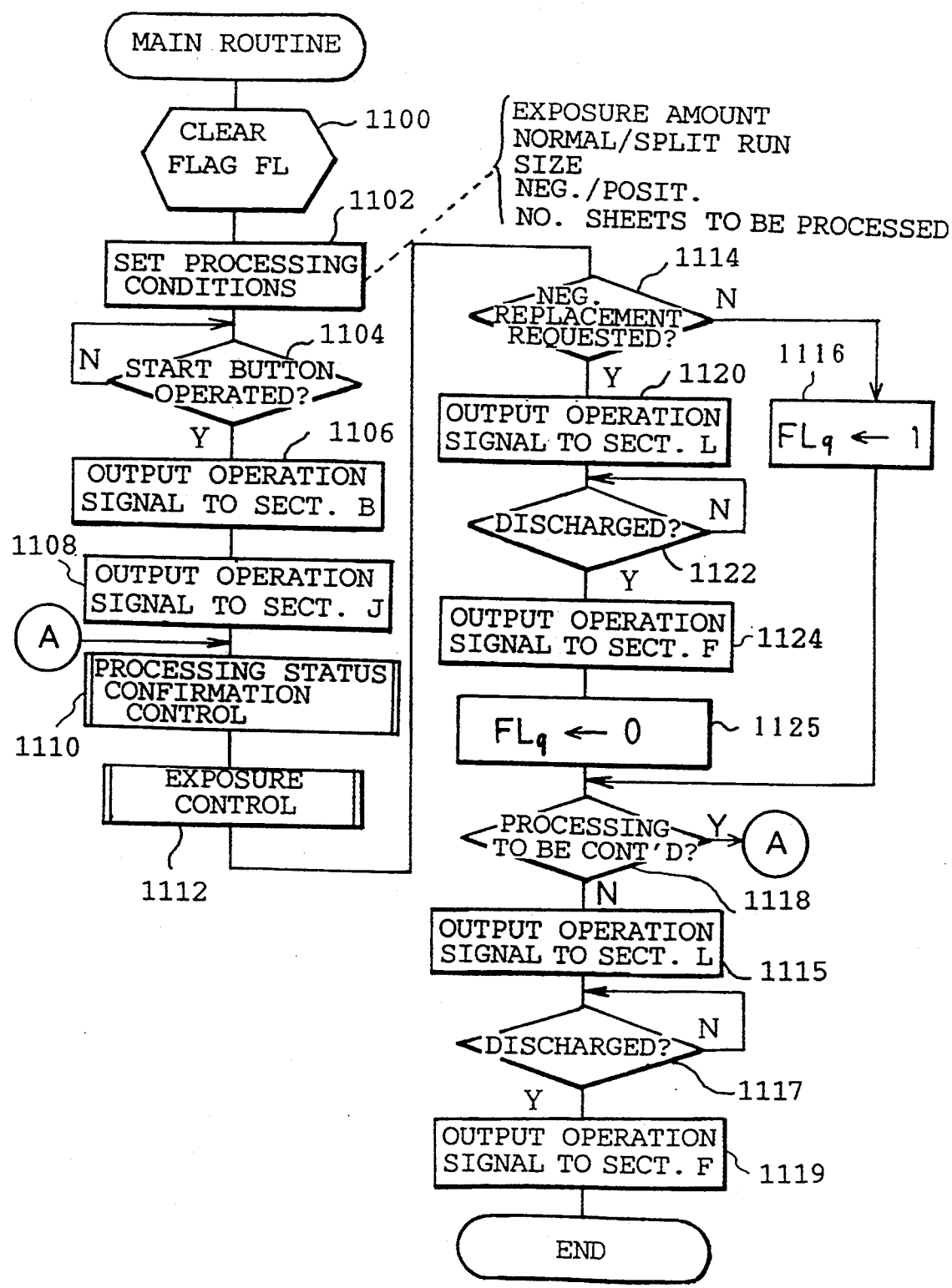
FIG. 57 is a control flowchart illustrating a main routine for operating the lithographic printing plate printer in accordance with the embodiment.
Figure 58A:
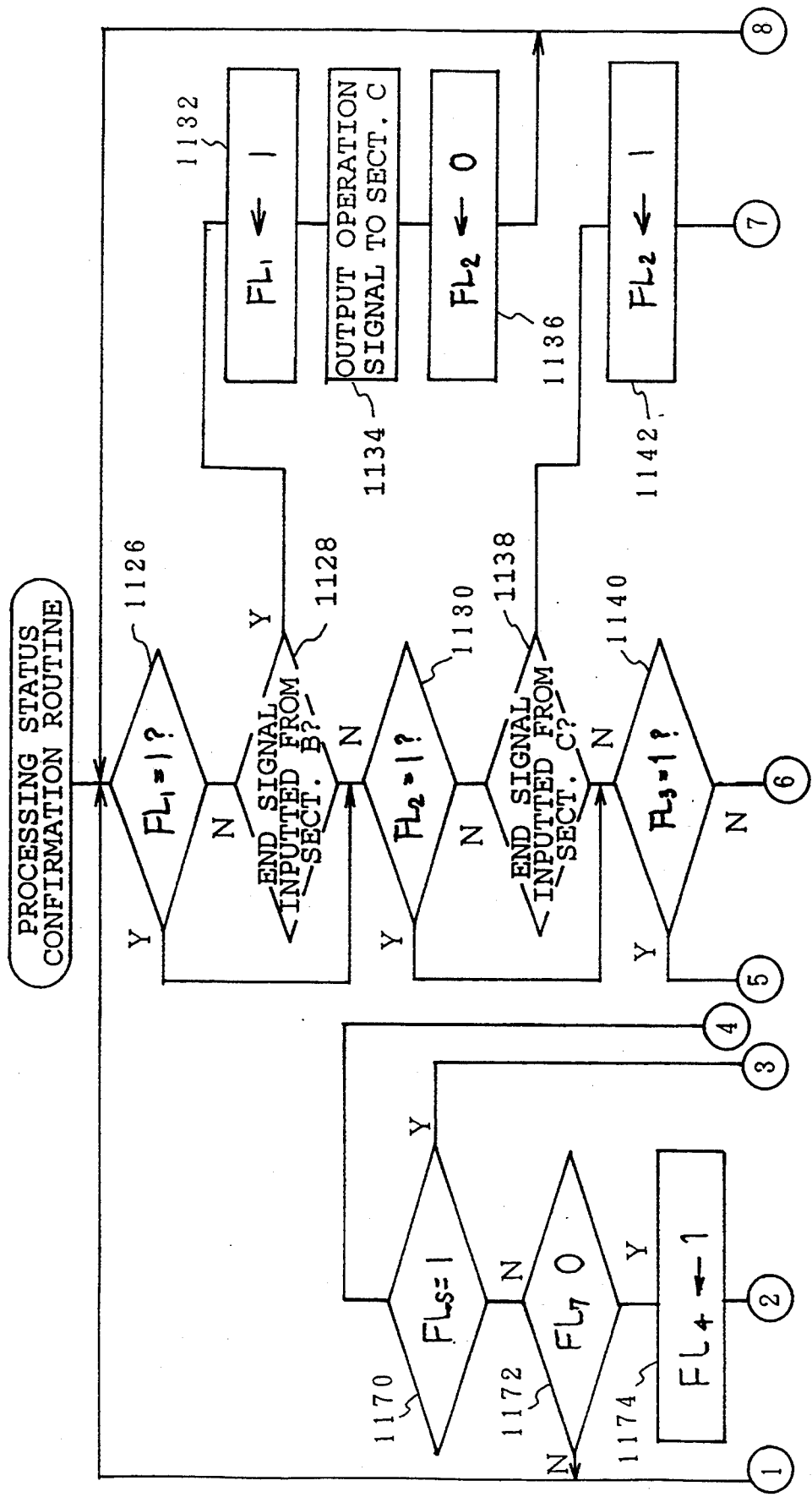
FIGS. 58A, 58B and 58C are parts of a single flowchart illustrating the details of control for confirming the processing status of the main routine.
Figure 58B:
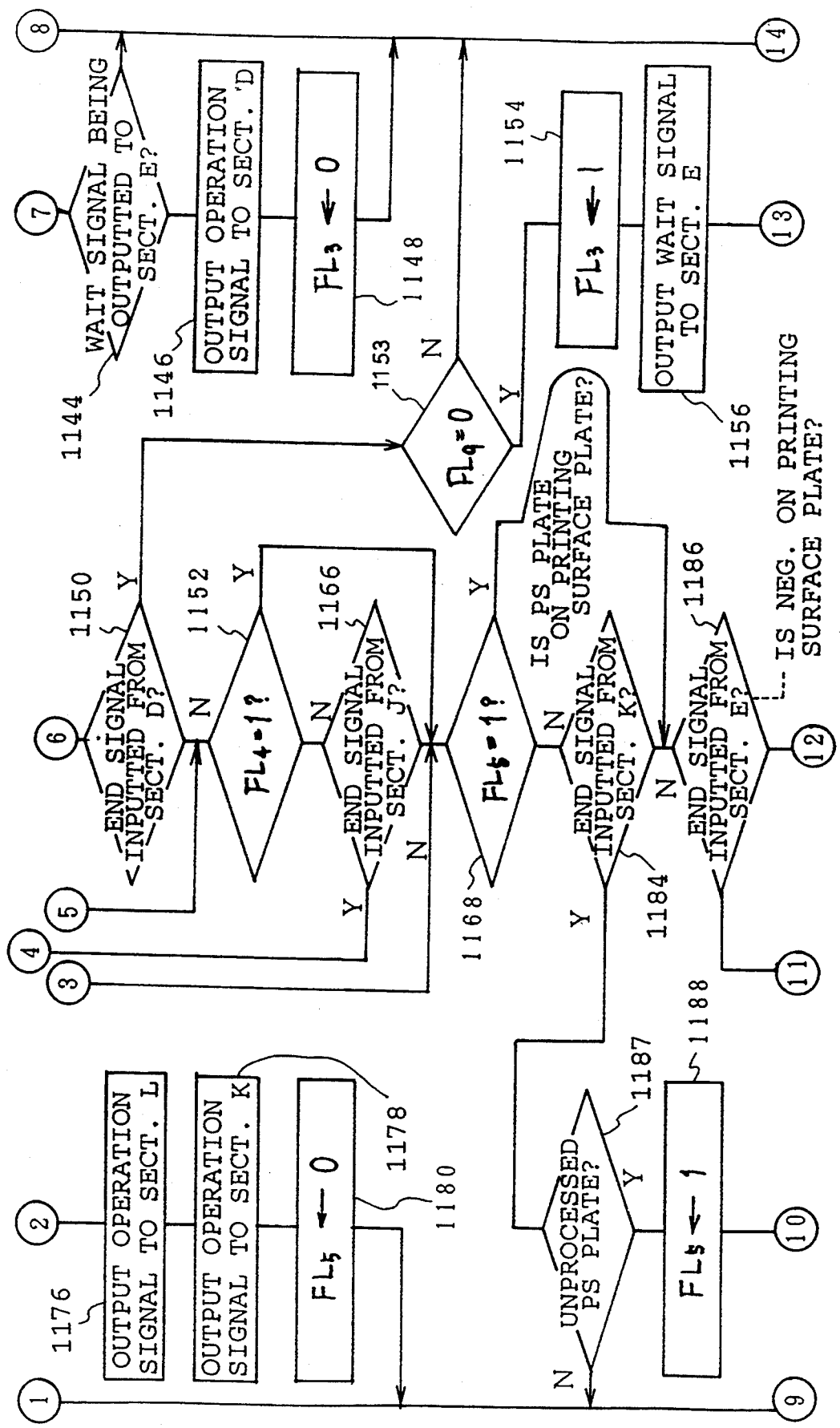
Figure 58C:
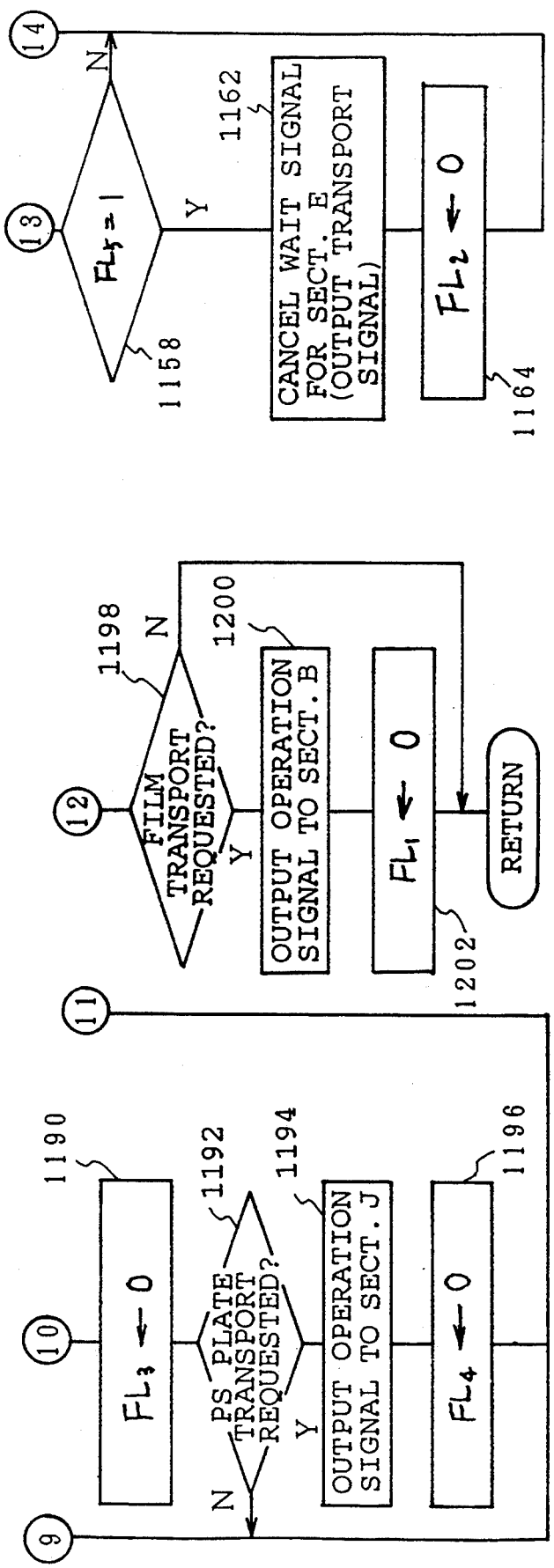

In a main routine shown in FIG. 57, in Step 1100, flags ($FL_1$–$FL_7$) are cleared (0), and the operation proceeds to Step 1102. In Step 1102, processing conditions are set. That is, conditions necessary for processing, such as an exposure amount, normal/split run processing, size, negative/positive, and the number of plates to be processed, are set by operating an operation section on the operation panel 14.

Upon completion of the setting of processing conditions on the operation panel 14, the operation proceeds from Step 1102 to Step 1104 to determine whether or not the start button has been operated. If YES is the answer in the determination, the operation proceeds to Step 1106 to output an operation signal for operating the section B. On the basis of an output of this operation signal, in the section B, an uppermost negative film 16 is fetched from the tray 24 placed in the section A, and is transported to the positioning surface plate 202. The detailed flow of this section B will be described later with reference to FIG. 62.

In an ensuing Step 1108, an operation signal for operating the section B is outputted. On the basis of an output of this operation signal, in the section J, an uppermost PS plate 18 is taken out from the skid 32 placed in the section H, and is transported toward the transporting-direction inverting section 500. The detailed flow of this section J will be described later with reference to FIG. 67.

In Step 1110, the processing status in each section is confirmed, and the operation of various sections is controlled in accordance with the present processing status. In this Step 1110, when the positioning of the PS plate 18 and the negative film 16 on the printing surface plate 812 is completed, the operation proceeds to Step 1112. In Step 1112, exposure processing is carried out, and in Step 1114 the presence or absence of a request for replacement of the negative film 16 is determined. If NO is the answer in the determination, i.e., if the replacement of the negative film 16 is unnecessary, the operation proceeds to Step 1116 to set a flag $FL_9$, and the operation proceeds to Step 1118. On the other hand, if YES is the answer in the determination in Step 1114, i.e., if the replacement of the negative film 16 is necessary, the operation proceeds from Step 1114 to Step 1120 to output an operation signal for operating the section L. If it is determined in Step 1122 that the discharging of the PS plate 18 has been completed, in Step 1124, an operation signal for operating the section F is outputted. Then, in Step 1125, the flag $FL_9$ is cleared, and then the operation proceeds to Step 1118. In the section F, the negative film 16 placed on the printing surface plate 812 is transported to the discharging section 28 on the basis of this operation signal. The detailed flow of this section F will be described later with reference to FIG. 66.

In an ensuing Step 1118, a determination is made as to whether or not processing is being continued, and if processing is taking place in any of the sections, the operation proceeds to Step 1112. If processing is taking place in none of the sections, in Step 1115, a signal for operating the section L is outputted to discharge the PS plate 18 on the printing surface plate 812. After it is confirmed in an ensuing Step 1117 that the processing of Step 1115 has been completed, in Step 1119, a signal for operating the section F is outputted to discharge the negative film 16, and processing ends.

Referring now to FIG. 60, a description will be given of a routine for confirming the processing status in Step 1110.

In Step 1126, a determination is made as to whether or not the flag $FL_1$ has been set (1). If NO is the answer in the determination, the operation proceeds to Step 1126 to determine whether or not a processing end signal has been inputted from the section B. It should be noted that the processing end signal for this section B, including the processing end signal for other sections shown below, is continuously outputted until an ensuing operation is started.

If NO is the answer in the determination in Step 1128, it is determined that the section B has not commenced operation or is undergoing operation, so that the operation proceeds to Step 1130. On the other hand, if YES is the answer in the determination in Step 1126, a determination is made that an ensuing operation has already been instructed on the basis of the processing end signal from the section B. Hence, the operation jumps Step 1128 and proceeds to Step 1130.

In addition, if YES is the answer in the determination in Step 1128, it is determined that processing in the section B has been completed, so that the operation proceeds to Step 1132 to set the flag $FL_1$. Then, in Step 1134, an operation signal for operating the section C is outputted. In the section C, punch holes are punched in the negative film 16 at predetermined positions for positioning on the printing surface plate 812 on the basis of this operation signal. The detailed flow of this section C will be described later with reference to FIGS. 63A and 63B.

In an ensuing Step 1136, the flag $FL_2$ is cleared, and then the operation proceeds to Step 1126.

In Step 1130, a determination is made as to whether or not the flag $FL_2$ has been set (1). If NO is the answer in the determination, the operation proceeds to Step 1138 to determine whether or not a processing end signal has been inputted from the section C. If NO is the answer in the determination in Step 1138, it is determined that the section C has not commenced operation or is undergoing operation, so that the operation proceeds to Step 1140. On the other hand, if YES is the answer in the determination in Step 1130, a determination is made that an ensuing operation has already been instructed on the basis of the processing end signal from the section C. Hence, the operation jumps Step 1138 and proceeds to Step 1140.

Meanwhile, if YES is the answer in the determination in Step 1138, a determination is made that processing in the section C has been completed, so the operation proceeds to Step 1142 to set the flag $FL_2$. Then, in Step 1144, a determination is made as to whether or not a wait signal is being outputted to the section E. In other words, if the wait signal is being outputted to the section, the negative film 16 is present in the standby section 26. If the negative film 16 is transported to the standby section 26 in this state, the negative films 16 will interfere with each other in the same plate. Hence, if YES is the answer in the determination, the operation proceeds to Step 1126. If NO is the answer in the determination in Step 1144, i.e., if the output of a wait signal to the section E has been canceled, it is determined that the negative film 16 is not present in the standby section 26. Accordingly, the operation proceeds to Step 1146 to output an operation signal for operation the section D. On the basis of this operation signal, in the section D, the negative film 16 is transported from the positioning surface plate 202 to the standby section 26. The detailed flow of this section D will be described later with reference to FIG. 64.

In an ensuing Step 1148, the flag $FL_3$ is cleared, and then the operation proceeds to Step 1126.

In Step 1140, a determination is made as to whether or not the flag $FL_3$ has been set (1). If NO is the answer in the determination, the operation proceeds to Step 1150 to determine whether or not a processing end signal has been inputted from the section D. If NO is the answer in the determination in Step 1150, it is determined that the section D has not commenced operation or is undergoing operation, so that the operation proceeds to Step 1152. On the other hand, if YES is the answer in the determination in Step 1140, a determination is made that an ensuing operation has already been instructed on the basis of the processing end signal from the section D. Hence, the operation jumps Step 1140 and proceeds to Step 1150.

Meanwhile, if YES is the answer in the determination in Step 1150, a determination is made that processing in the section D has been completed. Hence, in Step 1153, a determination is made as to whether or not the flag $FL_9$ has been cleared, i.e., whether or not it is the initial transport or transport for replacement of the negative film 16. If YES is the answer in the determination, the operation proceeds to Step 1154 to set the flag $FL_3$, and then in Step 1156 a wait signal is outputted to the section E. On the basis of this wait signal, in the section E, the negative film 16 is fetched from the standby section 26 and remains on standby. In addition, if NO is the answer in the determination in Step 1153, the operation proceeds to Step 1126.

In an ensuing Step 1158, a determination is made as to whether or not the flag $FL_5$ has been set. This flag $FL_5$ is for determining whether the feeding of the PS plate 18 to the printing surface plate 812 has been completed (flag $FL_5=1$) or not (flag $FL_5=0$) in the section K, i.e., in the transporting-direction inverting section 500. If NO is the answer in the determination, the standby in the section E is maintained, and the operation proceeds to Step 1126. Meanwhile, if YES is the answer in the determination, the operation proceeds to Step 1162 where the output of the wait signal to the section E is canceled, and a transport signal is outputted. On the basis of this transport signal, in the section E, the negative film 16 is transported from the standby section 26 to the printing surface plate 812, and the negative film 16 is positioned in place on the printing surface plate 812. The detailed flow of this section E will be described later with reference to FIG. 65.

In an ensuing Step 1164, the flag $FL_2$ is cleared, and then the operation proceeds to Step 1126.

As a result of the clearing of this flag $FL_2$, NO is the answer in the determination when the operation returns to Step 1130, and it is possible to determine the presence or absence of an input of the processing end signal from the section D. Namely, in Step 1144, since the output of the wait signal to the section has been canceled, NO is the answer in the determination, and it is possible to output an operation signal to the section D. Accordingly, after the negative film 16 has ceased to be present in the standby section 26, the negative film 16 is transported from the positioning surface plate 202 to the standby section 26, so that the interference between the negative films 16 does not occur.

Meanwhile, if YES is the answer in the determination in Step 1160, i.e., if the negative film 16 which is presently on the printing surface plate 812 is continued to be used, the operation jumps Steps 1162 and 1164, and proceeds to Step 1126.

In Step 1152, a determination is made as to whether or not the flag $FL_4$ has been set (1). If NO is the answer in the determination, the operation proceeds to Step 1166 to determine whether or not a processing end signal has been inputted from the section J. If NO is the answer in the determination in Step 1166, it is determined that the section J has not commenced operation or is undergoing operation, so that the operation proceeds to Step 1168. On the other hand, if YES is the answer in the determination in Step 1166, a determination is made that an ensuing operation has already been instructed on the basis of the processing end signal from the section J. Hence, the operation jumps Step 1166 and proceeds to Step 1168.

Meanwhile, if YES is the answer in the determination in Step 1166, a determination is made that processing in the section J has been completed. Then, in Step 1170, a determination is made as to whether or not the flag $FL_5$ has been set. If YES is the answer in the determination in this step, a determination is made that an unexposed PS plate 18 is present on the printing surface plate 812, and the operation proceeds to Step 1166. Meanwhile, if NO is the answer in the determination, a determination is made that an exposed PS plate 18 is present on the printing surface plate 812, and the operation proceeds to Step 1172.

In Step 1172, a determination is made as to whether or not the flag $FL_7$ has been set. This flag $FL_7$ is a flag which is cleared only during exposure processing.

If NO is the answer in the determination in Step 1172, i.e., if it is determined that exposure is yet to take place or is being carried out, it is impossible to feed the PS plate 18 onto the printing surface plate 812, so that the operation proceeds to Step 1126. Meanwhile, if YES is the answer in the determination in Step 1172, a determination is made that exposure processing has been completed and the negative film 16 has been discharged, so that the operation proceeds to Step 1174 to set the flag $FL_4$. Then, in Step 1176, a signal for operating the section L is outputted. In the section L, the PS plate 18 for which printing has been completed is discharged from the printing surface plate 812 on the basis of this operation signal. The detailed flow of this section L will be described later with reference to FIGS. 69A and 69B.

In an ensuing Step 1178, an operation signal for operating the section K is outputted. Then, in Step 1180, the flag $FL_5$ is rest, and the operation proceeds to Step 1126. In this section K, the PS plate 18 is fed onto the printing surface plate 812. The detailed flow of this section K will be described later with reference to FIG. 68.

Here, processing is effected substantially simultaneously in the section L and the section K. As a result, a new PS plate 18 is supplied while the PS plate 18 for which printing has been completed is being discharged from the printing surface plate 812, thereby reducing the processing speed.

In Step 1168, a determination is made as to whether or not the flag $FL_5$ has been set (1). If NO is the answer in the determination, the operation proceeds to Step 1184 to determine whether or not a processing end signal has been inputted from the section K. Namely, a determination is made as to whether or not the PS plate 18 is present on the printing surface plate 812. If NO is the answer in the determination in Step 1184, it is determined that the section K has not commenced operation or is undergoing operation, and that the PS plate 18 is not present. Hence, the operation proceeds to Step 1186. On the other hand, if YES is the answer in the determination in Step 1168, a determination is made that an ensuing operation has already been instructed on the basis of the processing end signal from the section K. Hence, the operation jumps Step 1184 and proceeds to Step 1186.

On the other hand, if YES is the answer in the determination in Step 1184, the operation proceeds to Step 1187 to determine whether or not the PS plate 18 on the printing surface plate 812 is an unprocessed one. If YES is the answer in the determination, i.e., if it is determined that the PS plate 18 is an unprocessed one, the operation proceeds to Step 1188. Meanwhile, if NO is the answer in the determination, a determination is made that it is an already processed one and that it needs to be discharged, so that the operation proceeds to Step 1126.

In Step 1188, the flag $FL_5$ is set, and then in Step 1190 the flag $FL_3$ is cleared.

In an ensuing Step 1192, a determination is made of the presence or absence of a request for transporting the PS plate 18, and if the transport request is present, the operation proceeds to Step 1194 to output a signal for operating the section J to fetch an ensuing PS plate 18 from the skid 30. Then, in Step 1196, the flag FL4 is cleared, and the operation proceeds to Step 1126. Meanwhile, if there is no request for transport in Step 1192, a determination is made that it is unnecessary to fetch a new PS plate 18 from the skid 30. Hence, the operation jumps Steps 1194 and 1196, and proceeds to Step 1126.

In Step 1186, a determination is made as to whether or not a processing end signal has been inputted from the section E. Namely, a determination is made as to whether or not the negative film 16 is present on the printing surface plate 812. Here, if NO is the answer in the determination, a determination is made that the section E has not commenced operation or is undergoing operation, and the operation proceeds to Step 1126. If YES is the answer in the determination in Step 1186, a determination is made that instruction of an ensuing operation has already been given on the basis of the processing end signal from the section E. Hence, the operation proceeds to Step 1198 to determine the presence or absence of a request for transporting the negative film 16.

If it is determined in Step 1198 that a transport request is present, the operation proceeds to Step 1200 to output a signal for operating the section B so as to fetch an ensuing negative film 16 from the tray 24. Subsequently, the operation proceeds to Step 1202 where the flag FL1 is cleared, and the operation returns to the main routine.

Thus, in this embodiment, the processing status of each section is confirmed through the inputting of a processing end signal from each sequence circuit unit 714 and the exposure-processing sequence circuit unit 716. Then, the section to be operated next is selected, and an operation signal is outputted. Accordingly, it is possible to manage the timings of the negative films 16 or the PS plates 18 in each section or the transport of the PS plate 18 and the transport of the negative film 16 on the printing surface plate 812.

Figure 59A:
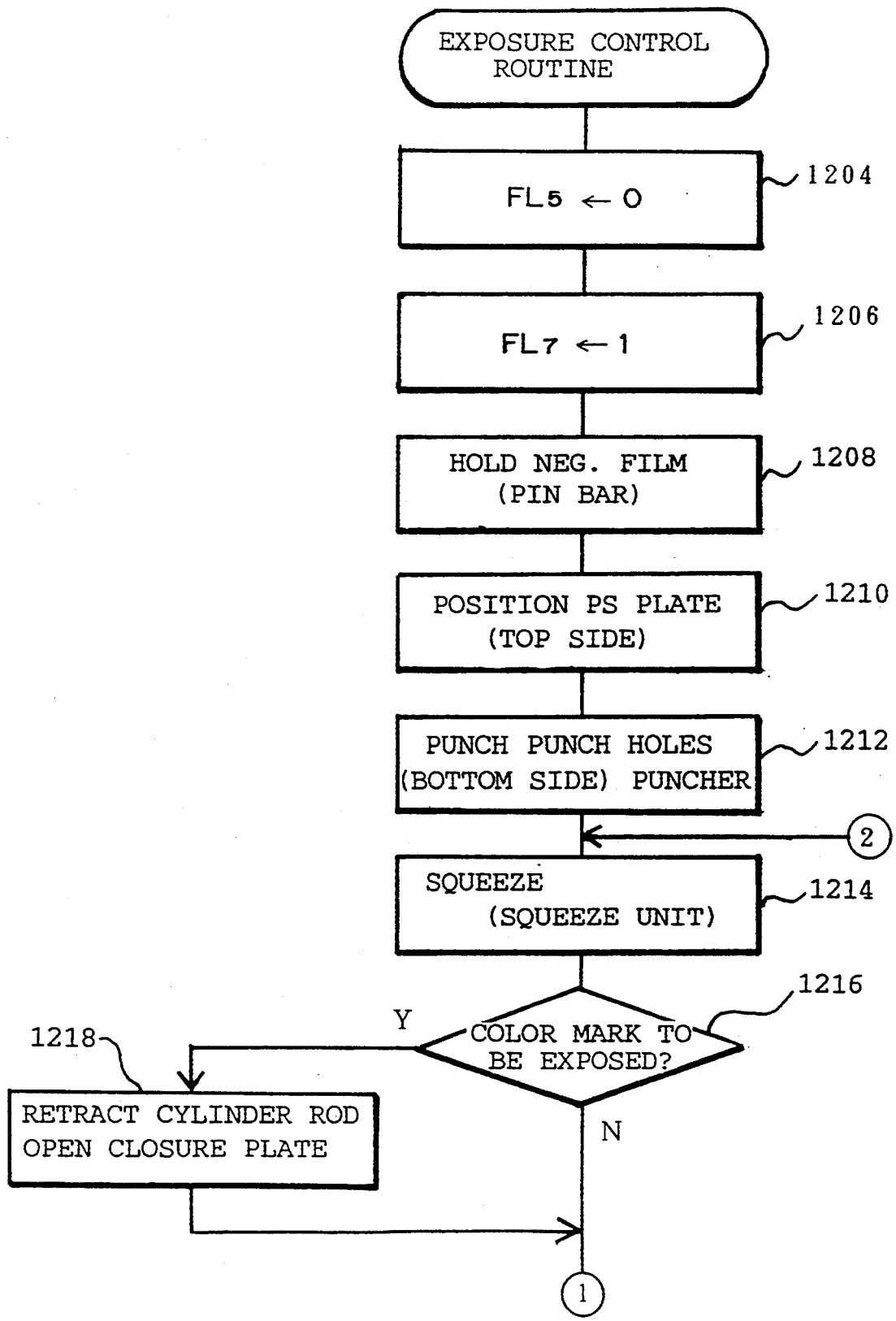
FIGS. 59A and 59B are parts of a single flowchart illustrating the details of exposure control of the main routine.
Figure 59B:
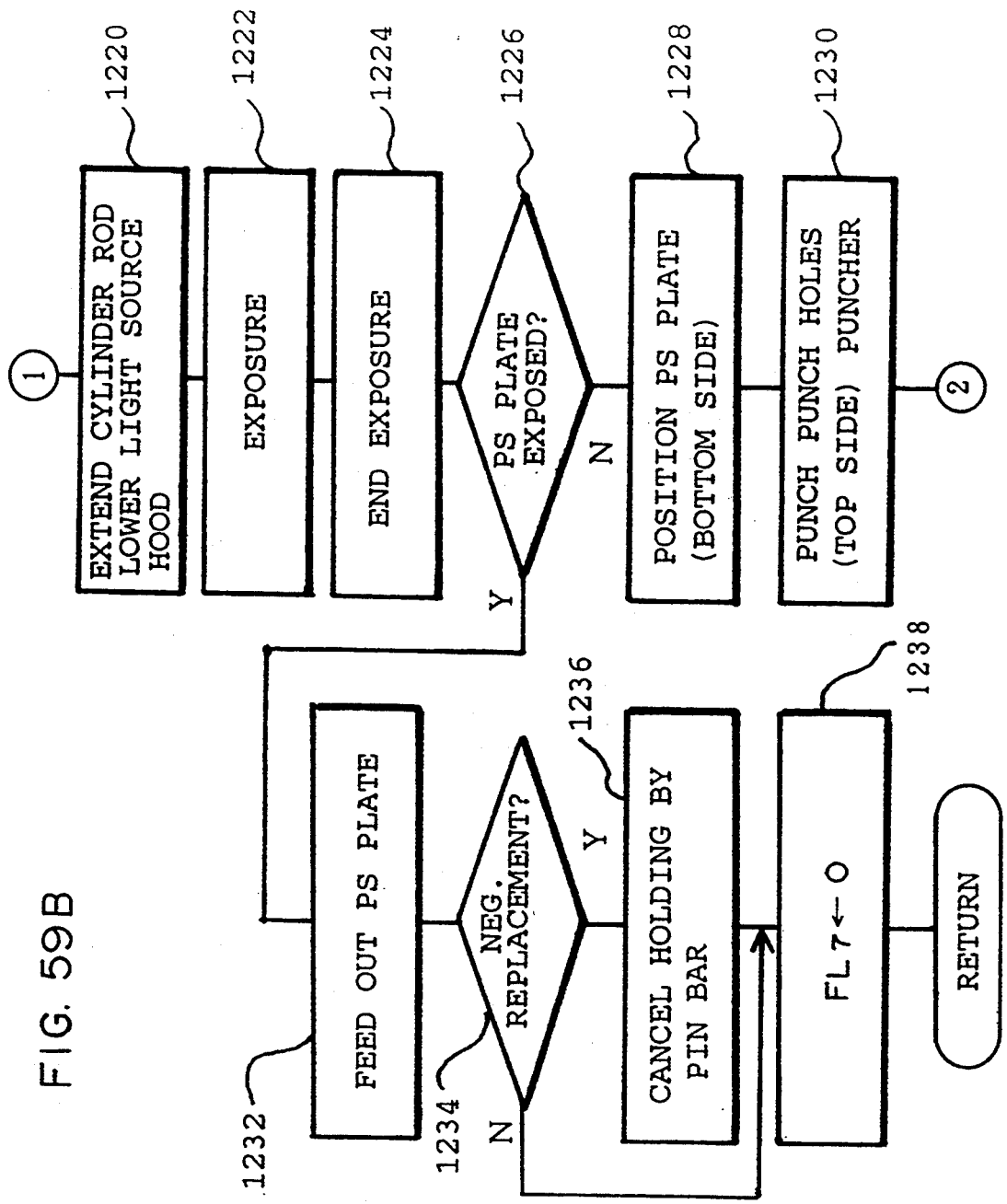

Referring now to the flowchart shown in FIGS. 59A and 59B, a description will be given of exposure control in Step 1112 in the main routine.

In Step 1204, the flag FL5 is cleared, and an operation signal is sent for making preparations for feeding an ensuing PS plate 18 to the printing surface-plate section 800.

In Step 1206, the flag FL7 is set, and an output is given to the effect that the printing surface-plate section 800 is operating.

Subsequently, in Step 1208, the negative film 16 fed to the printing surface-plate section 800 is held by the pin bar 990. The negative film sent to the printing surface-plate section 800 is placed on the PS plate 18 mounted on the upper surface of the printing surface plate 812, the pin 1004 and the pins 1006 of the pin bar 990 have been inserted in the punch holes 16A and 16B of the negative film 16. The eaves portion 994 of the pressing portion 996 has been retreated from the upper side of the main-body block 992.

In this state, the cylinder 1014 is driven to move the eaves portion 994 to above the main-body block 992, and the cylinders 1030 are driven to lower the eaves portion 994, thereby allowing the negative film 16 to be nipped by the main-body block 992 (between the groove section 1002 and the push-up plate 998). At the same time, air is supplied to the inflatable pipe 1032 placed in the groove 1000 to inflate the inflatable pipe 1032, thereby allowing the negative film 16 to be pressed against the eaves portion 994. As a result, the negative film 16 is held by the pin bar 990.

During this holding, when the eaves portion 994 is lowered, the elastic member 994A at the center of the eaves portion 994 is first brought into contact with the negative film 16, so that the pin 1004 is smoothly inserted into the punch hole 16A (see FIG. 43B(1)). Consequently, the slack occurring in the center of the negative film 16 is pushed out toward the opposite end portions by the elastic member 994A. Subsequently, as the eaves portion 994 is further lowered, the elastic members 994B attached to the longitudinal end portions of the eaves portion 994 are brought into contact with the negative film 16 (see FIG. 43B(2)). Hence, the slack pushed out toward the opposite end portions by the elastic member 994A is pushed out from the opposite ends of the negative film 16, and the slack is thereby overcome. In this state, the negative film 16 is clamped by the eaves portion 994 and the main-body block 992, and the negative film 16 is held with the pins 1006 inserted therethrough (see FIG. 43B(3)).

It should be noted that the pin bar 990 is moved in advance to a predetermined place by means of a moving mechanism unit 1034. The position of movement of this pin bar 990 serves to effect the adjustment of machine differences; for instance, in a case where a plurality of lithographic printing plate printers 10 used in this embodiment are operated in parallel, the mutual differences among the lithographic printing plate printers 10 are overcome.

In an ensuing Step 1210, the positioning of the PS plate 18 placed as extending between the first punching unit 808 and the printing surface-plate section 800 is carried out. In the first punching unit 808, the pin rollers 872 and 874 of the punching table 850 are made to project upward, and in the printing surface-plate section 800 the pin rollers 892 and the pin roller 910 of the pusher 908 are made to project upward.

In the case where the pusher 1908 having the plate 911 shown in FIG. 37B is used, the operation is performed as follows: At the same time as the pin roller 910 is made to project upward, the plate 911 attached to the distal end of the pin roller 910 is also made to project upward. However, since this plate 911 is made to correspond to only the peripheral edge (the portion protruding from the PS plate 18) of the negative film 16, of the PS plate 18 and the negative film 16 superposed one on top of another on the printing surface plate 812, the negative film 16 is lifted up by the plate 911 as the pin roller 910 projects upward. As a result, the negative film 16 is separated from the PS plate 18.

Subsequently, the PS plate 18 is pressed in the transverse direction by the pusher 898 placed between the printing surface plate 812 and the punching table 850, thereby allowing the PS plate 18 to be brought into contact with the pin rollers 872 and 892. In addition, the pusher 908 presses the pin roller 910 along the longitudinal direction of the PS plate 18 by means of the cylinder 920 so as to allow the pin roller 910 to be brought into contact with the pin roller 974.

In the case where the pusher having the plate 911 shown in FIG. 37B is used, since the negative film 16 is lifted up by the plate 911 during the movement of the pin roller 910, the pin roller 910 is brought into contact with the PS plate 18 alone without interference with the negative film 16. For this reason, there are no such drawbacks as the negative film 16 becoming twisted or deformed and the relative position of the negative film 16 becoming offset with respect to the PS plate 18.

As a result, the PS plate 18 is positioned with respect to the punching table 850 and the printing surface plate 812. In this state, negative pressure is supplied to the suction groove 960 in the printing surface plate 812, thereby allowing the PS plate 18 to be sucked and held on the printing surface plate 812.

Next, in the first punching unit 808, the puncher 852 is actuated to punch punch holes at a bottom-side end of the PS plate 18 (Step 1212). Punch holes serving as a reference for plate bending for the purpose of securing the PS plate on a plate cylinder of a rotary press are formed at the bottom-side end of the PS plate 18.

In step 1214, squeezing is performed for bringing the PS plate 18 and the negative film 16 on the printing surface plate 812 into close contact with each other.

Before this squeezing operation, negative pressure is supplied to the suction grooves 962 from the ejector unit 966 so that the negative film 16 is sucked. The air from the air supplying means is supplied to the ejector unit 966 after the air pressure is reduced by the regulator 968, so that its suction force is made weak.

The squeeze unit 1068 on the small surface plate 1066 starts to move as the motor 1088 is driven. The squeeze roller 1070 rides over the pin bar 990 by means of the cams 1080, presses the negative film 16 on the printing surface plate 812, and moves while covering the negative film 14 with the overlay sheet 1072. As a result, the air remaining between the negative film 16 and the PS plate 18 is squeezed out, thereby allowing the negative film 16 and the PS plate 18 to be brought into close contact with each other. As for the air squeezed out between the negative film 16 and the PS plate 18, the air is squeezed out while making a gap between the negative film and the upper surface of the printing surface plate 812 in the vicinity of the suction grooves 962 against the suction force, since the negative film 16 is held by the suction grooves 962 with a weak suction force. In addition, since the negative film 16 is covered with the overlay sheet 1072 with a fixed tension applied thereto, the negative film 16 is pressed against the surface of the PS plate 18, so that a warping or bend on the surface can be removed.

When the squeeze unit 1068 moves toward the side of the printing surface plate 812 which is the side away from the pin bar 990, the regulator 968 is changed over and air of a fixed pressure which is not subjected to pressure reduction is supplied to the ejector unit 966, with the result that the negative film 16 is sucked onto the suction grooves 962 by a strong suction force and is held thereby. In addition, the overlay sheet 1072 spread over the negative film 16 is sucked and held by the negative pressure supplied to the suction grooves 964 and 984.

Upon completion of squeezing, a determination is made as to whether or not a color mark is to be exposed (Step 1216). Namely, in a case where printing is effected on the top-side image-printing area of the PS plate 18, by printing a color mark on the PS plate 18 in advance, in the case of the image for color printing, it is readily possible to determine the color of the PS plate. It should be noted that in the case of the bottom-side image-printing area of the PS plate 18, the position of the color mark of the negative film will remain in the printed product, so that the color mark is not printed.

When the color mark is exposed, the cylinder 842 is driven to open the closure plate 834, and the light from the light source 806B is made to reach the color mark area of the negative film 16 (Step 1218).

Then, exposure is carried out in Steps 1220 and 1222. The cylinder 820 of the light source unit 802 is extended to lower the light-source hood 806. After the image portion of the negative film 16 is covered with the light-source hood 806, the light from the light source 804 is radiated to the negative film 16, and the PS plate 18 is exposed by the light transmitted through the negative film 16.

Upon completion of the exposure, in Step 1224, the rod 820A of the cylinder 820 is retracted to raise the light-source hood 806. At the same time, the supply of negative pressure to the suction groove 960, 962, 964 and 984 is stopped to cancel the suction and retention of the negative film 16 and the PS plate 18 on the printing surface plate 812.

Then, in Step 1226, a confirmation is made as to whether or not the exposure of an image has been completed on each of the top- and bottom-side image-printing areas of the PS plate 18. If only the top side has been printed, the operation proceeds to Step 1228 to push out the PS plate 18 from the first punching unit 808 and feeds it to the second punching unit 810 until the PS plate 18 extends between the printing surface plate 812 on the one hand, and the movable punching table 924 and the fixed punching table 926 on the other.

Subsequently, the pin rollers 974 and 922 of the printing surface plate 812 and the pin roller 944 of the fixed punching table 826 are made to project upward, so as to effect the positioning of the PS plate 18 by means of the pushers 946 and 948 (Step 1228).

The pusher 948 presses the PS plate 18 along the longitudinal direction and causes the PS plate 18 to be brought into contact with the pin roller 922, while the pusher 946 presses the PS plate 18 in the transverse direction and causes the PS plate 18 to be brought into contact with the pin rollers 894 and 944. As a result, the bottom-side end of the PS plate 18 is positioned with respect to the printing surface plate 812, and the top-side end thereof is positioned with respect to the puncher 928. Upon completion of positioning, negative pressure is supplied to the suction grooves 960 and 962 of the printing surface plate 812 so as to hold the PS plate 18 on the printing surface plate 812.

With respect to the positioned PS plate 18, punch holes (round holes and rectangular holes) which serve as references for plate bending are formed in the top-side end of the PS plate 18 by means of the puncher 928 (Step 1230).

In addition, the PS plate 18 whose bottom-side image-printing area has been positioned on the printing surface plate 812 is squeezed in Step 1214, and is then subjected to exposure (Steps 1216 to 124). It should be noted that in cases where the bottom-side image-printing area is to be subjected to exposure, the closure plate 834 is closed so that a color mark will not be printed (determination made in Step 1216).

The positioning of the PS plate 18 in the transverse direction thereof is effected by means of the pin rollers 874, 892, 894 and 944 which are aligned with each other, so tat the image on the top side and the image on the bottom side are not offset in the transverse direction of the PS plate 18.

Upon completion of the exposure of two-image portions, the PS plate 18 is discharged from the printing surface plate 812. When the suction and retention of the PS plate 18 on the printing surface plate 812 are canceled, the holder 958 of the movable punching table 924 is actuated to grip the transverse end of the PS plate 18. Subsequently, as the rodless cylinder 936 of the drive unit 940 is driven, the movable punching table 924 pushes out the PS plate 18 to the PS-plate discharging section 600. When the transversely opposite end of the PS plate 18 is brought into contact with the rollers of the PS-plate discharging section 600 and is nipped, the holder 958 cancels the gripping of the PS plate 18, and the movable punching table 924 returns to its standby position.

In Step 1234, a confirmation is made as to whether or not the replacement of the negative film is to be carried out. In the case where the replacement of the negative film 16 is carried out, the holding of the negative film 16 by the pin bar 990 is canceled (Step 1236).

In this operation, the supply of air to the inflatable pipe 1032 of the pin bar 990 is canceled to cause the inflatable pipe 1032 to become shrunk. In addition, after moving the eaves portion 994 upwardly by driving the cylinder 1022, the eaves portion 994 is made to retreat from a position above the end of the negative film 16 by means of the cylinder 1014. Furthermore, the push-up plate 998 is moved to above the main-body block 992 by means of the cylinder 1008. As a result, end portions of the negative film 16 in the vicinity of the punch holes 16A and 16B are pushed upward, with the result that the pin 1004 and the pins 1006 are withdrawn from the punch holes 16A and 16B. This cancels the holding of the negative film 16 by the pin bar 990.

In Step 1238, the flag $FL_7$ is cleared, indicating that processing in the printing surface-plate section 800 is completed.

Next, a detailed description will be given of processing for each section.

A plurality of negative films 16 are loaded in the tray 24, and this tray 24 is fed into the interior of the printer along two pairs of first and second guide rails 36 and 40. In this case, the sliders 36B of the first guide rails 36 are attached to the bodies 40A of the second guide rails, and the tray 24 is mounted on the bodies 40A of the second guide rails 40. Hence, the tray 24 can be slid over a large stroke between the position in which the overall upper surface of the tray 24 is placed outside the printer and the position in which the overall upper surface thereof is accommodated in the printer. Therefore, the loading of the negative films 16 is facilitated.

Figure 62:
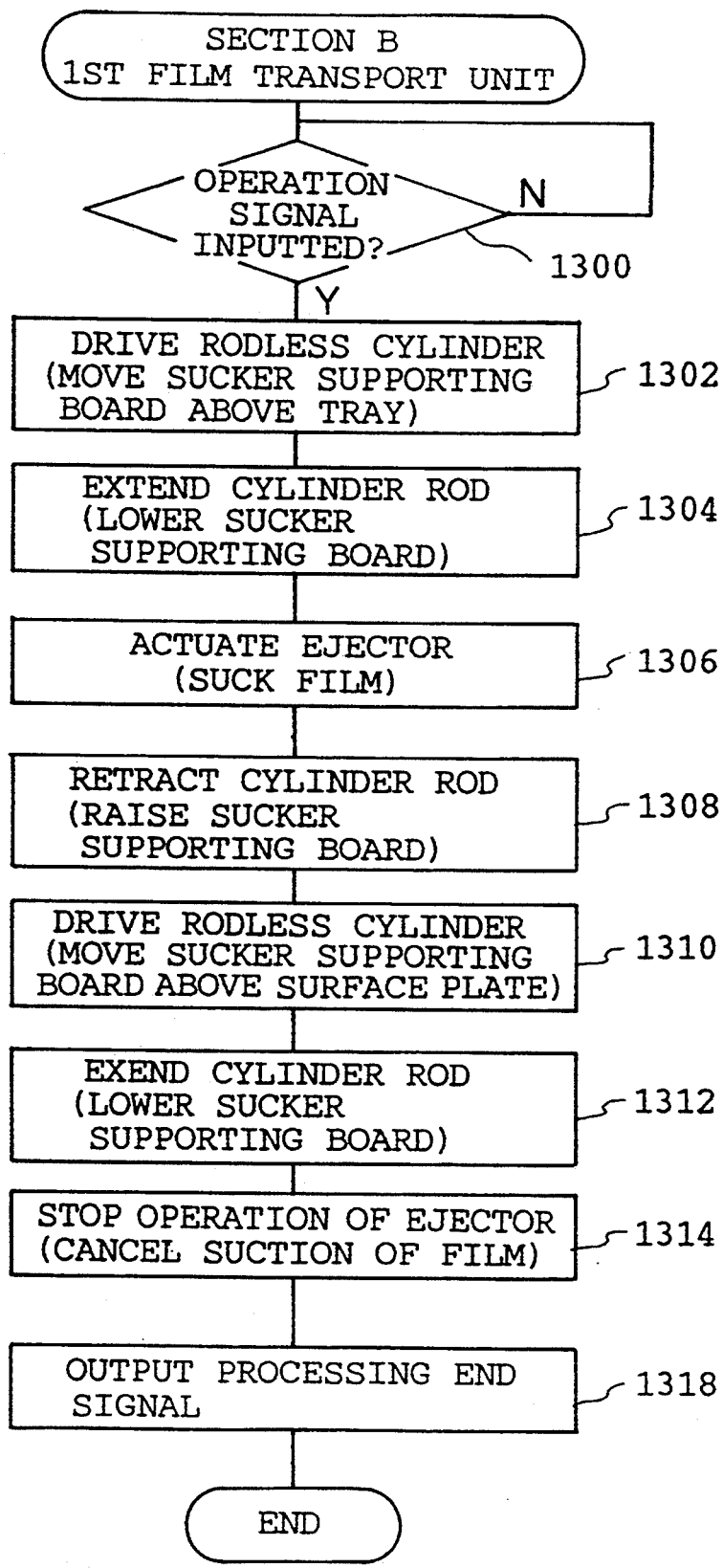
FIG. 62 is a control flowchart illustrating a processing routine for the section B.

FIG. 62 shows a routine for controlling the processing by the first film transport unit 100 (section B). When the tray 24 is loaded in a predetermined position (the position of the phantom lines in FIG. 5), an operation signal is inputted in the main routine (Step 1300) so as to drive the rodless cylinder 132 (Step 1302). As this rodless cylinder 132 is driven, the sucker supporting board 102 is placed over the tray 24, and the operation proceeds to an ensuing Step 1304.

In step 1304, as the rod 114A of the cylinder 114 is extended, the sucker supporting board 102 is lowered a large distance. As the sucker supporting board 102 is thus lowered, the suckers 104 come into contact with the surface of the uppermost negative film 16. The ejector 108 is actuated in this state (Step 1306), the negative film 16 can be sucked by the suckers 104.

When the negative film 16 is sucked by the suckers 104, the sucker supporting board 102 is raised as the rod 111A of the cylinder 114 is retracted (Step 1308), thereby making it possible to take out the uppermost one of the negative films 16.

When the retraction of the rod 114A of the cylinder 114 is completed, the sucker supporting board 102 is brought over the surface plate 202 as the rodless cylinder 132 is driven (Step 1310).

Here, the heightwise position of the surface plate 202 is set to be higher than the loaded height of the tray 24, but since the guide plates 212 are provided in this embodiment, the negative film 16 can smoothly reach the surface plate 202 while being guided by these guide plates 212.

Furthermore, since the guide plate 262 is disposed above the female blade 248A of each female-blade block provided on the surface plate 202, even if there is a step between the female blade 248A of the female-blade block 248 and the surface plate 202, even if the leading end of the negative film 16 is warped, the corner portions of the negative film 16 do not interfere with the female blades 248A, so that the negative film 16 moves smoothly over the surface plate 202.

In an ensuing Step 1312, the rod 116A of the cylinder 116 is extended. This cylinder 116 is mounted coaxially with the aforementioned cylinder 114, and the distal end faces of the rods 114A and 116A are secured to each other. Hence, it is possible to raise or lower the sucker supporting board 102 independently by these cylinders 116 and 114, respectively. For this reason, if the negative film 16 is made in contact with the placing surface of the surface plate 202 with the full stroke of the cylinder 116, the negative film 16 can be lowered to an appropriate position without driving the rod 114A of the cylinder 114.

When the rod 116A of the cylinder 116 is extended and the negative film 16 is brought into contact with the surface plate 202, in Step 1314, the operation of the ejector 108 is stopped. Consequently, the negative film 16 is released from the suckers 104, and is placed on the surface plate 202. When the negative film 16 is placed, a processing end signal indicating that the processing of the first film transport unit (section B) is completed is outputted in Step 1318.

Next, as shown in FIG. 63A, if it is confirmed in Step 1350 that the operation signal has been inputted to the section C, the operation proceeds to Step 1352 to clear a variable I (0). In Step 1354, the rod 274A of the cylinder 274 is extended. As a result, the guide plate 262 is retreated from the female blades 248A while being guided by the shaft 268.

In an ensuing Step 1356, the ejector 208 is actuated to suck and hold the negative film 16 onto the movable surface plate 204. Thus the negative film 16 moves integrally with the movable surface plate 204, and becomes movable relative to the fixed surface plate 206.

If it is determined in an ensuing Step 1358 that close contact has been achieved, the operation proceeds to Step 1360 to start reading the register marks recorded on the negative film 16. At this time, since the sucker supporting board 102 is in a lowered position and the soft sheet 110 is held in close contact with the negative film 16, an erroneous detection due to the floating of the negative film 16 does not occur, so that the register marks 16C can be read accurately.

In Step 1362, a determination is made as to whether or not one end of this register mark 16C, i.e., a change of color (at a boundary) from a black ground portion to a whitened portion in the negative film 16, has been detected. If NO is the answer in the determination, the operation proceeds to Step 1364 to determine whether the readable range of the scanner 246 has been exceeded. If NO is the answer in the determination in Step 1364, the operation proceeds to Step 1362, and Steps 1362 and 1364 are repeated until YES is given as the answer in the determination in Step 1362 or YES is the answer in the determination in Step 1364.

If YES is the answer in the determination in Step 1362, a determination is made that one end of the register mark 16C has been detected within the readable range of the scanner 246, and the operation proceeds to Step 1366 to read the positional data A obtained during detection. Then, the operation proceeds to Step 1368.

In Step 1368, determination is made as to whether or not another end of this register mark 16C, i.e., a change of color (at the boundary) from the whitened portion to the black ground portion in the negative film 16, has been detected. If NO is the answer in the determination, the operation proceeds to Step 1370 to determine whether the readable range of the scanner 246 has been exceeded. If NO is the answer in the determination in Step 1370, the operation proceeds to Step 1368, and Steps 1368 and 1370 are repeated until YES is given as the answer in the determination in Step 1368 or YES is given as the answer in the determination in Step 1370.

If YES is the answer in the determination in Step 1364 or YES is the answer in the determination in Step 1370, the operation proceeds to Step 1372 to increment the variable I. Then, in Step 1374, a determination is made as to whether or not this variable I is 3 or more. If NO is the answer in the determination, the operation proceeds to Step 1360 for a retry. Meanwhile, if YES is the answer in the determination, if the register mark 16C cannot be detected even three readings are carried out, the failure or the like of the scanner 246 is conceivable. Hence, the operation proceeds to Step 1376 to effect error processing such as by sounding an alarm or displaying a message, and this routine ends.

If YES is the answer in the determination in Step 1368, a determination is made that another end of the register mark 16C has been detected within the readable range of the scanner 246, and the operation proceeds to Step 1378 to fetch the positional data B obtained during detection. Then, the operation proceeds to Step 1380.

In Step 1380, average values of the positional data A and B are calculated to obtain the positional data of the center of the register 16C.

In Step 1382, an amount of deviation of the calculated center derived from the positional data from a normal center is calculated. Then, in Step 1384, respective amounts of correction in the X-direction, Y-direction, and $\theta$-direction are calculated. In an ensuing Step 1385, the rod 116A of the cylinder 116 is retracted to raise the sucker supporting board 102, and the operation proceeds to Step 1386.

In Step 1386, the pulse motors 226, 226 and 240 are consecutively actuated on the basis of the aforementioned amounts of correction, thereby moving the movable surface plate 204. Through this movement, the negative film 16 is moved relative to the fixed surface plate 206, and proper punch-hole punching positions of the negative film 16 can be made to correspond to the punch-hole punching mechanism section 250.

When the negative film 16 is positioned as the pulse motors 226, 226 and 240 are driven, in Step 1388, the ejector 210 is actuated, so that the negative film 16 is sucked and held on the fixed surface plate 206 as well.

In an ensuing Step 1390, the rod 116A of the cylinder 116 is lowered again, and the negative film 16 is nipped by the surface plate 202 and the soft sheet 110 attached to the underside of the sucker supporting board 102. As a result, the negative film 16 is held reliably, a floating or the like does not occur.

In this state, in Step 1392, the cylinder 256 is driven, the male-blade blocks 258 are raised, and the male blades engage female blades during the movement thereof, thereby punching punch holes in the negative film 16.

After the punch holes are formed, in Step 1394, the rod 116A of the cylinder 116 is retracted to raise the sucker supporting board 102. Then, in Step 1396, the operation of the ejectors 208 and 210 is stopped, thereby canceling the suction and holding of the negative film 16.

In an ensuing Step 1397, the rod 274A of the cylinder 274 is retracted to position the guide plate 262 above the female blade 248A. in Step 1398, the movable surface plate 202 is returned to its original position (as the pulse motors 226, 226 and 240 are driven). As a result, the processing of punching punch holes for positioning the negative film 16 is completed, so that a processing end signal is outputted in Step 1399.

Figure 64:
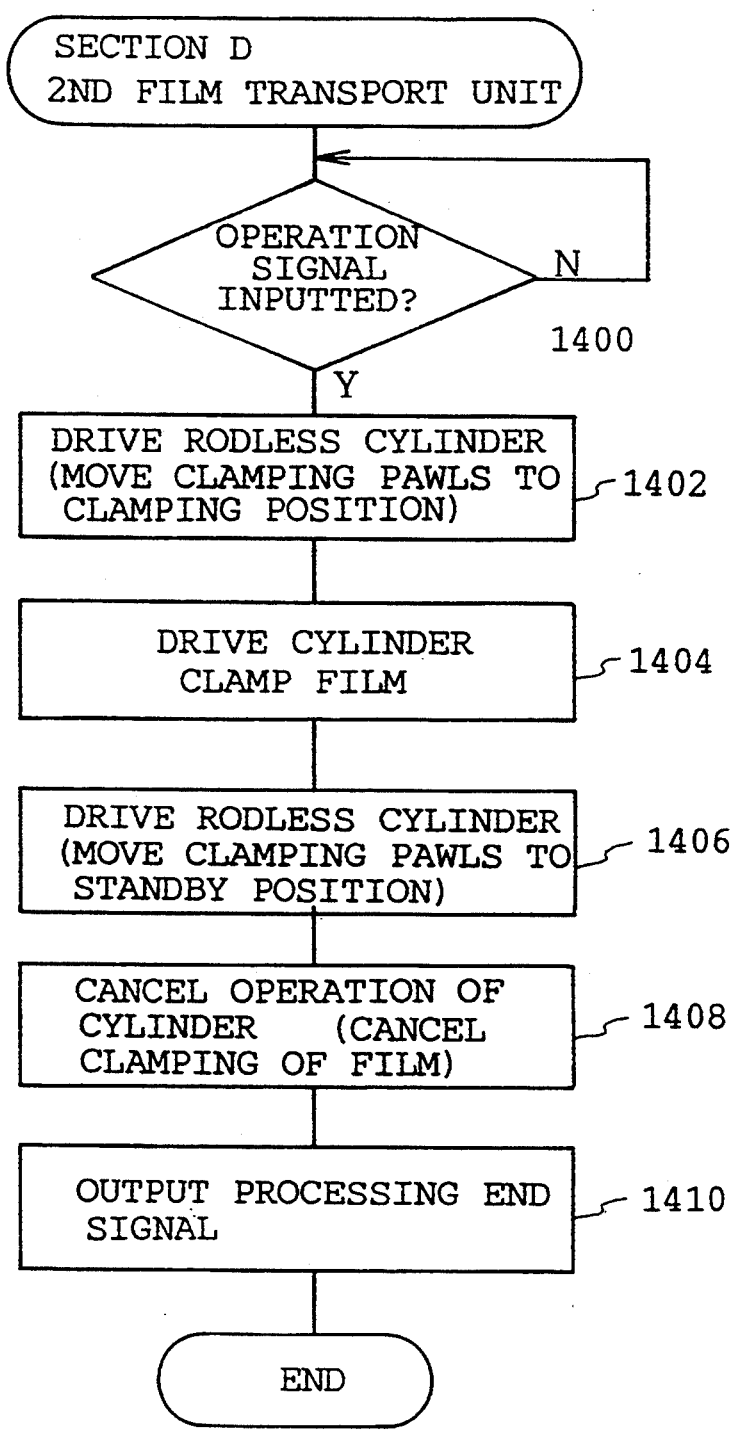
FIG. 64 is a control flowchart illustrating a processing routine for the section D.

FIG. 64 shows a flowchart of processing by the second film transport unit 300 (section D).

In Step 1400, if an input of an operation signal from the main control unit 712 is confirmed, the operation proceeds to Step 1402 to drive the rodless cylinder 312. As a result, the L-brackets 306 move, and the clamping claws 302 are moved to their film-clamping positions. This film-clamping positions are at the notches 206E formed at an end of the fixed surface plate 206, a pair of contact pieces of each clamping pawl 302 are made to correspond to the obverse and reverse sides of the negative film 16.

Here, in Step 1404, as the cylinder 304 is driven, the pairs of contact pieces move toward each other to clamp the negative film 16.

When the clamping of the negative film 16 by the clamping pawls 320 is completed, in Step 1406, the rodless cylinder 312 is driven to move the L-brackets 306, and the clamping pawls 302 move to the standby section 26. At this time, the negative film 16 is moved and is placed in the standby section 26 while being supported by the support plate 314 in such as manner as to be pulled by the clamping pawls 302. Hence, the negative film 16 is moved in parallel by maintaining its state in which its position was adjusted on the surface plate 202 in the X-Y-θ directions. Thus, the positional offset which could otherwise occur in the standby section 26 can be reduced. In addition, the structure for moving the clamping pawls 30 is simple, which makes it possible to realize a lightweight apparatus.

When the negative film 16 is moved to the standby section 26, the driving of the cylinder 304 is canceled, and the clamping of the negative film 16 by the pairs of contact pieces of the clamping pawls is thereby canceled (Step 1408). As a result, the negative film 16 is placed in the standby section 26, and a processing end signal indicating that the processing by the second film transport unit 300 (section D) is completed is outputted (Step 1410).

Figure 65:
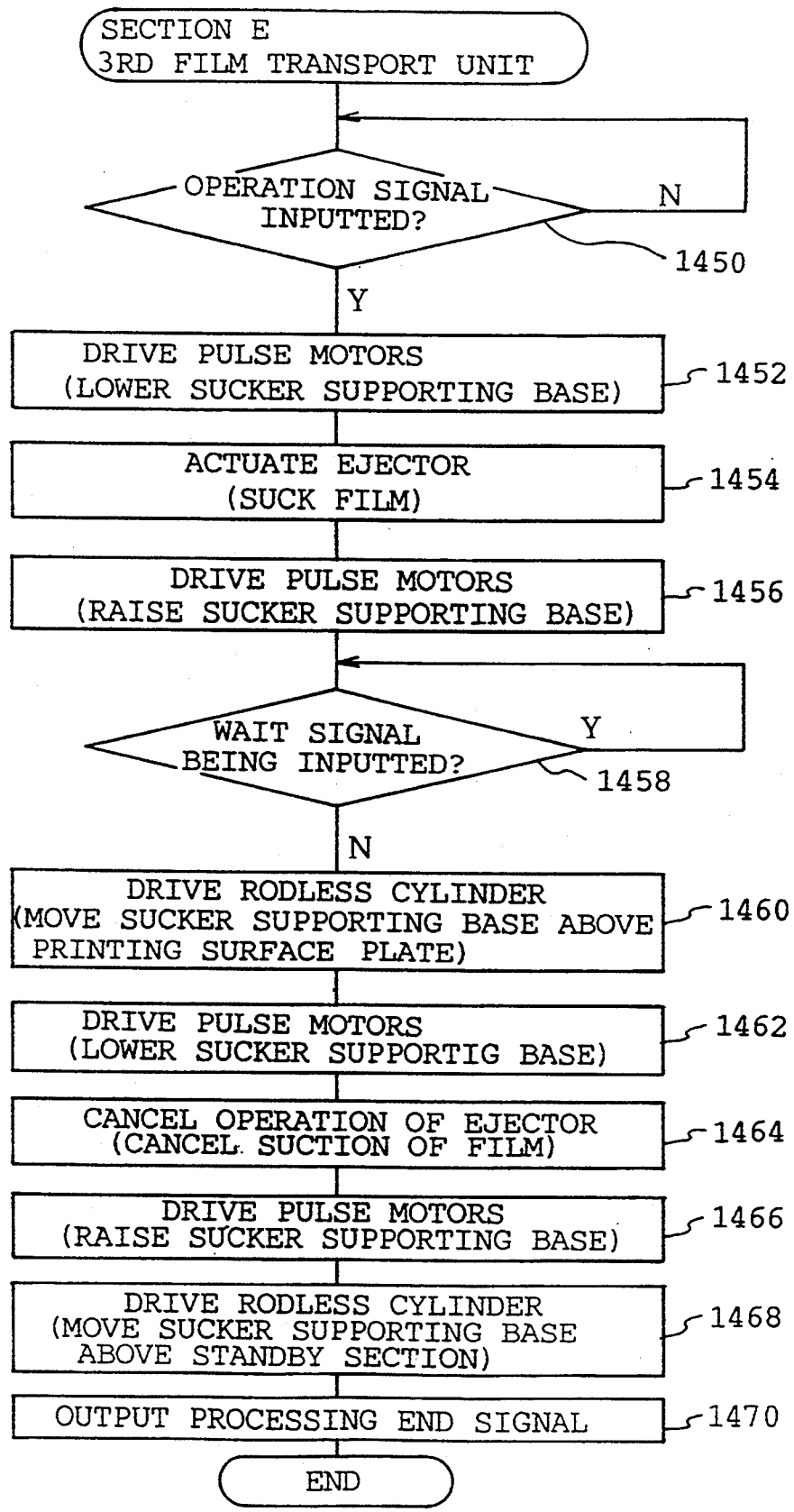
FIG. 65 is a control flowchart illustrating a processing routine for the section E.

FIG. 65 shows a flowchart of processing by the third film transport unit 350 (section E).

In step 1450, if it is determined that an operation signal has been inputted from the main control unit 712, the operation proceeds to Step 1452 to drive the four pulse motors 366A. The rotation of these pulse motors 366A is synchronized, whereby the sucker supporting base 358 is lowered while maintaining a parallel state with respect to the negative film 16 in the standby section 26. When the sucker supporting base 358 is lowered and the suckers 360 are brought into close contact with the negative film 16, in Step 1454, the ejector 362 is actuated to allow the negative film 16 to be sucked by the suckers 360. In this sucked state of the negative film 16, the pulse motors 366A are driven to raise the sucker supporting base 358 (Step 1456). Here, since the shafts 364 also function as guide shafts during the raising and lowering the sucker supporting base 358, the sucker supporting base 358 is raised and lowered smoothly.

In an ensuing Step 1458, a determination is made as to whether or not a wait signal is being inputted from the main control unit 712. If YES is the answer in the determination, the operation waits for a cancellation of the output of this wait signal. If NO is the answer in the determination in Step 1458, i.e., if the output of the wait signal is canceled, the operation proceeds to Step 1460 to drive the rodless cylinder 376. As a result, the sucker supporting base 358 is moved to above the printing surface plate 812 while sucking and holding the negative film 16.

When the sucker supporting base 358 reaches a position above the printing surface plate 812, since the PS plate 18 is already placed on the printing surface plate 812, the negative film 16 is placed on this PS plate 18 as the pulse motors 366A are driven (Step 1462).

Since the negative film 16 is lowered substantially vertically through the synchronous driving of the pulse motors 366A, the pins of the pins bar 990 at the printing surface plate 812 are smoothly inserted through the punch holes. When the pins of the pin bar 990 are inserted through the punch holes, the operation of the ejector 362 is canceled (Step 1464), and in Step 1466 the sucker supporting base 358 is raised again as the pulse motors 366A are driven.

In an ensuing Step 1468, as the rodless cylinder 376 is driven, the sucker supporting base 358 is moved to the standby section 26, and is retreated from the path of movement of the light-shielding hood 816 for exposure processing.

In an ensuing Step 1470, a processing end signal indicating that the processing by the third film transport unit (section D) is completed is outputted.

Figure 66:
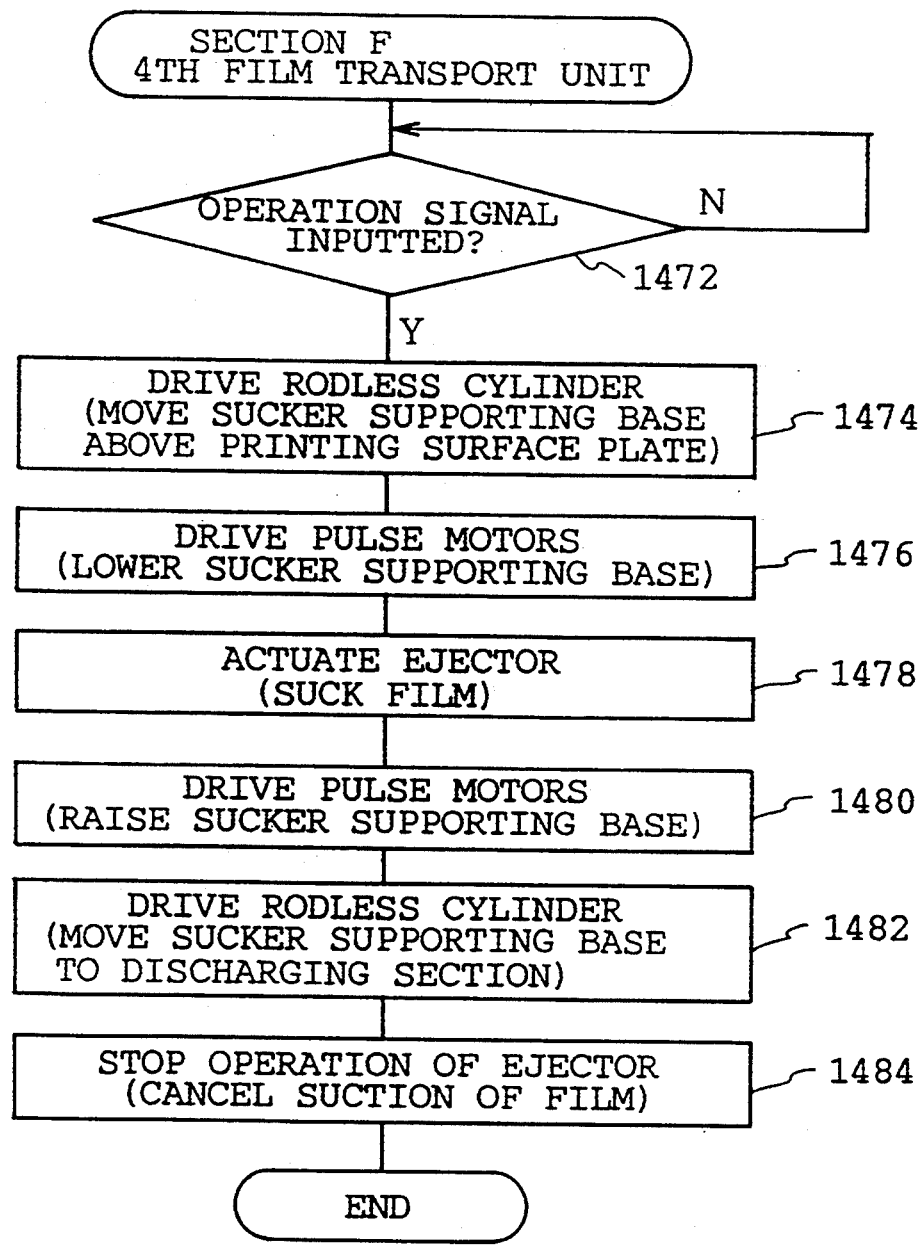
FIG. 66 is a control flowchart illustrating a processing routine for the section F.

FIG. 66 shows a flowchart of processing by the fourth film transport unit 354 (section F).

In Step 1472, if an input of an operation signal from the main control unit 712 is confirmed, in Step 1474, the rodless cylinder 380 is driven to move the sucker supporting base 358 from the discharging section 28 to above the printing surface plate 812. In an ensuing Step 1476, the pulse motors 366A are driven to lower the sucker supporting base 358. with the result that the suckers 360 are brought into close contact with the negative film 16, and the ejector 362 is actuated (Step 1478). Through the operation of this ejector 362, the negative film 16 is sucked by the suckers 360. In this state, the pulse motors 366A are driven to raise the sucker supporting base 358 while the negative film 16 is being sucked and held (Step 1480).

After the raising of the sucker supporting base 358, in Step 1482, the rodless cylinder 380 is driven to move the sucker supporting base 358 to the discharging section 28, and the operation of the ejector 362 is stopped (Step 1484), thereby allowing the negative film 16 to be placed in the discharging section 28.

Then, a description will be given of control for transporting the PS plate 18. The PS plates 18 are loaded in the PS-plate loading section 34 (section H) in a state in which they are stacked in advance on the skid 32.

Figure 67:
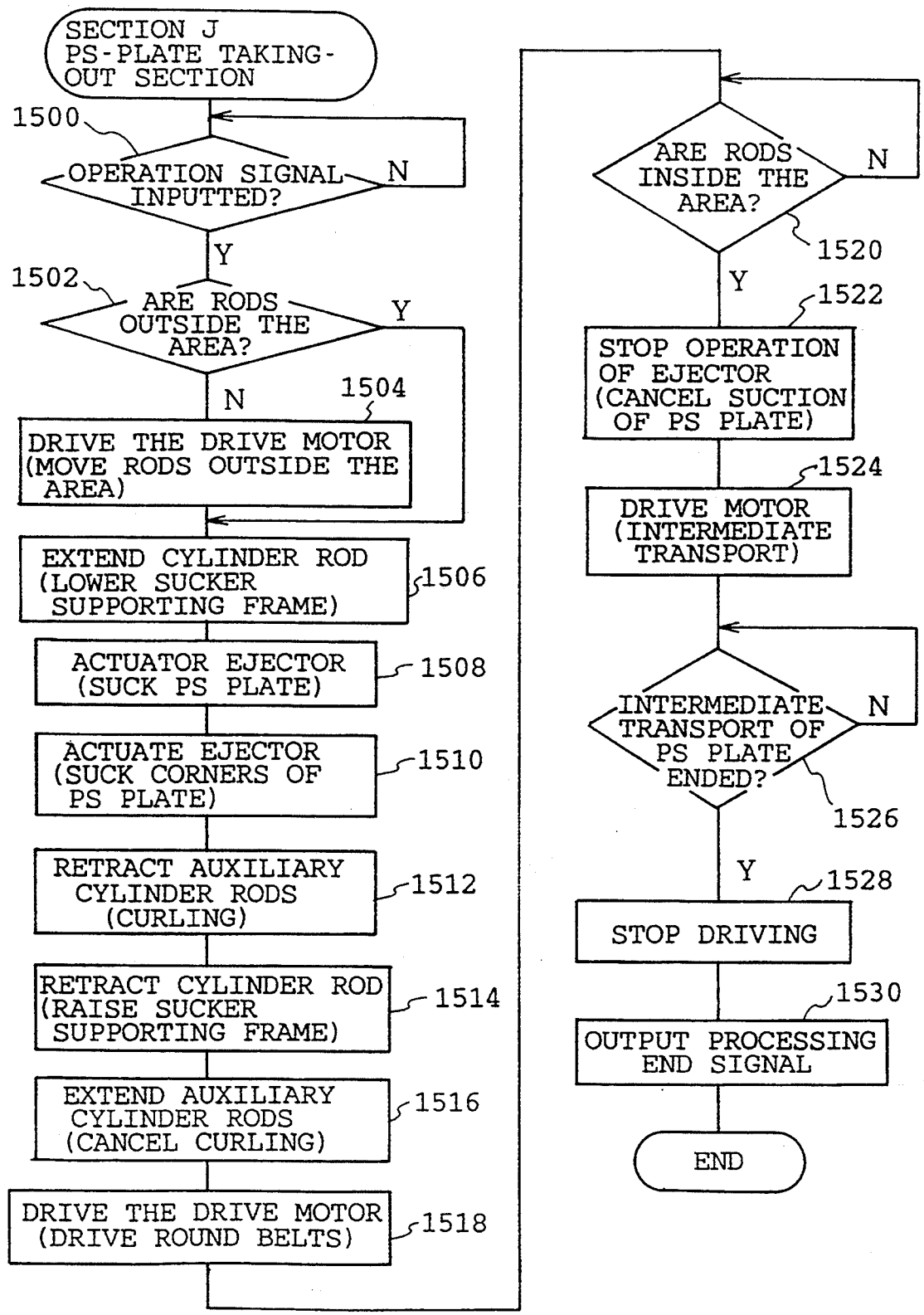
FIG. 67 is a control flowchart illustrating a processing routine for the section J.

FIG. 67 shows a flowchart of processing by the PS-plate taking-out section 400 (section J) for taking out an uppermost one of the PS plates 18 loaded in this PS-plate loading section 34.

In Step 1500, when an input of an operation signal from the main control unit 712 is confirmed, the operation proceeds to Step 1502 to determine whether or not the rods 440 are outside the moving area 438 of the sucker supporting frame 410. If NO is the answer in the determination, to prevent the interference with the sucker supporting frame 410, the drive motor 436 is driven in Step 1504 to move the rods 440 outside the area 438. Then, the operation proceeds to Step 1506.

In addition, if YES is the answer in the determination in Step 1502, the operation jumps Step 1504, and proceeds to Step 1506.

In Step 1506, the rod 412A of the cylinder 412 is extended, thereby lowering the sucker supporting frame 410. In this case, since the sucker supporting base 410 passes through the space (area 438) surrounded by the first and second shafts 428A and 828B and the pair of round belts 432, the sucker supporting base 410 can be moved from a position above the feeding-out transport unit 404 to the lower skid 32 without any interference with other members.

When the sucker supporting frame 410 is brought into contact with an uppermost one of the PS plates 18 stacked on the skid 32, in Step 1508, the ejector 414 is actuated to suck this uppermost PS plate 18. Then, in Step 1510, as the ejector 426 is actuated, the PS plate 18 is sucked by the auxiliary suckers 424 corresponding to the corner portions of the PS plate 18.

In this state, if the rods 420A of the auxiliary cylinders 420 are retracted (Step 1512), the auxiliary suckers 424 corresponding to the corner portions of the PS plate 18 are raised, with the result that the corner portions of the PS plate 18 are curled upward. By virtue of this curling, the separatability of that PS plate from an ensuing PS plate placed therebelow is improved. When the sucker supporting frame 410 is raised as the rod 412 of the cylinder 412 is retracted (Step 1514), only the uppermost PS plate 18 sucked and held by the suckers 408 and the auxiliary suckers 424 is taken out.

In addition, as the rods 420A of the auxiliary cylinders 420 are extended when the sucker supporting frame 410 is being raised (Step 1516), the flatness of the PS plate 18 is recovered.

In an ensuing Step 1518, the drive motor 436 is driven. As a result, the pair of round belts 432 start to be driven, and by means of this driving, the rods 440 are moved in a range including the moving area 438 of the sucker supporting frame 410.

When it is confirmed in Step 1520 that the rods 440 have come to the area 438, the operation proceeds to Step 1522 to stop the operation of the ejectors 414 and 426, thereby canceling the suction and holding of the PS plate 18. At this time, since the rods 440 are located below the sucker supporting frame 410, the PS plate 18 is supported on these rods 440, and is transported toward the intermediate transport unit 406.

In step 1524, the driving of the motor 452 is started to drive the round belts 446 in the intermediate transport unit 406. As a result, the PS plate 18 is delivered smoothly to the intermediate transport unit 406, and is sent to the transporting-direction inverting section 500 while climbing upward. In the transporting-direction inverting section 500, since the placing unit 502 is inclined (approx. 15°) in such a manner as to continue rectilinearly from the transport passage of the intermediate transport unit 406, the PS plate 18 is delivered smoothly to this placing unit 502.

In an ensuing Step 1526, if it is determined that the trailing end of the PS plate 18 has passed through the intermediate transport unit 406, the operation proceeds to Step 1528 to stop the driving of the respective units. Then, in Step 1530, a processing end signal indicating that the processing by the PS-plate taking-out section 400 (section J) is completed is outputted.

Here, the printing surface plate 812 is disposed above the intermediate transport unit 406, a plurality of component parts are disposed in that section. To replace these components or provide maintenance, it has been necessary for the operator to get into the narrow space or extend his or her hands to perform such servicing operations. In this embodiment, however, the overall intermediate transport unit 406 can be retreated. In other words, if the support brackets 445 are removed, the intermediate transport unit 406 is set in a horizontal state as the downstream-side shaft 442B side thereof is rotated downward about the upstream-side shaft 442A. In this state, if the intermediate transport unit 406 is rotated about the shaft 447 in the direction of arrow A shown in FIG. 26, this intermediate transport unit 407 can be retreated from the position above the printing surface plate 812. Accordingly, a maintenance work space can be obtained, so that the operator can easily perform the replacement of component parts and other maintenance operations below the printing surface plate 812.

Figure 68:
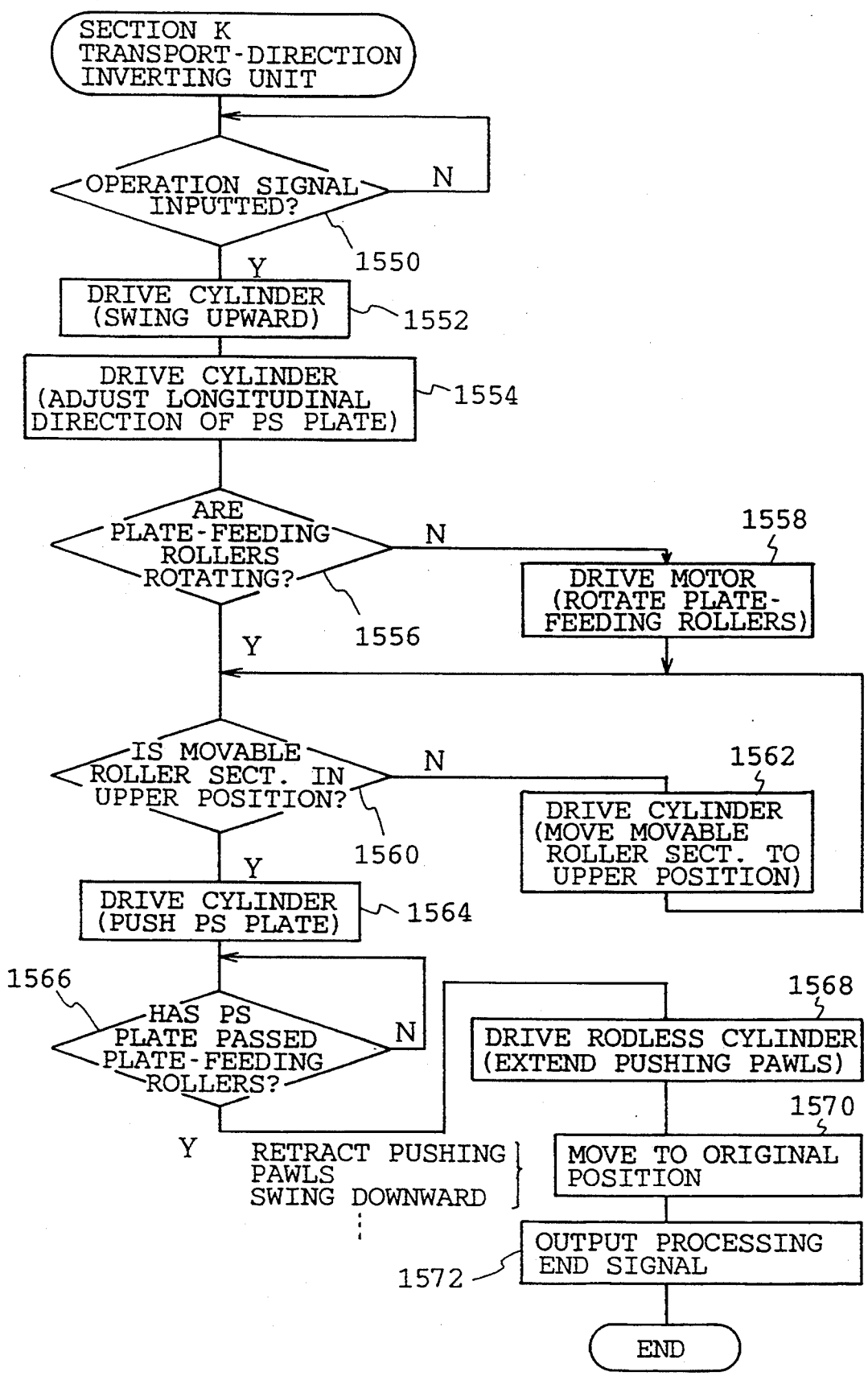
FIG. 68 is a control flowchart illustrating a processing routine for the section K.

FIG. 68 shows a flowchart of processing by the transporting-direction inverting section 500 (section K) for feeding out the PS plate to the printing surface plate 812.

In Step 1550, if an input of an operation signal from the main control unit 712 is confirmed, the operation proceeds to Step 1552 to retract the rod 530A of the cylinder 530. As a result, the placing unit 502 is rotated such that the first shaft 506A side thereof is swung upward about the third shaft 506C through a large angle, and the placing unit 502 is thereby set in an inclined state in which a trailing end of the PS plate 18 fed from the intermediate transport unit 406 is set at a highest position. In this inclined state, the direction of an extension toward the first shaft 506 side becomes the direction of the upper surfaces of the printing surface plate 812 and the punching table 850 of the first punching unit 808.

In this case, since a balancer is mounted at a position opposing the drive unit 518 fixed to the placing unit 502, the placing unit 502 can be swung stably without a twisting of the frame body 504.

In an ensuing Step 1554, the cylinder 530 is driven to adjust the position of the PS plate 18 in the longitudinal direction thereof. Then, in Step 1556, a determination is made as to whether or not the rollers of the plate-feeding roller unit 540 are rotating.

A low-friction cylinder is used as this cylinder 530, and its pressure is regulated by a precision regulator in correspondence with the size of the PS plate 18 to be fed. For this reason, the position of any sizes of PS plates 18 can be adjusted by appropriate amounts and without causing deformation.

The plate-feeding roller unit 540 is used jointly by the PS-plate discharging section 600 which will be described later. Therefore, whether or not the rollers of the plate-feeding roller unit 540 are rotating depends on the state of processing. Hence, in this Step 1556, a determination is made as to whether or not they are rotating. If NO is the answer in the determination, the operation proceeds to Step 1558 to drive the motor 558, and after the rollers of the late-feeding roller unit 540 are rotated, the operation proceeds to Step 1560. On the other hand, if YES is the answer in the determination in Step 1556, the operation jumps Step 1558, and proceeds to Step 1560.

In Step 1560, a determination is made as to whether or not the movable roller section 554 is in the high position. That is, since the PS plate 18 fed onto the printing surface plate 812 is transported by being nipped between the large-diameter roller 552B and the lower small-diameter roller 552C, if YES is the answer in the determination, in Step 1562, the cylinder 562 is driven to move the movable roller section 554 to the upper position. Hence, the point of contact between the large-diameter roller 552B and the lower small-diameter roller 552C comes to be located on the passage for feeding the PS plate 18 onto the printing surface plate 812.

In an ensuing Step 1564, the cylinder 536 is driven to push the trailing end of the PS plate 18 in a case where the direction of transport toward the printing surface plate 812 is set as the forward direction. As a result, the leading end of the PS plate 18 is nipped between the large-diameter roller 552B and the lower small-diameter roller 552C, and by the driving force of this large-diameter roller 552, the PS plate 18 is transported toward the printing surface plate 812.

Here, if it is confirmed that the trailing end of the PS plate 18 has passed through the plate-feeding roller unit 540 (Step 1566), the transporting force by which the PS plate 18 is transported ceases, the operation proceeds to Step 1568 to drive the rodless cylinder 550. As a result, pushing pawls 542 respectively attached to distal ends of brackets adapted to move by the driving force of this rodless cylinder 550 are moved in the direction of travel of the PS plate 18, and the trailing end of the PS plate 18 is received by the grooves 542A. The PS plate 18 is further fed by these pushing pawls 542, with the result that the PS plate 18 is reliably placed on the printing surface plate 812.

Upon completion of the feeding of the PS plate 18 by the pushing pawls 542, the pushing pawls 542 return to their original position. As the rod 530A of the cylinder 530 is extended, the placing unit 502 is rotated such that the first shaft 506A side thereof is swung downward about the third shaft 506C through a large angle. Hence, the placing unit 502 is returned to the position in which its transport passage is rectilinearly continuous from the transport passage of the intermediate transport unit 406 (Step 1570).

In Step 1572, a processing end signal indicating that the processing by this intermediate transport unit 500 (section K) is completed is outputted.

Figure 69A:
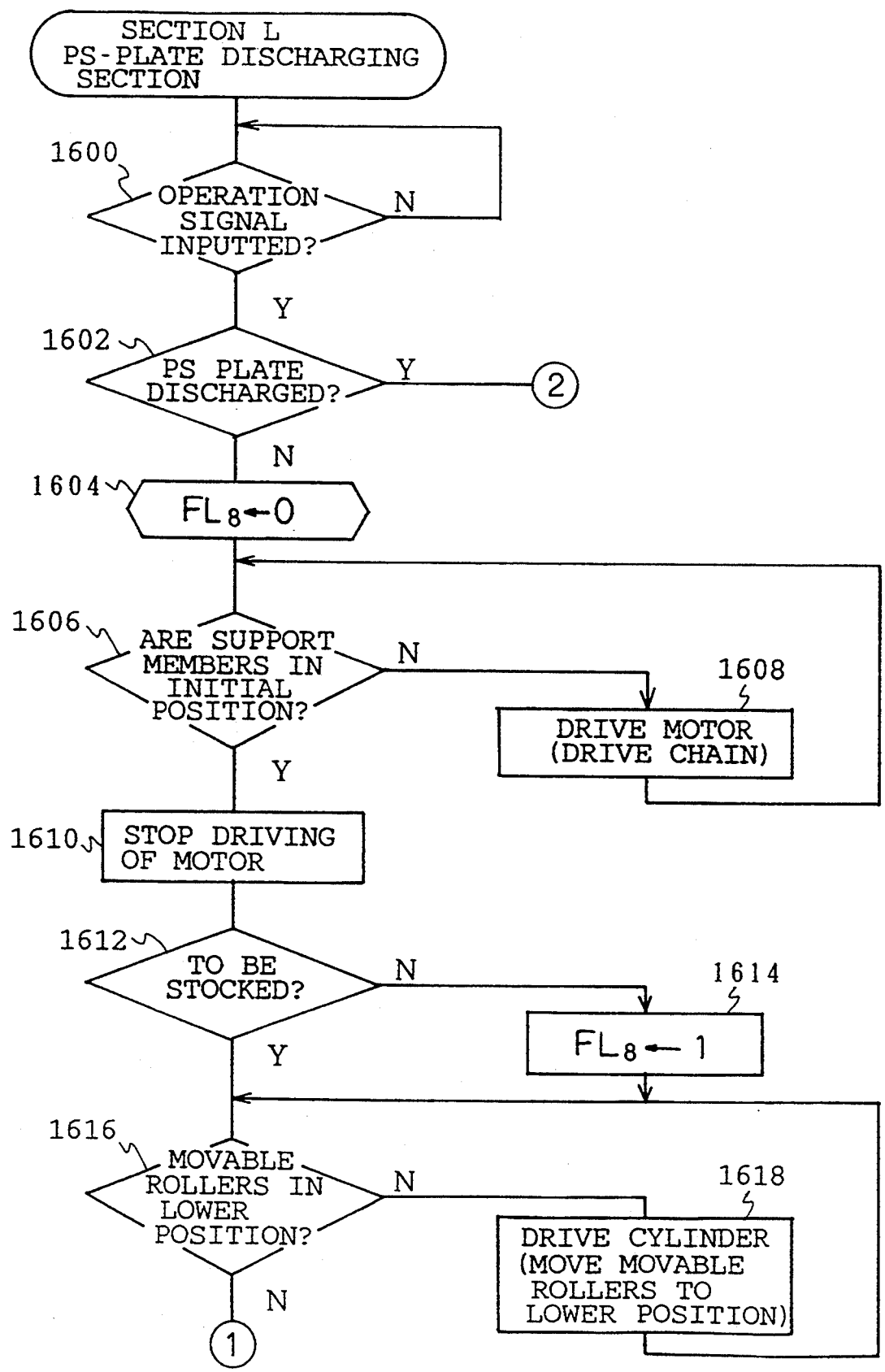
FIGS. 69A and 69B are parts of a single control flowchart illustrating a processing routine for the section L.
Figure 69B:
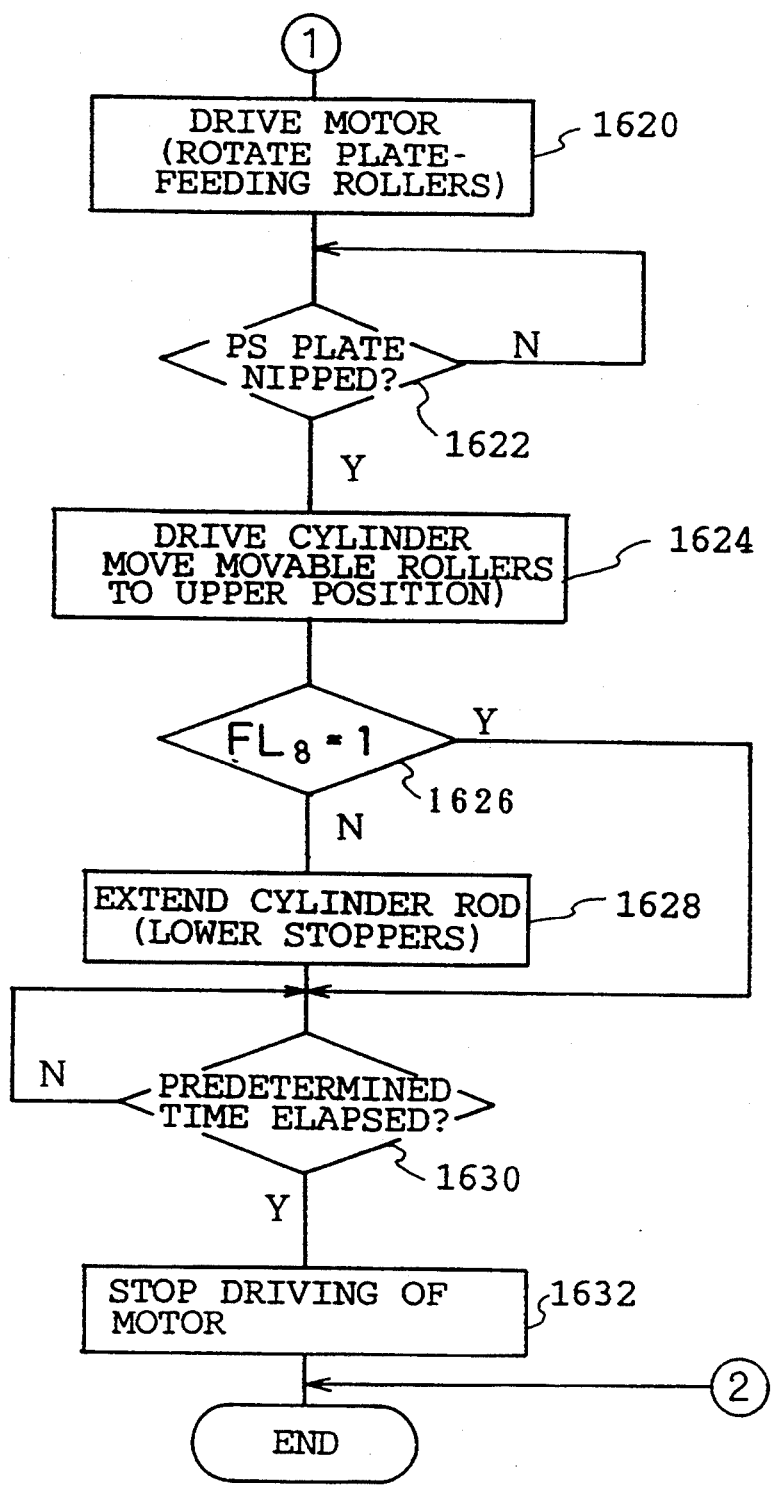

FIGS. 69A and 69B show parts of a single flowchart of processing by the PS-plate discharging section 600 for discharging the PS plate from the printing surface plate 812.

In Step 1600, if an input of an operation signal from the main control unit 712 is confirmed, the operation proceeds to Step 1602 to determine whether or not the PS plate 18 has already been discharged. That is, in a case where an identical image is printed on a plurality of PS plates 18 by using an identical negative film 16, to feed a new PS plate 18 to the printing surface plate 812 and discharge the printed PS plate 18 therefrom, it is necessary to discharge beforehand the PS plate 18 remaining on the printing surface plate 812 in a case where the negative film 16 is replaced.

Accordingly, if YES is the answer in the determination in Step 1602, a determination is made that the discharge has already been completed in the main routine, and the processing by this PS-plate discharging section 600 (section K) is canceled.

On the other hand, if NO is the answer in the determination in Step 1602, a determination is made that the PS plate 18 remains on the printing surface plate 812, so that the operation proceeds to Step 1604 to clear the flag $FL_8$. Subsequently, a determination is made in Step 1606 as to whether or not the support members 612 are at the initial position. If NO is the answer in the determination in this step, the motor 616 is driven in Step 1608, and when the support members are located at the initial position, the operation proceeds to Step 1610 to stop the driving of the motor 616.

In an ensuing Step 1612, a determination is made as to whether or not the printed PS plates 18 are to be stocked, or are to be fed out directly to a developing apparatus installed adjacent to the printer. This determination is set in advance by operating the operation panel.

If NO is the answer in the determination in Step 1612, the flag $FL_8$ is set in Step 1614, and the operation then proceeds to Step 1616. On the other hand, if YES is the answer in the determination, the operation proceeds to Step 1616 leaving the flag $FL_8$ intact (cleared).

In Step 1616, a determination is made as to whether or not the movable roller section 554 is at the lower position. If NO is the answer in the determination, the cylinder 562 is driven in Step 1618 to set the movable roller section in the lower position. Then, the operation proceeds to Step 1620 to drive the motor 558. As a result, the point of contact between the large-diameter roller 552B and the upper roller 552A is set at the same height as the upper surface of the printing surface plate 812, and the rotation of the rollers of the plate-feeding roller unit is started.

When the PS plate 18 is pushed out from the printing surface plate 812, and its leading end is nipped between the large-diameter roller 552B and the upper small-diameter roller 552A (Step 1622), the cylinder 562 is driven in Step 1624 to set the movable roller section 554 in the upper position.

Thus, in a state in which the PS plate 18 being discharged is nipped, the movable roller section 554 is set in the upper position. Accordingly, even though the PS plate 18 is nipped between the large-diameter roller 552B and the lower roller 552C in this state and fed onto the printing surface plate 812, the PS plates 18 do not interfere with each other. Thus discharging and feeding can be effected simultaneously.

In an ensuing Step 1626, a determination is made as to whether or not the flag FL$_8$ has been set. If NO is the answer in the determination, it is necessary to stock the PS plates 18, the rod 622A of the cylinder 622 is extended in Step 1628, thereby lowering the stopper members 624. Meanwhile, if YES is the answer in the determination, since the PS plates 18 are fed directly to the developing apparatus, the stopper members 624 are set in a retreated state.

Consequently, when the PS plate 18 is fed by the plate-feeding roller unit 540 while being supported on the support members 612, if the stopper members 624 are lowered, the PS plate 18 and the stopper members interfere with each other, and only the support members 612 move. For this reason, when the support members are rotated to the lower side of the loop, the PS plate 18 drops from the support members 612, and is accommodated on the exit tray 602.

In addition, in the state in which the stopper members 624 are retreated, the PS plate 18 is transported by the support members 612, and is discharged through the discharge port.

In Step 1630, if it is determined that a sufficient time (a predetermined time duration) has elapsed in the accommodation of the PS plates 18 on the exit tray 602 or in the discharge thereof through the discharge port, the operation proceeds to Step 1632 to stop the driving of the motor 616.

The above-described procedures are taken in processing by various sections. Processing by each section is managed by the main control unit 712, and the operation is conducted on the basis of operation signals. For this reason, if the negative films 16 are stacked on the tray 24 and the PS plates 18 are stacked on the skid 32 and are loaded in the predetermined positions, and if the processing conditions are set by operating the operation panel 14, it is possible to perform print processing onto the PS plates 18 automatically.

In the wiring adopted in this embodiment, since the power unit 772 is connected to the input boards of respective sections (e.g., the input board 733 of the section B), and both the sequence circuit unit 714B and signal lines to be connected are wired to the relay board 776, it is unnecessary to wire the power line and signal lines separately.

In addition, a capacitor for noise control can be provided in the input board 733, and can be used jointly for a plurality of signal lines. Thus it is possible to reduce the number of components used.

As described above, the lithographic printing plate printer in accordance with the present invention offers outstanding advantages in that by feeding the original film directly to the printer by removing the cover sheet, and by positioning the lithographic printing plate and the original film on a printing surface plate constantly in a fixed positional relationship, it is possible to make adjustment of machine differences, render the printer compact, and facilitate the replacement of original films.

In addition to the above-described advantage, the present invention offers an advantage in that the position of the original film can be maintained when the lithographic printing plate is moved with the original film superposed thereon at a time when an identical image is printed on a plurality of lithographic printing plates.

What is claimed is:

1. A device for positioning an image on an original film at a proper position on a lithographic printing plate for use in a lithographic printing plate printer, comprising:

holding means for holding a side of the original film superimposed on said printing plate;

moving means for moving the lithographic printing plate independently of the original film held by said holding means; and separating means for separating another side of the original film from the lithographic printing plate when the lithographic printing plate is moved by said moving means so as to prevent said moving means from interfering with the original film.

2. The device according to claim 1, wherein said holding means is an original film holder comprising:

an elongated main body having a plurality of pins for engaging a plurality of punch holes formed in a side portion of an original film;

a push-up plate for pushing up the side portion of the original film from said main body to disengage the original film from said pins, said push-up plate being located on said main body and having holes through which said pins are inserted;

a pressing member located above said main body and said push-up plate to clamp the original film in cooperation with said push-up plate;

push-up plate moving means for moving said push-up plate upwardly from said main body to disengage the original film from said pins;

pressing member moving means for moving said pressing member downwardly to press the original film on said push-up plate; and retreating means for retreating said pressing member from a position above said main body.

3. The device according to claim 1, wherein said moving means is a pusher for pushing the lithographic printing plate on the surface plate to position the lithographic printing plate, said pusher comprising:
- a pushing member for pushing the printing plate while moving along an elongated hole formed in the surface plate;
- a sliding member on which said pushing member is disposed uprightly;
- first guiding means for guiding said sliding member in a vertical direction and causing said pushing member to project upwardly from the elongated hole at an upper end position of said sliding member;
- first moving means for moving said sliding member along said first guiding means;
- second guiding means for guiding said sliding member along the elongated hole in a state in which said sliding member is guided to the upper end position by said first guiding means;
- second moving means for moving said sliding member along said second guiding means; and
- an original film separating member disposed on said pushing member to separate a portion of the original film placed on the lithographic printing plate from the lithographic printing plate when the lithographic printing plate is pushed by said pushing member.

4. The pusher according to claim 3, wherein said separating means is a plate disposed on an upper portion of said pushing member in parallel with the upper surface of the surface plate.

* * * * *